(12) United States Patent
Yamazaki et al.

(10) Patent No.: US 12,156,410 B2
(45) Date of Patent: Nov. 26, 2024

(54) MEMORY DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Takanori Matsuzaki, Atsugi (JP); Tatsuya Onuki, Atsugi (JP); Yuki Okamoto, Isehara (JP); Hideki Uochi, Atsugi (JP); Satoru Okamoto, Isehara (JP); Hiromichi Godo, Isehara (JP); Kazuki Tsuda, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 480 days.

(21) Appl. No.: 17/629,804

(22) PCT Filed: Jul. 31, 2020

(86) PCT No.: PCT/IB2020/057246
§ 371 (c)(1),
(2) Date: Jan. 25, 2022

(87) PCT Pub. No.: WO2021/028770
PCT Pub. Date: Feb. 18, 2021

(65) Prior Publication Data
US 2022/0262858 A1    Aug. 18, 2022

(30) Foreign Application Priority Data

Aug. 9, 2019   (JP) .................................. 2019-146975
Aug. 23, 2019  (JP) .................................. 2019-152611
(Continued)

(51) Int. Cl.
*H10B 63/00*   (2023.01)
*H10B 41/27*   (2023.01)
*H10B 43/27*   (2023.01)

(52) U.S. Cl.
CPC ........... *H10B 63/845* (2023.02); *H10B 63/34* (2023.02)

(58) Field of Classification Search
CPC ...... H10B 63/845; H10B 63/34; H10B 43/27; H10B 41/10; H10B 41/27; H10B 63/20;
(Continued)

(56) References Cited

U.S. PATENT DOCUMENTS 8,472,231 B2   6/2013  Takemura
9,406,694 B1*  8/2016  Ikeno .................... H01L 21/764
(Continued)

FOREIGN PATENT DOCUMENTS

JP   2011-238333 A   11/2011
JP   2014-041689 A    3/2014
(Continued)

OTHER PUBLICATIONS

International Search Report (Application No. PCT/IB2020/057246) Dated Oct. 13, 2020.
(Continued)

*Primary Examiner* — David Vu
(74) *Attorney, Agent, or Firm* — Eric J. Robinson; Robinson Intellectual Property Law Office, P.C.

(57) ABSTRACT

A highly reliable memory device is provided. On a side surface of a first conductor extending in a first direction, a first insulator, a first semiconductor, a second insulator, a second semiconductor, and a third insulator are provided in this order when seen from the first conductor side. A first region overlapping with a second conductor with the first insulator, the first semiconductor, the second insulator, the
(Continued)

second semiconductor, and the third insulator therebetween, and a second region overlapping with a third conductor with the first insulator, the first semiconductor, the second insulator, the second semiconductor, and the third insulator therebetween are provided in the first conductor. In the second region, a fourth conductor is provided between the first insulator and the first semiconductor.

9 Claims, 79 Drawing Sheets

(30) Foreign Application Priority Data

| Sep. 20, 2019 | (JP) | 2019-171318 |
|---|---|---|
| Dec. 5, 2019 | (JP) | 2019-220147 |
| Dec. 5, 2019 | (JP) | 2019-220340 |
| Dec. 20, 2019 | (JP) | 2019-229897 |

(58) Field of Classification Search
CPC ........ H10B 41/50; H10B 41/70; H10B 43/10; H10B 41/41; H10B 41/35; H10B 43/35; H10B 43/40; G11C 16/10; G11C 16/26; G11C 11/405; G11C 16/0483; G11C 11/40; H01L 29/40114; H01L 29/40117; H01L 29/7869; H01L 29/78642; H10N 70/823; H10N 70/8825; H10N 70/25; H10N 70/8822; H10N 70/8828

See application file for complete search history.

(56) References Cited

U.S. PATENT DOCUMENTS

| 9,634,097 | B2 | 4/2017 | Rabkin et al. |
|---|---|---|---|
| 9,990,997 | B2 | 6/2018 | Matsuzaki et al. |
| 10,043,808 | B1 | 8/2018 | Tezuka et al. |
| 10,497,712 | B2 | 12/2019 | Tezuka et al. |
| 10,600,469 | B2 | 3/2020 | Kimura et al. |
| 10,839,883 | B2 | 11/2020 | Kimura et al. |
| 2011/0065270 | A1 | 3/2011 | Shim et al. |
| 2011/0122673 | A1 | 5/2011 | Kamata et al. |
| 2011/0128777 | A1 | 6/2011 | Yamazaki et al. |
| 2011/0134683 | A1 | 6/2011 | Yamazaki et al. |
| 2011/0156025 | A1 | 6/2011 | Shionoiri et al. |
| 2011/0176355 | A1 | 7/2011 | Furutani et al. |
| 2011/0176377 | A1 | 7/2011 | Koyama |
| 2011/0186837 | A1 | 8/2011 | Takahashi et al. |
| 2011/0249484 | A1 | 10/2011 | Takemura |
| 2012/0025284 | A1 | 2/2012 | Kato et al. |
| 2012/0033485 | A1 | 2/2012 | Matsuzaki et al. |
| 2012/0292613 | A1 | 11/2012 | Shionoiri et al. |
| 2013/0062600 | A1 | 3/2013 | Koezuka et al. |
| 2015/0372122 | A1 | 12/2015 | Hodo et al. |
| 2017/0207242 | A1 | 7/2017 | Yamazaki |
| 2017/0236839 | A1 | 8/2017 | Yamazaki et al. |
| 2018/0269210 | A1 | 9/2018 | Tezuka et al. |
| 2018/0331116 | A1 | 11/2018 | Tezuka et al. |
| 2018/0374529 | A1 | 12/2018 | Kimura et al. |
| 2019/0006386 | A1 | 1/2019 | Yamazaki et al. |
| 2019/0027493 | A1 | 1/2019 | Kimura et al. |
| 2020/0126991 | A1 | 4/2020 | Yamazaki et al. |
| 2020/0126992 | A1 | 4/2020 | Yamazaki et al. |
| 2020/0161309 | A1 | 5/2020 | Asami |
| 2021/0013223 | A1 | 1/2021 | Onuki et al. |
| 2021/0074346 | A1 | 3/2021 | Kimura et al. |
| 2021/0135010 | A1 | 5/2021 | Yamazaki et al. |
| 2021/0312970 | A1 | 10/2021 | Onuki et al. |
| 2021/0383881 | A1 | 12/2021 | Onuki et al. |
| 2021/0384326 | A1 | 12/2021 | Yamazaki et al. |
| 2022/0068967 | A1 | 3/2022 | Yamazaki et al. |

FOREIGN PATENT DOCUMENTS

| JP | 2014-160535 A | 9/2014 |
|---|---|---|
| JP | 2017-168809 A | 9/2017 |
| JP | 2018-157205 A | 10/2018 |
| JP | 2018-157208 A | 10/2018 |
| JP | 2018-207038 A | 12/2018 |
| JP | 2019-008862 A | 1/2019 |
| KR | 2013-0042486 A | 4/2013 |
| WO | WO-2011/125432 | 10/2011 |
| WO | WO-2017/068478 | 4/2017 |

OTHER PUBLICATIONS

Written Opinion (Application No. PCT/IB2020/057246) Dated Oct. 13, 2020.
Kimizuka.N et al., "2.4.4 Discussion on Growth Mechanism", Physics and Technology of Crystalline Oxide Semiconductor CAAC-IGZO: Fundamentals, Sep. 15, 2016, pp. 94-97, Wiley.

* cited by examiner

FIG. 11A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 11B
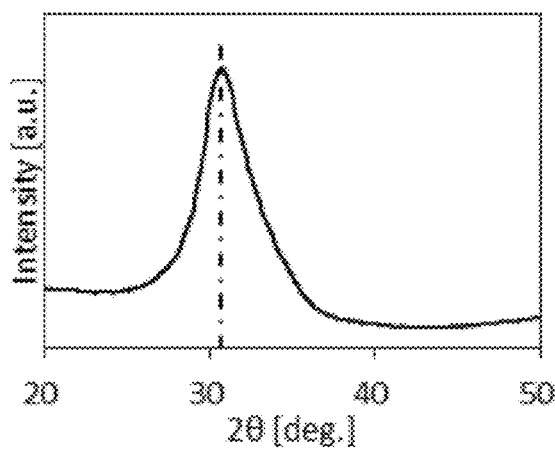
FIG. 11C
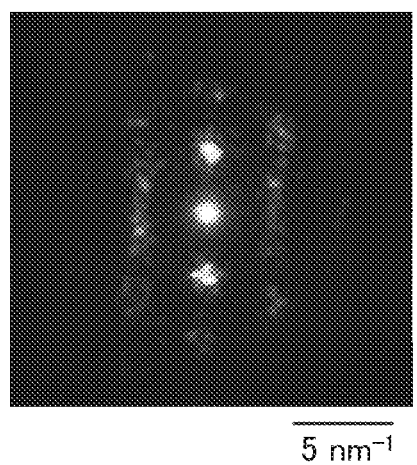

FIG. 35A
FIG. 35B
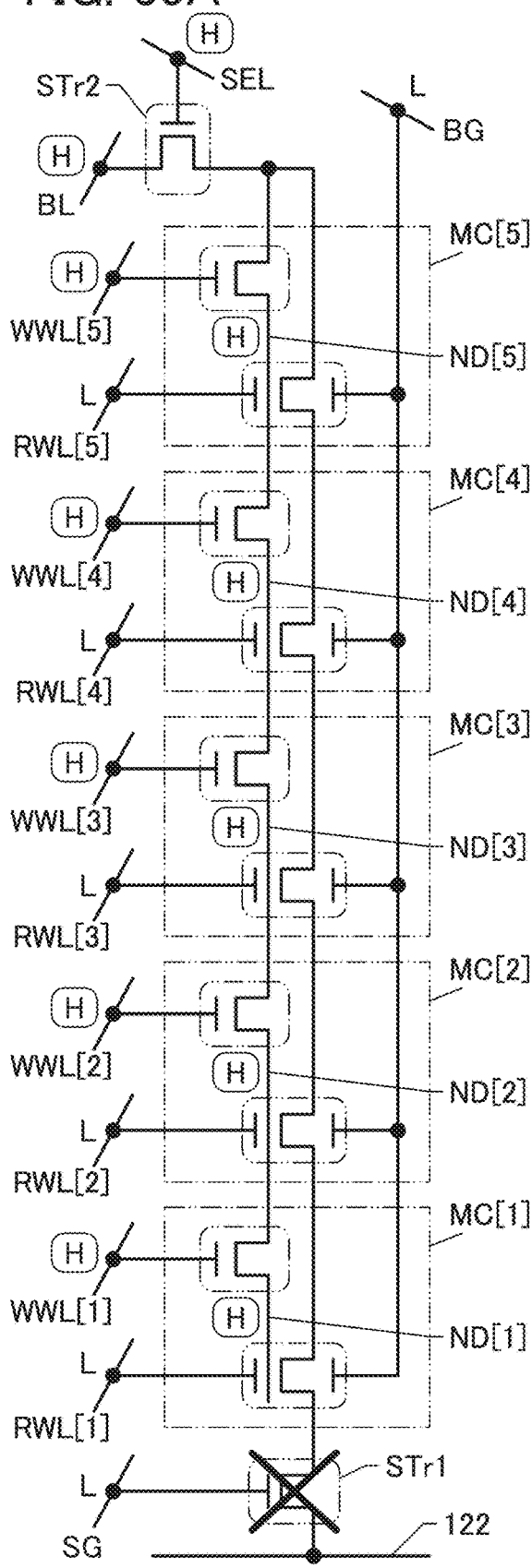
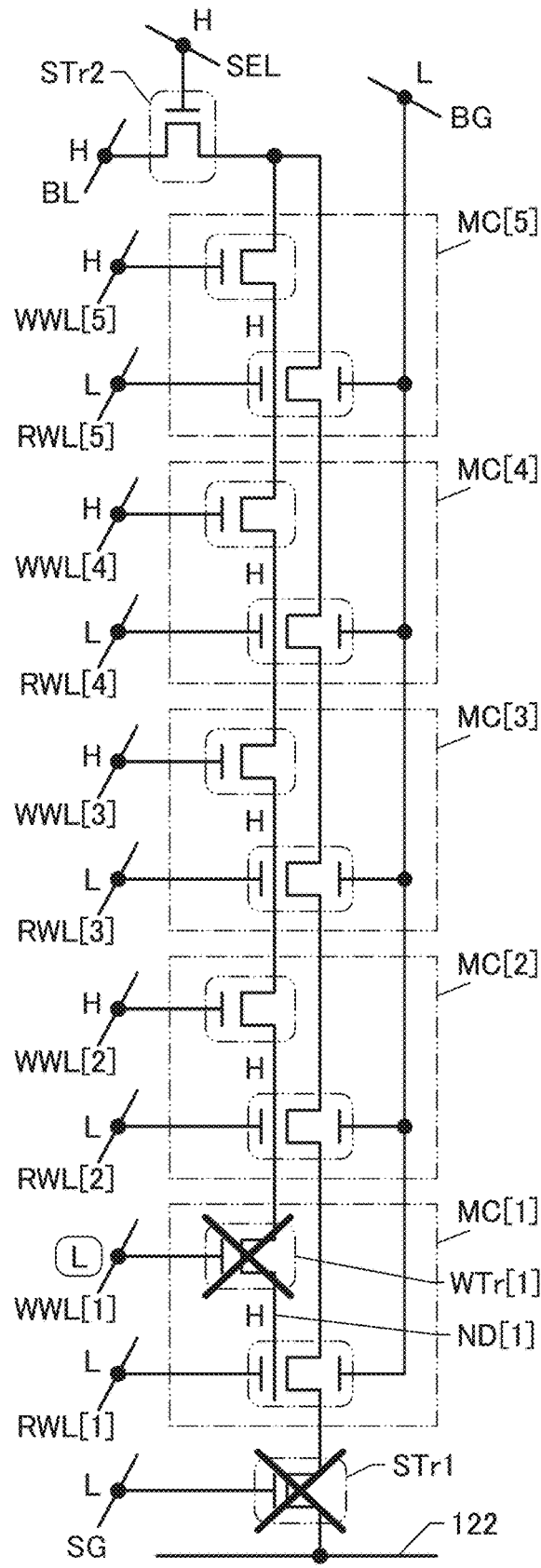

FIG. 39A
FIG. 39B
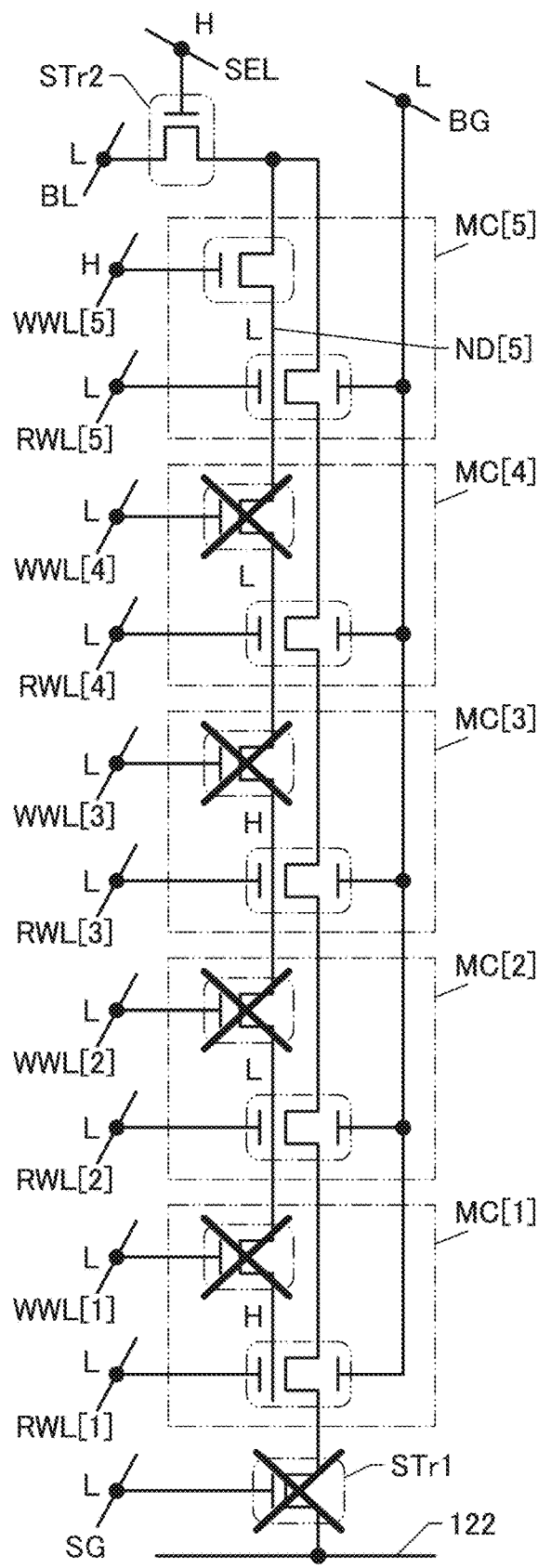
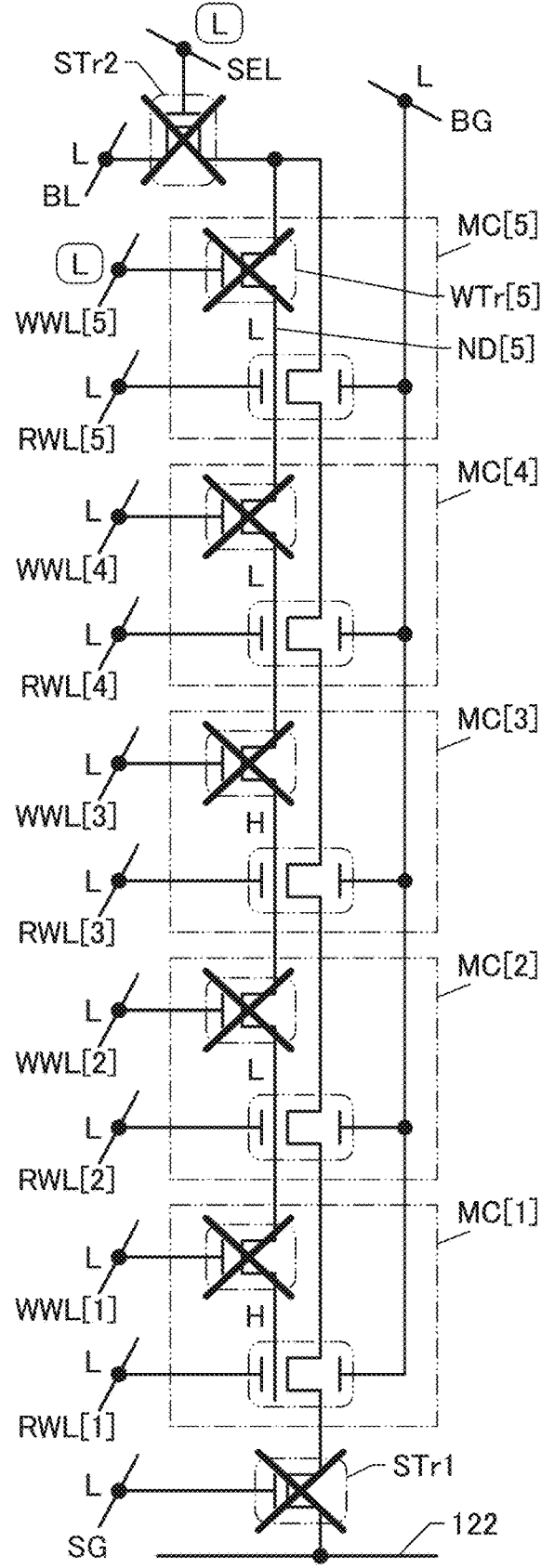

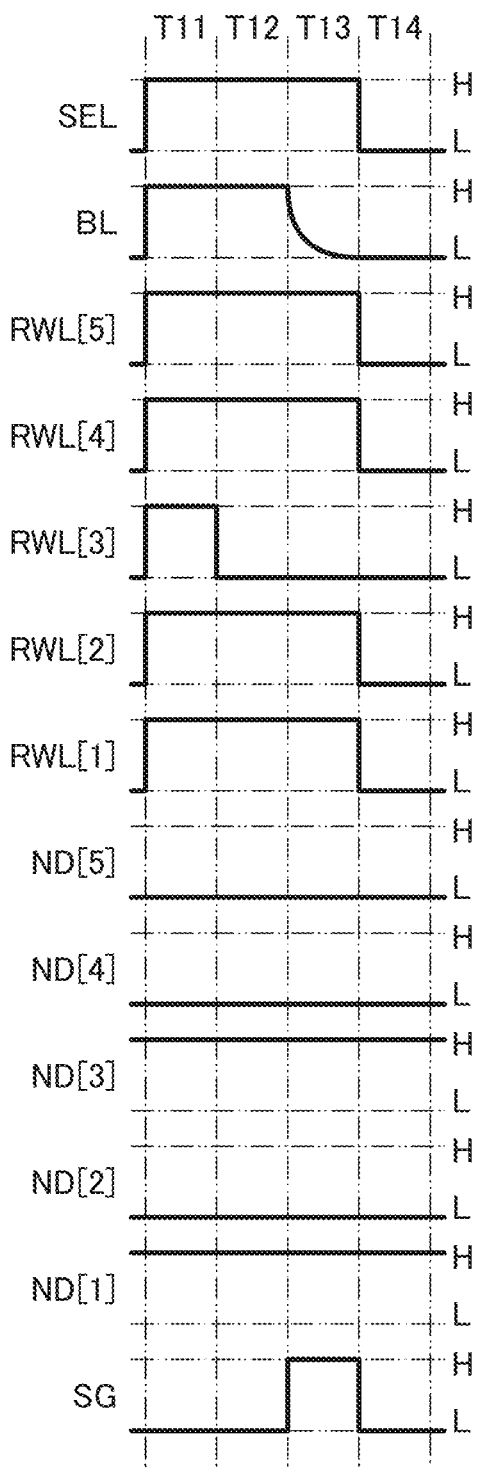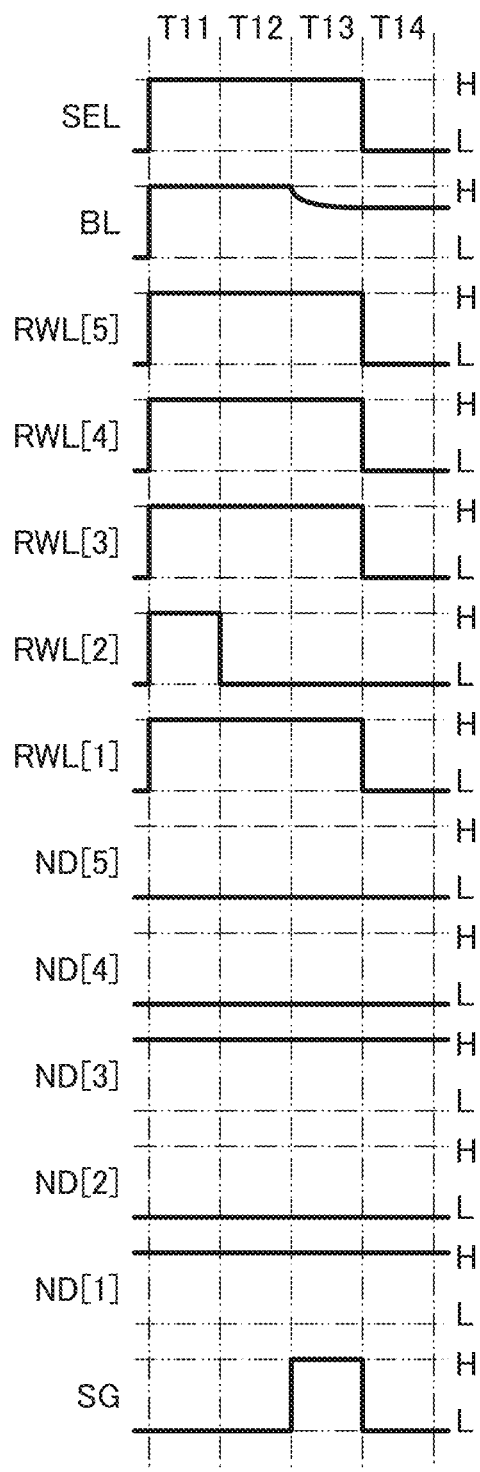

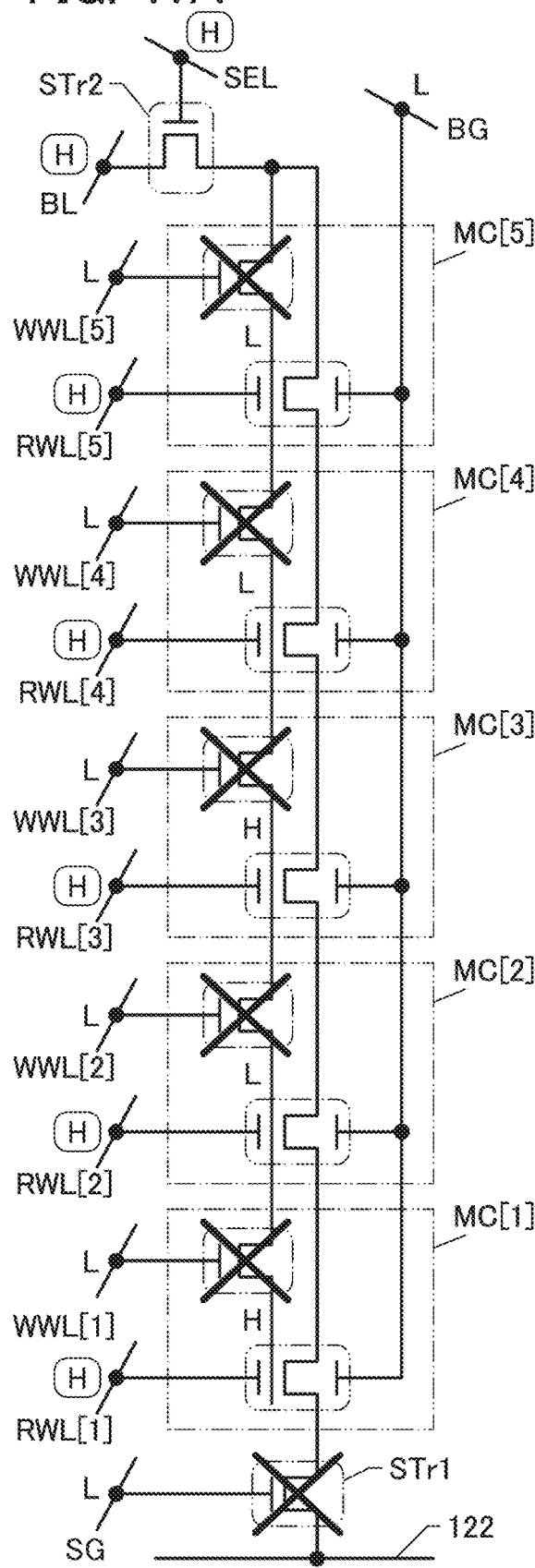
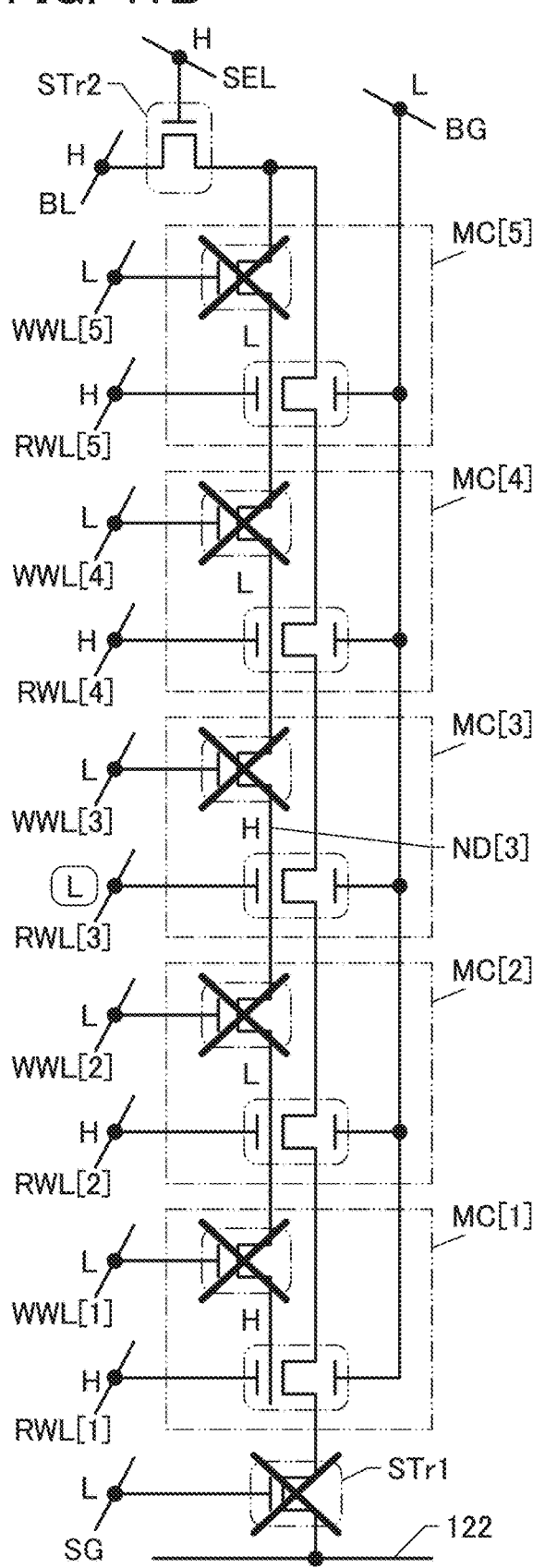
FIG. 41A
FIG. 41B

FIG. 42A
FIG. 42B
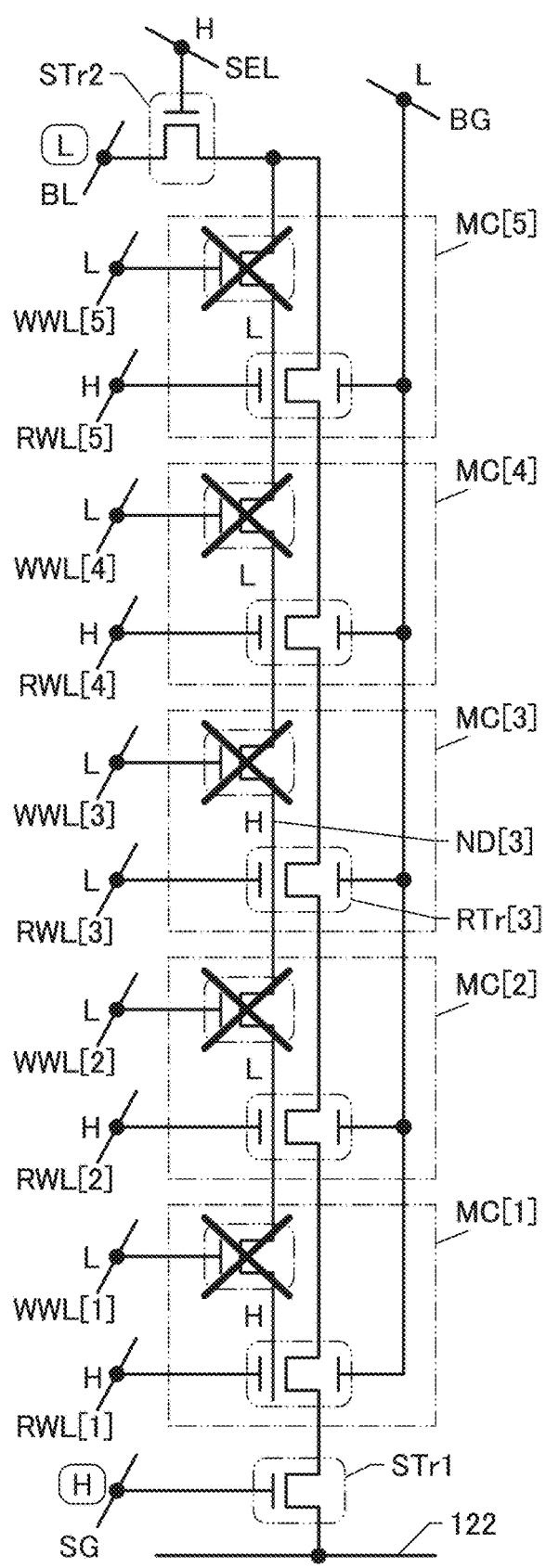
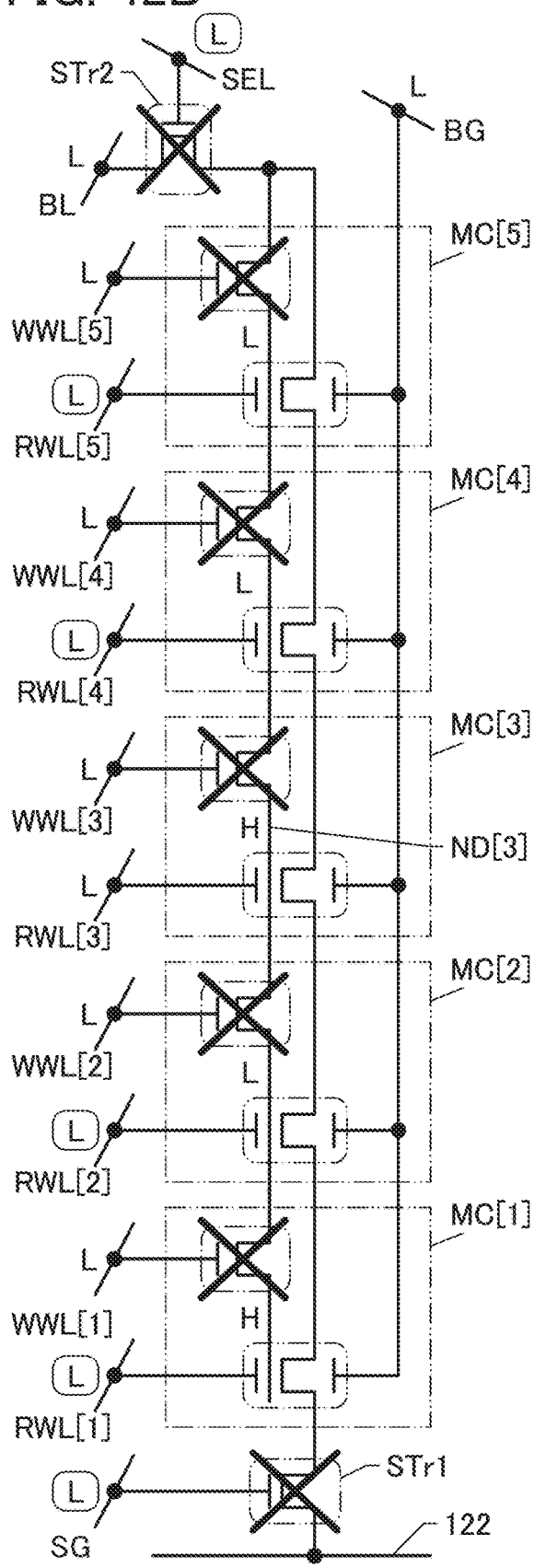

MEMORY DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a memory device, an imaging device, a communication device, an electronic device, and the like may include a semiconductor element or a semiconductor circuit. A display device, a light-emitting device, a lighting device, an electro-optical device, a memory device, an imaging device, a communication device, an electronic device, and the like may be referred to as a semiconductor device.

BACKGROUND ART

In recent years, with an increasing amount of data to process, a semiconductor device having a larger storage capacity has been required. To increase storage capacity per unit area, stacking memory cells is effective (see Patent Document 1 and Patent Document 2). Stacking memory cells can increase storage capacity per unit area in accordance with the number of stacked memory cells. Patent Document 3 and Patent Document 4 disclose memory devices that use an oxide semiconductor. Patent Document 5 discloses a semiconductor memory that uses an oxide semiconductor as a charge storage layer.

REFERENCE

Patent Document

[Patent Document 1] United States Patent Application Publication No. 2011/0065270A1
[Patent Document 2] U.S. Pat. No. 9,634,097B2
[Patent Document 3] Japanese Published Patent Application No. 2018-207038
[Patent Document 4] Japanese Published Patent Application No. 2019-8862
[Patent Document 5] Japanese Published Patent Application No. 2018-157205

SUMMARY OF THE INVENTION

Problems to be Solved by the Invention

In Patent Document 1 and Patent Document 2, a plurality of memory elements (also referred to as memory cells) are stacked and connected in series, so that a three-dimensional memory cell array (also referred to as a memory string) is formed.

In Patent Document 1, a semiconductor provided in a columnar shape is in contact with an insulator including a charge accumulation layer. In Patent Document 2, a semiconductor provided in a columnar shape is in contact with an insulator functioning as a tunnel dielectric. In both Patent Document 1 and Patent Document 2, writing of data to the memory cells is performed by extraction and injection of charge through the insulator. In this case, trap centers might be formed at the interface where the semiconductor and the insulator are in contact with each other. The trap centers can shift the threshold voltage of the transistor by trapping electrons, in some cases. This can adversely influence the reliability of the memory device.

An object of one embodiment of the present invention is to provide a highly reliable memory device. Another object of one embodiment of the present invention is to provide a memory device with a large storage capacity. Another object of one embodiment of the present invention is to provide a memory device with a small area. Another object of one embodiment of the present invention is to provide a memory device with low manufacturing cost. Another object of one embodiment of the present invention is to provide a highly reliable semiconductor device. Another object of one embodiment of the present invention is to provide a semiconductor device with low manufacturing cost. Another object of one embodiment of the present invention is to provide a novel semiconductor device.

Note that the description of these objects does not preclude the existence of other objects. In one embodiment of the present invention, there is no need to achieve all the objects. Other objects are apparent from and can be derived from the description of the specification, the drawings, the claims, and the like.

Means for Solving the Problems

One embodiment of the present invention is a semiconductor device in which, on a side surface of a first conductor extending in a first direction, a first insulator, a first semiconductor, a second insulator, a second semiconductor, and a third insulator are provided in this order when seen from the first conductor side. The first conductor includes a first region overlapping with a second conductor with the first insulator, the first semiconductor, the second insulator, the second semiconductor, and the third insulator provided therebetween, and a second region overlapping with a third conductor with the first insulator, the first semiconductor, the second insulator, the second semiconductor, and the third insulator provided therebetween. In the second region, a fourth conductor is included between the second insulator and the second semiconductor.

Another embodiment of the present invention is a memory device which includes a first conductor, a second conductor, a third conductor, a fourth conductor, a first insulator, a second insulator, a third insulator, a first semiconductor, a second semiconductor, and a first transistor. The first conductor extends in a first direction. On a side surface extending in the first direction of the first conductor, the first insulator is provided adjacent to the first conductor, the first semiconductor is provided adjacent to the first insulator, the second insulator is provided adjacent to the first semiconductor, the second semiconductor is provided adjacent to the second insulator, and the third insulator is provided adjacent to the second semiconductor. The first conductor includes a first region and a second region. In the first region, the second conductor is provided adjacent to the third insulator. In the second region, the third conductor is provided adjacent to the third insulator. In the second region, the fourth conductor is provided between the second insulator and the second semiconductor. The first semiconductor and the second semiconductor are electrically connected to one of a source and a drain of the first transistor.

In the first region, the first insulator, the second insulator, the third insulator, the first semiconductor, and the second semiconductor are each preferably provided concentrically. In the second region, the first insulator, the second insulator, the third insulator, the first semiconductor, the second semiconductor, and the fourth conductor are preferably provided concentrically.

Furthermore, the first region can function as a second transistor. The second region can function as a third transistor. The first semiconductor is preferably an oxide semiconductor. The second semiconductor is preferably an oxide semiconductor.

The carrier concentration of the first semiconductor is preferably higher than or equal to $4\times10^{17}/cm^3$ and lower than or equal to $1.4\times10^{18}/cm^3$. The sheet resistance of the first semiconductor is preferably higher than or equal to $3\times10^5 \Omega/\square$ and lower than or equal to $1\times10^6 \Omega/\square$.

Effect of the Invention

With one embodiment of the present invention, a highly reliable memory device can be provided. With one embodiment of the present invention, a memory device with a large storage capacity can be provided. With one embodiment of the present invention, a memory device with a small area can be provided. With one embodiment of the present invention, a memory device with low manufacturing cost can be provided. With one embodiment of the present invention, a highly reliable semiconductor device can be provided. With one embodiment of the present invention, a semiconductor device with low manufacturing cost can be provided. With one embodiment of the present invention, a novel semiconductor device can be provided.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 11A is a diagram showing the classification of crystal structures of IGZO.
FIG. 11B is a diagram showing an XRD spectrum of a CAAC-IGZO film.
FIG. 11C is an image showing a nanobeam electron diffraction pattern of a CAAC-IGZO film.

FIG. 35A and FIG. 35B are circuit diagrams illustrating the writing operation example of the memory string.

FIG. 39A and FIG. 39B are circuit diagrams illustrating the writing operation example of the memory string.

FIG. 40A and FIG. 40B are timing charts showing a reading operation example of the memory string.

FIG. 41A and FIG. 41B are circuit diagrams illustrating the reading operation example of the memory string.

FIG. 42A and FIG. 42B are circuit diagrams illustrating the reading operation example of the memory string.

MODE FOR CARRYING OUT THE INVENTION

Figure 1:
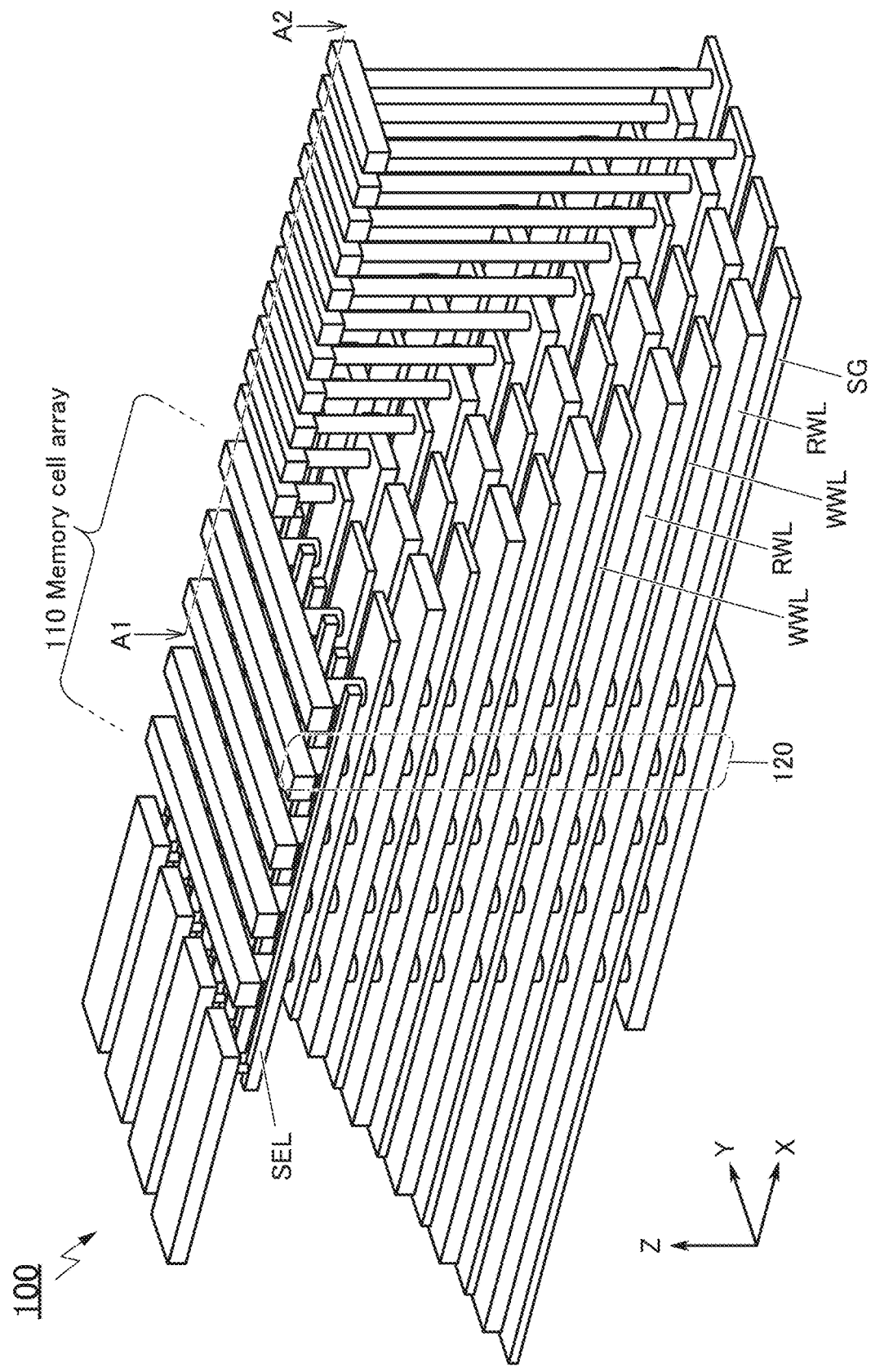
FIG. 1 is a perspective view of a memory device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In drawings and the like, some components might be omitted for easy understanding of the explanation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current or a voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "an electrode B over an insulating layer A" does not necessarily mean that the electrode B is formed over and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function." There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values or in describing objects, methods, events, and the like that can be converted into calculation values or measurement values allow for a margin of error of ±20% unless otherwise specified.

The term "adjacent" or "proximity" in this specification and the like does not necessarily mean that a component is directly in contact with another component. For example, the expression "an electrode B adjacent to an insulating layer A" does not necessarily mean that the insulating layer A and the electrode B are formed in direct contact with each other, and does not exclude the case where another component is placed between the insulating layer A and the electrode B.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator." In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor." In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS," "L potential," or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Also, unless otherwise specified, "an L potential is supplied to a gate of a transistor" means that "the transistor is brought into an off state" in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

In general, a "capacitor" has a structure in which two electrodes face each other with an insulator (dielectric) therebetween. This specification and the like include a case where a "capacitor element" is the above-described "capacitor." That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, when a plurality of components are denoted by the same reference sign, and in particular need to be distinguished from each other, an identification numeral such as "[1]", "[2]", "[n]", or "[m,n]" is sometimes added to the reference sign. For example, the second wiring GL may be expressed as a wiring GL[2].

Embodiment 1

Figure 2:
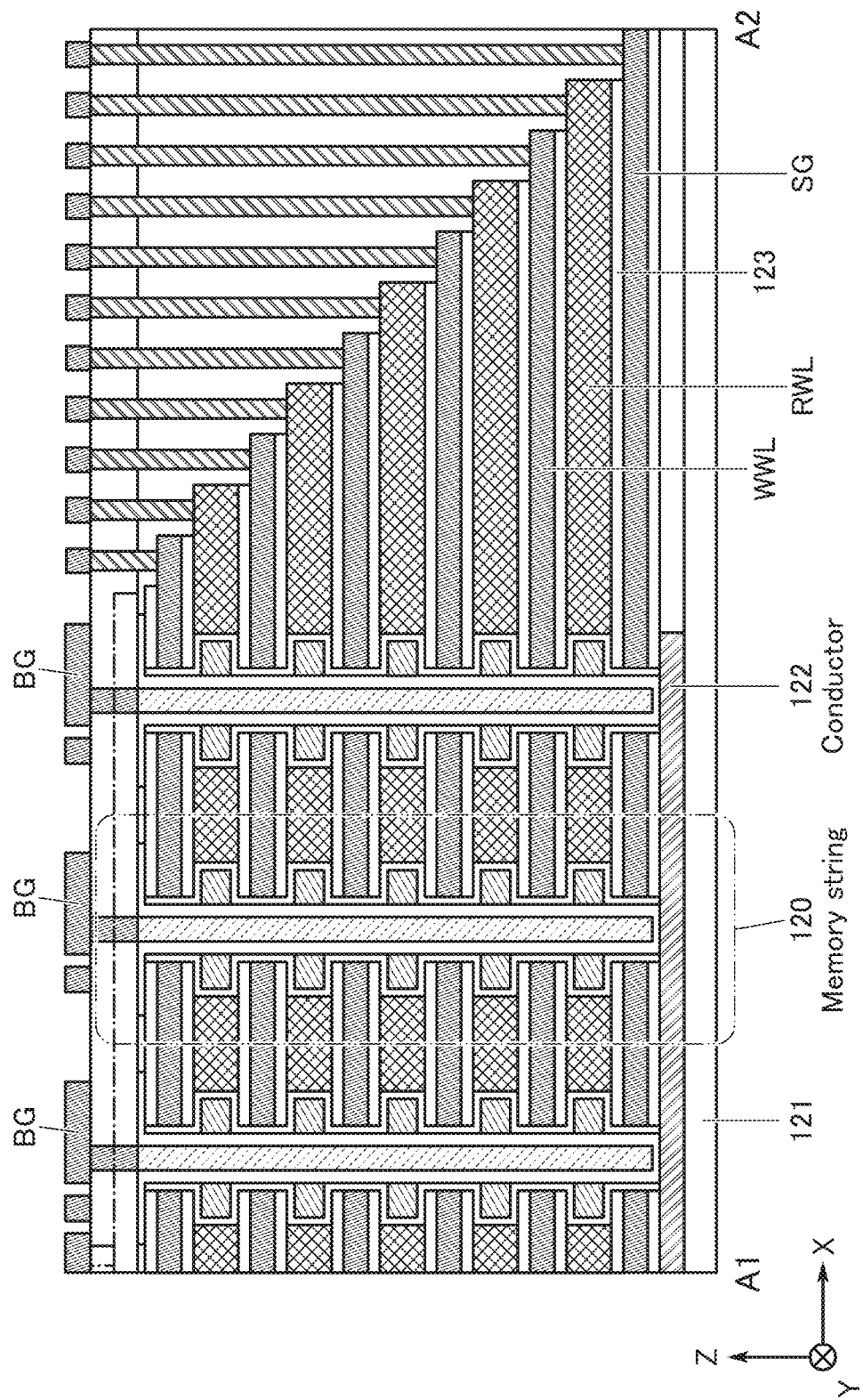
FIG. 2 is a cross-sectional view of the memory device.

FIG. 1 is a perspective view of a memory device 100 of one embodiment of the present invention. The memory device 100 is a memory device having a three-dimensional stacked-layer structure. FIG. 2 is a cross-sectional view of a portion A1-A2 indicated by a dashed-dotted line in FIG. 1. Note that arrows indicating the X direction, the Y direction, and the Z direction are illustrated in some drawings such as FIG. 1. The X direction, the Y direction, and the Z direction are directions orthogonal to each other. In this specification and the like, one of the X direction, the Y direction, and the Z direction may be referred to as a first direction. Another one of the directions may be referred to as a second direction. Furthermore, the remaining one of the directions may be referred to as a third direction.

FIG. 2 illustrates a cross section along the X-Z plane. As described above, some components might be omitted in FIG. 1, FIG. 2, and the like for easy understanding of the explanation.

<Structure Example of Memory Device>

The memory device 100 of one embodiment of the present invention includes a memory cell array 110. The memory cell array 110 includes a plurality of memory strings 120. The memory strings 120 extend in the Z direction and are arranged in a matrix on the XY plane.

Figure 3:
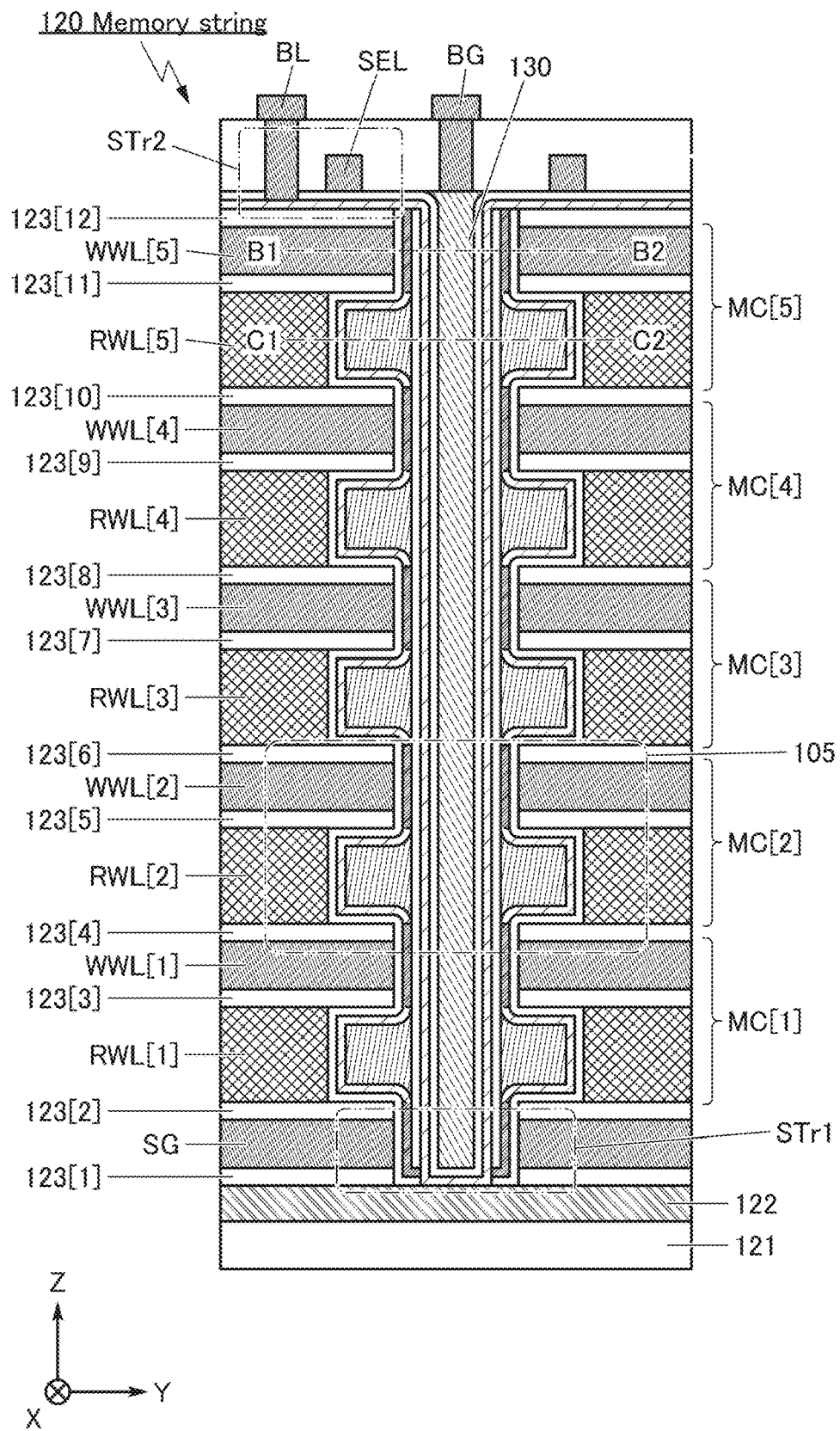
FIG. 3 is a cross-sectional view of a memory string.

FIG. 3 illustrates a cross-sectional structure example of the memory string 120 of one embodiment of the present invention. The memory string 120 has a structure in which a plurality of memory elements MC (also referred to as "memory cells") are connected in series. Although a case where five memory elements MC are connected in series is described in this embodiment, the number of memory elements MC provided in the memory string 120 is not limited to five. Given that the number of memory elements MC provided in the memory string 120 is n, n is an integer of 2 or more.

Furthermore, the memory string 120 includes a plurality of conductors WWL, a plurality of conductors RWL, and a conductor SG. In the memory cell array 110, the conductors WWL, the conductors RWL, and the conductor SG extend in the X direction. The plurality of the conductors WWL and the plurality of conductors RWL are alternately stacked with insulators 123 therebetween. The conductor SG is provided in a layer below the plurality of the conductors WWL and the plurality of conductors RWL.

FIG. 3 illustrates the five memory elements MC as a memory element MC[1] to a memory element MC[5]. When explaining a matter common to the memory element MC[1] to the memory element MC[5], the memory elements are simply referred to as "the memory element(s) MC." The same applies to the other components such as the conductors WWL, the conductors RWL, and the insulators 123.

The memory string 120 includes a transistor STr1 electrically connected to the memory element MC[1] and a transistor STr2 electrically connected to the memory element MC[5].

A gate of the transistor STr2 is electrically connected to a conductor SEL. The conductor SEL can function as the gate electrode of the transistor STr2. One of a source and a drain of the transistor STr2 is electrically connected to a conductor BL.

The conductors WWL, the conductors RWL, and the conductor SG include a region extending beyond the memory cell array 110. Furthermore, the conductors WWL, the conductors RWL, and the conductor SG are stacked stepwise outside the memory cell array 110 (see FIG. 1 and FIG. 2).

Figure 5A:
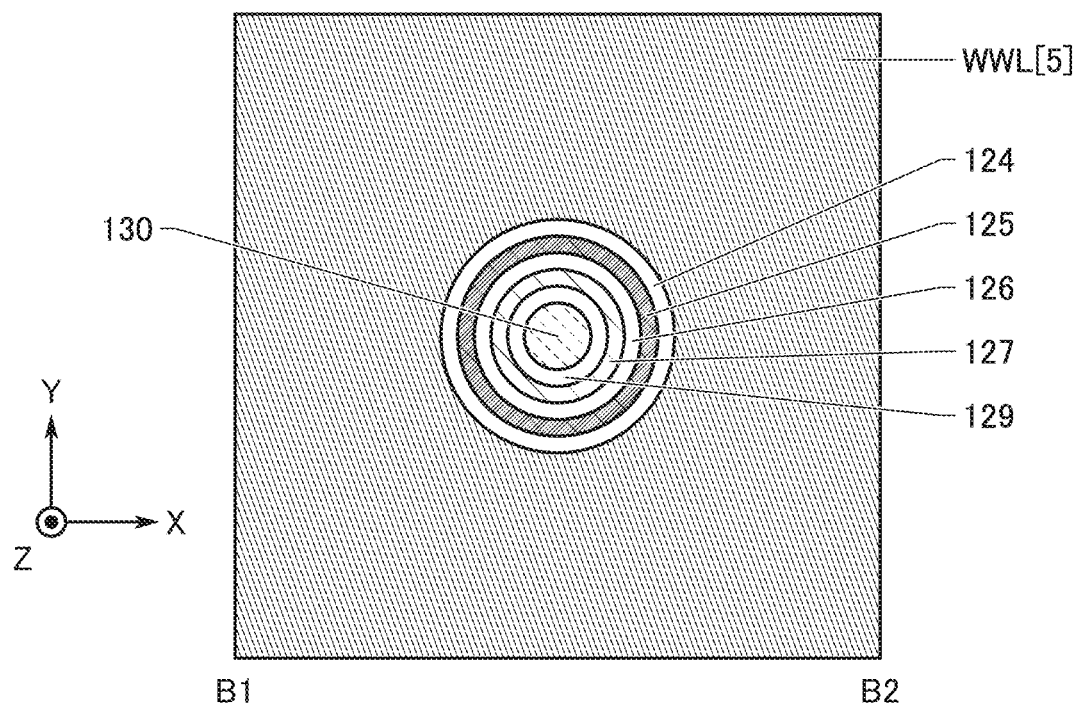
FIG. 5A and FIG. 5B are cross-sectional views of the memory string.
Figure 5B:
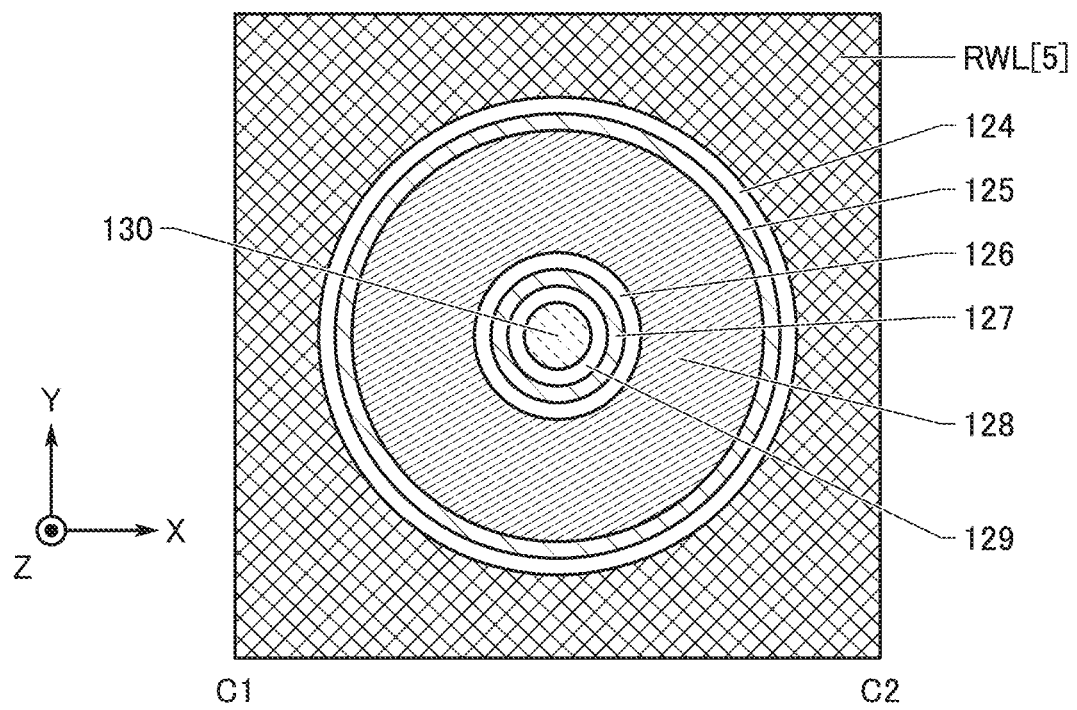
Figure 7A:
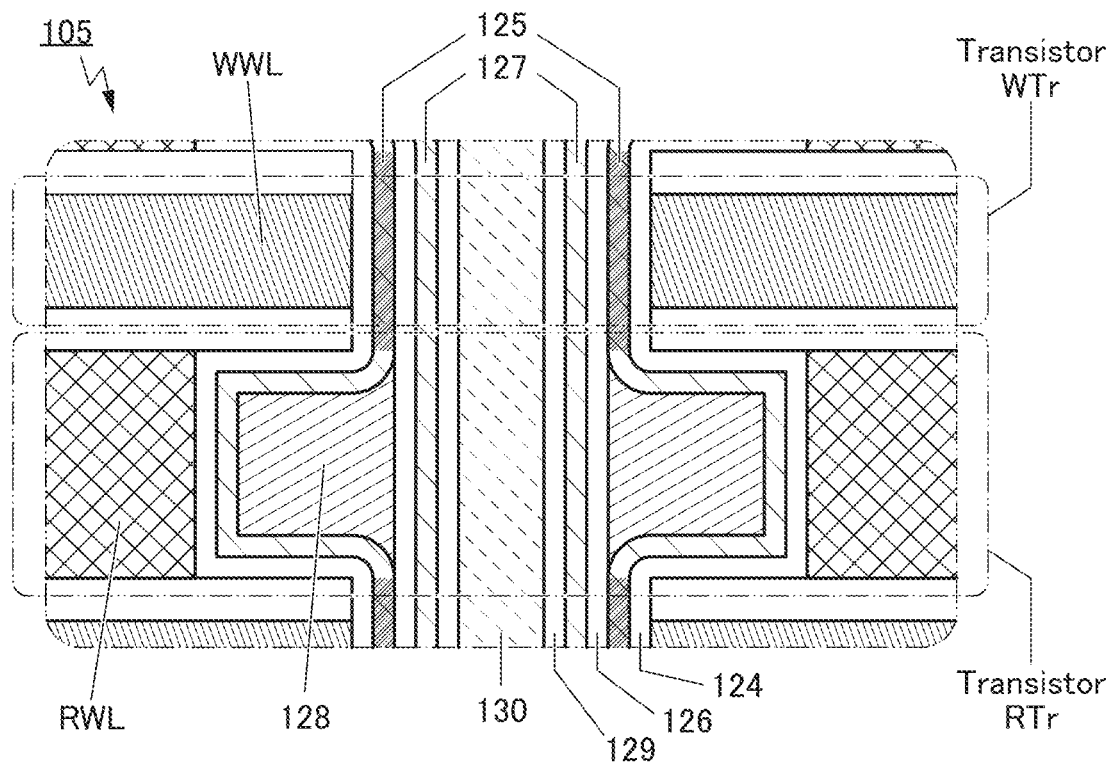
FIG. 7A is a cross-sectional view of a memory element.

FIG. 5A illustrates a cross section of a portion B1-B2 indicated by a dashed-dotted line in FIG. 3 when seen from the Z direction. FIG. 5B illustrates a cross section of a portion C1-C2 indicated by a dashed-dotted line in FIG. 3 when seen from the Z direction. FIG. 7A illustrates an enlarged diagram of a region 105 indicated by a dashed double-dotted line in FIG. 3. FIG. 7A corresponds to a cross-sectional view of the memory element MC.

The memory string 120 includes a conductor 122 over a substrate 121. As the substrate 121, an insulator may be used, for example. A substrate that will be described later may be used as the substrate 121. In addition, an insulator 123[1], the conductor SG, an insulator 123[2], a conductor RWL[1], an insulator 123[3], a conductor WWL[1], an insulator 123[4], a conductor RWL[2], an insulator 123[5], a conductor WWL[2], an insulator 123[6], a conductor RWL[3], an insulator 123[7], a conductor WWL[3], an insulator 123[8], a conductor RWL[4], an insulator 123[9], a conductor WWL[4], an insulator 123[10], a conductor RWL[5], an insulator 123[11], a conductor WWL[5], and an insulator 123[12] are included over the conductor 122 (see FIG. 3).

Figure 4:
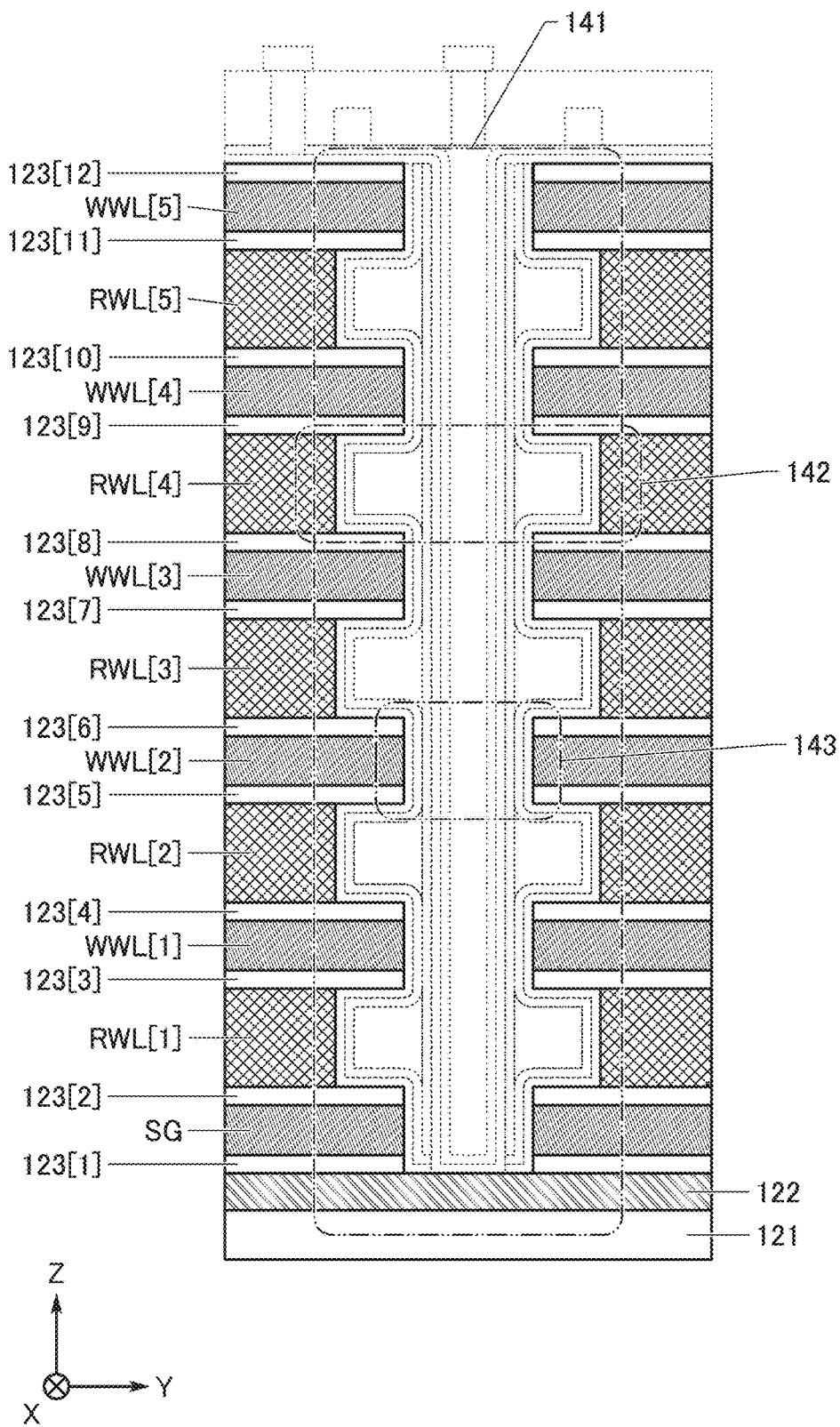
FIG. 4 is a cross-sectional view of the memory string.

Furthermore, the memory string 120 includes an opening 141 which is formed by removing part of each of the insulator 123[1], the conductor SG, the insulator 123[2], the conductor RWL[1], the insulator 123[3], the conductor WWL[1], the insulator 123[4], the conductor RWL[2], the insulator 123[5], the conductor WWL[2], the insulator 123[6], the conductor RWL[3], the insulator 123[7], the conductor WWL[3], the insulator 123[8], the conductor RWL[4], the insulator 123[9], the conductor WWL[4], the insulator 123[10], the conductor RWL[5], the insulator 123[11], the conductor WWL[5], and the insulator 123[12] (see FIG. 4). For easy recognition of the opening 141, some components are indicated by broken lines in FIG. 4.

The opening 141 extends in the Z direction and reaches the conductor 122. In the opening 141, the diameter of a region 142 overlapping with the conductor RWL is larger than the diameter of a region 143 overlapping with the conductor WWL. Thus, a side surface of the opening 141 has projections and depressions.

An insulator 124 and a semiconductor 125 are provided along the side surface of the opening 141 (see FIG. 3, FIG. 5A, and FIG. 5B). The semiconductor 125 includes a region overlapping with the side surface of the opening 141 with the insulator 124 therebetween.

Furthermore, the memory string 120 includes a conductor 130 extending in the Z direction. The conductor 130 is electrically connected to a conductor BG. The conductor 130 is provided in or in the vicinity of the center of the opening 141. A region of the conductor 130 overlapping with the side surface of the opening 141 is provided with an insulator 129, a semiconductor 127, and an insulator 126. The semiconductor 127 includes a region overlapping with a side surface of the conductor 130 with the insulator 129 therebetween. The insulator 126 includes a region overlapping with the side surface of the conductor 130 with the insulator 129 and the semiconductor 127 therebetween. The semiconductor 127 includes a region electrically connected to the conductor 122 in a bottom portion of the opening 141. The semiconductor 125 is electrically connected to the conductor 122 through the semiconductor 127. In the bottom portion of the opening 141, the conductor 130 includes a region overlapping with the conductor 122 with the insulator 129 and the semiconductor 127 therebetween. In a region where the conductor 130 and the conductor RWL overlap with each other, a conductor 128 is provided between the semiconductor 125 and the insulator 126.

The insulator 124, the semiconductor 125, the insulator 126, the semiconductor 127, and the insulator 129 are provided in this order from the conductor WWL side between the conductor WWL and the conductor 130 (see FIG. 5A). Between the conductor RWL and the conductor 130, the insulator 124, the semiconductor 125, the conductor 128, the insulator 126, the semiconductor 127, and the insulator 129 are provided in this order from the conductor RWL side (see FIG. 5B).

Figure 6A:
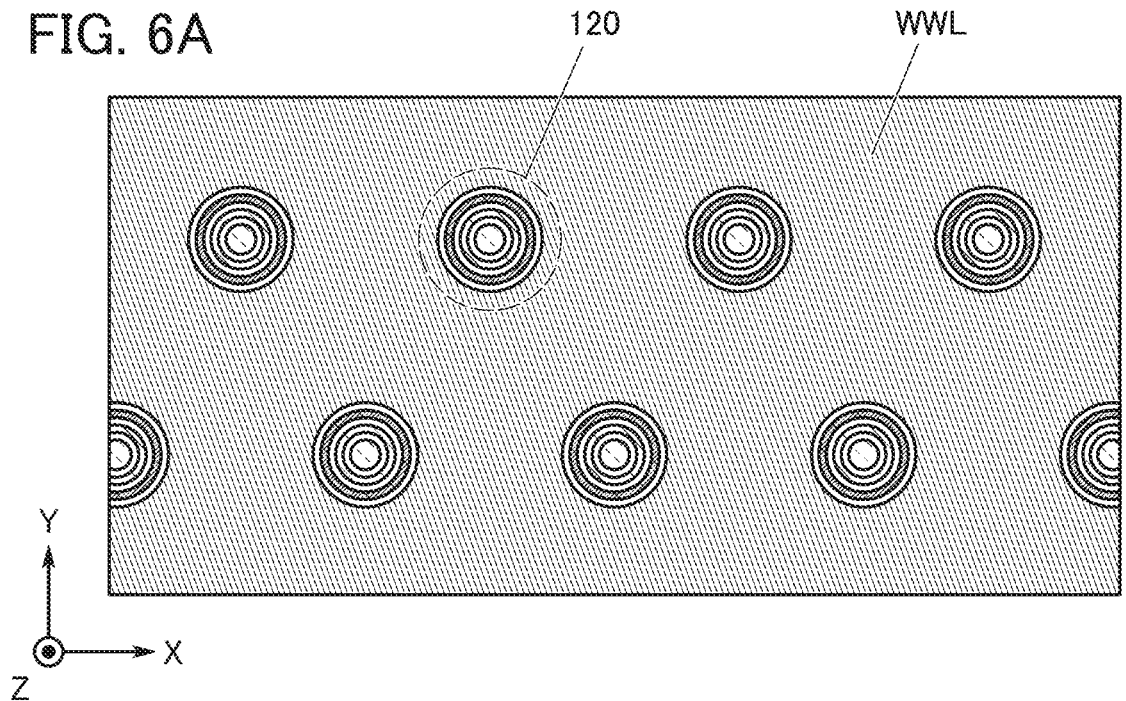
FIG. 6A and FIG. 6B are cross-sectional views of memory strings.
Figure 6B:
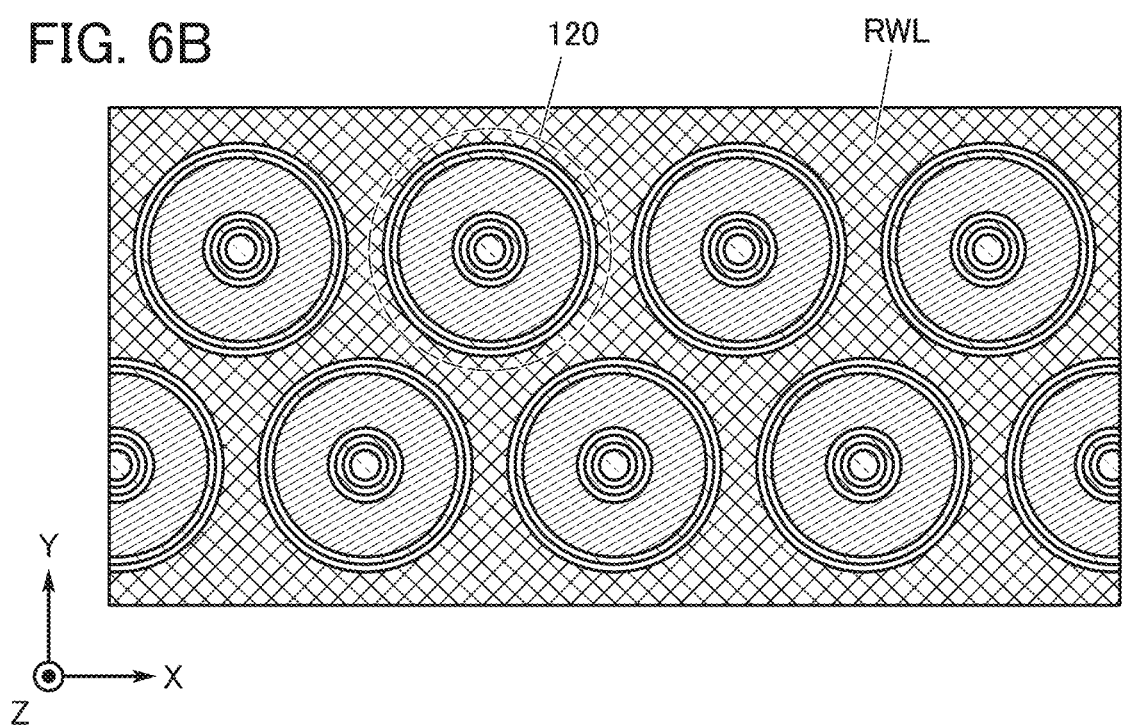

FIG. 5A and FIG. 5B illustrate cross sections (X-Y cross sections) of one memory string 120, while FIG. 6A and FIG. 6B illustrate an example where the plurality of memory strings 120 are provided. The plurality of memory strings 120 may be arranged in the X-axis direction, in the Y-axis direction, or in a matrix.

The memory element MC includes a transistor WTr and a transistor RTr (see FIG. 7A). A region where the conductor WWL and the conductor 130 overlap with each other functions as the transistor WTr. In other words, an intersection portion of the conductor WWL and the conductor 130 functions as the transistor WTr. In the intersection portion of the conductor WWL and the conductor 130, the insulator 129 is adjacent to the conductor 130, and the semiconductor 127 is adjacent to the insulator 129. In addition, the insulator 126 is adjacent to the semiconductor 127, and the semiconductor 125 is adjacent to the insulator 126. Moreover, the insulator 124 is adjacent to the semiconductor 125.

The conductor WWL functions as a gate electrode of the transistor WTr, and the conductor 130 functions as a back gate electrode of the transistor WTr. Part of the semiconductor 125 functions as a semiconductor layer where a channel of the transistor WTr is formed. The semiconductor layer where the channel of the transistor WTr is formed overlaps with the gate electrode (the conductor WWL) with part of the insulator 124 therebetween. Note that although part of the conductor WWL functions as the gate electrode in the example described in this embodiment and the like, the gate electrode and the conductor WWL may be provided independently and they may be electrically connected to each other.

A region where the conductor RWL and the conductor 130 overlap with each other functions as the transistor RTr. In other words, an intersection portion of the conductor RWL and the conductor 130 functions as the transistor RTr. In the intersection portion of the conductor RWL and the conductor 130, the conductor 128 is provided. Like the intersection portion of the conductor WWL and the conductor 130, the intersection portion of the conductor RWL and the conductor 130 also includes a region where the insulator 129, the semiconductor 127, the insulator 126, the semiconductor 125, and the insulator 124 overlap with each other in a direction perpendicular to the Z direction. Note that the intersection portion of the conductor RWL and the conductor 130 is different from the intersection portion of the conductor WWL and the conductor 130 in including the conductor 128 between the insulator 126 and the semiconductor 125.

The conductor RWL functions as a gate electrode of the transistor RTr. The conductor 130 functions as a back gate electrode of the transistor RTr. Part of the semiconductor 127 functions as a semiconductor layer where a channel of the transistor RTr is formed. The semiconductor layer where the channel of the transistor RTr is formed overlaps with the gate electrode (the conductor RWL) with part of each of the insulator 126, the conductor 128, the semiconductor 125, and the insulator 124 therebetween. The semiconductor layer where the channel of the transistor RTr is formed overlaps with the back gate electrode (the conductor 130) with part of the insulator 129 therebetween. Note that although part of the conductor RWL functions as the back gate electrode in the example described in this embodiment and the like, the back gate electrode and the conductor RWL may be provided independently and they may be electrically connected to each other.

One of a source and a drain of the transistor STr1 is electrically connected to the semiconductor 125 included in the transistor WTr and the semiconductor 127 included in the transistor RTr. The one of the source and the drain of the transistor STr2 is electrically connected to the semiconductor 125 included in the transistor WTr and the semiconductor 127 included in the transistor RTr.

Here, a back gate is described. A gate and a back gate are positioned so as to overlap with each other with a channel formation region of a semiconductor layer therebetween. The back gate can function like the gate. By changing the potential of the back gate, the threshold voltage of the transistor can be changed. One of the gate and the back gate is referred to as a "first gate" and the other is referred to as a "second gate," in some cases.

The gate and the back gate are formed using conductive layers, semiconductor layers with low resistivity, or the like and thus each have a function of preventing an electric field generated outside the transistor from influencing the semiconductor layer where a channel is formed (particularly, a function of preventing static electricity). That is, a variation in the electrical characteristics of the transistor due to the influence of an external electric field such as static electricity can be prevented.

Controlling the potential of the back gate can control the threshold voltage of the transistor. The potential of the back gate may be the same as the potential of the gate or may be a ground potential (GND potential) or a given potential.

For the semiconductor layers where the channels of the transistor WTr and the transistor RTr are formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used. The same applies to the transistor STr1 and the transistor STr2.

Note that semiconductor layers may be stacked in the transistors. In the case of stacking semiconductor layers, semiconductors having different crystal states may be used or different semiconductor materials may be used.

The semiconductor layers used for the transistor WTr, the transistor RTr, the transistor STr1, and the transistor STr2 are preferably oxide semiconductors including a metal oxide. A transistor that uses a metal oxide in its semiconductor layer achieves a higher field effect mobility than a transistor that uses amorphous silicon in its semiconductor layer. Furthermore, in a transistor that uses polycrystalline silicon in its semiconductor layer, a grain boundary might be generated in the semiconductor layer. It is highly probable that the grain boundary captures carriers and thus decreases the on-state current and field-effect mobility of the transistor, for example. In contrast, although the details are described later, an oxide semiconductor can achieve a crystal structure in which a clear grain boundary is not observed or a crystal structure in which the number of grain boundaries is extremely small. Using such an oxide semiconductor in a semiconductor layer is preferable to obtain a transistor with favorable electrical characteristics such as a high on-state current and a high field-effect mobility.

Moreover, an oxide semiconductor, particularly a CAAC-IGZO, which is a crystalline oxide semiconductor, has a characteristic structure where nanoclusters of several nanometers (e.g., 1 to 3 nm) with a c-axis alignment in a direction vertical to a surface on which the oxide semiconductor is deposited are connected to each other. Therefore, a crystal structure in which a clear grain boundary is not observed can be formed also in an opening extending in the Z direction.

In particular, the transistor WTr is preferably a transistor including an oxide semiconductor, which is a kind of metal oxide, in its semiconductor layer where a channel is formed (also referred to as an "OS transistor"). An oxide semiconductor has a band gap of 2 eV or more and thus has an extremely low off-state current. When an OS transistor is used as the transistor WTr, charge written to a node ND, which will be described later, can be retained for a long time. In the case where an OS transistor is used as the transistor included in the memory element MC, the memory element MC can be referred to as an "OS memory." In addition, the memory string 120 including the memory element MC can also be referred to as an "OS memory." Furthermore, the memory device 100 can also be referred to as an "OS memory."

The OS memory can retain data written thereto for a period of one year or longer, or even 10 years or longer after power supply is stopped. Thus, the OS memory can be regarded as a nonvolatile memory.

Since the amount of charge written to the OS memory hardly changes for a long period, multilevel (multi-bit) data as well as binary (1-bit) data can be retained in the OS memory.

Furthermore, an OS memory employs a method in which charge is written to a node through the transistor; hence, a high voltage, which a conventional flash memory requires, is unnecessary and a high-speed writing operation is possible. The OS memory does not require an erasing operation that is performed in a flash memory before data rewriting. Furthermore, the OS memory does not conduct charge injection and extraction to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level. Hence, the OS memory has higher write endurance than the magneto-resistive memory and the resistance-change memory.

The off-state current of the OS transistor hardly increases even in a high-temperature environment. Specifically, the off-state current hardly increases even at an environment temperature of from room temperature to 200° C. In addition, the on-state current of the OS transistor is unlikely to decrease even in a high-temperature environment. A memory device including the OS memory achieves a stable operation and high reliability even in a high-temperature environment. Furthermore, the withstand voltage between the source and the drain of the OS transistor is high. When OS transistors are used as transistors included in a semiconductor device, the semiconductor device achieves a stable operation and high reliability even in a high-temperature environment.

The semiconductor 127 is preferably an n-type semiconductor. A region overlapping with the conductor WWL of the semiconductor 125 is preferably an i-type or substantially i-type semiconductor. In this case, the transistor WTr is an enhancement (normally-off) transistor, and the transistor RTr is a depletion (normally-on) transistor.

Note that the semiconductor 125 and the semiconductor 127 may include the same material or different materials. For example, the semiconductor 125 and the semiconductor 127 may each be an oxide semiconductor. The semiconductor 125 and the semiconductor 127 may each be a semiconductor including silicon. The semiconductor 125 may be an oxide semiconductor, and the semiconductor 127 may be a semiconductor including silicon. The semiconductor 125 may be a semiconductor including silicon, and the semiconductor 127 may be an oxide semiconductor.

Figure 7B:
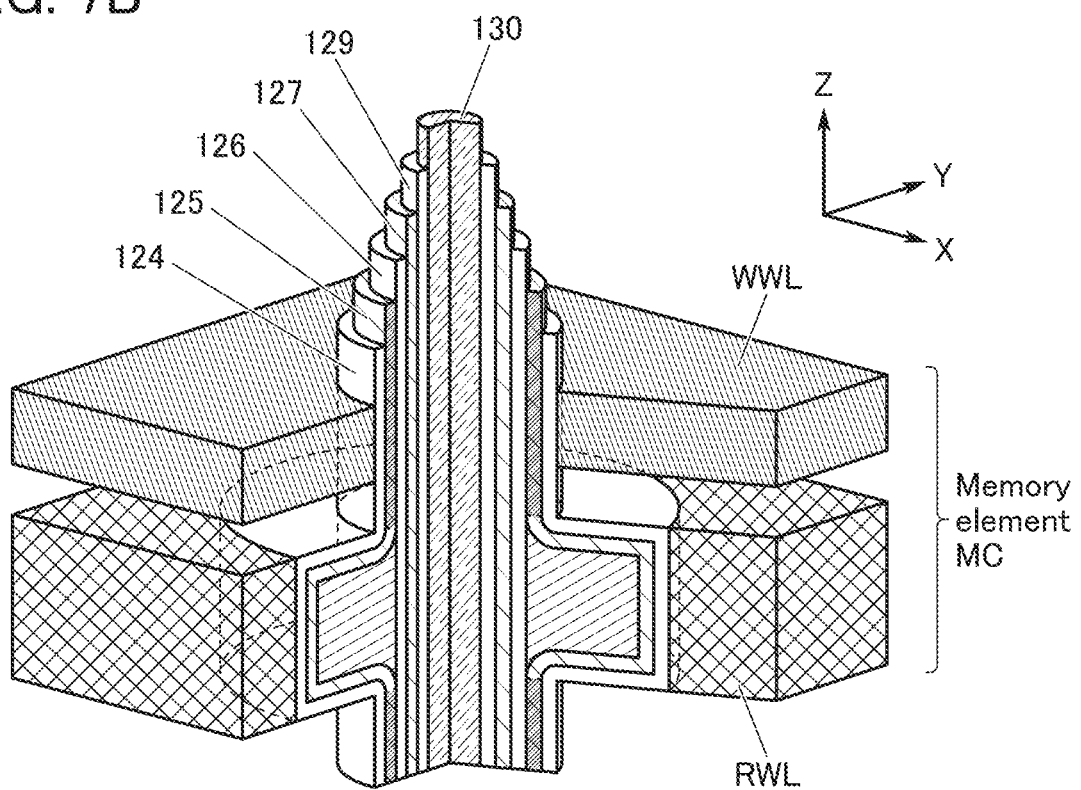
FIG. 7B is a cross-sectional perspective view of the memory element.

FIG. 7B is a perspective cross-sectional view of the memory element MC. For easy understanding of the structure of the memory element MC, the insulator 123 is not illustrated in FIG. 7B.

Note that FIG. 5A corresponds to the X-Y plane of the center of the transistor WTr or the vicinity of the center, and FIG. 5B corresponds to the X-Y plane of the center of the transistor RTr or the vicinity of the center. In the case where the cross-sectional shape of the conductor 130 is a circular shape in FIG. 5A and FIG. 5B, the insulator 129 is concentrically provided outside the conductor 130, the semiconductor 127 is concentrically provided outside the insulator 129, the insulator 126 is concentrically provided outside the semiconductor 127, the semiconductor 125 is concentrically provided outside the insulator 126, and the insulator 124 is concentrically provided outside the semiconductor 125. Furthermore, the conductor 128 is concentrically provided between the insulator 126 and the semiconductor 125.

Figure 8A:
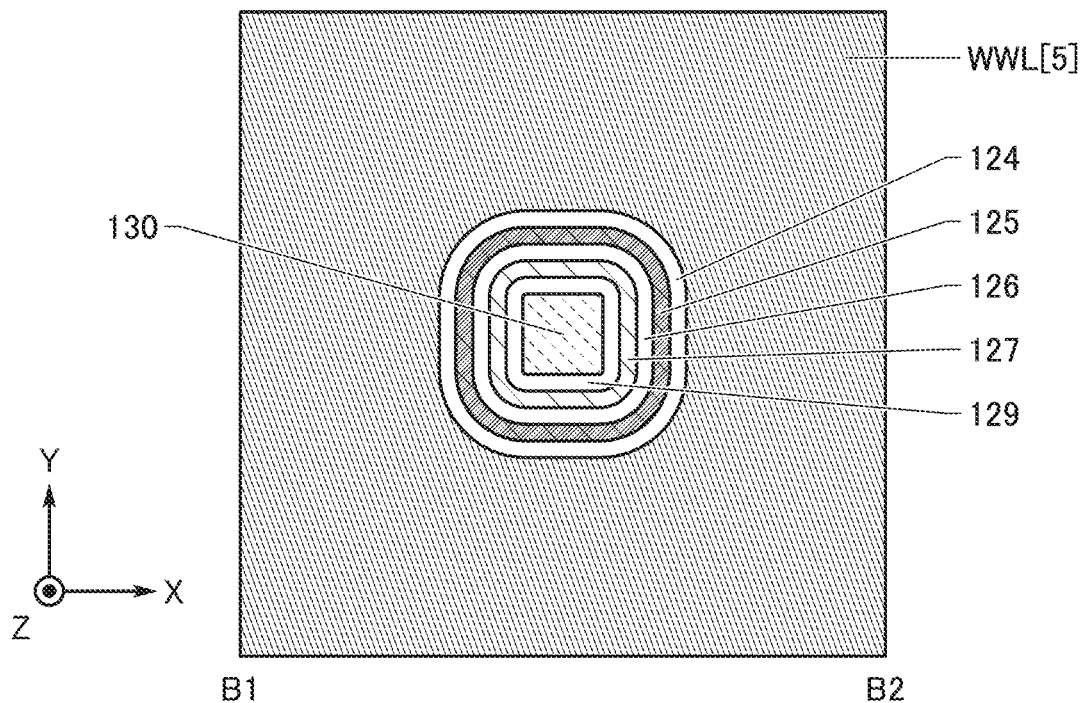
FIG. 8A and FIG. 8B are cross-sectional views of memory strings.
Figure 8B:
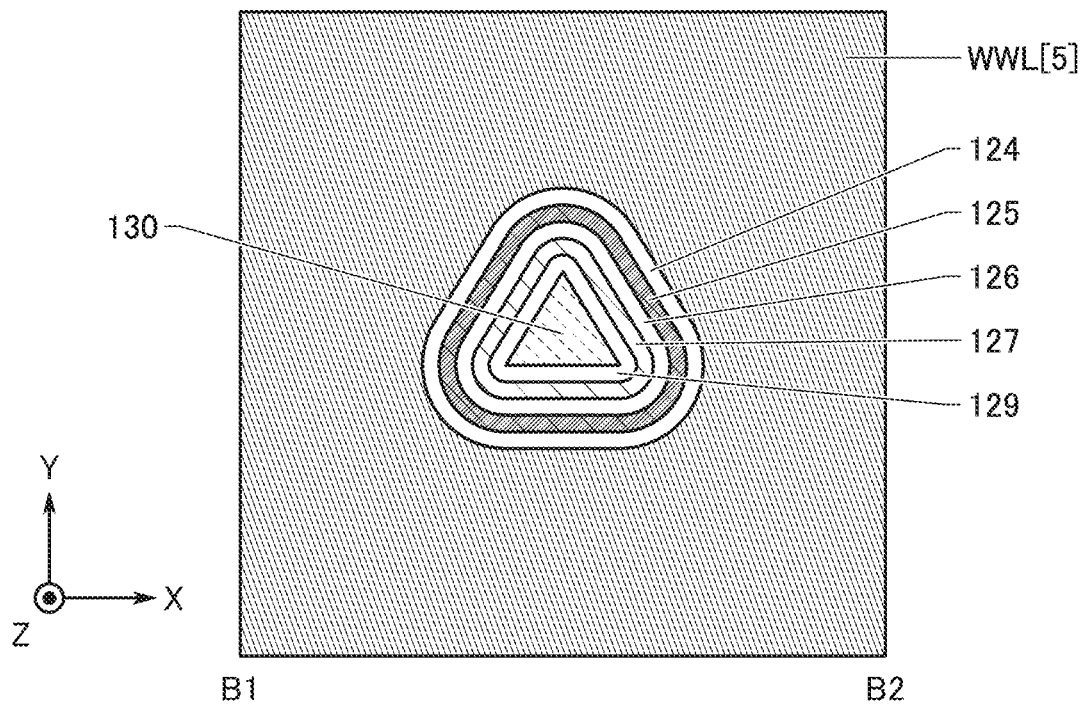

The cross-sectional shape of the conductor 130 is not limited to a circular shape. As illustrated in FIG. 8A, the cross-sectional shape of the conductor 130 may be a rectangular shape. Alternatively, as illustrated in FIG. 8B, the cross-sectional shape of the conductor 130 may be a triangular shape. Note that FIG. 8A and FIG. 8B correspond to cross sections of the portion B1-B2 indicated by the dashed-dotted line in FIG. 3 when seen from the Z direction.

Furthermore, dividing the memory strings 120 along the Z-axis direction is preferable to increase the number of memory cells provided in the opening 141. In the case of dividing the memory strings 120 along the Z-axis direction, the conductors WWL and the conductors RWL may also be divided.

Figure 9A:
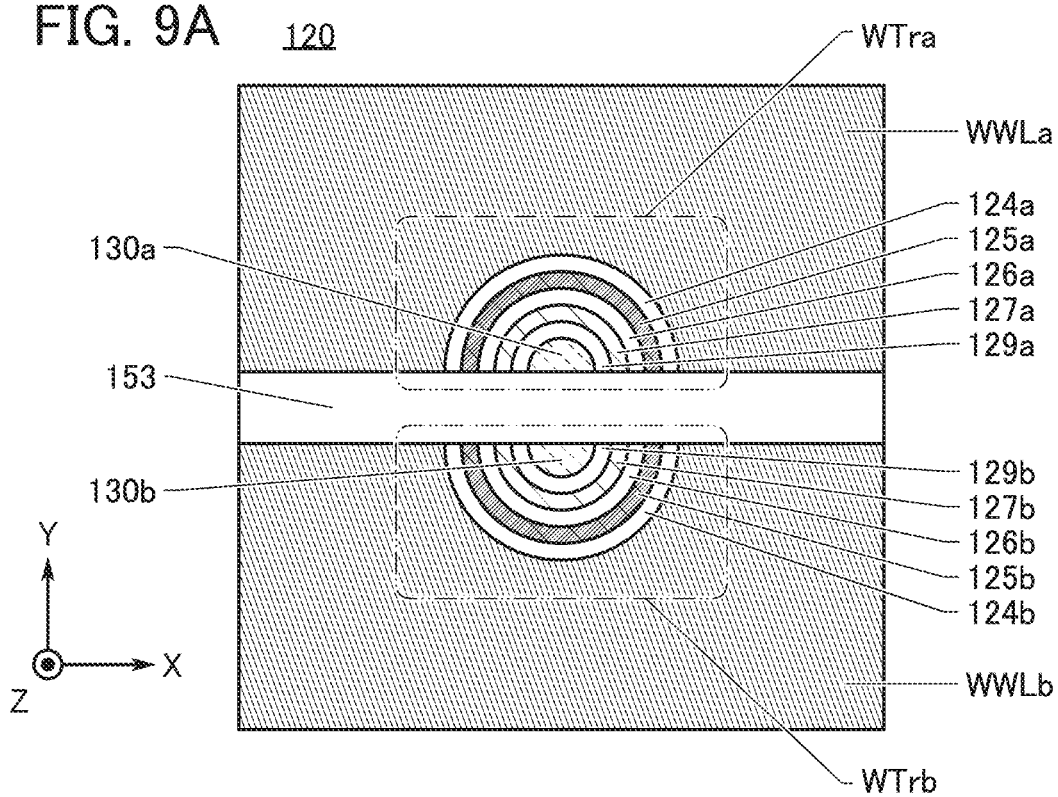
FIG. 9A and FIG. 9B are cross-sectional views of a memory string.
Figure 9B:
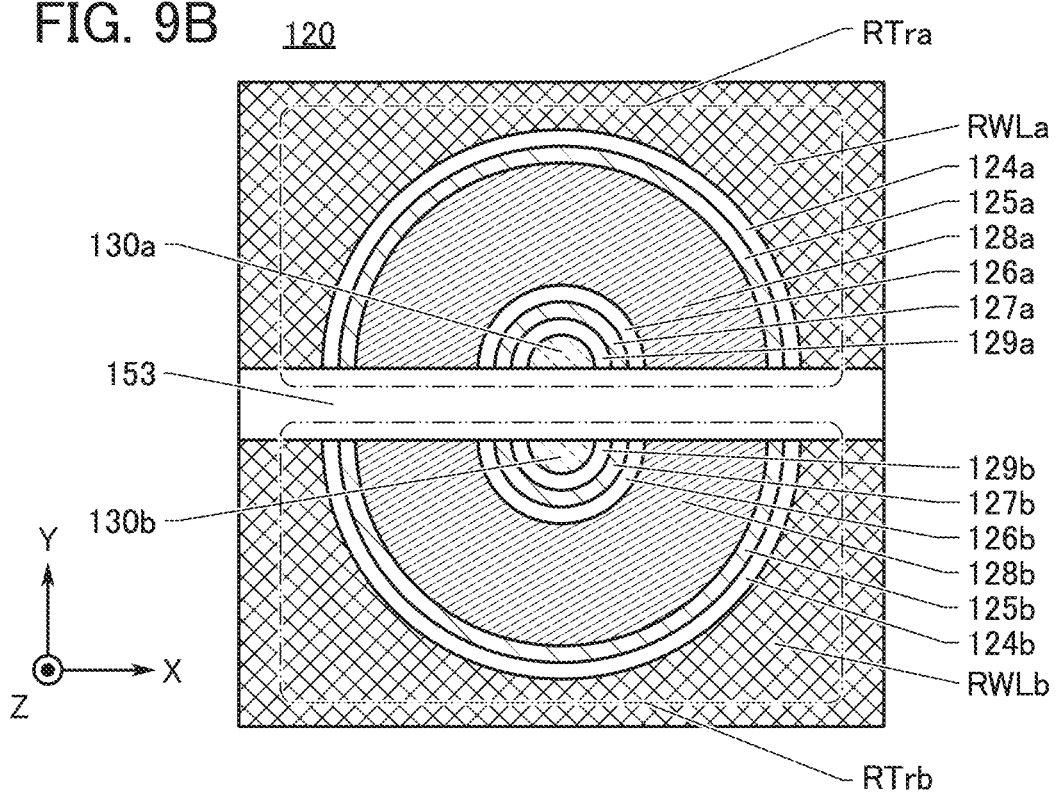

FIG. 9A illustrates a state where the conductor WWL and the memory string 120 are divided by an insulator 153 provided along the X-Z plane, and FIG. 9B illustrates a state where the conductor RWL and the memory string 120 are divided by the insulator 153 provided along the X-Z plane. In FIG. 9 and the like, divided components are denoted with a or b added to the end of the reference numerals.

As illustrated in FIG. 9A, a region where a conductor WWLa and a conductor 130a overlap with each other functions as a transistor WTra. The transistor WTra includes the conductor WWLa, an insulator 124a, a semiconductor 125a, an insulator 126a, a semiconductor 127a, an insulator 129a, and the conductor 130a. The conductor WWLa functions as a gate electrode of the transistor WTra, and the conductor 130a functions as a back gate electrode of the transistor WTra. Part of the semiconductor 125a functions as a semiconductor layer where a channel of the transistor WTra is formed. The semiconductor layer where the channel of the transistor WTra is formed overlaps with the gate electrode (the conductor WWLa) with part of the insulator 124a therebetween.

A region where a conductor WWLb and a conductor 130b overlap with each other functions as a transistor WTrb. The transistor WTrb includes the conductor WWLb, an insulator 124b, a semiconductor 125b, an insulator 126b, a semiconductor 127b, an insulator 129b, and the conductor 130b. The conductor WWLb functions as a gate electrode of the transistor WTrb, and the conductor 130b functions as a back gate electrode of the transistor WTrb. Part of the semiconductor 125b functions as a semiconductor layer where a channel of the transistor WTrb is formed. The semiconductor layer where the channel of the transistor WTrb is formed overlaps with the gate electrode (the conductor WWLb) with part of the insulator 124b therebetween.

As illustrated in FIG. 9B, a region where a conductor 128a, a conductor RWLa, and the conductor 130a overlap with each other functions as a transistor RTra. The transistor RTra includes RWLa, the insulator 124a, the semiconductor 125a, the conductor 128a, the insulator 126a, the semiconductor 127a, the insulator 129a, and the conductor 130a. The conductor RWLa functions as a gate electrode of the transistor RTra. The conductor 130a functions as a back gate electrode of the transistor RTra. Part of the semiconductor 127a functions as a semiconductor layer where a channel of the transistor RTra is formed. The semiconductor layer where the channel of the transistor RTra is formed overlaps with the gate electrode (the conductor RWLa) with part of each of the insulator 126a, the conductor 128a, the semiconductor 125a, and the insulator 124a therebetween. The semiconductor layer where the channel of the transistor RTra is formed overlaps with the back gate electrode (the conductor 130a) with part of the insulator 129a therebetween.

A region where a conductor 128b, a conductor RWLb, and the conductor 130b overlap with each other functions as a transistor RTrb. The transistor RTrb includes RWLb, the insulator 124b, the semiconductor 125b, the conductor 128b, the insulator 126b, the semiconductor 127b, the insulator 129b, and the conductor 130b. The conductor RWLb functions as a gate electrode of the transistor RTrb. The conductor 130b functions as a back gate electrode of the transistor RTrb. Part of the semiconductor 127b functions as a semiconductor layer where a channel of the transistor RTrb is formed. The semiconductor layer where the channel of the transistor RTrb is formed overlaps with the gate electrode (the conductor RWLb) with part of each of the insulator 126b, the conductor 128b, the semiconductor 125b, and the insulator 124b therebetween. The semiconductor layer where the channel of the transistor RTrb is formed overlaps with the back gate electrode (the conductor 130b) with part of the insulator 129b therebetween.

Figure 10A:
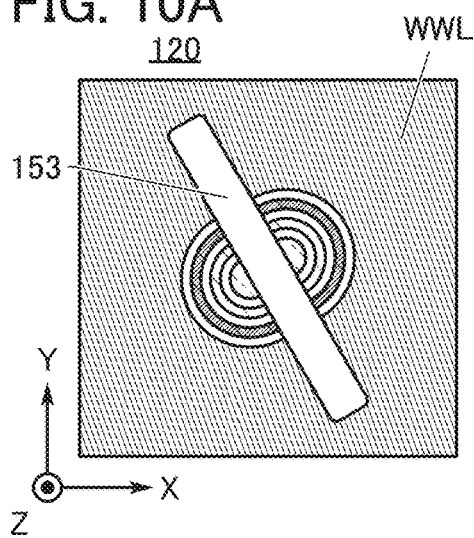
FIG. 10A to FIG. 10F are cross-sectional views of memory strings.
Figure 10B:
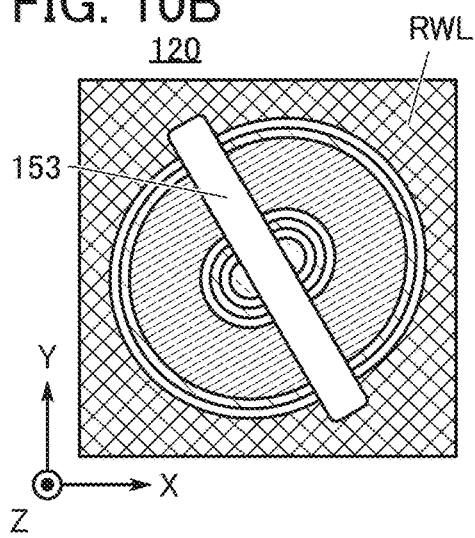
Figure 10C:
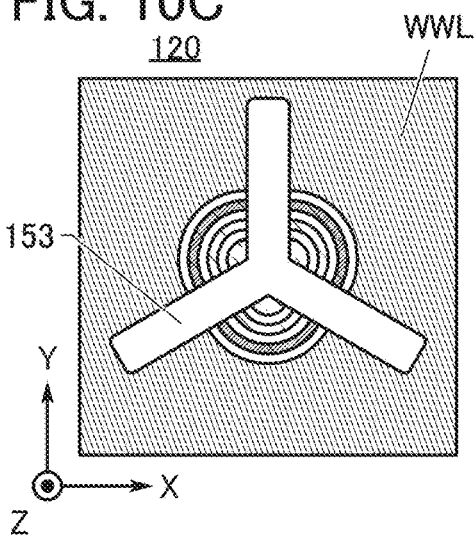
Figure 10D:
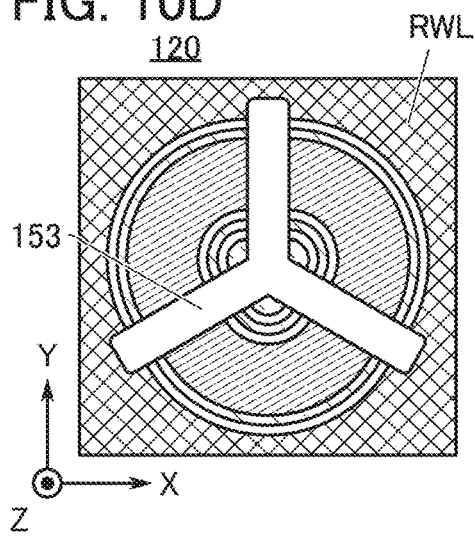
Figure 10E:
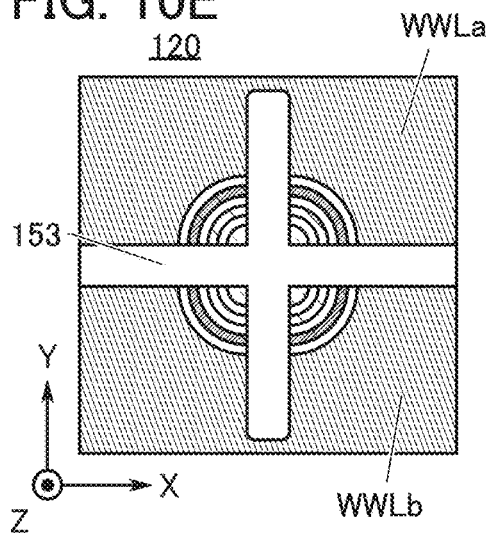
Figure 10F:
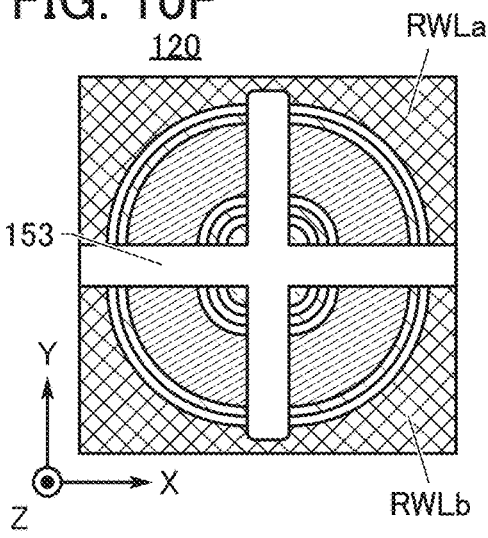

Dividing the conductor WWL, the conductor RWL, and the memory string 120 in the above-described manner can double the number of memory cells provided in the opening 141. Note that the method for dividing the memory string 120 is not limited to the one described above. Although the memory string 120 is divided by the insulator 153 extending in the X-axis direction in FIG. 9A and FIG. 9B, the insulator 153 may extend in a direction different from the X-axis direction as illustrated in FIG. 10A and FIG. 10B. Furthermore, as illustrated in FIG. 10B, the memory string 120 may be divided into three or more parts. FIG. 10C and FIG. 10D illustrate an example where the memory string 120 is divided into three parts, and FIG. 10E and FIG. 10F illustrate an example where the memory string 120 is divided into four parts; in these cases, the number of memory cells provided in the opening 141 can be triplicated or quadruplicated, respectively.

In FIG. 10A to FIG. 10F, the insulator 153 is preferably provided so as not to inhibit the conduction of the conductor WWL and the conductor RWL in the X-axis direction.

Note that the memory string 120 can also be referred to as a memory device, and the memory element MC can also be referred to as a memory device.

[Constituent Materials for Semiconductor Device]

Next, constituent materials that can be used for the memory device 100 are described.

[Substrate]

The memory device 100 can be provided over a substrate. As the substrate, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a memory element.

[Insulator]

Examples of the insulator include an oxide, a nitride, an oxynitride, a nitride oxide, a metal oxide, a metal oxynitride, and a metal nitride oxide, each of which has an insulating property.

Note that in this specification and the like, "oxynitride" refers to a material that contains more oxygen than nitrogen. For example, "silicon oxynitride" refers to a silicon material that contains more oxygen than nitrogen. Moreover, in this specification and the like, "nitride oxide" refers to a material that contains more nitrogen than oxygen, and "aluminum nitride oxide" refers to an aluminum material that contains more nitrogen than oxygen.

As miniaturization and high integration of transistors progress, for example, a problem such as a leakage current may arise because of a thinner gate insulator. When a high-k material is used for the insulator functioning as a gate insulator, the voltage during the operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

In the case where an oxide semiconductor is used as the semiconductor 125 and/or the semiconductor 127, the insulator functioning as a gate insulator preferably includes a region containing oxygen that is released by heating. For example, when a structure is employed in which silicon oxide or silicon oxynitride including a region containing oxygen that is released by heating is in contact with the semiconductor 125 and/or the semiconductor 127, oxygen vacancies included in the semiconductor 125 and/or the semiconductor 127 can be compensated for.

[Conductor]

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

In the case where an oxide semiconductor, which is a kind of metal oxide, is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in the oxide semiconductor where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the oxide semiconductor where the channel is formed can be captured in some cases. Alternatively, hydrogen entering from an external insulator or the like can be captured in some cases.

[Oxide Semiconductor]

The semiconductor 125 and the semiconductor 127 are preferably formed using a metal oxide functioning as a semiconductor (an oxide semiconductor). An oxide semiconductor that can be used for the semiconductor 125 and the semiconductor 127 is described below.

The oxide semiconductor preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In—M—Zn oxide that contains indium, the element M, and zinc is considered. Note that the element M represents one or more elements selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Classification of Crystal Structure]

First, the classification of the crystal structures of an oxide semiconductor will be described with reference to FIG. 11A. FIG. 11A is a diagram showing the classification of crystal structures of an oxide semiconductor, typically IGZO (a metal oxide containing In, Ga, and Zn).

As shown in FIG. 11A, an oxide semiconductor is roughly classified into "Amorphous," "Crystalline," and "Crystal." The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 11A are in an intermediate state between "Amorphous" and "Crystal," and belong to a new crystalline phase. That is, these structures are completely different from "Amorphous," which is energetically unstable, and "Crystal."

A crystal structure of a film or a substrate can be evaluated with an X-ray diffraction (XRD) spectrum. FIG. 11B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 11B and obtained by GIXD measurement is hereinafter simply referred to as an XRD spectrum. The CAAC-IGZO film in FIG. 11B has a composition in the vicinity of In:Ga:Zn=4:2:3 [atomic ratio]. The CAAC-IGZO film in FIG. 11B has a thickness of 500 nm.

As shown in FIG. 11B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 11B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 11C shows a diffraction pattern of the CAAC-IGZO film. FIG. 11C shows a diffraction pattern obtained with the NBED method in which an electron beam is incident in the direction parallel to the substrate. The composition of the CAAC-IGZO film in FIG. 11C is In:Ga:Zn=4:2:3 [atomic ratio] or the neighborhood thereof. In the nanobeam electron diffraction method, electron diffraction is performed with a probe diameter of 1 nm.

As shown in FIG. 11C, a plurality of spots indicating c-axis alignment are observed in the diffraction pattern of the CAAC-IGZO film.

[Structure of Oxide Semiconductor]

Oxide semiconductors might be classified in a manner different from that in FIG. 11A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface on which the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—M—Zn oxide, the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using 1912θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

[Structure of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be achieved.

Furthermore, an oxide semiconductor with a low carrier concentration is preferably used for a channel formation region of the transistor. For example, the carrier concentration of the channel formation region of the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{3}$, yet still further preferably lower than $1\times10^{12}$ cm$^{3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in a film provided in proximity be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1 \times 10^{20}$ atoms/cm$^3$, preferably lower than $5 \times 10^{19}$ atoms/cm$^3$, further preferably lower than $1 \times 10^{19}$ atoms/cm$^3$, still further preferably lower than $5 \times 10^{18}$ atoms/cm$^3$, further preferably lower than $1 \times 10^{18}$ atoms/cm$^3$.

When an oxide semiconductor with sufficiently reduced impurities is used for the channel formation region of the transistor, stable electrical characteristics can be given.

[Other semiconductor materials]

Semiconductor materials that can be used for the semiconductor 125 and the semiconductor 127 are not limited to the above-described oxide semiconductors. A semiconductor material having a bandgap (a semiconductor material that is not a zero-gap semiconductor) may be used for the semiconductor 125 and the semiconductor 127. For example, a single element semiconductor such as silicon, a compound semiconductor such as gallium arsenide, or a layered material (also referred to as an atomic layered material or a two-dimensional material) may be used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the semiconductor 125 and the semiconductor 127, a transition metal chalcogenide functioning as a semiconductor is preferably used, for example. Specific examples of the transition metal chalcogenide which can be used for the semiconductor 125 and the semiconductor 127 include molybdenum sulfide (typically MoS$_2$), molybdenum selenide (typically MoSe$_2$), molybdenum telluride (typically MoTe$_2$), tungsten sulfide (WS$_2$), tungsten selenide (typically WSe$_2$), tungsten telluride (typically WTe$_2$), hafnium sulfide (HfS$_2$), hafnium selenide (HfSe$_2$), zirconium sulfide (ZrS$_2$), and zirconium selenide (ZrSe$_2$).

<Example of Method for Manufacturing Memory Device>

Next, an example of a method for manufacturing the memory device according to the present invention will be described with reference to FIG. 12A to FIG. 26C. Note that in FIG. 12A to FIG. 26C, A is a top view seen from the Z direction and B is a cross-sectional view of a portion indicated by a dashed-dotted line A1-A2 in A. Furthermore, in FIG. 12A to FIG. 26C, C is a cross-sectional view of a portion indicated by a dashed-dotted line A3-A4 in A. FIG. 17D is an enlarged cross-sectional view of a portion surrounded by a dashed-dotted line in FIG. 17B. Although an example of manufacturing one memory string 120 including two (two stages of) memory elements MC is described in this manufacturing method, this embodiment is not limited to the example. The memory string 120 may include three or more stages of memory elements MC. For example, the memory string 120 preferably includes 32 or more, preferably 64 or more, further preferably 128 or more, still further preferably 256 or more stages of memory elements MC.

Figure 12A:
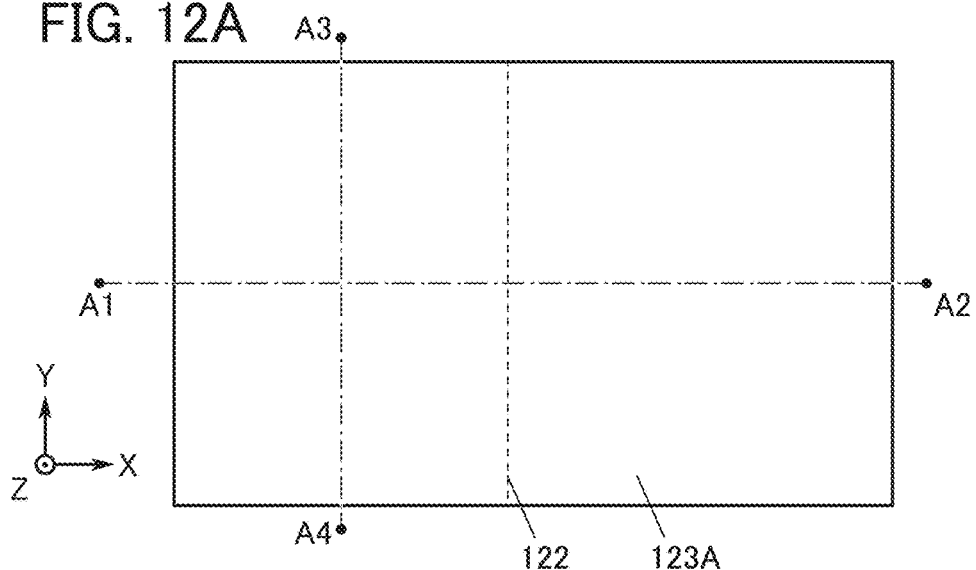
FIG. 12A to FIG. 12C are cross-sectional views illustrating a process for manufacturing a semiconductor device of one embodiment of the present invention.
Figure 12B:
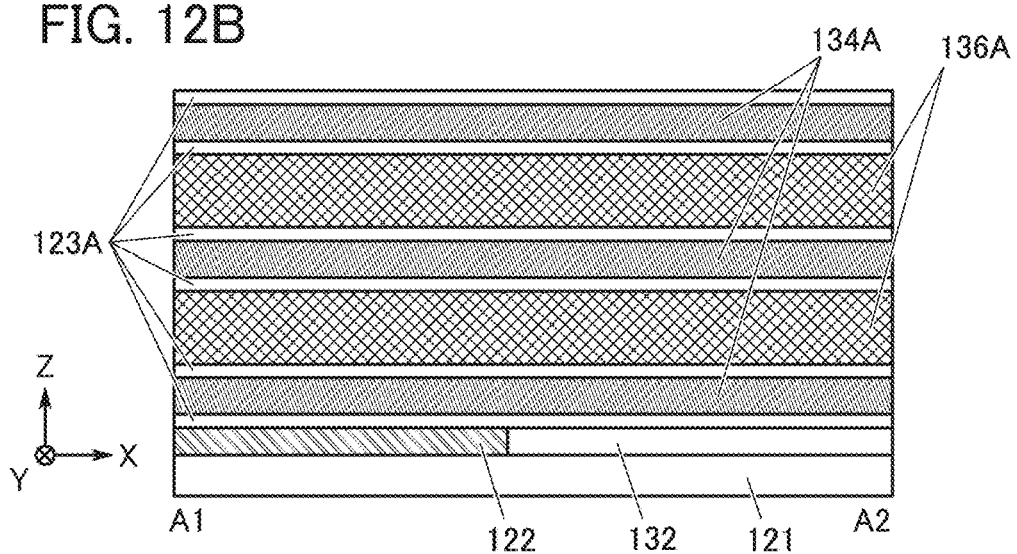
Figure 12C:
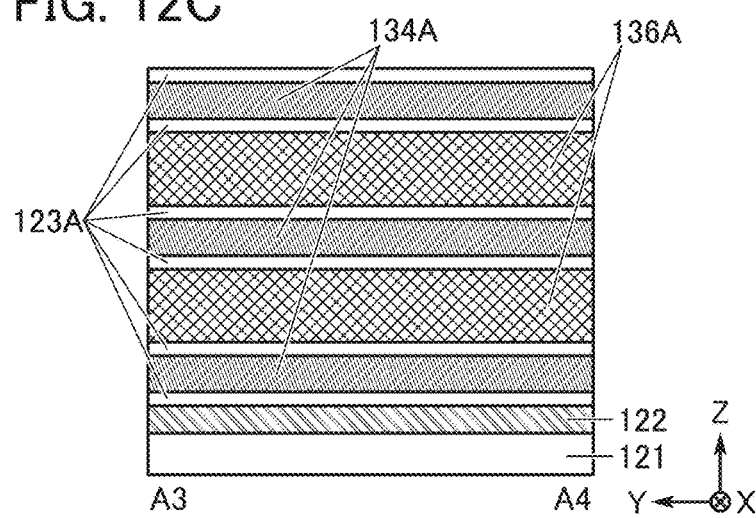

First, the conductor 122 is formed over the substrate 121 having an insulating surface, and an insulator 132 is formed around the conductor 122 (see FIG. 12A to FIG. 12C).

Specifically, a conductive film is formed and processed by a lithography technique, whereby the conductor 122 is formed. Then, an insulating film is formed over the substrate 121 so as to cover the conductor 122. Next, the insulating film is preferably subjected to planarization treatment. In the planarization treatment, the insulating film is preferably polished until a surface of the conductor 122 is exposed. By the above-described method, the insulator 132 can be formed. Note that the method for forming the conductor 122 and the insulator 132 is not limited to this method. The insulator 132 may be formed over the substrate 121 and an unnecessary portion of the insulator 132 may be removed to form a groove or an opening, and the conductor 122 may be embedded in the groove or the opening portion. Such a formation method of a conductor is referred to as a damascene method (a single damascene method or a dual damascene method) in some cases. By the above-described method, structures of the conductor 122 and the insulator 132 illustrated in FIG. 12A to FIG. 12C can be obtained.

The conductor 122 and the insulator 132 can be formed by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

Using a plasma CVD method, a high-quality film can be obtained at a relatively low temperature. A thermal CVD method is a deposition method that does not use plasma and thus enables less plasma damage to a processed object. For example, a wiring, an electrode, an element (a transistor, a capacitor element, or the like), or the like included in a semiconductor device might be charged up by receiving charge from plasma. In that case, accumulated charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that enables less plasma damage to a processed object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of a processed object. Thus, a CVD method and an ALD method are deposition methods that enable favorable step coverage almost regardless of the shape of a processed object. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the use of the flow rate ratio of the source gases. For example, using a CVD method and an ALD method, a film with a certain composition can be formed depending on the flow rate ratio of the source gases. Moreover, for example, by a CVD method and an ALD method, a film whose composition is continuously changed can be formed by changing the flow rate ratio of the source gases during the deposition. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

Note that in the lithography technique, first, a resist is exposed to light through a photomask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a photomask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

For the processing, a dry etching method or a wet etching method can be employed. Processing using a dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

In the case where a hard mask is used for etching of the conductive film, the etching treatment may be performed after the resist mask used for formation of the hard mask is removed or with the resist mask left. In the latter case, the resist mask sometimes disappears during the etching. The hard mask may be removed by etching after the etching of the conductive film. Meanwhile, the hard mask is not necessarily removed when the hard mask material does not affect subsequent steps or can be utilized in subsequent steps.

As a conductive film to be the conductor 122, a conductive film including a metal element is preferably formed by a sputtering method. The conductive film can also be formed by a CVD method.

A surface of the insulator 132 is preferably subjected to planarization treatment as needed. A chemical mechanical polishing (CMP) method, a reflow method, or the like can be used as the planarization treatment.

Insulating films 123A, conductive films 134A, and conductive films 136A are alternately stacked over the conductor 122 and the insulator 132. In this embodiment, an example where an insulating film 123A is formed over the insulator 132, a conductive film 134A is formed over the insulating film 123A, another insulating film 123A is formed over the conductive film 134A, and a conductive film 136A is formed over the insulating film 123A is described (see FIG. 12A to FIG. 12C). A CVD method can be used for the formation of the conductive films 134A, the conductive films 136A, and the insulating films 123A. Alternatively, a sputtering method may be used.

As the conductor 122, the conductive films 134A, and the conductive films 136A, a conductive material such as silicon to which an impurity is added or a metal can be used. A material different from materials of the conductor 122 and the conductive films 134A is preferably used for the conductive films 136A because the conductive films 136A need to be selectively etched with respect to the conductor 122 and the conductive films 134A in a later step, while the same material or different materials may be used for the conductor 122 and the conductive films 134A. In the case where silicon is used for the conductor 122, the conductive films 134A, or the conductive films 136A, amorphous silicon or polysilicon can be used. Furthermore, a p-type impurity or an n-type impurity may be added to give a conducting property to silicon. As a conductive material containing silicon, silicide containing titanium, cobalt, or nickel can be used for the conductor 122, the conductive films 134A, or the conductive films 136A. In the case where a metal material is used for the conductor 122, the conductive films 134A, or the conductive films 136A, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

An insulating oxide, an insulating nitride, an insulating oxynitride, an insulating nitride oxide, an insulating metal oxide, an insulating metal oxynitride, an insulating metal nitride oxide, or the like can be used as the insulator 132 and the insulating films 123A. Silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide or resin, aluminum oxide, gallium oxide, hafnium oxide, zirconium oxide, oxide including aluminum and hafnium, oxynitride including aluminum and hafnium, oxide including silicon and hafnium, oxynitride including silicon and hafnium, nitride including silicon and hafnium, or the like can be used.

Although an example where six insulating films 123A, three conductive films 134A, and two conductive films 136A are formed is described in this embodiment, the number of stacked layers is not limited thereto. Each of the films can be formed in accordance with the required performance of the semiconductor device. Assuming that the number of stacked conductive films 134A is m (m is an integer greater than or equal to 2), the number of stacked insulating films 123A is 2×m and the number of stacked conductive films 136A is m−1. For example, m can be greater than or equal to 33, preferably greater than or equal to 65, further preferably greater than or equal to 129, still further preferably greater than or equal to 257.

Figure 13A:
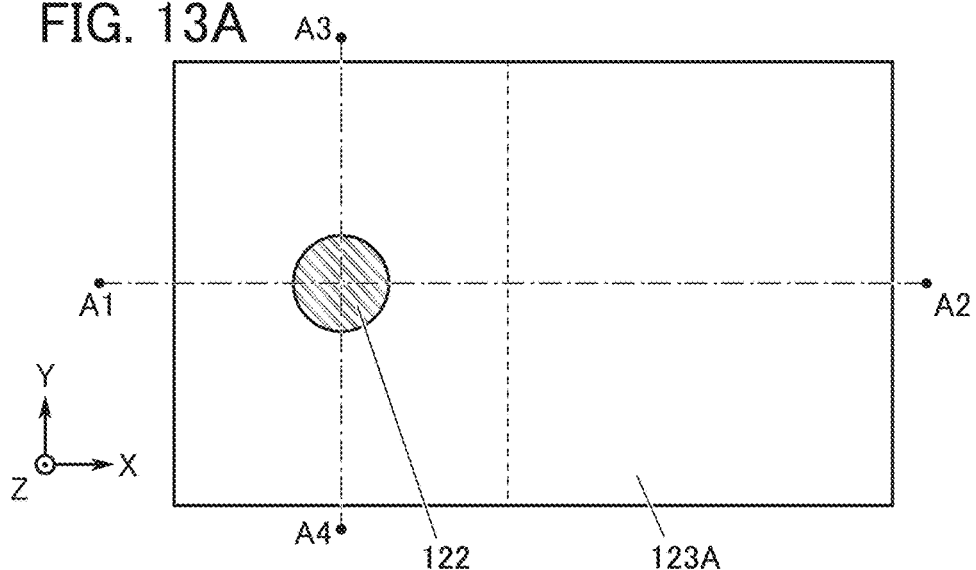
FIG. 13A to FIG. 13C are cross-sectional views illustrating the process for manufacturing a semiconductor device of one embodiment of the present invention.
Figure 13B:
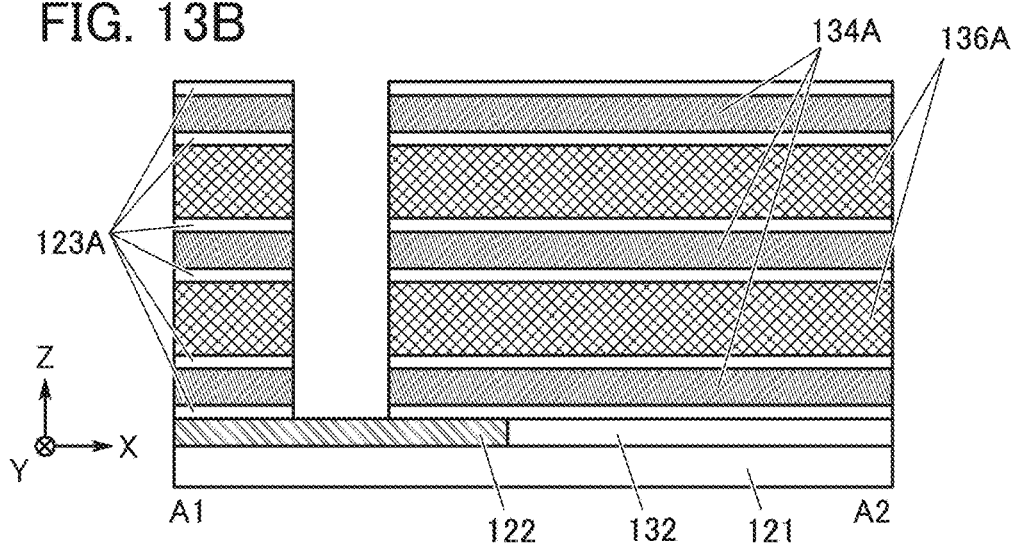
Figure 13C:
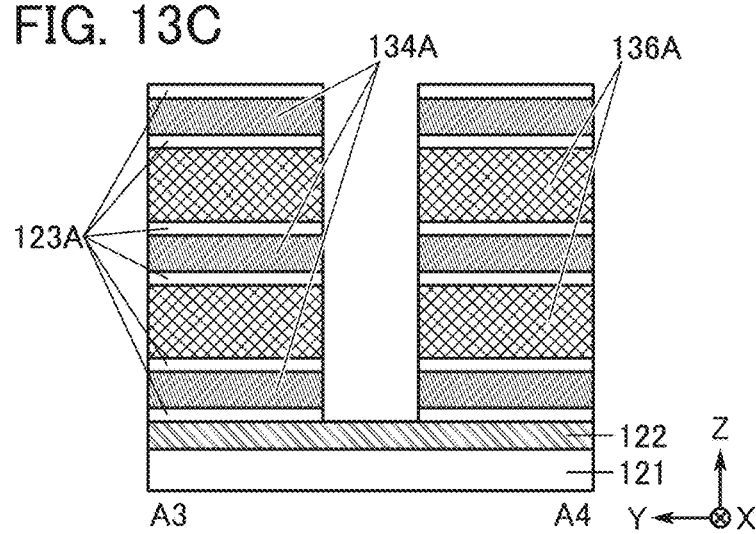

Next, a mask is formed over the insulating films 123A; and the insulating films 123A, the conductive films 134A, and the conductive films 136A are processed by a lithography technique, so that a first opening is formed so as to expose the conductor 122 (see FIG. 13A to FIG. 13C).

Figure 14A:
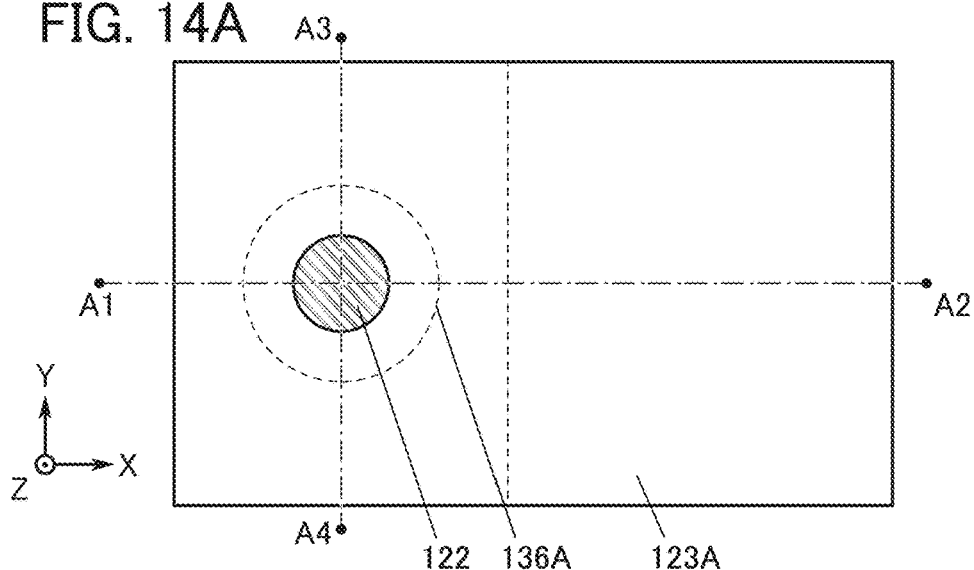
FIG. 14A to FIG. 14C are cross-sectional views illustrating the process for manufacturing a semiconductor device of one embodiment of the present invention.
Figure 14B:
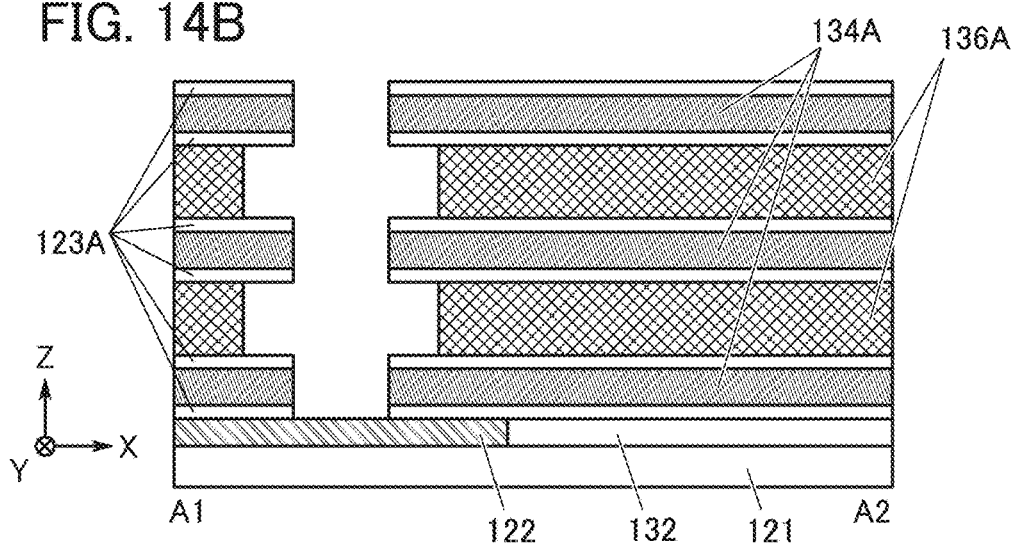
Figure 14C:
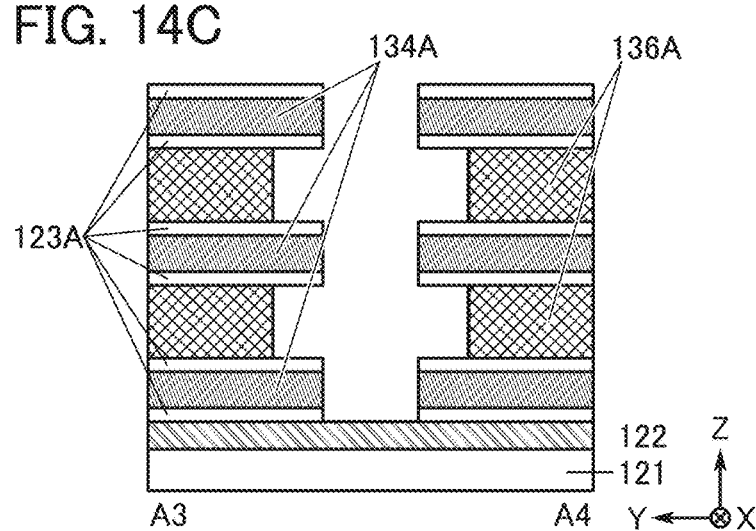

Next, isotropic etching is performed on the conductive films 136A so that side surfaces of the conductive films 136A in the first opening recede from side surfaces of the insulating films 123A and side surfaces of the conductive films 134A (see FIG. 14A to FIG. 14C). By the processing, the diameter of the first opening overlapping with the conductive film 136A becomes larger than the diameter of the first opening overlapping with the insulating film 123A and the opening diameter of the diameter of the first opening overlapping with the conductive film 134A. Thus, projections and depressions are formed on a side surface of the first opening. As such processing, isotropic etching using dry etching with a gas, a radical, plasma, or the like, or isotropic etching using wet etching with a liquid can be used. A liquid used in wet etching may be referred to as an etchant. In the case where isotropic etching is performed using dry etching, a gas, a radical, plasma, or the like containing at least one of chlorine, bromine, and fluorine can be used. Isotropic etching is preferably performed without the mask used for formation of the first opening removed. The first opening obtained by the above processing corresponds to the opening 141 illustrated in FIG. 4.

Figure 15A:
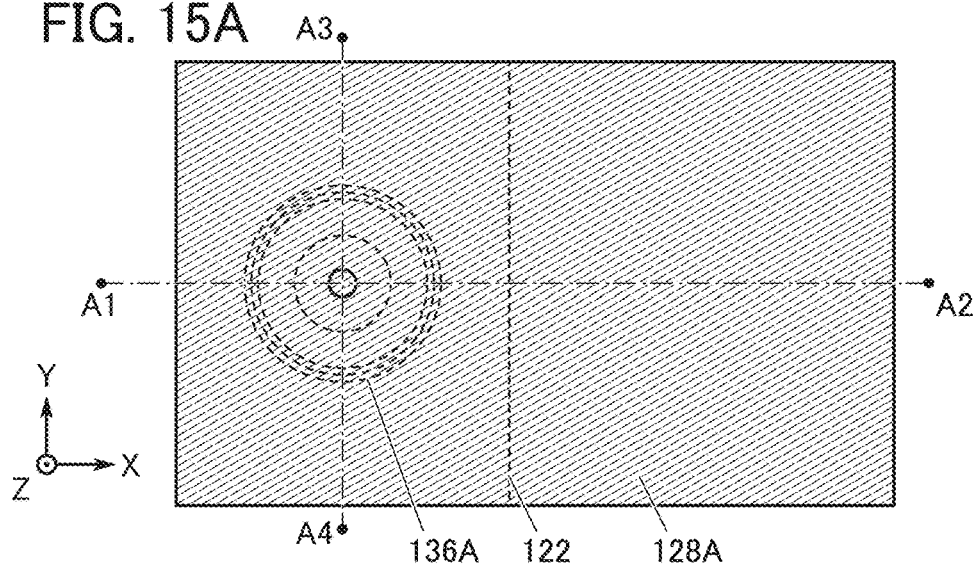
FIG. 15A to FIG. 15C are cross-sectional views illustrating the process for manufacturing a semiconductor device of one embodiment of the present invention.
Figure 15B:
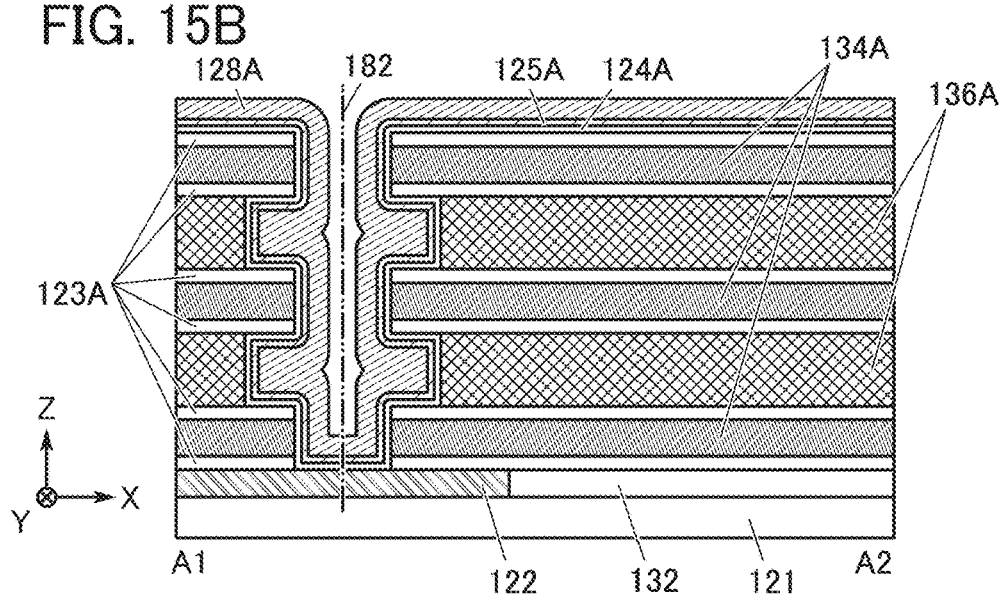
Figure 15C:
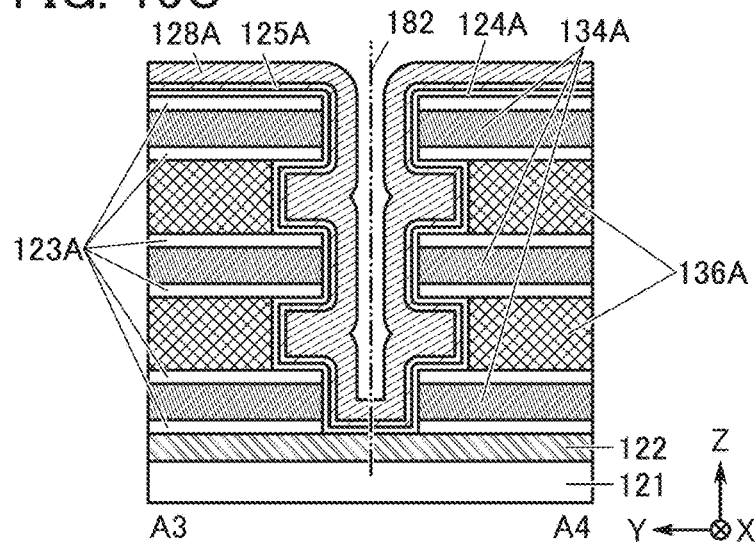

Next, an insulating film 124A, a semiconductor film 125A, and a conductive film 128A are formed over the insulating film 123A and in the first opening (see FIG. 15A to FIG. 15C). Although not illustrated, the insulating film 124A may have a stacked-layer structure. The insulating film 124A can be formed by a CVD method or an ALD method. It is particularly preferable to employ an ALD method, in which case a film with a uniform thickness can be formed even in a groove or an opening portion having a high aspect ratio. Alternatively, the insulating film 124A may be formed by a combination of an ALD method and a CVD method. In the case where the insulating film 124A has a stacked-layer structure, insulating films may be formed in the same deposition apparatus or different deposition apparatuses.

The insulating film 124A formed by the above-described method has high coverage and can be formed on the projections and depressions of the side surface of the first opening. In other words, the insulating film 124A can be formed in contact with not only the side surfaces of the insulating films 123A, the conductive films 134A, and the conductive films 136A but also part of a top surface of the insulating films 123A and part of a bottom surface of the insulating films 123A.

The semiconductor film 125A can be formed by a CVD method or an ALD method. It is particularly preferable to employ an MOCVD method, in which case a film with a uniform thickness can be formed even in a groove or an opening portion having a high aspect ratio. Alternatively, the semiconductor film 125A may be formed by a combination of an ALD method and a CVD method.

The semiconductor film 125A is preferably an oxide semiconductor having a CAAC structure. In the case where the semiconductor film 125A is an oxide semiconductor having a CAAC structure, c-axes of the semiconductor film 125A are aligned in a direction of the normal to a surface on which the semiconductor film 125A is deposited, at the inside of the first opening. In this case, the c-axes of the semiconductor film 125A positioned over the side surfaces of the insulating film 123A, the conductive film 134A, and the conductive film 136A with the insulating film 124A therebetween are aligned from the surface where the semiconductor film 125A is deposited toward an axis 182 illustrated in FIG. 15B and FIG. 15C. Note that the axis 182 can be referred to as the central axis of the first opening. Thus, c-axes of the semiconductor 125 positioned as described above are aligned from the surface where the semiconductor 125 is deposited toward the axis 182.

The conductive film 128A is at least formed to fill the depressions of the conductive films 136A with the insulating film 124A and the semiconductor film 125A positioned between the conductive film 128A and the conductive films 136A, and need not entirely fill the inside of the first opening. The insulating film 128A can be formed by a CVD method or an ALD method. It is particularly preferable to employ an ALD method, in which case a film with a uniform thickness can be formed even in a groove or an opening portion. Alternatively, the conductive film 128A may be formed by a combination of an ALD method and a CVD method.

Figure 16A:
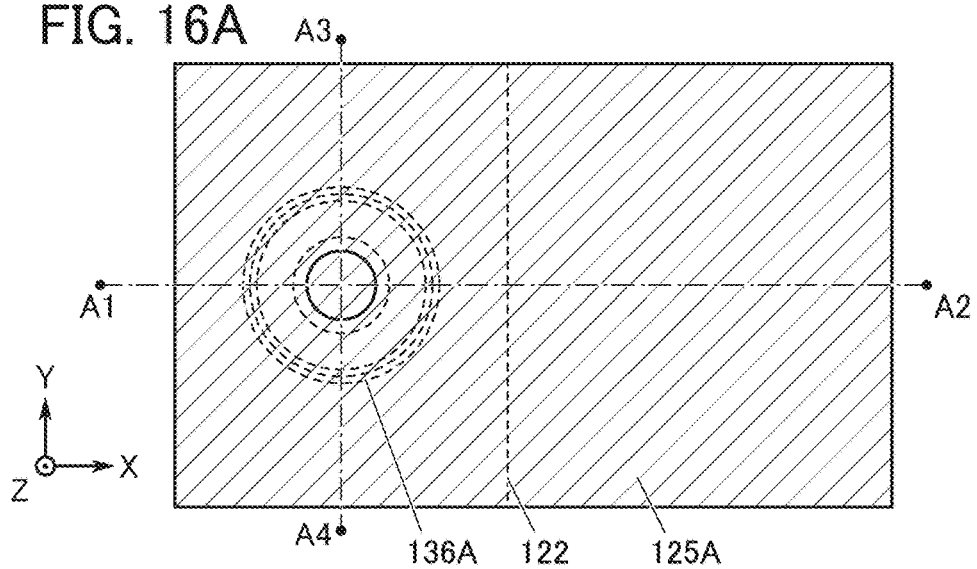
FIG. 16A to FIG. 16C are cross-sectional views illustrating the process for manufacturing a semiconductor device of one embodiment of the present invention.
Figure 16B:
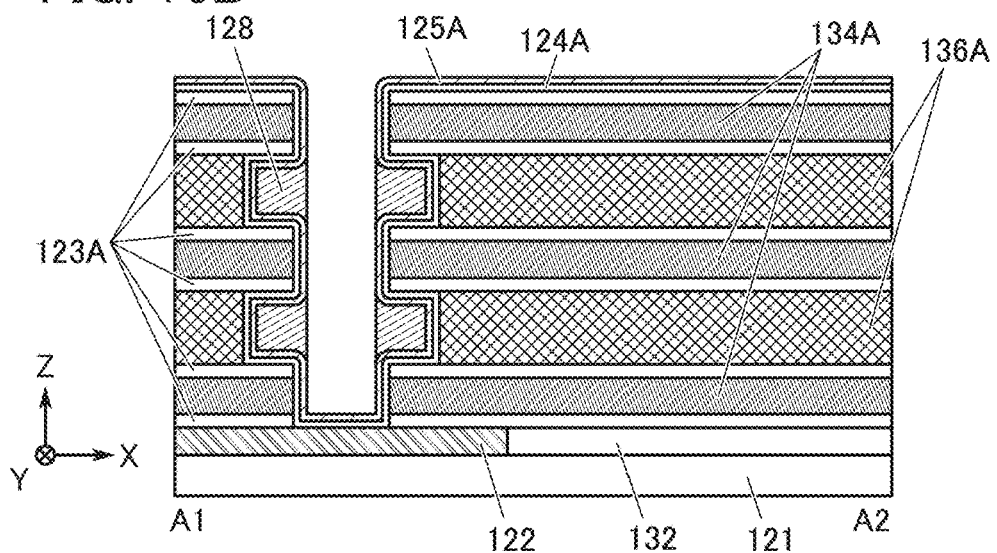
Figure 16C:
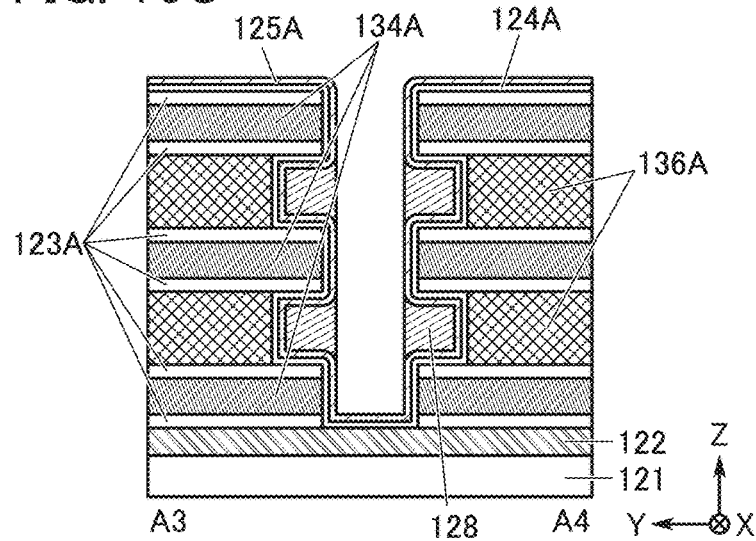
Figure 17A:
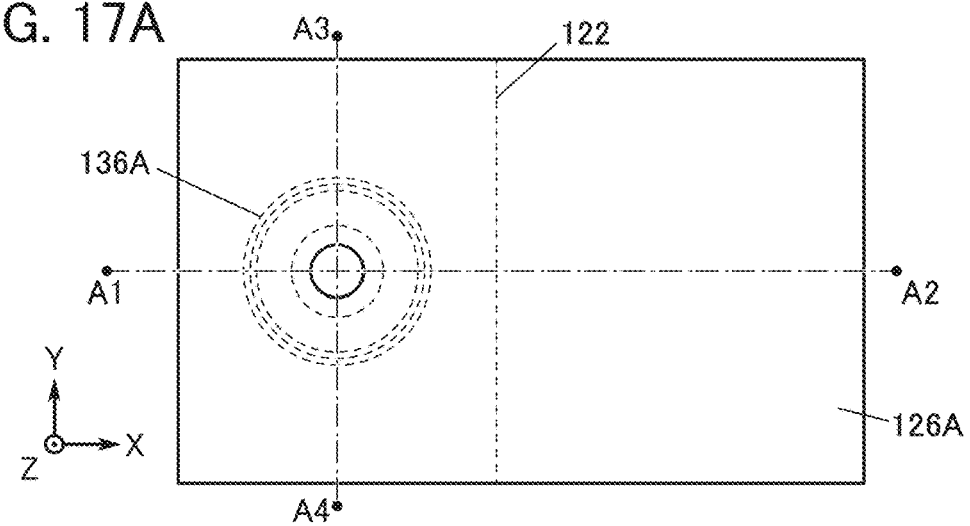
FIG. 17A to FIG. 17D are cross-sectional views illustrating the process for manufacturing a semiconductor device of one embodiment of the present invention.
Figure 17B:
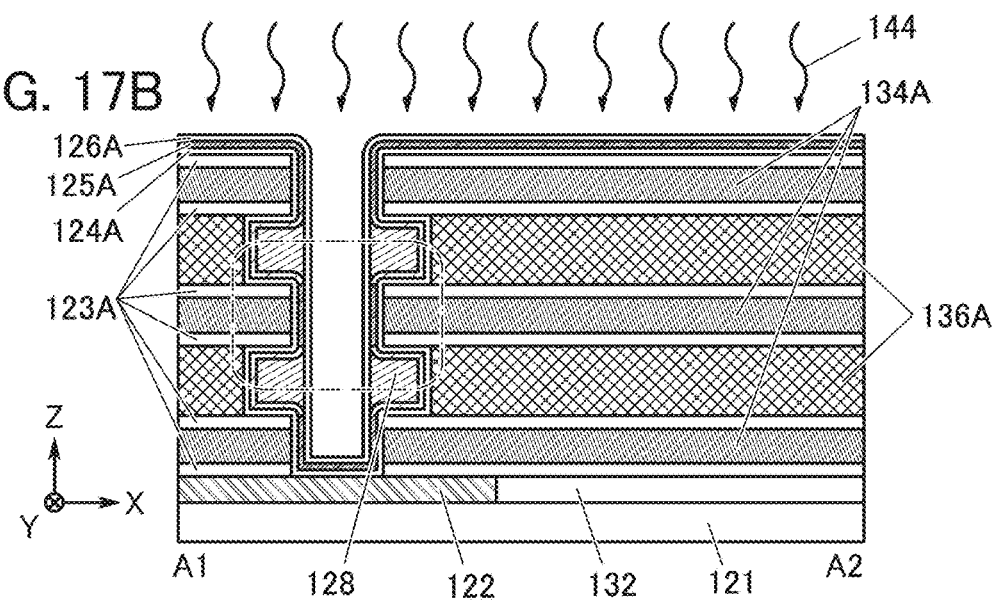
Figure 17C:
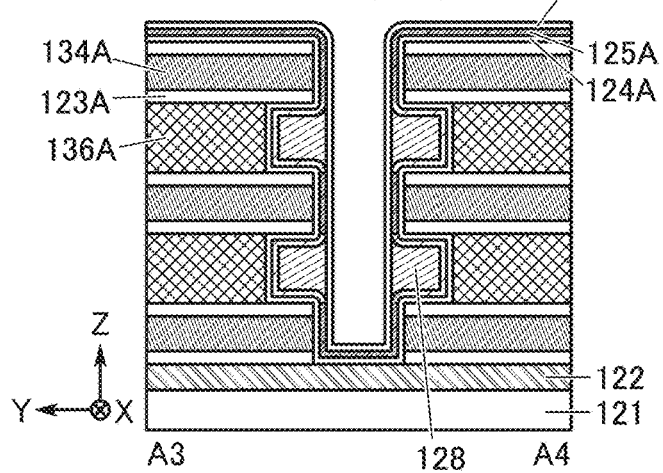
Figure 17D:
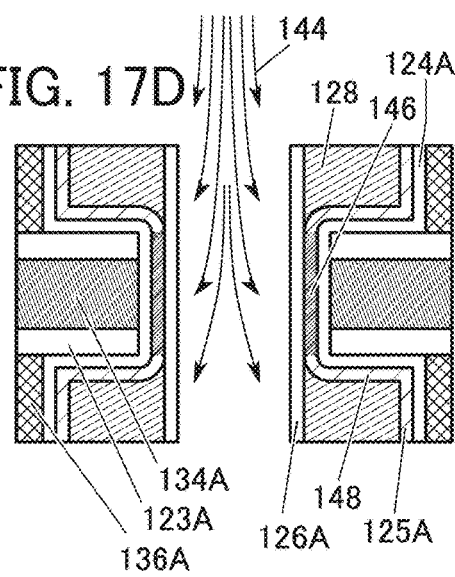

Next, the conductive film 128A is processed to form the conductors 128 (see FIG. 16A to FIG. 16C). For the processing of the conductive film 128A, isotropic etching or anisotropic etching can be used. In the case where the formed conductive film 128A fills the depressions and does not completely fill the first opening as illustrated in FIG. 15A to FIG. 15C, isotropic etching is preferably used for the processing of the conductive film 128A. In contrast, in the case where the conductive film 128A is formed to fill the depressions and the first opening, anisotropic etching is preferably used. By the above-described processing, the conductors 128 can be formed inside the depressions.

Next, an insulating film 126A is formed inside the first opening (see FIG. 17A to FIG. 17D).

The insulating film 126A can be formed by a CVD method or an ALD method. It is particularly preferable to employ an ALD method, in which case a film with a uniform thickness can be formed even in a groove or an opening portion. Alternatively, the insulating film 126A may be formed by a combination of an ALD method and a CVD method.

Next, the resistance of part of the semiconductor film 125A is increased using the conductors 128 as a mask to form high-resistance regions (i-type regions). In a formation method of the high-resistance regions, irradiation of the semiconductor film 125A with a microwave 144 is performed to remove hydrogen contained in the semiconductor film 125A. The irradiation with the microwave 144 is preferably performed in an atmosphere containing oxygen, in which case oxygen is supplied to the semiconductor film 125A. In this embodiment, part of the semiconductor film 125A is irradiated with the microwave 144 under an atmosphere containing oxygen and argon, whereby the resistance of a region 146 of the semiconductor film 125A is increased (see FIG. 17A to FIG. 17D).

Here, heat treatment may be performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

The heat treatment reduces the resistance of the semiconductor film 125A in contact with the conductors 128, so that low-resistance regions (N-type regions) can be formed in regions 148. The heat treatment performed in the state where the semiconductor film 125A and the conductors 128 are in contact with each other sometimes forms a metal compound layer containing a metal element contained in the conductors 128 and a component of the semiconductor film 125A at an interface between the conductors 128 and the semiconductor film 125A. Formation of the metal compound layer is preferable because the resistance of the semiconductor film 125A is reduced in the regions in contact with the conductors 128. In addition, oxygen contained in the semiconductor film 125A is absorbed by the conductors 128 in some cases. When the heat treatment is performed in the state where the semiconductor film 125A and the conductors 128 are in contact with each other, the resistance of the semiconductor film 125A is further reduced. The heat treatment may be performed before the microwave treatment. Since the regions 148 whose resistance is reduced by the heat treatment are covered with the conductors 128, the regions 148 are not affected by the microwave 144 and can maintain the low resistance value even after the microwave treatment.

It is preferable that the carrier concentration of the region 146 after the above-described microwave treatment and heat treatment be lower than $1\times10^{18}/cm^3$, further preferably lower than or equal to $1\times10^{17}/cm^3$, still further preferably lower than or equal to $1\times10^{16}/cm^3$. The carrier concentration of the regions 148 is preferably higher than or equal to $1\times10^{18}/cm^3$, further preferably higher than or equal to $1\times10^{19}/cm^3$, still further preferably higher than or equal to $1\times10^{20}/cm^3$.

Figure 18A:
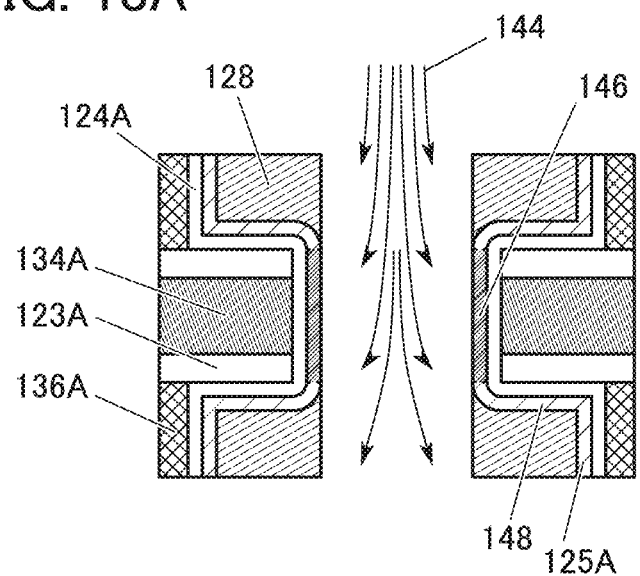
FIG. 18A and FIG. 18B are cross-sectional views illustrating the process for manufacturing a semiconductor device of one embodiment of the present invention.

Note that although the treatment of increasing resistance for the semiconductor film 125A is performed after the formation of the insulating film 126A in the example illustrated in FIG. 17A to FIG. 17D, this embodiment is not limited to the example. As illustrated in FIG. 18A, the treatment of increasing resistance may be performed before the formation of the insulating film 126A.

Figure 18B:
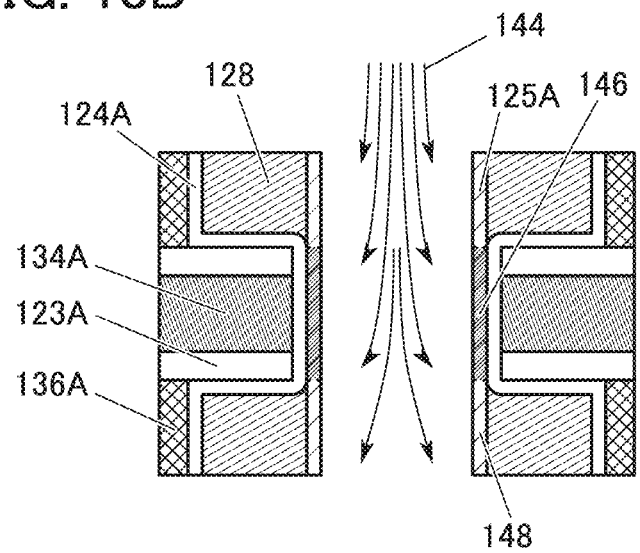
Figure 19A:
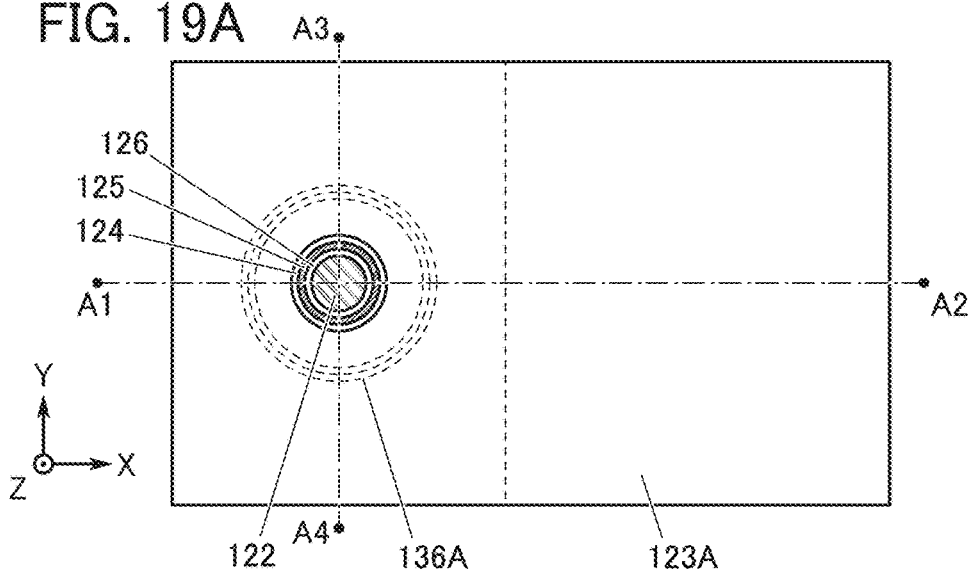
FIG. 19A to FIG. 19C are cross-sectional views illustrating the process for manufacturing a semiconductor device of one embodiment of the present invention.
Figure 19B:
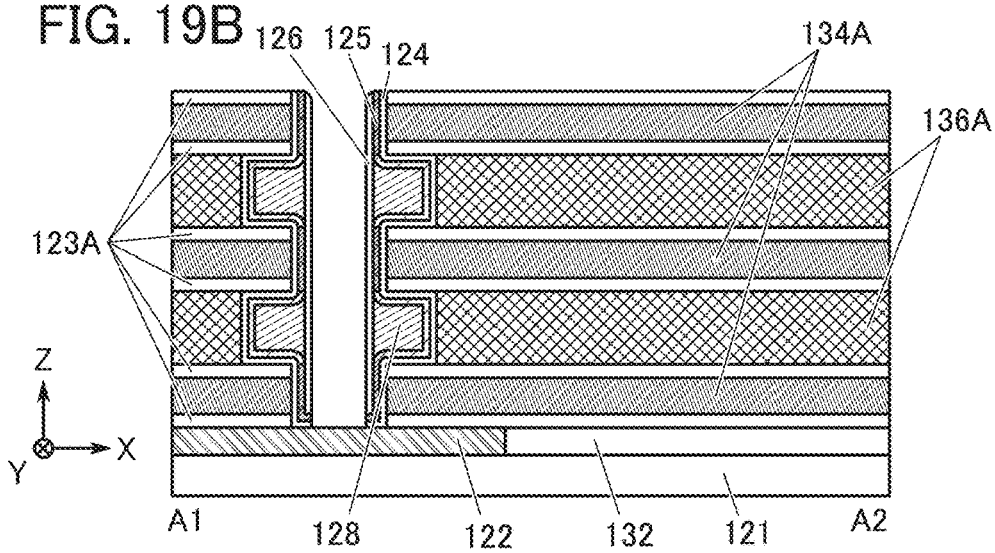
Figure 19C:
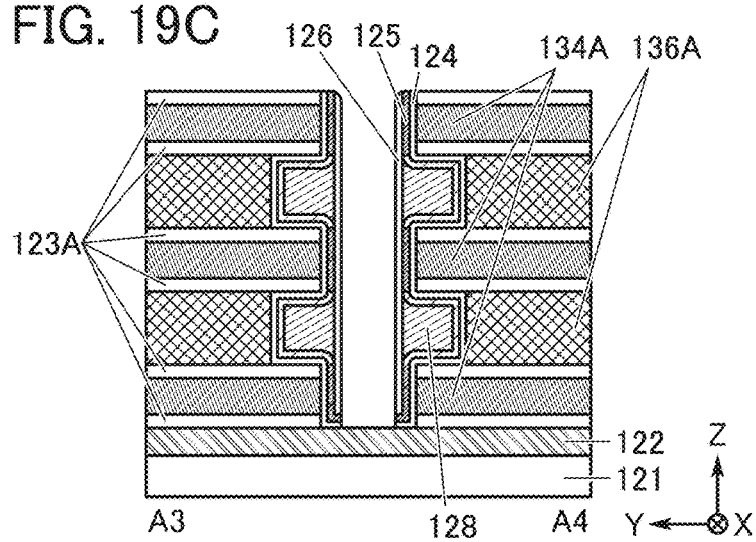

Furthermore, the treatment of increasing resistance for the semiconductor film 125A is performed with the use of the conductors 128 as a mask in the example illustrated in FIG. 17A to FIG. 17D, this embodiment is not limited to the example. As illustrated in FIG. 18B, the treatment of increasing resistance may be performed on the semiconductor film 125A in the state where the semiconductor film 125A is in contact with the conductor 128 provided between the semiconductor film 125A and the insulating film 124A. At this time, the regions 148 are subjected to the treatment of increasing resistance such as the microwave irradiation; however, since the regions 148 are in contact with the conductors 128, the regions 148 can maintain their low resistances owing to a reaction or interaction between the regions 148 and the conductors 128 as described above. Furthermore, the heat treatment enables the regions 148 to have lower resistances than the region 146 in some cases.

Note that in order to provide the conductor 128 between the semiconductor film 125A and the insulating film 124A, the conductive film 128A is formed after the formation of the insulating film 124A and before the formation of the semiconductor film 125A. After the conductor 128 is formed by processing of the conductive film 128A, the semiconductor film 125A is formed, and then treatment of increasing resistance is performed.

Next, the insulating film 124A, the semiconductor film 125A, and the insulating film 126A that are formed in a bottom portion of the first opening are removed to obtain the insulator 124, the semiconductor 125, and the insulator 126. Anisotropic etching is preferably used for the removal of the insulating film 124A, the semiconductor film 125A, and the insulating film 126A. At this time, the insulating film 124A, the semiconductor film 125A, and the insulating film 126A over the insulating film 123A are also removed; thus, the insulator 124, the semiconductor 125, and the insulator 126 are provided only on a sidewall of the first opening (see FIG. 19A to FIG. 19C). By the removal of the insulating film 124A, the semiconductor film 125A, and the insulating film 126A in the bottom portion of the first opening, the conductor 122 is exposed.

Figure 20A:
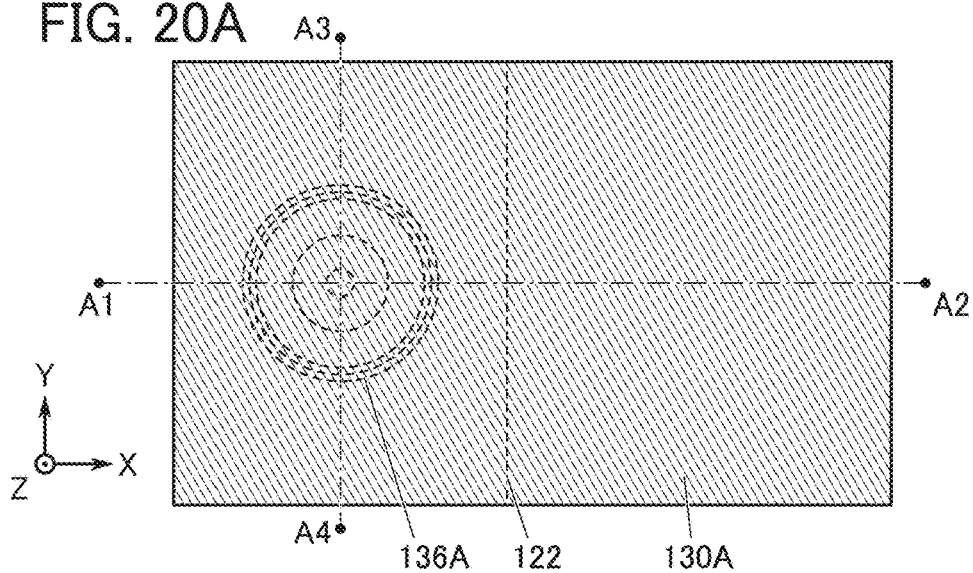
FIG. 20A to FIG. 20C are cross-sectional views illustrating the process for manufacturing a semiconductor device of one embodiment of the present invention.
Figure 20B:
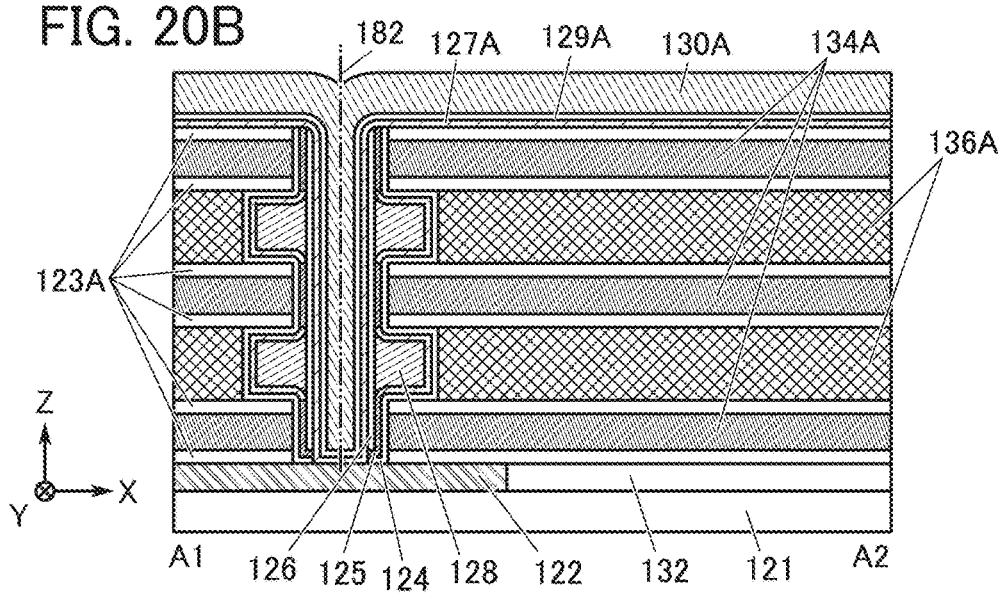
Figure 20C:
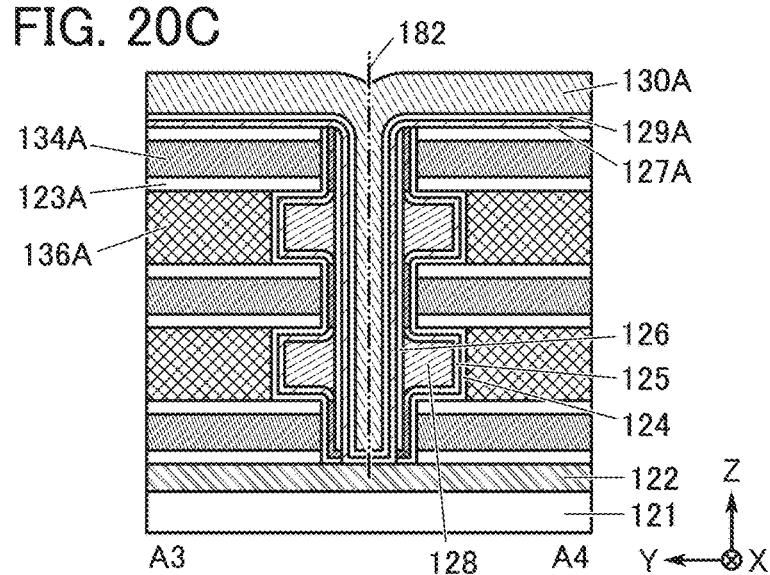

Then, a semiconductor film 127A is formed in the first opening to be partially in contact with the conductor 122 (see FIG. 20A to FIG. 20C). The semiconductor film 127A is preferably formed to be partially in contact with the semiconductor 125. In the memory device 100 described as an example in this embodiment, the semiconductor film 127A can be connected to the semiconductor 125 in the bottom portion of the first opening and a top portion of the first opening.

The semiconductor film 127A is preferably an oxide semiconductor having a CAAC structure. In the case where the semiconductor film 127A is an oxide semiconductor having a CAAC structure, c-axes of the semiconductor film 127A are aligned in a direction of the normal to a surface where the semiconductor film 127A is deposited, at the inside of the first opening. In this case, the c-axes of the semiconductor film 127A positioned on the side surface of the first opening are aligned from the surface where the semiconductor film 127A is deposited toward the axis 182. Thus, the c-axes of the semiconductor 127 positioned as described above are aligned from the surface where the semiconductor 127 is deposited toward the axis 182.

Subsequently, an insulating film 129A is formed to overlap with the semiconductor film 127A, and a conductive film 130A is formed to overlap with the insulating film 129A. The semiconductor film 127A, the insulating film 129A, and the conductive film 130A can be formed by a CVD method or an ALD method. It is particularly preferable to employ a CVD method or an ALD method, in which case a film with a uniform thickness can be formed even in a groove or an opening portion having a high aspect ratio. Alternatively, an ALD method and a CVD method may be used in combination. Alternatively, the films may be formed using different deposition methods or different deposition apparatuses. For example, an MOCVD method is preferably used for formation of the semiconductor film 127A.

Here, treatment of increasing resistance similar to that performed on the semiconductor film 125A may be performed on the semiconductor film 127A. In the case where treatment of increasing resistance is performed on the semiconductor film 127A, the treatment of increasing resistance is preferably performed before the formation of the conductive film 130A or before the formation of the insulating film 129A. In the case where the resistance of the region 146 of the semiconductor film 125A is also increased by the treatment of increasing resistance performed on the semiconductor film 127A, the treatment of increasing resistance in the aforementioned step may be omitted.

Then, heat treatment is performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

Figure 21A:
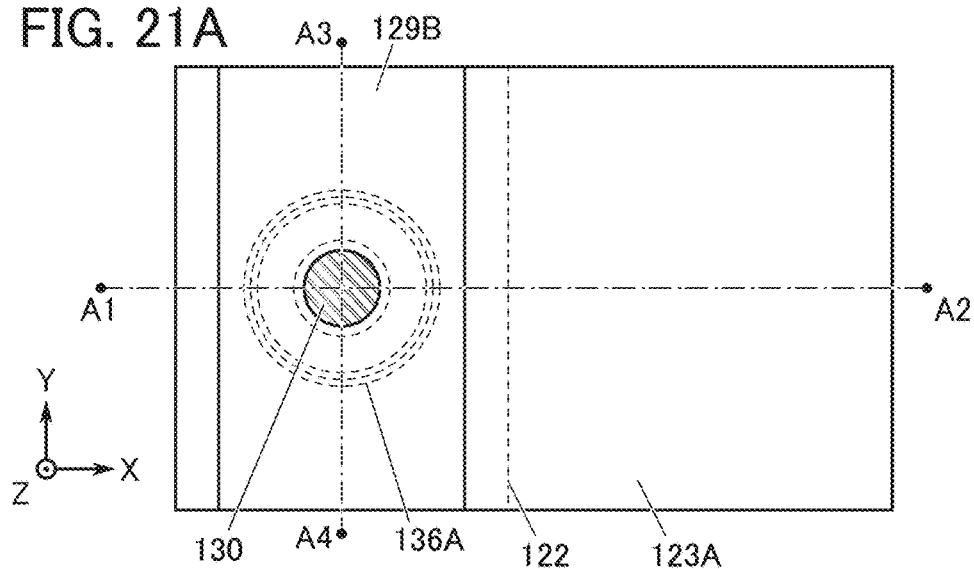
FIG. 21A to FIG. 21C are cross-sectional views illustrating the process for manufacturing a semiconductor device of one embodiment of the present invention.
Figure 21B:
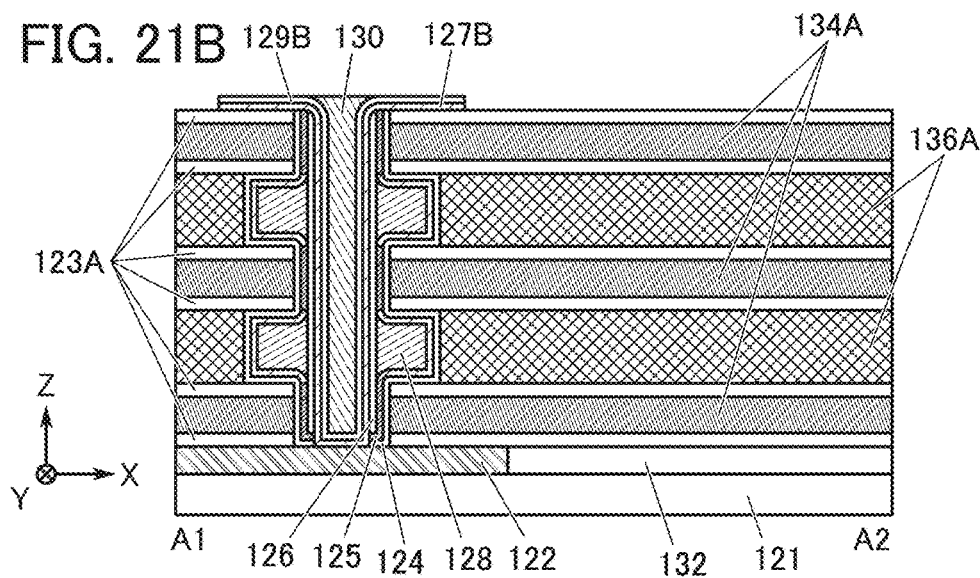
Figure 21C:
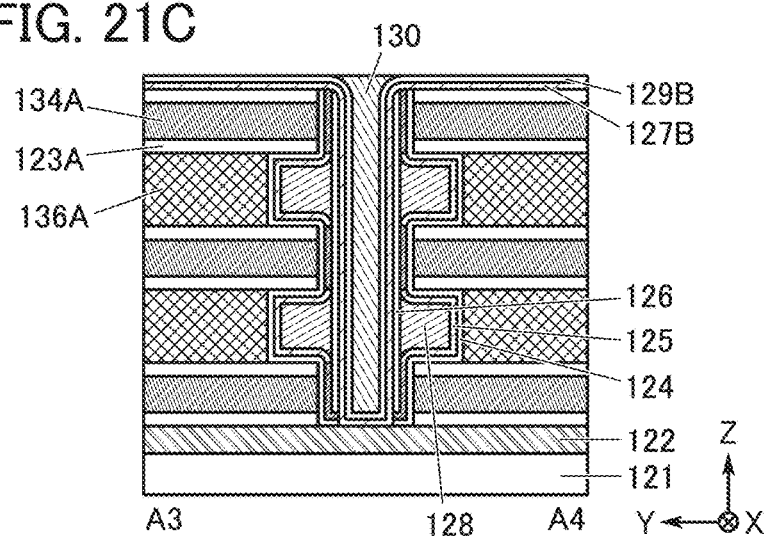

Next, the conductive film 130A is removed by a CMP method or the like until a surface of the insulating film 129A is exposed, whereby the conductor 130 is obtained (see FIG. 21A to FIG. 21C). Note that the above-described heat treatment may be performed after the formation of the conductor 130.

Next, the semiconductor film 127A and the insulating film 129A are processed, whereby a semiconductor film 127B and an insulating film 129B are obtained (see FIG. 21A to FIG. 21C). For the processing, a dry etching method or a wet etching method can be employed.

Figure 22A:
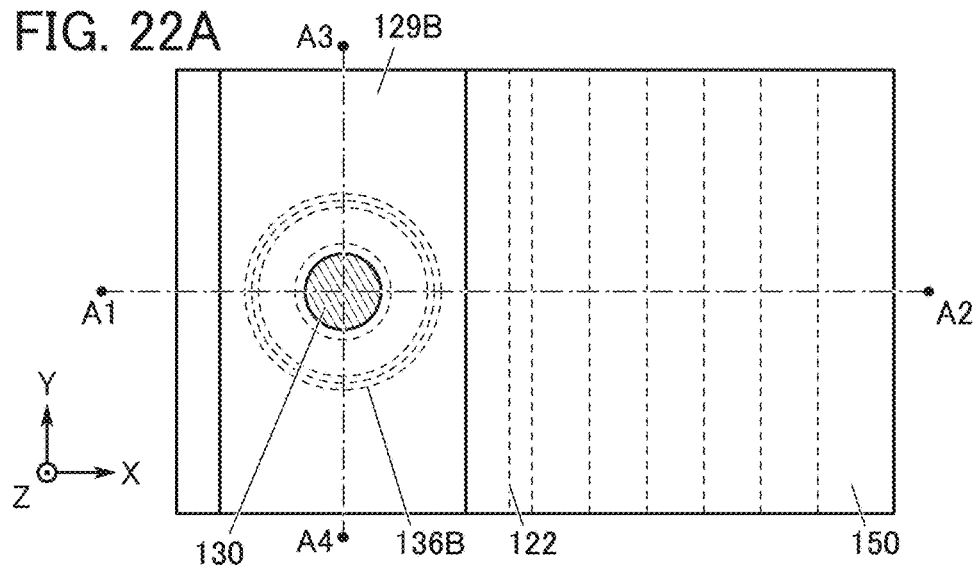
FIG. 22A to FIG. 22C are cross-sectional views illustrating the process for manufacturing a semiconductor device of one embodiment of the present invention.
Figure 22B:
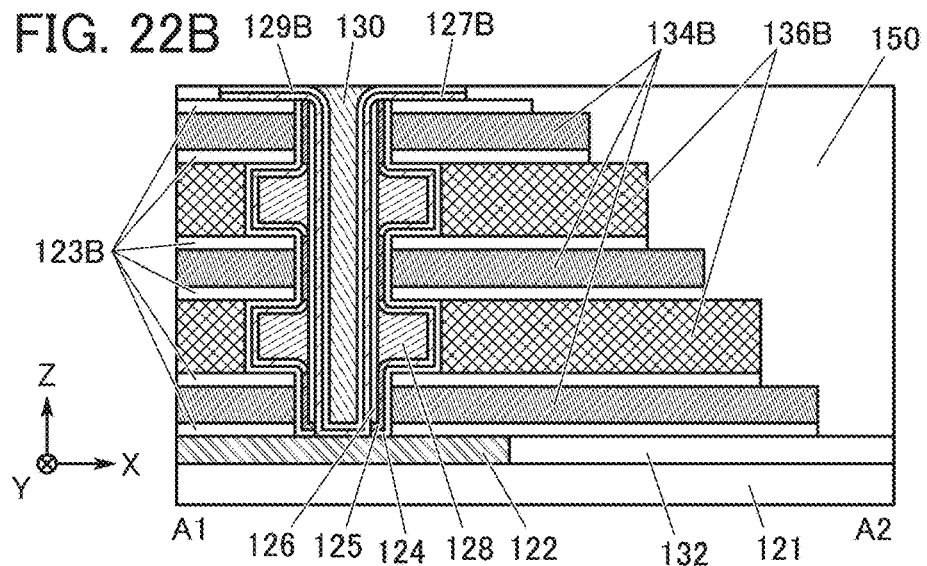
Figure 22C:
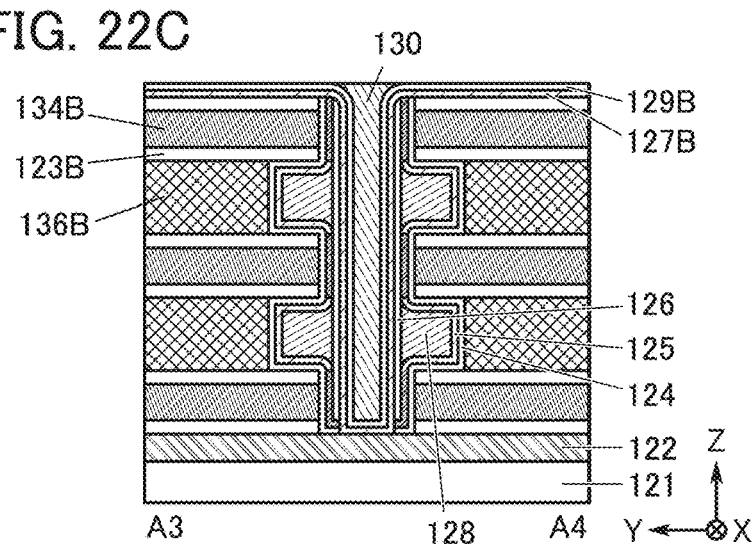

Next, the insulating films 123A, the conductive films 134A, and the conductive films 136A are processed, so that insulators 123B, conductors 134B, and conductors 136B having a step-like shape as illustrated in FIG. 22B are formed (see FIG. 22A to FIG. 22C). In the processing of the insulating films 123A, the conductive films 134A, and the conductive films 136A, etching of the insulating films 123A, the conductive films 134A, and the conductive films 136A and slimming of a mask are alternately performed, whereby the insulators 123B, the conductors 134B, and the conductors 136B having a step-like shape can be formed. Note that at end portions of the conductors 134B and the conductors 136B having a step-like shape, the insulating films 123A are removed and top surfaces of the conductors 134B and the conductors 136B are exposed.

Next, an insulator 150 is formed (see FIG. 22A to FIG. 22C). The insulator 150 can be formed by a CVD method. The insulator 150 is preferably subjected to planarization treatment by a CMP method or a reflow method.

Figure 23A:
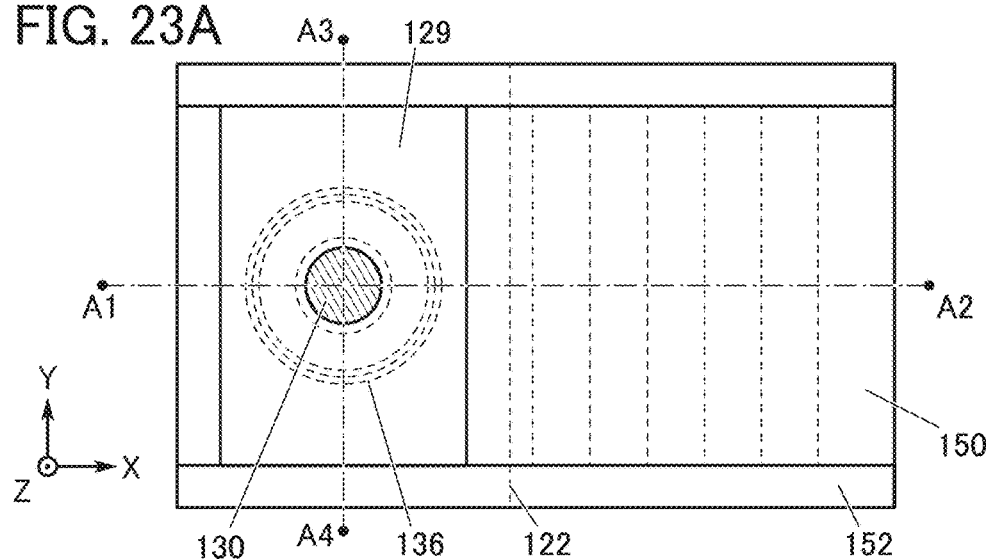
FIG. 23A to FIG. 23C are cross-sectional views illustrating the process for manufacturing a semiconductor device of one embodiment of the present invention.
Figure 23B:
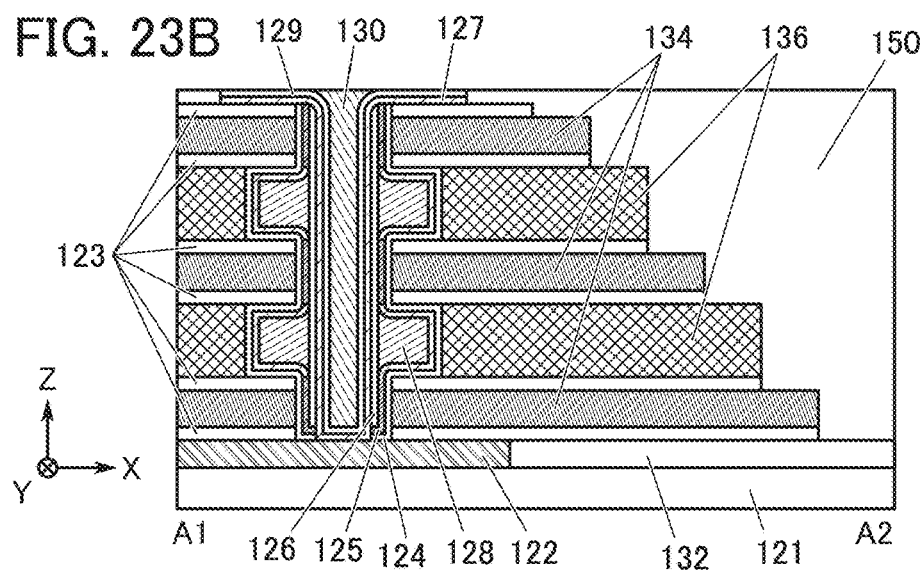
Figure 23C:
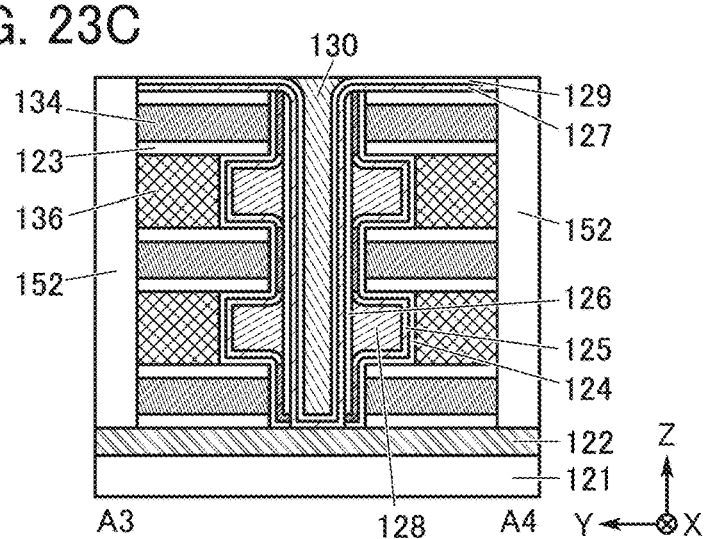

Next, the semiconductor film 127B, the insulating film 129B, the insulator 150, the insulators 123B, the conductors 134B, and the conductors 136B are processed, so that the semiconductor 127, the insulator 129, the insulators 123, conductors 134, and conductors 136 are obtained (see FIG. 23A to FIG. 23C). In this manner, the semiconductor 127 electrically connected to the semiconductor 125 can be formed. The semiconductor 127 can be connected the semiconductor 125 in the bottom portion of the first opening and the top portion of the first opening.

Next, insulators 152 are formed so as to be embedded in the areas removed by the above-described processing (see FIG. 23A to FIG. 23C). The insulators 152 can be formed by a CVD method or an ALD method. Alternatively, the insulators 152 may be formed by a combination of an ALD method and a CVD method. The insulators 152 are preferably subjected to planarization treatment by a CMP method, a reflow method, or the like. Note that although one memory string is provided between the insulators 152 in the example illustrated in FIG. 23A and FIG. 23C, this embodiment is not limited to the example. A plurality of memory strings may be provided between the insulators 152 in the Y direction. At this time, the plurality of memory strings share the conductors 134, the conductors 136, the semiconductor 127, and the like.

Figure 24A:
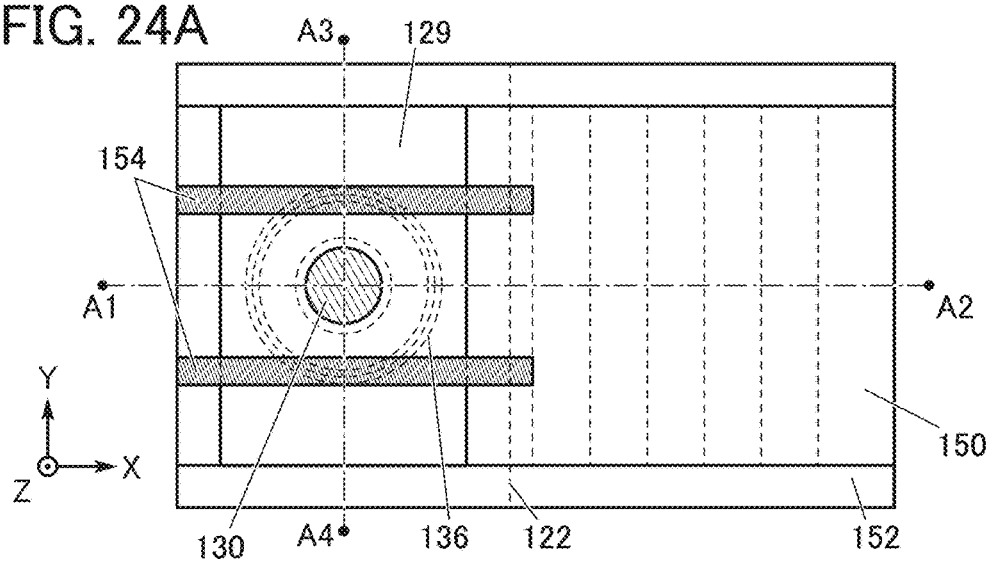
FIG. 24A to FIG. 24C are cross-sectional views illustrating the process for manufacturing a semiconductor device of one embodiment of the present invention.
Figure 24B:
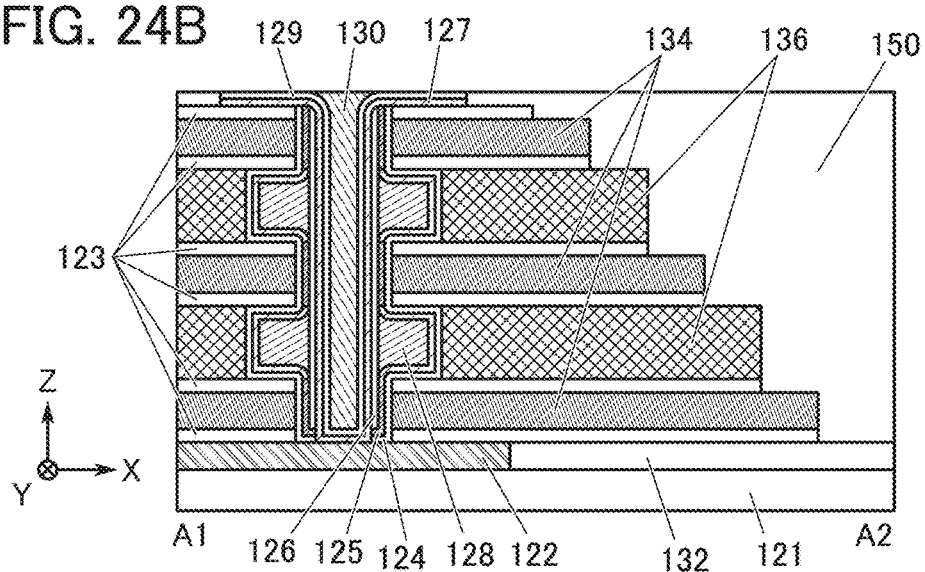
Figure 24C:
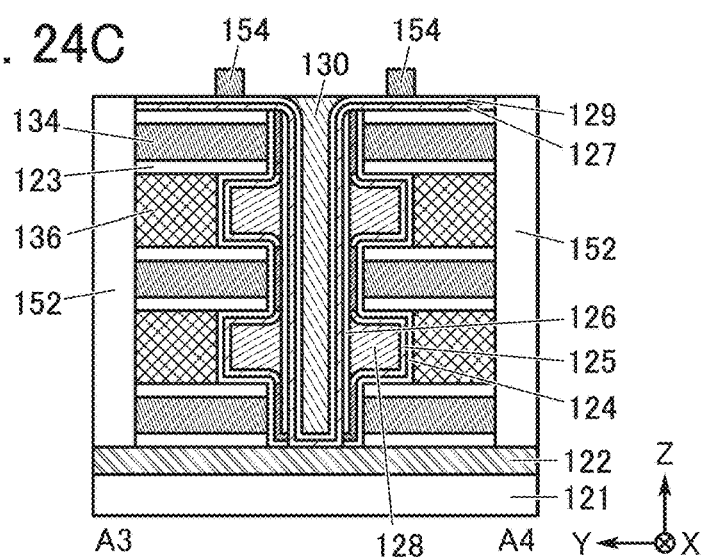

Next, conductors 154 are formed so as to overlap with part of the semiconductor 127 with the insulator 129 therebetween (see FIG. 24A to FIG. 24C). The conductors 154 are obtained in such a manner that a conductive film is formed over the insulator 129, the insulator 150, and the insulators 152 and processed by a lithography technique. Note that although the conductors 154 do not exist on the dashed-dotted line A1-A2 in FIG. 24A, the conductors 154 are illustrated with a dashed-dotted line in FIG. 24B.

The conductor 154 functions as the gate of the transistor STr2. A region of the semiconductor 127 overlapping with the conductor 154 functions as a channel formation region of the transistor STr2. Therefore, the conductor 154 is preferably provided between the first opening and the conductor BL described later. Meanwhile, in the case where the semiconductor 127 is shared by the memory strings 120 adjacent to each other in the Y direction, the conductor 154 is preferably also provided between the first opening and the conductor BL of the adjacent memory string 120 (in FIG. 24C, on a side closer to A4 than the first opening).

Figure 25A:
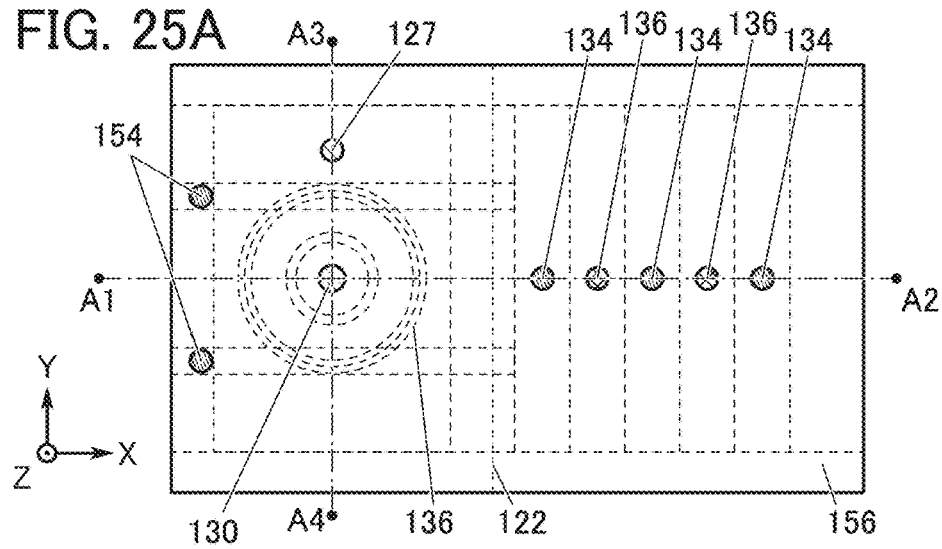
FIG. 25A to FIG. 25C are cross-sectional views illustrating the process for manufacturing a semiconductor device of one embodiment of the present invention.
Figure 25B:
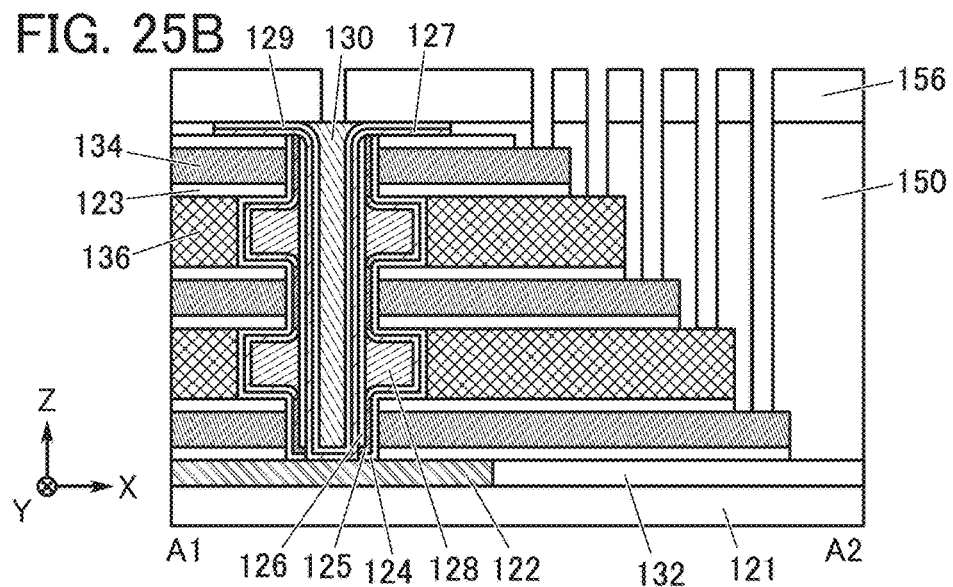
Figure 25C:
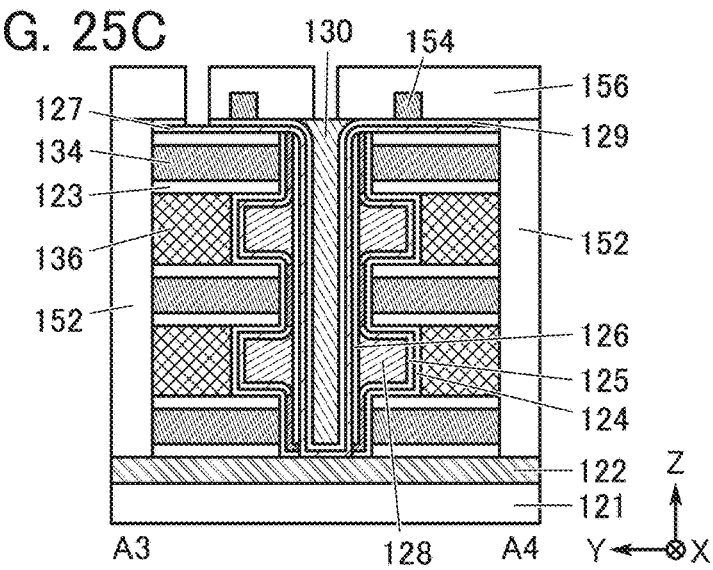

Next, an insulator 156 is formed so as to cover the conductors 154, the insulator 129, the insulator 150, and the insulators 152 (see FIG. 25A to FIG. 25C). The insulator 156 can be formed by a CVD method, an ALD method, a sputtering method, or the like.

Next, the insulator 156, the insulator 129, and the insulator 150 are processed by a lithography technique, whereby second openings are formed so as to expose the conductors 134, the conductors 136, the conductor 130, the conductors 154, and the semiconductor 127. The second opening is formed for each of the conductors 134 and the conductors 136 formed stepwise (see FIG. 25A to FIG. 25C).

Figure 26A:
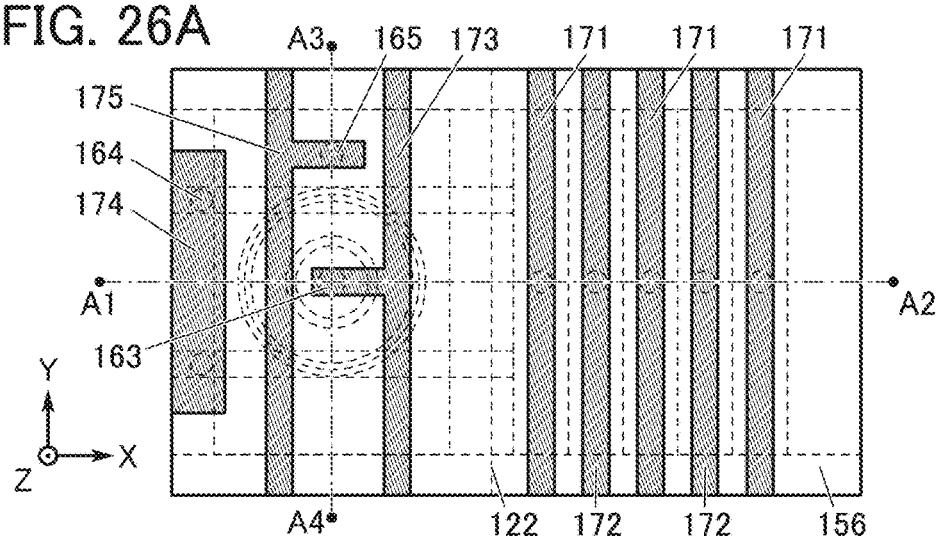
FIG. 26A to FIG. 26C are cross-sectional views illustrating the process for manufacturing a semiconductor device of one embodiment of the present invention.
Figure 26B:
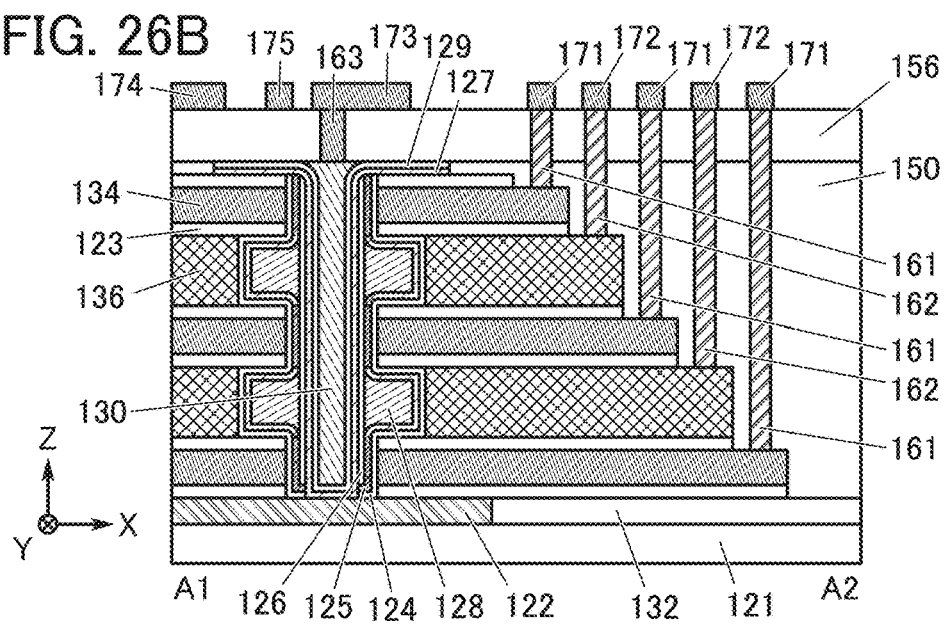
Figure 26C:
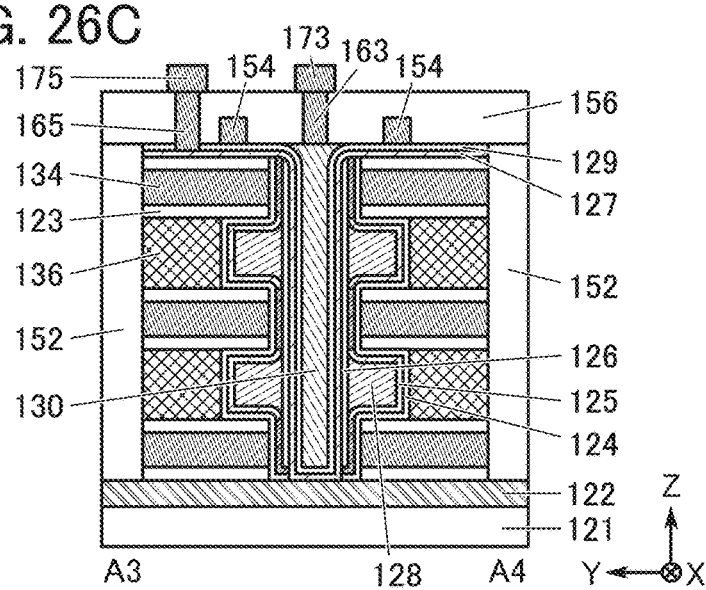

Next, conductors 161 electrically connected to the conductors 134, conductors 162 electrically connected to the conductors 136, a conductor 163 electrically connected to the conductor 130, conductors 164 electrically connected to the conductors 154, and a conductor 165 electrically connected to the semiconductor 127 are formed so as to be embedded in the second openings (see FIG. 26A to FIG. 26C). The conductors 161, the conductors 162, the conductor 163, the conductors 164, and the conductor 165 can be formed by a CVD method or an ALD method. Alternatively, the above-described conductors may be formed by a combination of an ALD method and a CVD method. The conductors 161, the conductors 162, the conductor 163, the conductors 164, and the conductor 165 may have a stacked-layer structure composed of a plurality of layers. The conductors 161, the conductors 162, the conductor 163, the conductors 164, and the conductor 165 can be formed in such a manner that a conductive film is formed over the insulator 156 and inside the second openings and an unnecessary conductive film is removed by CMP or the like.

Next, conductors 171 electrically connected to the conductors 161, conductors 172 electrically connected to the conductors 162, a conductor 173 electrically connected to the conductor 163, a conductor 174 electrically connected to the conductors 164, and a conductor 175 electrically connected to the conductor 165 are formed (see FIG. 26A to FIG. 26C). The conductors 171, the conductors 172, the conductor 173, the conductor 174, and the conductor 175 can be formed in such a manner that a conductive film is formed over the insulator 156 and processed by a lithography technique.

The conductors 171, the conductors 161, and the conductors 134 function as the conductor SG or the conductors WWL. The conductors 172, the conductors 162, and the conductors 136 function as the conductors RWL. The conductor 173, the conductor 163, and the conductor 130 function as the conductor BG. The conductor 174, the conductors 164, and the conductors 154 function as the conductors SEL. The conductor 175 and the conductor 165 function as the conductor BL. Through the above-described steps, the transistor STr1 that includes the semiconductor 127 functioning as the channel formation region and the conductor 134 functioning as the gate; the transistor STr2 that includes the semiconductor 127 functioning as the channel formation region and the conductor 154 functioning as the gate; the transistor WTr that includes the semiconductor 125 functioning as the channel formation region and the conductor 134 functioning as the gate; and the transistor RTr that includes the semiconductor 127 functioning as the channel formation region, the conductor 136 functioning as the gate, the conductor 130 functioning as the back gate, and the conductor 128 between the semiconductor 127 and the conductor 136 can be manufactured. Furthermore, the memory device including the transistor STr1, the transistor STr2, the transistor WTr, and the transistor RTr can be manufactured.

<MOCVD Apparatus and Deposition Method Using MOCVD Method>

Figure 27:
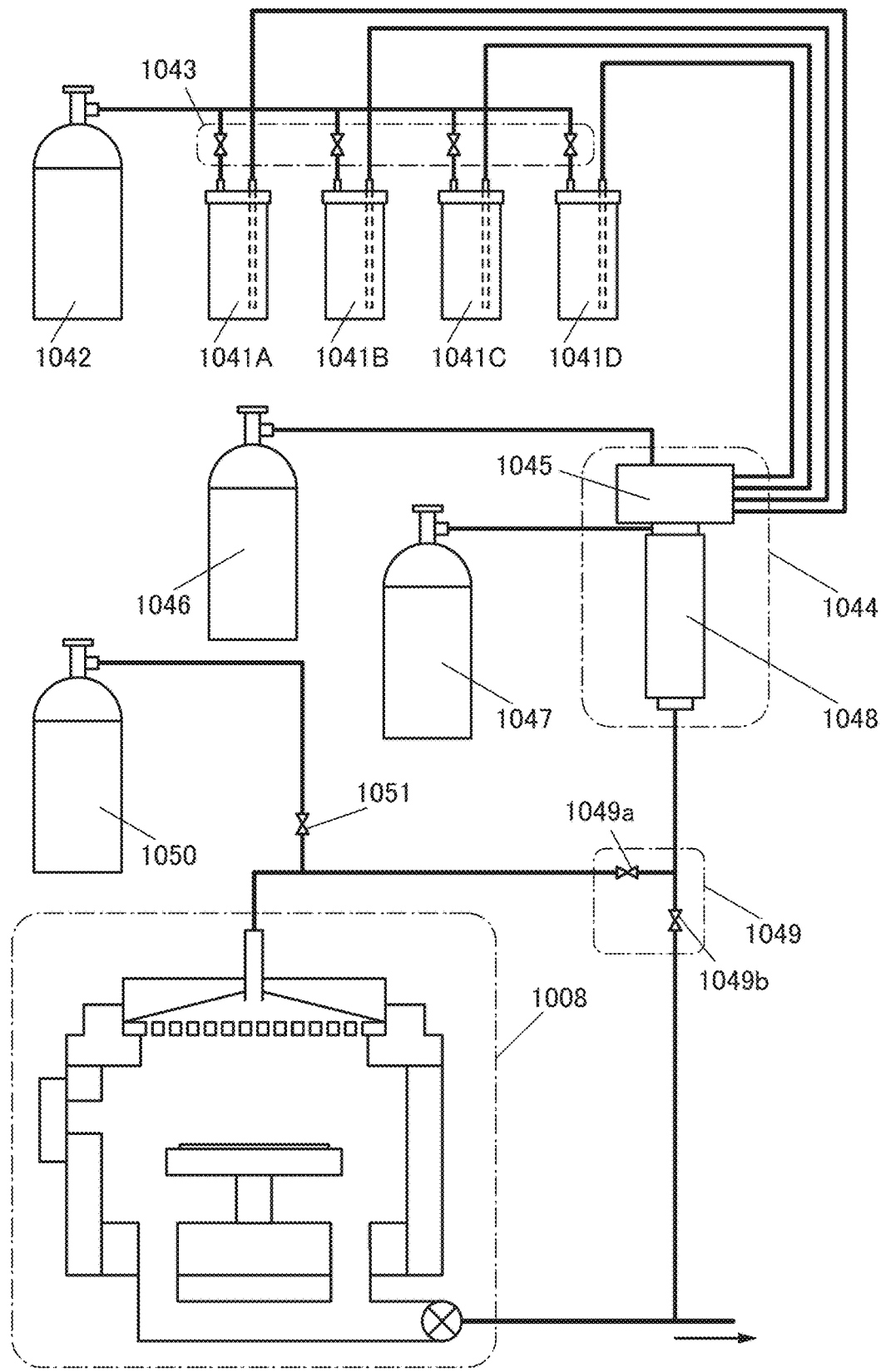
FIG. 27 is a diagram illustrating a structure example of an MOCVD apparatus.

An MOCVD apparatus that can be used for formation of an oxide or the like and a deposition method using an MOCVD method will be described with reference to FIG. 27 and FIG. 28.

In an MOCVD method, liquid materials (also referred to as precursors or metal precursors) are vaporized with a vaporizer and introduced into a chamber to perform deposition. The liquid precursors are held in their respective cylinders 1041 (cylinders 1041A to 1041D). A gas 1042 is supplied into the cylinders 1041 in which the precursors used for deposition are held. As the gas 1042, an inert gas such as helium, argon, or nitrogen can be used. The supply of the gas 1042 can be controlled with a valve 1043, so that the inside of the desired cylinder 1041 can be pressurized. The pressurization of the inside of the cylinder 1041 makes the liquid precursor supplied to a vaporizer 1044. The gas 1042 may be supplied to one of the cylinders 1041 or two or more cylinders 1041 at the same time. Furthermore, although an example where four cylinders 1041 are connected to an MOCVD apparatus is illustrated in FIG. 27, this embodiment is not limited to the example. At least one cylinder 1041 is provided.

Deposition using a plurality of precursors enables formation of films with different compositions. For example, a precursor containing indium is held in the cylinder 1041A, a precursor containing gallium is held in the cylinder 1041B, a precursor containing zinc is held in the cylinder 1041C, and the gas 1042 is supplied to the cylinders 1041A to 1041C at the same time, whereby a film containing indium, gallium, and zinc can be formed. Although the details are described later, by mixing the above-described vaporized precursors with a reaction gas containing oxygen and supplying the mixed gas to a deposition chamber 1008 or 1009, an oxide containing indium, gallium, and zinc can be formed over a wafer 1012 held in the deposition chamber 1008 or 1009.

The precursor supplied to the vaporizer 1044 are supplied first to a dispersion unit 1045. In the case where a plurality of kinds of precursors are used for deposition, these precursors are mixed in the dispersion unit 1045. At this time, a gas 1046 is preferably supplied to the dispersion unit. The gas 1046 is referred to as a primary carrier gas, in some cases. The gas 1046 is used in order to supply the precursor or the mixed precursors from the dispersion unit 1045 to a vaporization unit 1048. As the gas 1046, an inert gas such as helium, argon, or nitrogen can be used.

The precursor or the mixed precursors are heated and vaporized in the vaporization unit 1048. The vaporized precursor is supplied in a direction of valves 1049 by a gas 1047. The gas 1047 is referred to as a secondary carrier gas, in some cases. As the gas 1047, an inert gas such as helium, argon, or nitrogen can be used.

Until the supply of the vaporized precursor and the secondary carrier gas is stabilized, exhaustion is preferably performed without the precursor and the secondary carrier gas supplied to the deposition chamber 1008 or 1009. At this time, by closing a valve 1049a and opening a valve 1049b, the precursor and the secondary carrier gas can be exhausted.

After the supply of the vaporized precursor and the secondary carrier gas is stabilized, the valve 1049a is opened and the valve 1049b is closed. By the supply of the precursor and the secondary carrier gas to the deposition chamber 1008 or 1009, a desired film can be formed over the wafer 1012.

The exhaustion of the precursor and the secondary carrier gas before the stabilization as described above allows a desired amount of precursor or precursors at a desired mixing ratio to be supplied to the deposition chamber 1008 or 1009. The exhaustion of the precursor and the secondary carrier gas before the stabilization allows a film with a desired quality or a desired thickness to be formed over the wafer 1012. Moreover, uniformity of the formed film is improved, which is preferable.

A gas 1050 may be mixed with the precursor and the secondary carrier gas having passed through the valve 1049a. As the gas 1050, a reaction gas such as an oxidizing gas or a nitriding gas is preferably used, for example. As the oxidizing gas, oxygen, ozone, or the like can be used. As the nitriding gas, nitrogen, dinitrogen monoxide, nitrogen dioxide, ammonia, or the like can be used. The supply of the gas 1050 can be controlled with a valve 1051. Furthermore, a mass flow controller or the like may be provided as appropriate to control the supply amount of the gas 1050.

Here, the precursor vaporized by the vaporization unit 1048 might be liquefied or solidified owing to the temperature change. For example, a powder of a component contained in the precursor is generated by solidification, in some cases. Therefore, piping from the vaporization unit 1048 to the deposition chamber 1008 or 1009, the deposition chamber 1008, the deposition chamber 1009, and the exhaustion piping are preferably heated. The heating temperature for the piping and the exhaustion piping is preferably higher than or equal to the heating temperature in the vaporization unit. The heating temperatures in the deposition chamber 1008 and the deposition chamber 1009 can be appropriately determined by a practitioner in consideration of the quality of the film to be deposited, the uniformity of the film, the deposition rate, and the like.

In the above-described manner, a film with high uniformity in thickness and film quality can be formed by the deposition method using the vaporized precursor. In addition, the coverage of a surface having projections and depressions with the film is high. In particular, in an opening having a high aspect ratio, a film with high uniformity in quality and thickness can be formed on a bottom portion of the opening and a side surface of the opening.

Figure 28A:
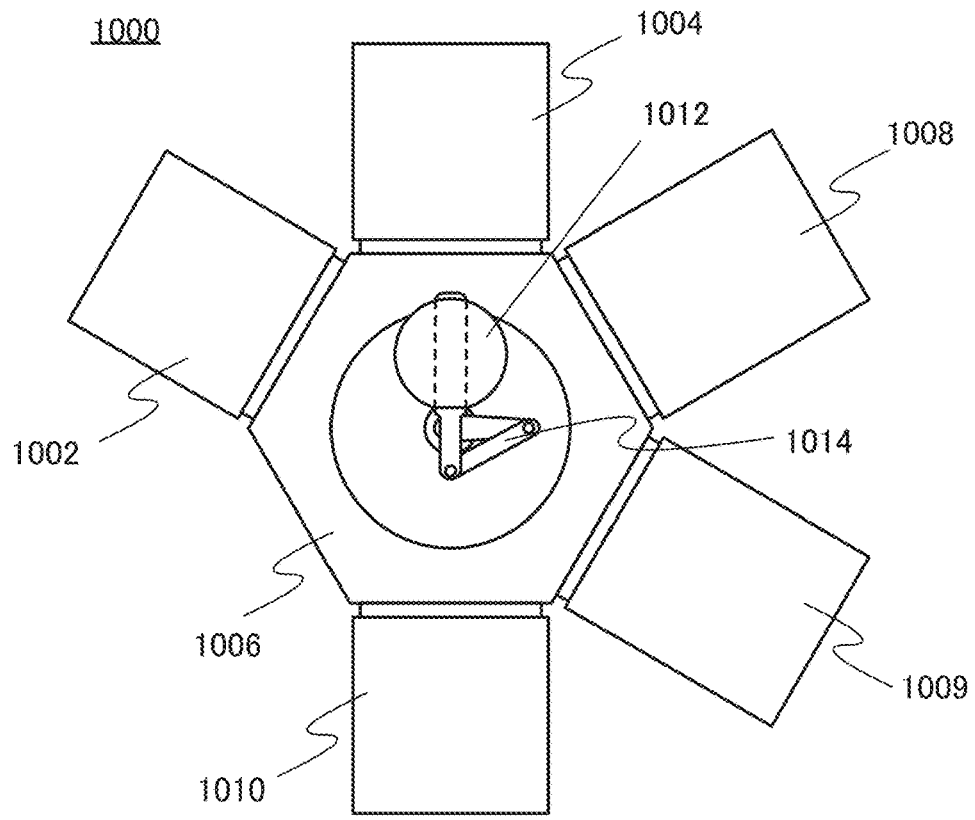
FIG. 28A is a schematic diagram of a multi-chamber deposition apparatus.
Figure 28B:
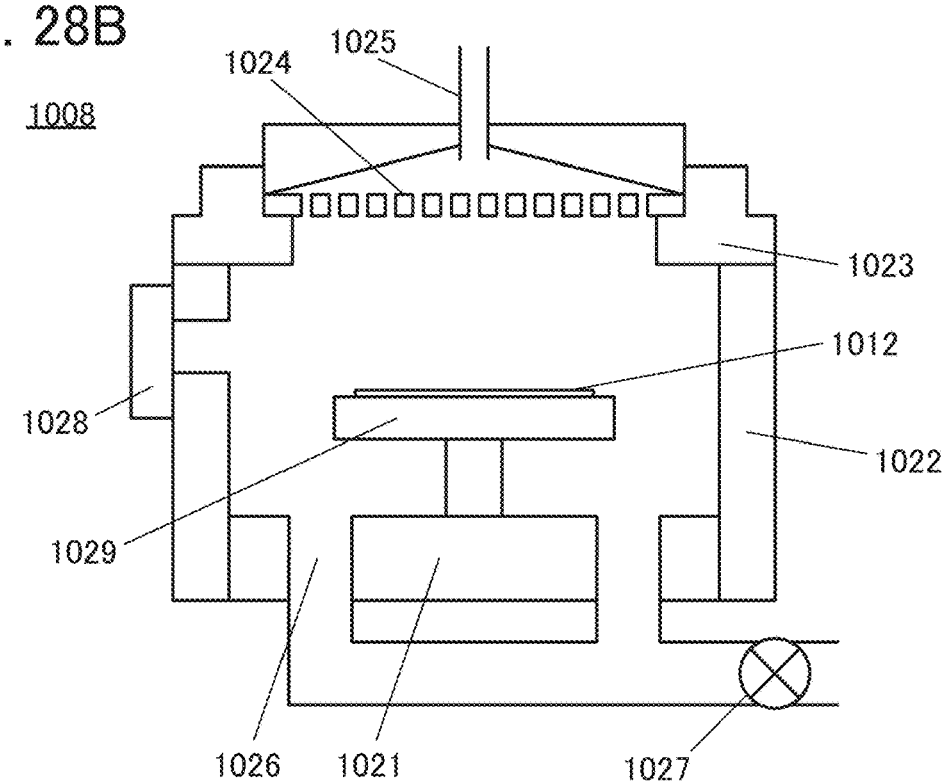
FIG. 28B is a cross-sectional view of a deposition chamber.

Here, as an example of the apparatus capable of deposition by an MOCVD method, a structure example of a deposition apparatus 1000 is described with reference to FIG. 28A and FIG. 28B. FIG. 28A is a schematic diagram of the multi-chamber deposition apparatus 1000, and FIG. 28B is a cross-sectional view of the deposition chamber 1008.

<Structure Example of Deposition Apparatus>

The deposition apparatus 1000 includes a cassette chamber 1002, an alignment chamber 1004, a transfer chamber 1006, the deposition chamber 1008, the deposition chamber 1009, a cooling chamber 1010, and a transfer arm 1014. By the transfer arm 1014, the wafer 1012 can be transferred. Here, the cassette chamber 1002, the alignment chamber 1004, the deposition chamber 1008, the deposition chamber 1009, and the cooling chamber 1010 are connected to the transfer chamber 1006. This enables successive deposition in the deposition chamber 1008 and the deposition chamber 1009 without exposure to the air, preventing entry of impurities into a film. Moreover, contamination of an interface between a substrate and a film and interfaces between films can be reduced, so that clean interfaces can be obtained.

A cassette including a plurality of wafers 1012 can be set in the cassette chamber 1002. One or more cassettes can be set. By the transfer arm 1014, the wafer 1012 in the cassette is taken out and, after treatment such as deposition, returned to a desired cassette in the cassette chamber 1002.

In the alignment chamber 1004, the positional alignment of the wafer 1012 over the transfer arm 1014 is performed. The wafer 1012 taken out from the cassette chamber 1002 is preferably subjected to positional alignment before being transferred to the deposition chamber 1008 or 1009. Furthermore, the positional alignment may be performed after the treatment such as deposition is performed and before the wafer 1012 is returned to the cassette chamber 1002.

In the deposition chamber 1008 and the deposition chamber 1009, deposition on the wafer 1012 is performed.

In the cooling chamber 1010, the temperature of the wafer 1012 processed in the deposition chamber 1008 or the deposition chamber 1009 is adjusted. For example, in the case where the treatment performed in the deposition chamber 1008 or the deposition chamber 1009 is performed in a heating atmosphere, the wafer 1012 is preferably transferred out to the cassette chamber 1002 after temperature adjustment is performed in the cooling chamber 1010 to avoid rapid cooling of the heated wafer 1012.

Note that in order to prevent attachment of moisture and the like, the cassette chamber 1002, the alignment chamber 1004, the transfer chamber 1006, the deposition chamber 1008, the deposition chamber 1009, and the cooling chamber 1010 are preferably filled with an inert gas (such as a nitrogen gas) whose dew point is controlled, and desirably maintain reduced pressure.

Furthermore, an MOCVD apparatus can be used in the deposition chamber 1008 and the deposition chamber 1009. A structure using a deposition apparatus other than an MOCVD apparatus in either of the deposition chamber 1008 and the deposition chamber 1009 may be employed. Examples of the deposition apparatus that is used in the deposition chamber 1008 and the deposition chamber 1009 include a sputtering apparatus, a PECVD apparatus, a TCVD apparatus, and an ALD apparatus Although the deposition apparatus 1000 has a structure including the cassette chamber 1002, the alignment chamber 1004, the transfer chamber 1006, the deposition chamber 1008, the deposition chamber 1009, and the cooling chamber 1010, the present invention is not limited thereto. The deposition apparatus 1000 may have a structure including three or more deposition chambers or a structure added with a treatment chamber for performing heat treatment or plasma treatment. The deposition apparatus 1000 may be of a single-wafer type or may be of a batch type, in which case deposition is performed on a plurality of substrates at a time.

<MOCVD Apparatus>

Next, a structure of the deposition chamber 1008 in the case where an MOCVD apparatus is used is described with reference to FIG. 28B. The deposition chamber 1008 includes a bottom outer wall 1021, a side outer wall 1022, and a top outer wall 1023. The top outer wall 1023 is provided with a material inlet 1025 and a shower plate 1024. The side outer wall 1022 is provided with a gate valve 1028 for transferring in and out the wafer 1012. The bottom outer wall 1021 is provided with an exhaustion portion 1026, an exhaustion valve 1027, and a stage 1029. Note that the bottom outer wall 1021, the side outer wall 1022, and the top outer wall 1023 are preferably provided with a heater for controlling the temperature during the deposition. Note that the bottom outer wall 1021, the side outer wall 1022, and the top outer wall 1023 are not necessarily provided independently. For example, the bottom outer wall 1021, the side outer wall 1022, and the top outer wall 1023 may be formed as one united wall. Alternatively, the bottom outer wall 1021 and the side outer wall 1022 may be formed as one united wall, and the top outer wall 1023 may function as a lid.

A gas containing a precursor vaporized by the vaporization unit 1048 is introduced from the material inlet 1025 into the deposition chamber 1008 and supplied through the shower plate 1024 to the wafer 1012 over the stage 1029. The supplied gas is deposited on the wafer 1012 to form a film. The gas that is not used for the formation of the film or an excess gas is exhausted from the exhaustion portion 1026 to the outside of the deposition chamber 1008.

This embodiment can be implemented in combination with any of the structures described in the other embodiments and the like, as appropriate.

Embodiment 2

Figure 29:
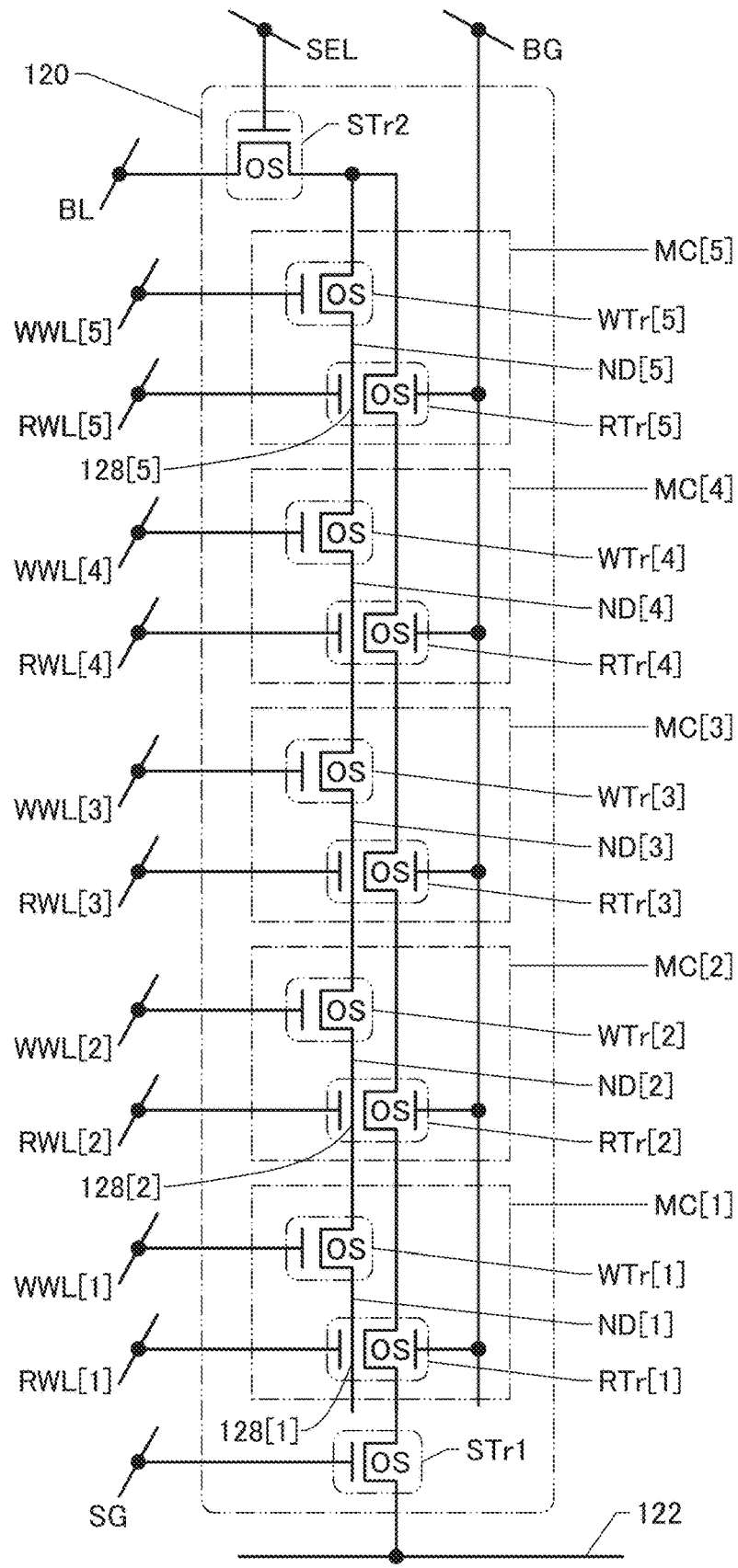
FIG. 29 is a diagram illustrating a circuit structure example of a memory string.
Figure 30:
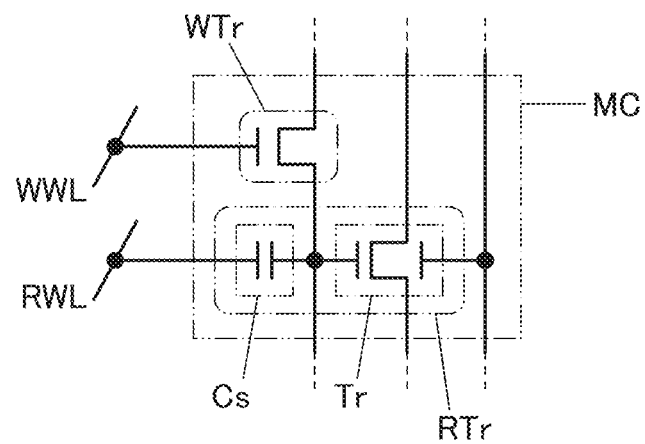
FIG. 30 is an equivalent circuit diagram of a memory element MC.

In this embodiment, a circuit structure and operations of the memory string 120 that is a memory device will be described. FIG. 29 illustrates a circuit structure example of the memory string 120. FIG. 30 is an equivalent circuit diagram of a memory element MC.

<Circuit Structure Example of Memory String>

FIG. 29 illustrates a circuit structure example of the memory string 120 including five memory elements MC. The memory elements MC include the transistors WTr and the transistors RTr. In FIG. 29, the transistor WTr included in the memory element MC[1] is referred to as a transistor WTr[1], and the transistor RTr included in the memory element MC[1] is referred to as a transistor RTr[1]. Accordingly, the memory string 120 illustrated in FIG. 29 includes the transistor WTr[1] to a transistor WTr[5] and the transistor RTr[1] to a transistor RTr[5]. Furthermore, the memory string 120 illustrated in FIG. 29 includes the transistor STr1 and the transistor STr2. The memory string 120 is a NAND memory device.

A NAND memory device including the OS memory is referred to as an "OS NAND type" or an "OS NAND memory device." An OS NAND memory device in which a plurality of OS memories are stacked in the Z direction is referred to as a "3D OS NAND type" or a "3D OS NAND memory device."

To clarify that a transistor is an OS transistor in an equivalent circuit diagram and the like, "OS" is sometimes written beside a circuit symbol of the transistor. Similarly, to clarify that a transistor is a Si transistor (a transistor using silicon in a semiconductor layer in which a channel is formed), "Si" is sometimes written beside a circuit symbol of the transistor. FIG. 29 illustrates that the transistors WTr and the transistors RTr are OS transistors.

The transistor WTr is preferably a normally-off transistor, and the transistor RTr is preferably a normally-on transistor. As described in the above embodiment, the transistor RTr includes the conductor 128 between the gate and the semiconductor layer. The conductor 128 can function as a floating gate of the transistor RTr. For example, the conductor 128 included in the transistor RTr[1] is referred to as a conductor 128[1].

A node where the conductor 128 and one of a source and a drain of the transistor WTr are electrically connected to each other is referred to as a node ND. For example, a node where the conductor 128[1] and one of a source and a drain of the transistor WTr[1] are electrically connected to each other is referred to as a node ND[1].

One of a source and a drain of the transistor RTr[1] is electrically connected to one of a source and a drain of the transistor STr1, and the other thereof is electrically connected to one of a source and a drain of the transistor RTr[2]. The gate of the transistor RTr[1] is electrically connected to the conductor RWL[1]. The back gate of the transistor RTr[1] is electrically connected to the conductor BG. The one of the source and the drain of the transistor WTr[1] is electrically connected to the conductor 128[1] and the other thereof is electrically connected to a conductor 128[2]. The gate of the transistor WTr[1] is electrically connected to the conductor WWL[1]. The other of the source and the drain of the transistor STr1 is electrically connected to the conductor 122, and the gate of the transistor STr1 is electrically connected to the conductor SG.

Here, as illustrated in FIG. 30, the transistor RTr can be replaced with a capacitor Cs and a transistor Tr. A gate of the transistor Tr is electrically connected to the conductor RWL through the capacitor Cs.

One of a source and a drain of the transistor RTr[5] is electrically connected to the other of a source and a drain of the transistor RTr[4], and the other thereof is electrically connected to the one of the source and the drain of the transistor STr2. The gate of the transistor RTr[5] is electrically connected to the conductor RWL[5]. The back gate of the transistor RTr[5] is electrically connected to the conductor BG. One of a source and a drain of the transistor WTr[5] is electrically connected to a conductor 128[5], and the other thereof is electrically connected to the one of the source and the drain of the transistor STr2. The gate of the transistor WTr[5] is electrically connected to the conductor WWL[5]. The other of the source and the drain of the transistor STr2 is electrically connected to the conductor BL, and the gate of the transistor STr2 is electrically connected to the conductor SEL.

In the case where the memory string 120 includes n memory elements MC (n is an integer greater than or equal to 1), in an i-th (i is an integer greater than or equal to 1 and less than or equal to n) memory element MC[i] except the first and n-th memory elements MC, one of a source and a drain of a transistor RTr[i] is electrically connected to the other of a source and a drain of a transistor RTr[i−1], and the other thereof is electrically connected to one of a source and a drain of a transistor RTr[i+1]. A gate of the transistor RTr[i] is electrically connected to a conductor RWL[i]. A back gate of the transistor RTr[i] is electrically connected to the conductor BG. One of a source and a drain of a transistor WTr[i] is electrically connected to a conductor 128[i] and the other thereof is electrically connected to a conductor 128[i+1]. A gate of the transistor WTr[i] is electrically connected to a conductor WWL[i].

The transistor STr1 and the transistor STr2 may be OS transistors or Si transistors, for example. One of the transistor STr1 and the transistor STr2 may be an OS transistor, and the other may be a Si transistor. Note that in the case where both the transistors WTr and the transistors RTr are formed of OS transistors, the transistor STr1 and the transistor STr2 are preferably also formed of OS transistors. By using the same semiconductor material for the transistors, productivity of the semiconductor device can be increased.

Figure 31:
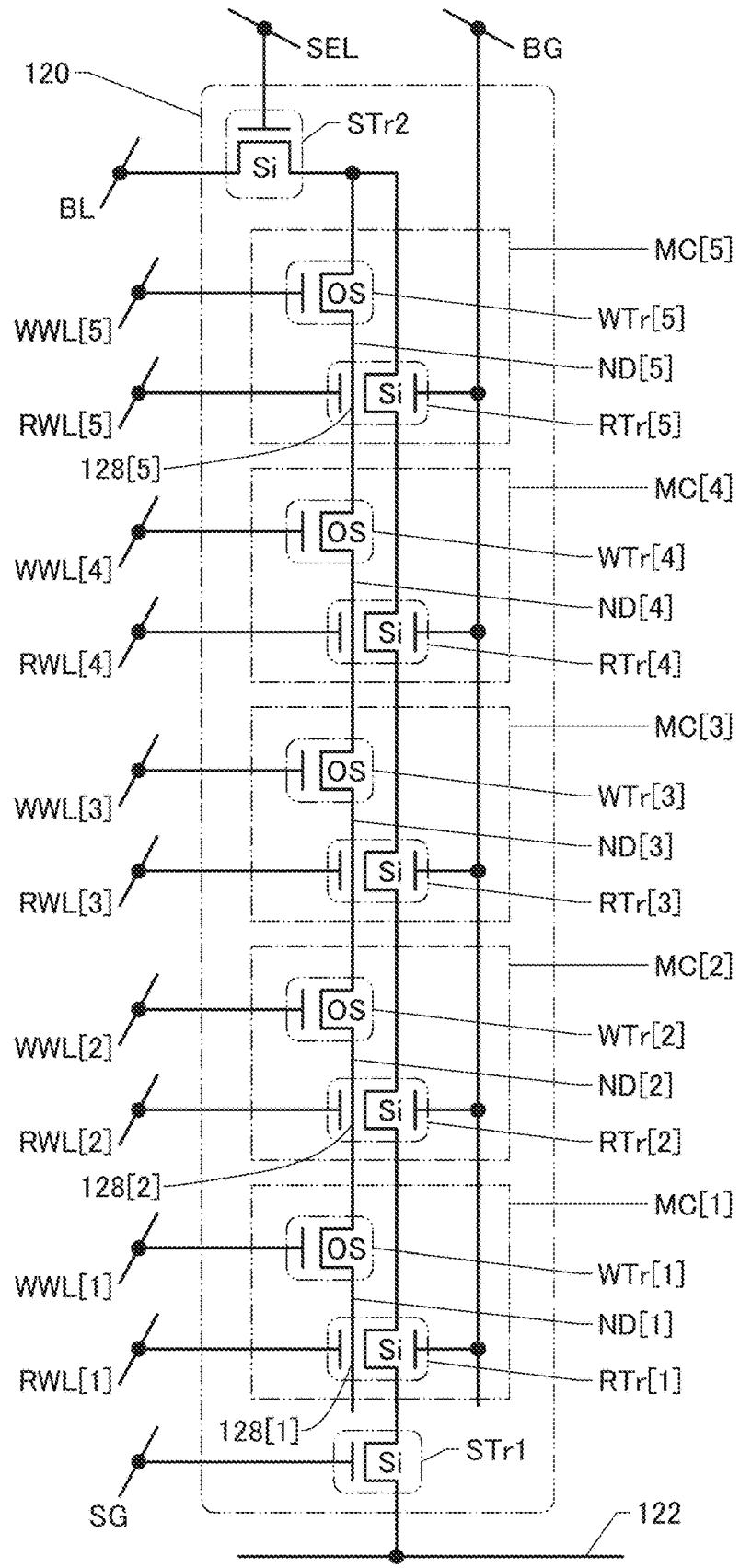
FIG. 31 is a diagram illustrating a circuit structure example of a memory string.

Alternatively, OS transistors may be used as the transistors WTr, and Si transistors may be used as the transistors RTr. FIG. 31 is an equivalent circuit diagram of the memory string 120 in the case where OS transistors are used as the transistors WTr and Si transistors are used as the transistors RTr. FIG. 31 illustrates an example in which Si transistors are used as the transistor STr1 and the transistor STr2.

In the case where the transistors RTr are formed of Si transistors, polycrystalline silicon is used as the semiconductor 125, for example. In the case where OS transistors are used as the transistors WTr, CAAC-IGZO is used as the semiconductor 127, for example.

Figure 32:
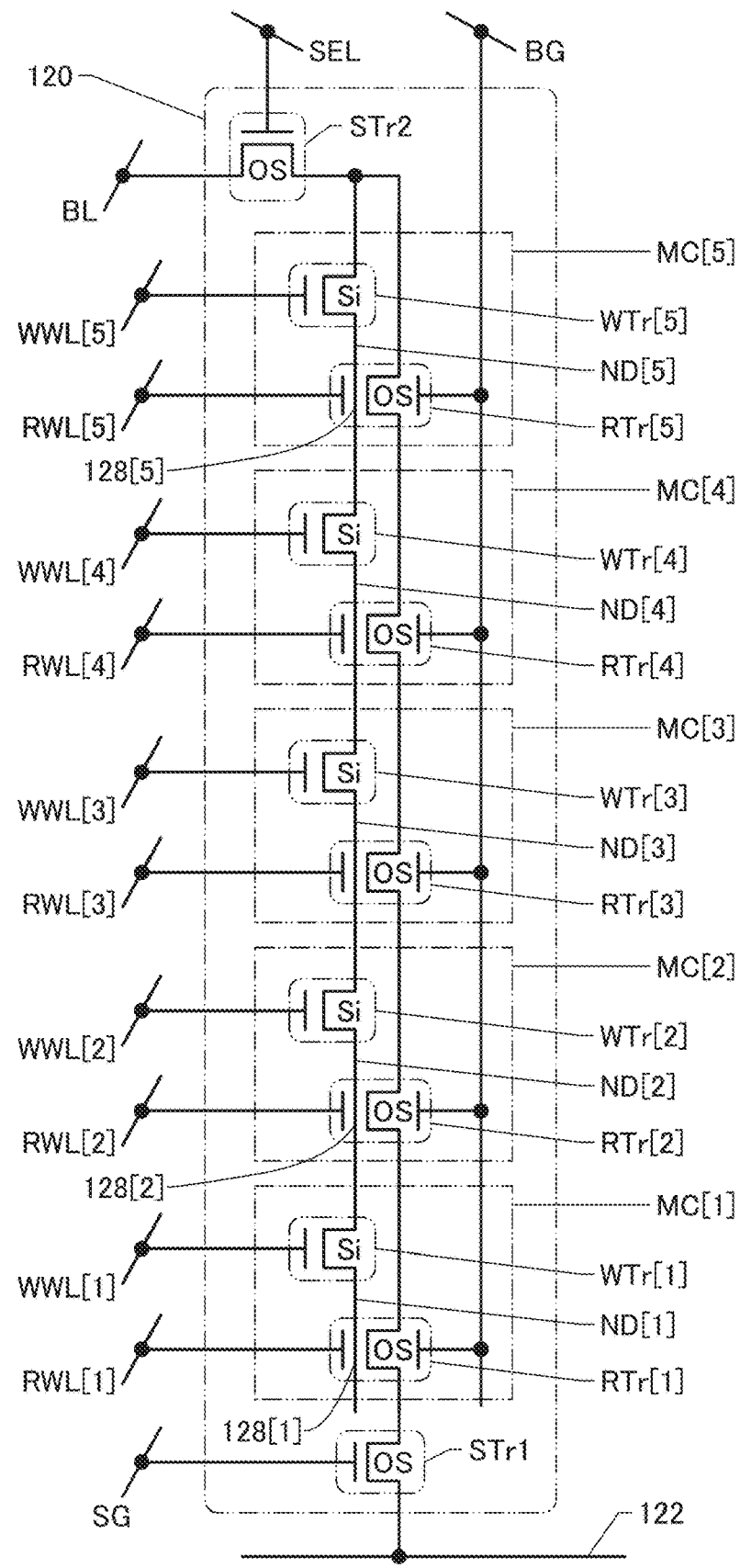
FIG. 32 is a diagram illustrating a circuit structure example of a memory string.

As illustrated in FIG. 32, Si transistors may be used as the transistors WTr and OS transistors may be used as the transistors RTr depending on the purpose, application, or the like. FIG. 32 illustrates an example in which OS transistors are used as the transistor STr1 and the transistor STr2.

Figure 33:
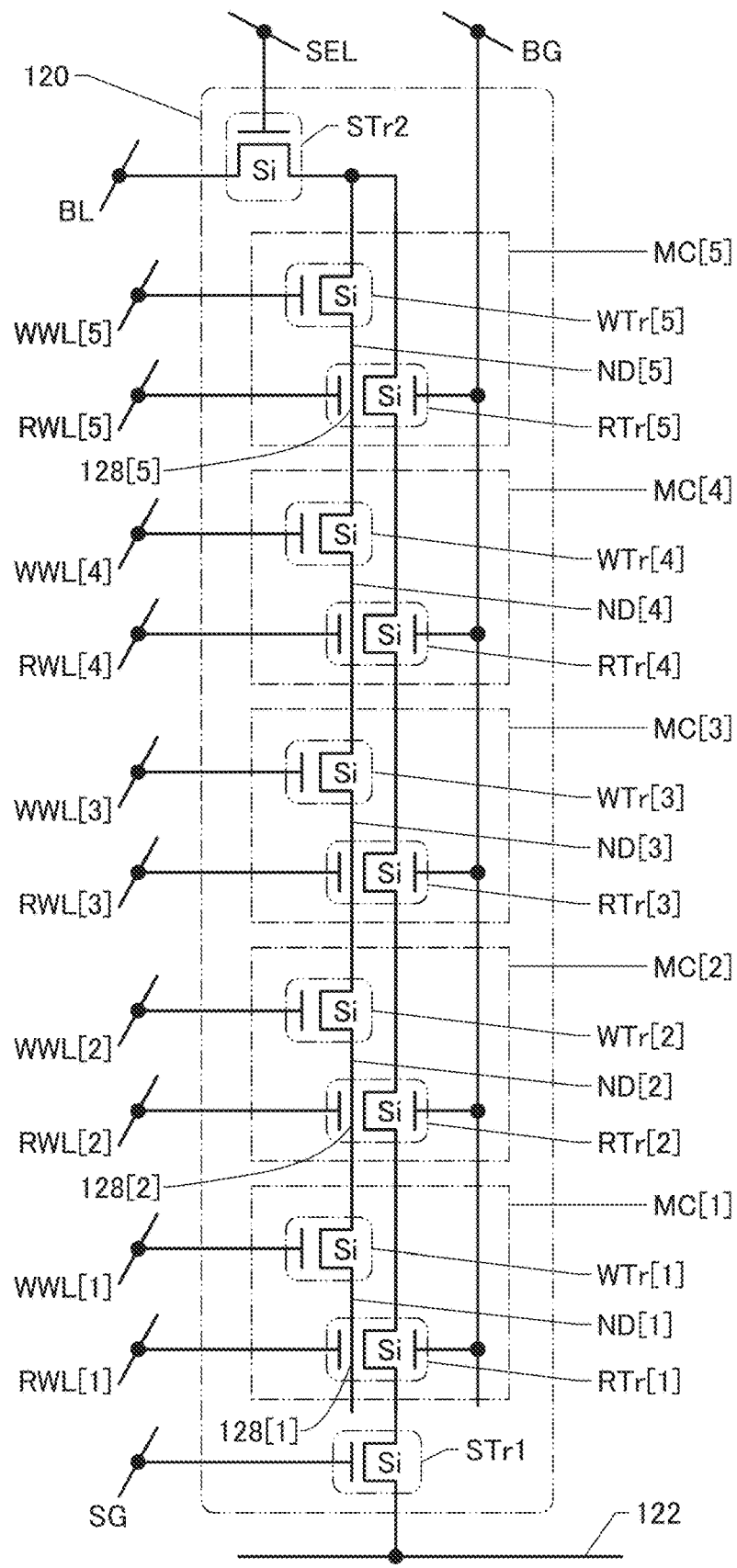
FIG. 33 is a diagram illustrating a circuit structure example of a memory string.

As illustrated in FIG. 33, Si transistors may be used as both the transistors WTr and the transistors RTr depending on the purpose, application, or the like. In the case where Si transistors are used as both the transistors WTr and the transistors RTr, Si transistors are preferably also used as the transistor STr1 and the transistor STr2.

<Operation Example of Memory String>

Next, an operation example of the memory string 120 illustrated in FIG. 29 is described.

[Writing Operation]

Figure 34:
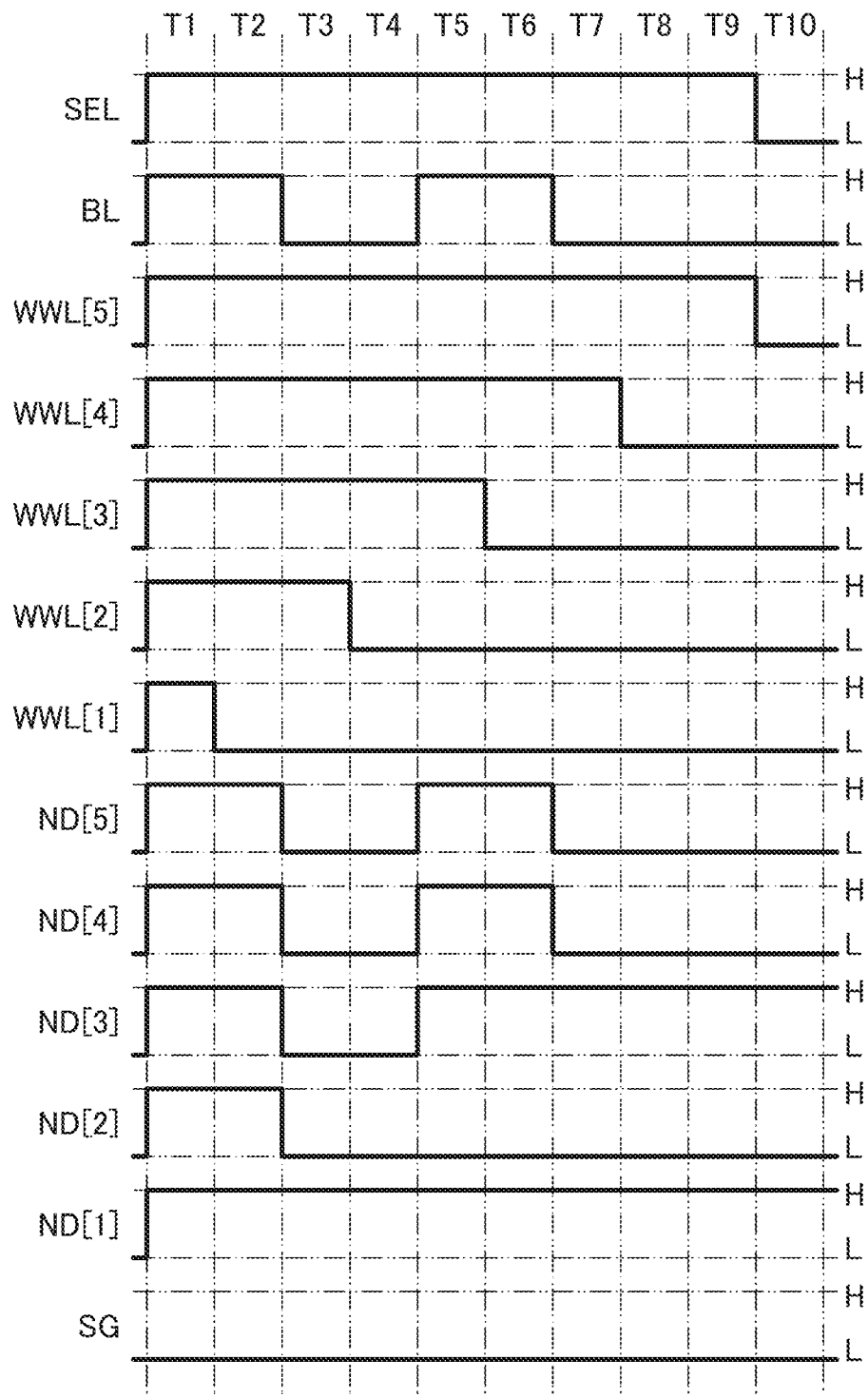
FIG. 34 is a timing chart showing a writing operation example of a memory string.

In this embodiment, an operation example of the case where the H potential is written to the memory element MC[1] and a memory element MC[3] and the L potential is written to the other memory elements MC is described. FIG. 34 is a timing chart showing a writing operation. FIG. 35A to FIG. 39B are circuit diagrams for explaining the writing operation.

In an initial state, it is assumed that the L potential is written to the memory element MC[1] to the memory element MC[5]. Furthermore, it is assumed that the L potential is supplied to the conductor WWL[1] to the conductor WWL[5], the conductor RWL[1] to the conductor RWL[5], the conductor SEL, the conductor BG, the conductor BL, the conductor SG, and the conductor 122. Note that the conductor BG can control the threshold of the transistor RTr. The potential supplied to the conductor BG may be adjusted appropriately so that the transistor RTr can be a desired normally-on transistor.

[Period T1]

In Period T1, the H potential is supplied to the conductor WWL[1] to the conductor WWL[5], the conductor BL, and the conductors SEL (see FIG. 35A). Then, the node ND[1] to a node ND[5] have the H potential.

[Period T2]

In Period T2, the L potential is supplied to the conductor WWL[1] (see FIG. 35B). This brings the transistor WTr[1] into an off state, and charge written to the node ND[1] is retained. Here, the charge corresponding to the H potential is retained in the node ND[1].

[Period T3]

Figure 36A:
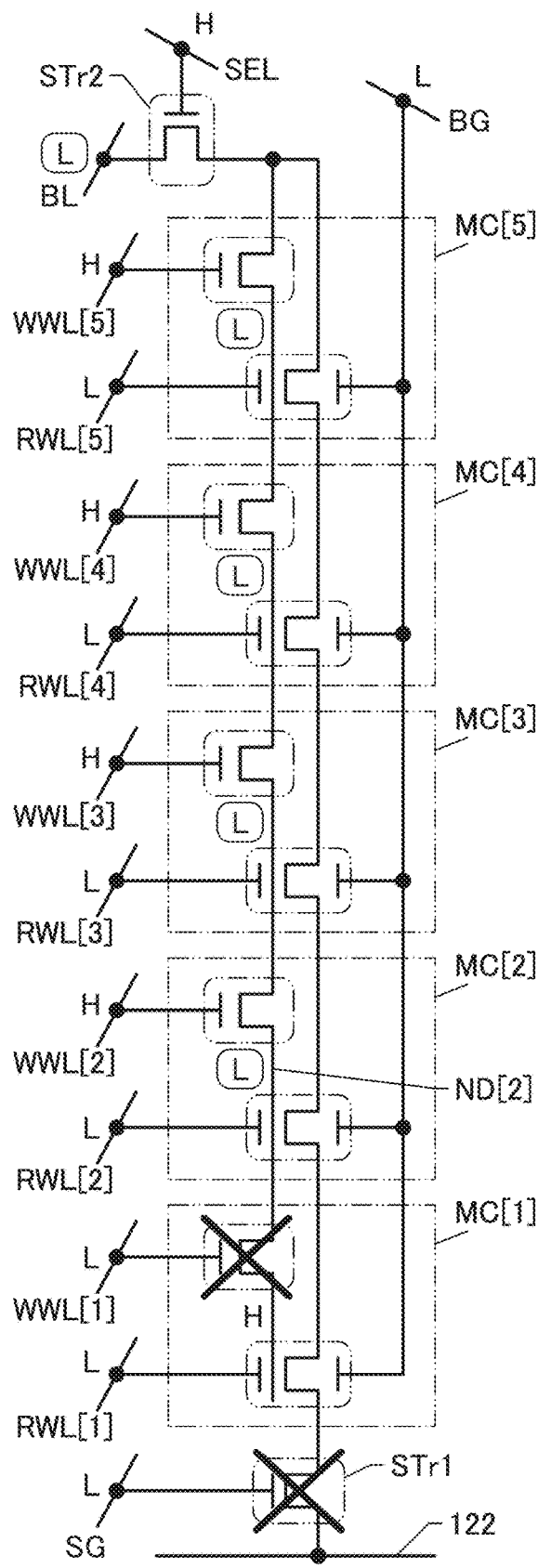
FIG. 36A and FIG. 36B are circuit diagrams illustrating the writing operation example of the memory string.

In Period T3, the L potential is supplied to the conductor BL (see FIG. 36A). This brings the potentials of a node ND[2] to the node ND[5] to the L potential. In this case, the conductor 128[2] to the conductor 128[5] are also brought to the L potential; however, since the transistors RTr are normally-on transistors, the transistor RTr[2] to the transistor RTr[5] are not brought into an off state.

[Period T4]

Figure 36B:
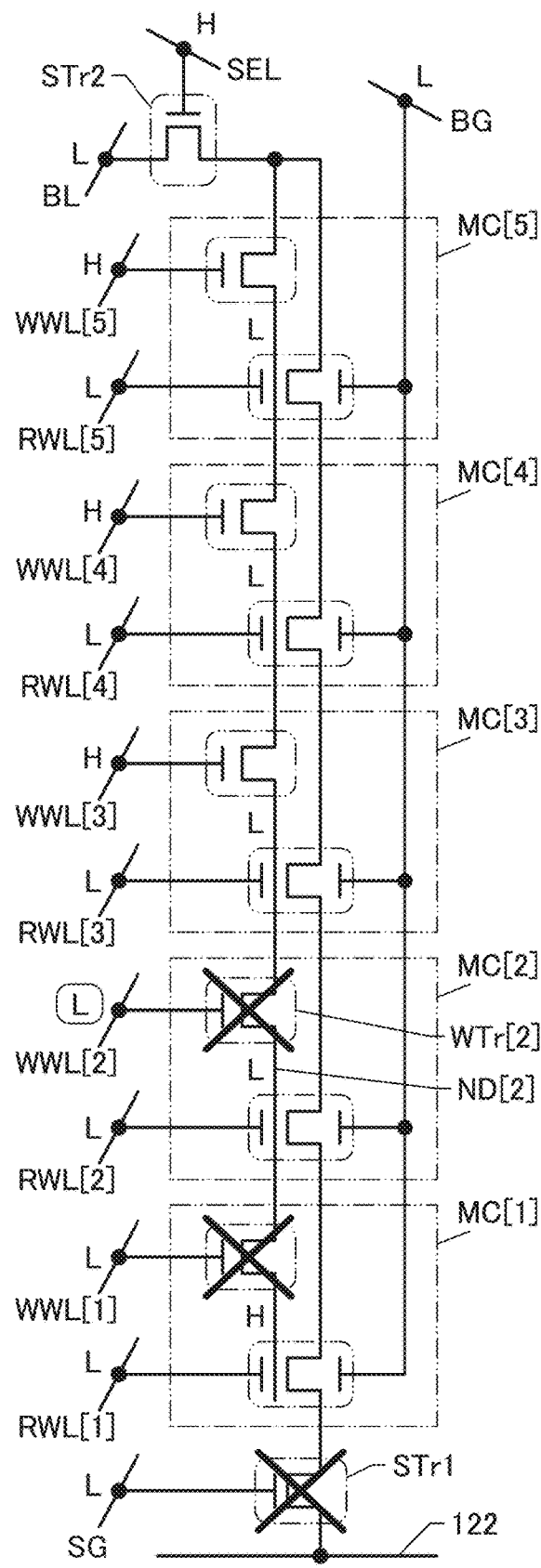

In Period T4, the L potential is supplied to the conductor WWL[2] (see FIG. 36B). This brings the transistor WTr[2] into an off state, and charge written to the node ND[2] is retained. Here, the charge corresponding to the L potential is retained in the node ND[2].

[Period T5]

Figure 37A:
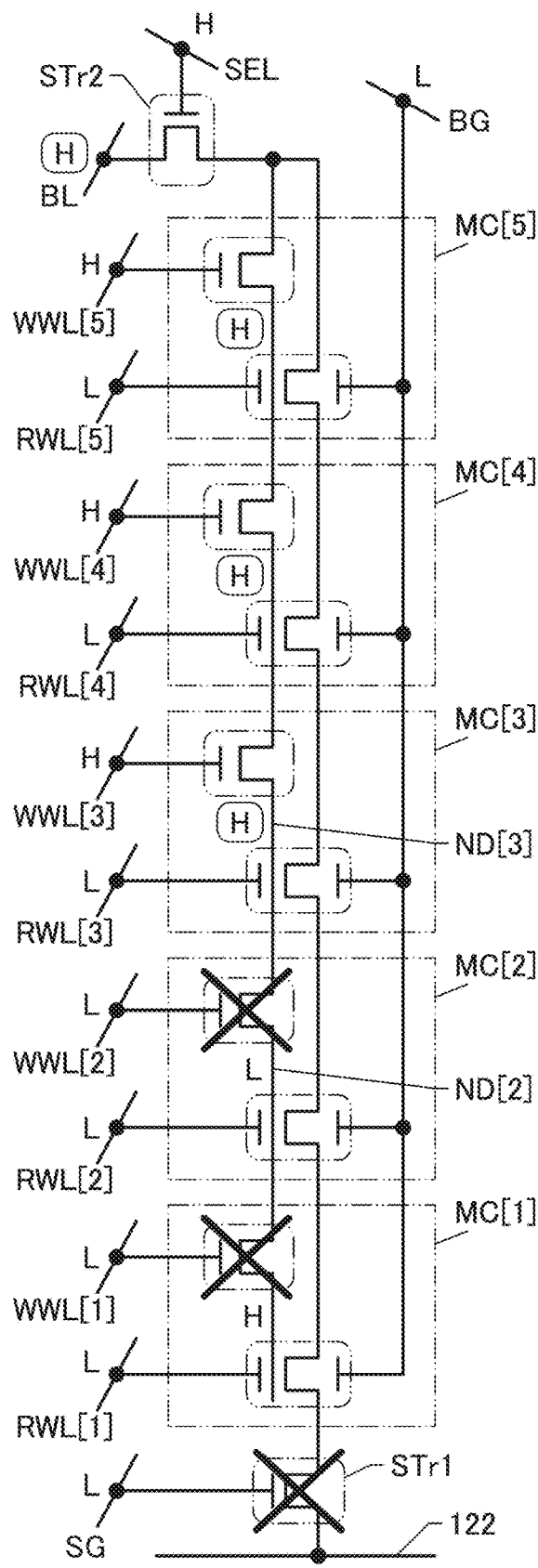
FIG. 37A and FIG. 37B are circuit diagrams illustrating the writing operation example of the memory string.

In Period T5, the H potential is supplied to the conductor BL (see FIG. 37A). This brings the potentials of a node [3] to the node [5] to the H potential.

[Period T6]

Figure 37B:
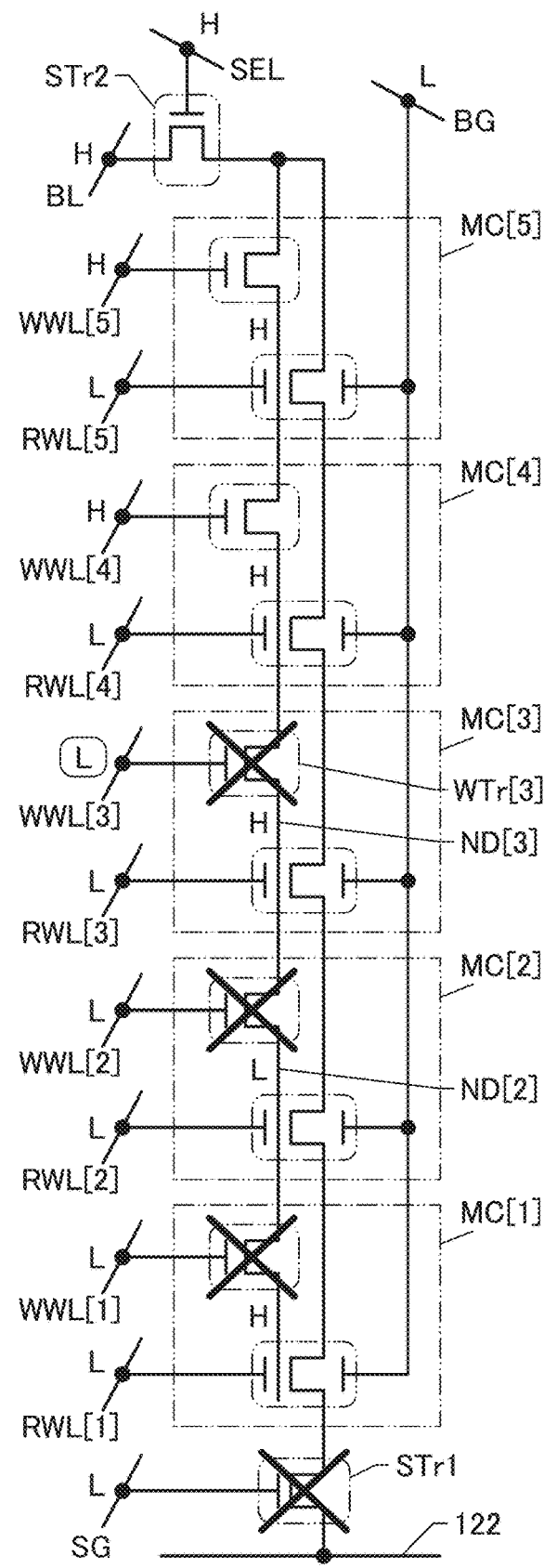

In Period T6, the L potential is supplied to the conductor WWL[3] (see FIG. 37B). This brings the transistor WTr[3] into an off state, and charge written to the node ND[3] is retained. Here, the charge corresponding to the H potential is retained in the node ND[3].

[Period T7]

Figure 38A:
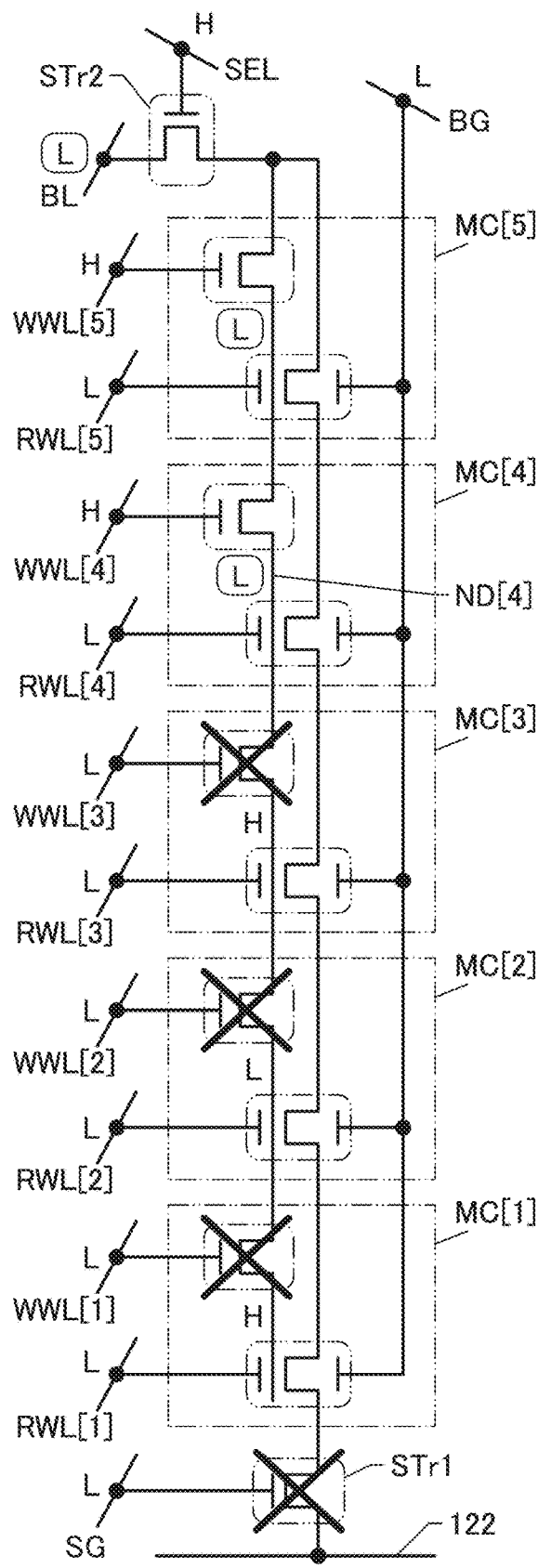
FIG. 38A and FIG. 38B are circuit diagrams illustrating the writing operation example of the memory string.

In Period T7, the L potential is supplied to the conductor BL (see FIG. 38A). This brings the potentials of the node ND[4] and the node ND[5] to the L potential.

[Period T8]

Figure 38B:
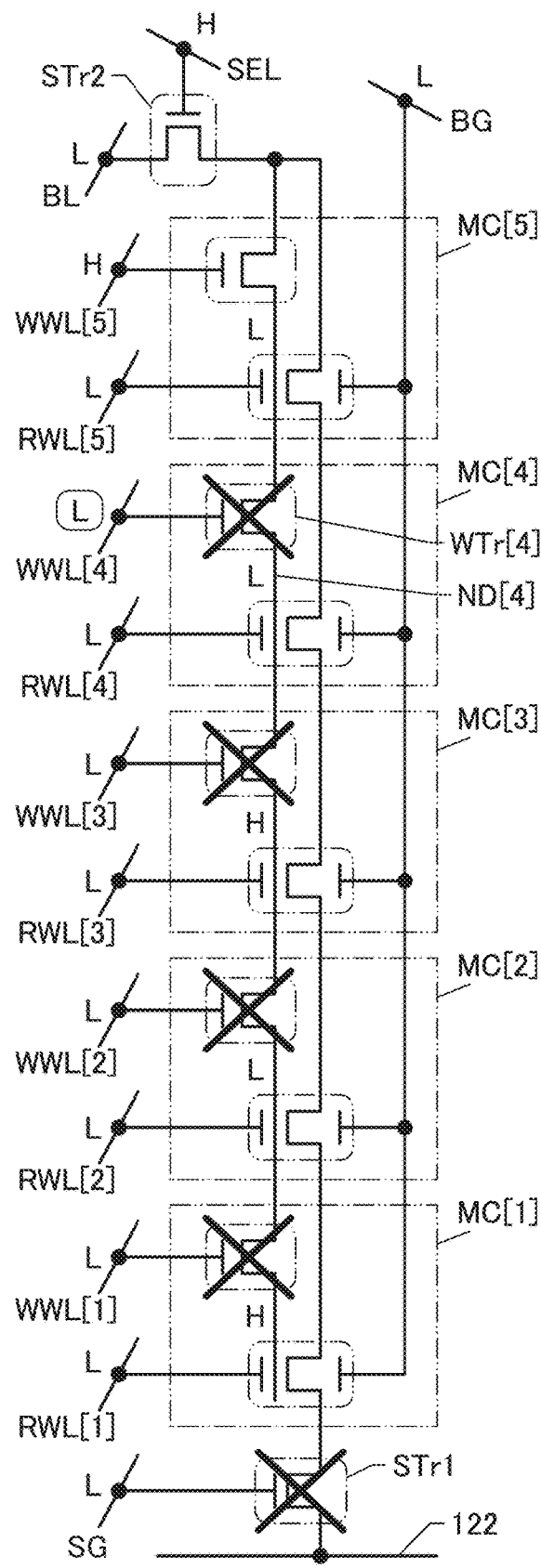

In Period T8, the L potential is supplied to the conductor WWL[4] (see FIG. 38B). This brings the transistor WTr[4] into an off state, and charge written to the node ND[4] is retained. Here, the charge corresponding to the L potential is retained in the node ND[4].

[Period T9]

In Period T9, the conductor BL remains at the L potential. Thus, the potential of the node ND[5] also remains at the L potential (see FIG. 39A).

[Period T10]

In Period T10, the L potential is supplied to the conductor WWL[5] (see FIG. 39B). This brings the transistor WTr[5] into an off state, and charge written to the node ND[5] is retained. Here, the charge corresponding to the L potential is retained in the node ND[5]. Furthermore, the L potential is supplied to the conductor SEL.

In this manner, data can be written to the memory elements MC.

Note that in the case where data is written to the i-th (except for i=1) memory element MC among the plurality of memory elements MC, a data writing operation for the memory elements MC up to the (i−1)-th memory element can be omitted. For example, in the case where data is written to a memory element MC[4], a data writing operation for the memory element MC[1] to the memory element MC[3] may be omitted. In other words, the writing operation from Period T1 to Period T6 described in this embodiment can be omitted. Therefore, the time and consumed power for the writing operation of the memory device can be reduced.

[Reading operation]

A reading operation example of the memory string 120 with the above-described circuit structure is described. In an initial state, it is assumed that the H potential is retained in the memory element MC[1] and the memory element MC[3]. Furthermore, it is assumed that the L potential is supplied to the conductor WWL[1] to the conductor WWL[5], the conductor RWL[1] to the conductor RWL[5], the conductor SEL, the conductor BG, the conductor BL, the conductor SG, and the conductor 122. FIG. 40A and FIG. 40B are timing charts showing a reading operation. FIG. 41A to FIG. 42B are circuit diagrams for explaining the reading operation.

<<Case where Retained Potential is H Potential>>

First, a reading operation for the memory element MC[3] where the H potential is retained is described.

[Period T11]

In Period T11, the H potential is supplied to the conductor RWL[1] to the conductor RWL[5] and the conductor SEL (see FIG. 41A). This brings the transistor STr2 into an on state, and the semiconductor 127 included in the transistors RTr and the conductor BL are brought into conduction. In this state, the conductor BL and the semiconductor 127 are precharged with the H potential and both brought into a floating state.

Figure 43A:
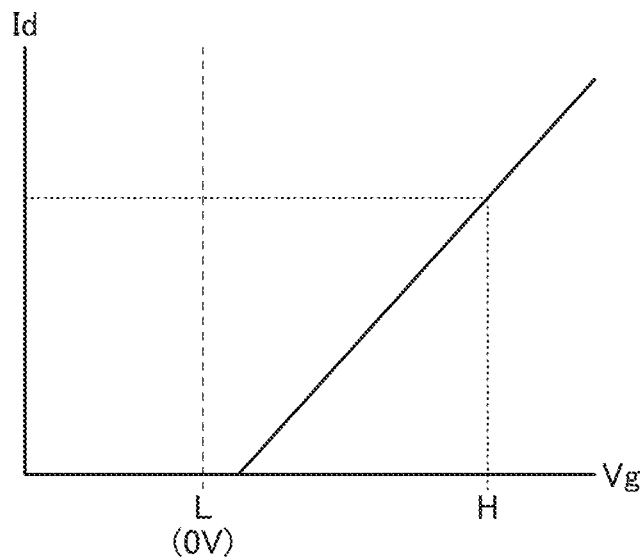
FIG. 43A and FIG. 43B are diagrams showing Id-Vg characteristics of transistors.
Figure 43B:
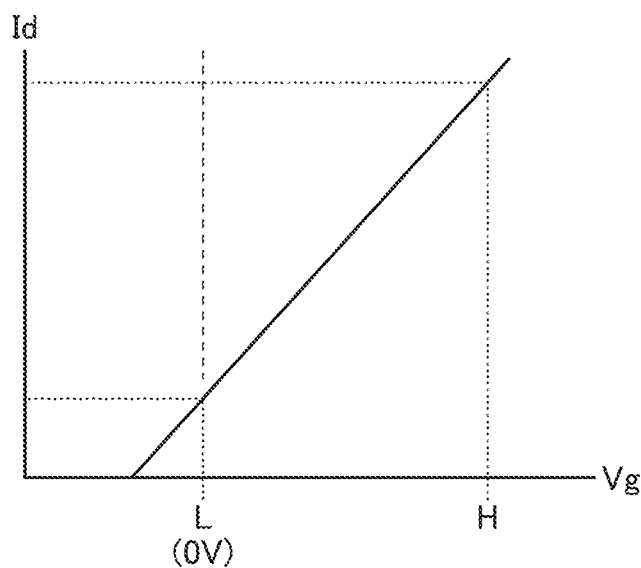

Here, Id-Vg characteristics of transistors are described. FIG. 43A and FIG. 43B are diagrams showing Id-Vg characteristics of transistors. In FIG. 43A and FIG. 43B, the horizontal axis represents the gate voltage (Vg) and the vertical axis represents the drain current (Id). FIG. 43A shows Id-Vg characteristics of a normally-off transistor, and FIG. 43B shows Id-Vg characteristics of a normally-on transistor.

The H potential is higher than the L potential. When the L potential is 0 V, the H potential is a positive voltage. In a normally-off transistor, the channel resistance (channel resistance between the source and the drain) at the time when Vg is the L potential (0 V) is extremely high and Id hardly flows. Furthermore, when Vg becomes the H potential, the channel resistance lowers and Id increases (see FIG. 43A).

In a normally-on transistor, even when Vg is the L potential, the channel resistance is low and a large amount of Id flows compared with the case of the normally-off transistor. Furthermore, when Vg becomes the H potential, the channel resistance becomes further low and Id increases more (see FIG. 43B).

Since the transistors RTr are normally-on transistors, even with the potential of the conductors RWL kept at the L potential, precharging of the semiconductor 127 is possible. However, supplying the H potential to the conductors RWL lowers the on resistance of the transistors RTr, and therefore, the time and consumed power necessary for precharging can be reduced.

[Period T12]

In Period T12, the L potential is supplied to the conductor RWL[3] (see FIG. 41B). Since the H potential is retained in the node ND[3], even when the potential of the conductor RWL[3] becomes the L potential, the channel resistance of the transistor RTr[3] is low.

[Period T13]

In Period T13, the H potential is supplied to the conductor SG to bring the transistor STr1 into an on state (see FIG. 42A). This brings the conductor BL and the conductor 122 into conduction. At this time, since the H potential is supplied to the conductor RWL[1], the conductor RWL[2], the conductor RWL[4], and the conductor RWL[5], the channel resistances of the transistor RTr[1], the transistor RTr[2], the transistor RTr[4], and the transistor RTr[5] are low regardless of the potentials of the nodes ND. Although the L potential is supplied to the conductor RWL[3], the H potential is retained in the node ND[3] and thus the channel resistance of the transistor RTr[3] is also low. Hence, the potential of the conductor BL in a floating state changes abruptly from the H potential to the L potential (see FIG. 40A).

[Period T14]

In Period T14, the L potential is supplied to the conductor SEL, the conductors RWL, and the conductor SG (see FIG. 42B).

<<Case where Retained Potential is L Potential>>

First, a reading operation for the memory element MC[2] where the L potential is retained is described. In the case where the data (potential) retained in the memory element MC[2] is read, the potential of the conductor RWL[2] is set at the L potential in Period T12 (see FIG. 40B). At this time, since the L potential is retained in the node ND[2], the channel resistance of the transistor RTr[2] remains high.

Next, in Period T13, the H potential is supplied to the conductor SG to bring the conductor BL and the conductor 122 into conduction. At this time, since the channel resistance of the transistor RTr[2] is high, the potential of the conductor BL gently changes from the H potential toward the L potential.

In this manner, by setting the potential of the conductor RWL corresponding to the memory element MC of a reading target at the L potential in Period T12 and Period T13, data retained in the memory element MC can be found.

<Variation>

Figure 44:
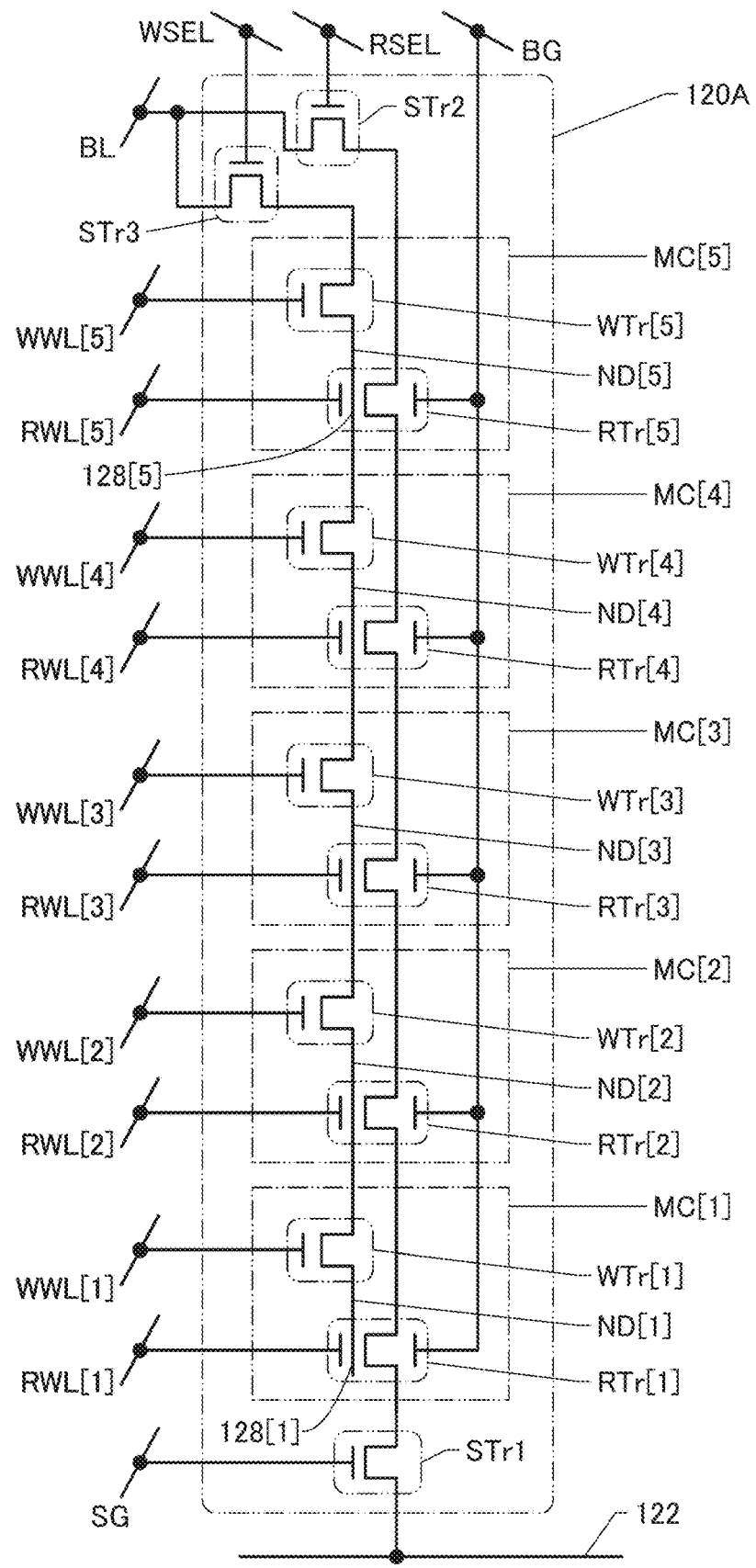
FIG. 44 is a diagram illustrating a circuit structure example of a memory string.

FIG. 44 illustrates a circuit structure example of a memory string 120A, which is a variation of the memory string 120. The memory string 120A has a circuit structure of the memory string 120 to which a transistor STr3 is added.

In the memory string 120A illustrated in FIG. 44, the other of the source and the drain of the transistor WTr[5] is electrically connected to not the one of the source and the drain of the transistor STr2 but one of a source and a drain the transistor STr3. Furthermore, the other of the source and the drain of the transistor STr3 is electrically connected to the conductor BL. In addition, the gate of the transistor STr2 is electrically connected to a conductor RSEL, and a gate of the transistor STr3 is electrically connected to a conductor WSEL.

At the time of the writing operation, the transistor STr3 is in an on state and the transistor STr2 is in an off state. At the time of the reading operation, the transistor STr3 is in an off state and the transistor STr2 is in an on state. To perform writing or reading of data through the conductor BL, the data transmission paths can be switched with the dedicated transistors. Thus, the operation of the memory device is stabilized and the reliability of the memory device can be increased.

Figure 45:
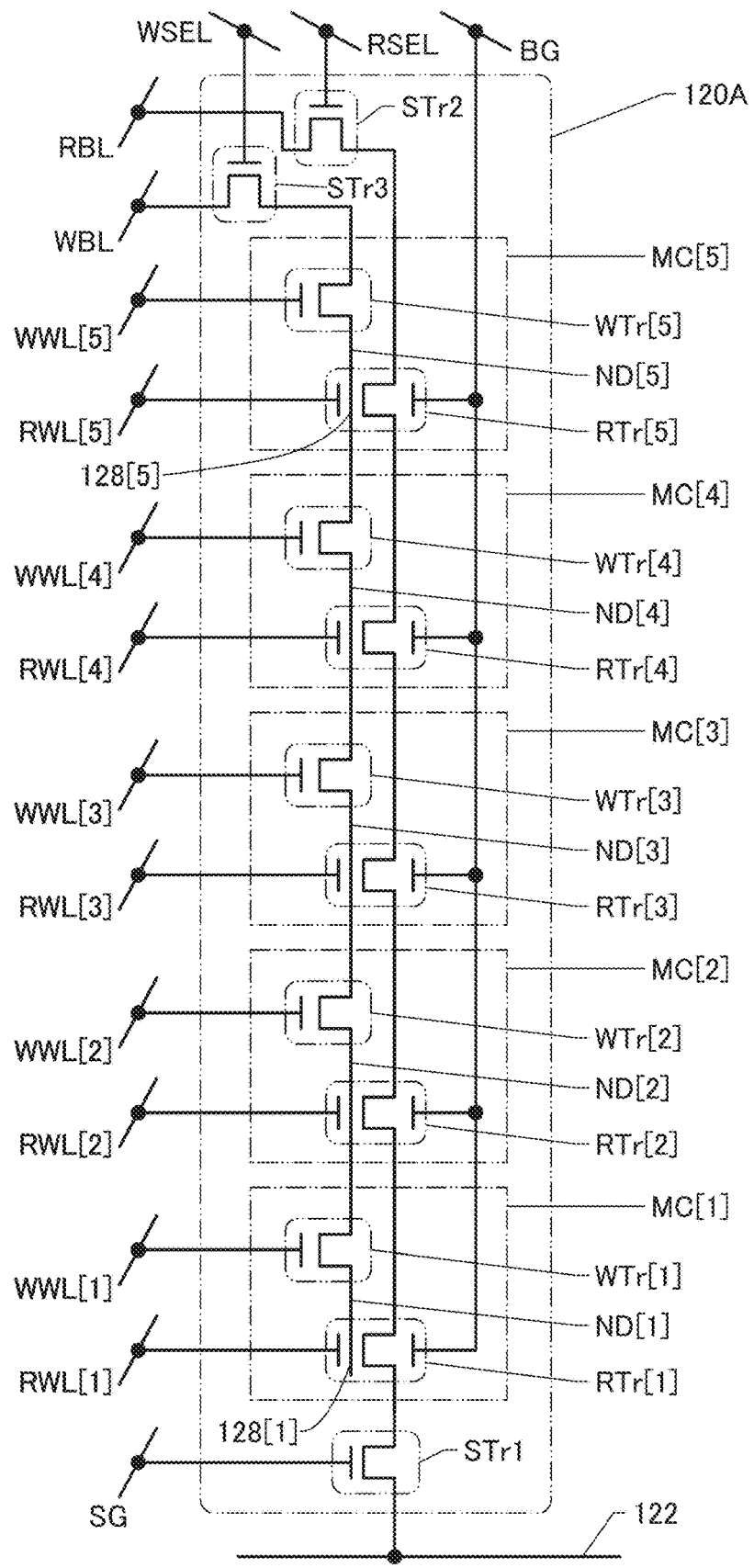
FIG. 45 is a diagram illustrating a circuit structure example of a memory string.

As illustrated in FIG. 45, the other of the source and the drain of the transistor STr2 may be electrically connected to a conductor RBL, and the other of the source and the drain of the transistor STr3 may be electrically connected to a conductor WBL. During the writing operation, writing of data through the conductor WBL is performed, while during the reading operation, reading of data through the conductor RBL is performed. With the dedicated conductors BL for the writing operation and the reading operation, the operation of the memory device is stabilized and the reliability of the memory device can be increased.

Figure 46:
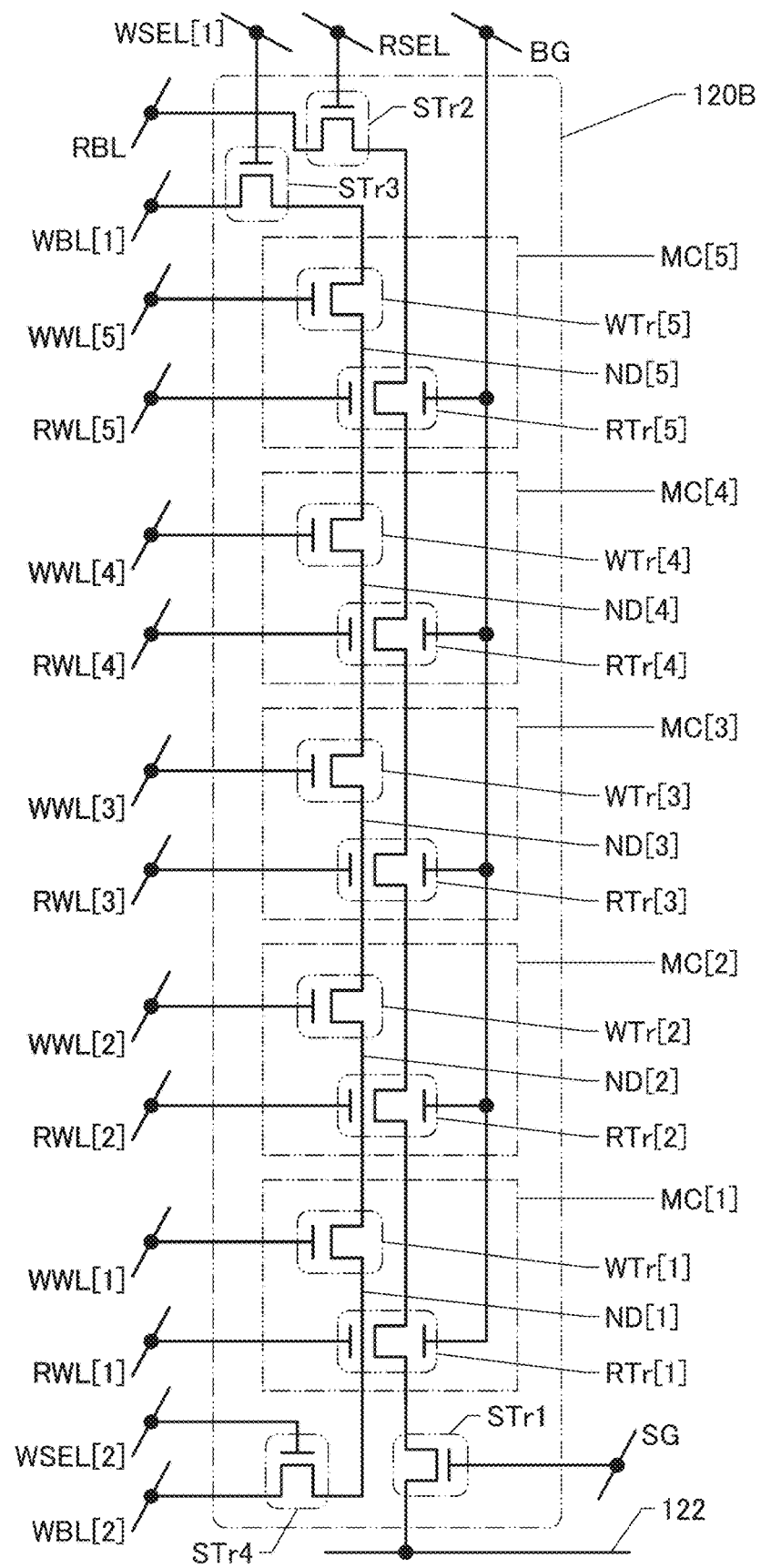
FIG. 46 is a diagram illustrating a circuit structure example of a memory string.

A memory string 120B illustrated in FIG. 46 has a circuit structure of the memory string 120A to which a transistor STr4 is added. One of a source and a drain of the transistor STr4 is electrically connected to the one of the source and the drain of the transistor WTr[1], and the other thereof is electrically connected to a conductor WBL[2]. A gate of the transistor STr4 is electrically connected to a conductor WSEL[2].

Furthermore, in the memory string 120B, the gate of the transistor STr3 is electrically connected to a conductor WSEL[1], and the other of the source and the drain of the transistor STr3 is electrically connected to a conductor WBL[1]. As illustrated in FIG. 44, the circuit structure where the transistor STr2 and the transistor STr3 are electrically connected to the conductor BL may be employed as well.

In the memory string 120B, data can be written from both the conductor WBL[1] and the conductor WBL[2]. Thus, the data writing speed can be increased. Moreover, charge corresponding to written data can be supplied more surely.

Furthermore, in the case where data is written to the i-th memory element MC, when i is close to n, data is written from the conductor WBL[1] side, so that the data writing operation for the first to (i−1)-th memory elements MC can be omitted. When i is close to 1, data is written from the conductor WBL[2] side, so that the data writing operation for the (i+1)-th to n-th memory elements MC can be omitted. The memory string 120B can further reduce the time and consumed power concerning the writing operation.

This embodiment can be implemented in combination with any of the structures described in the other embodiments and the like, as appropriate.

Embodiment 3

Figure 47:
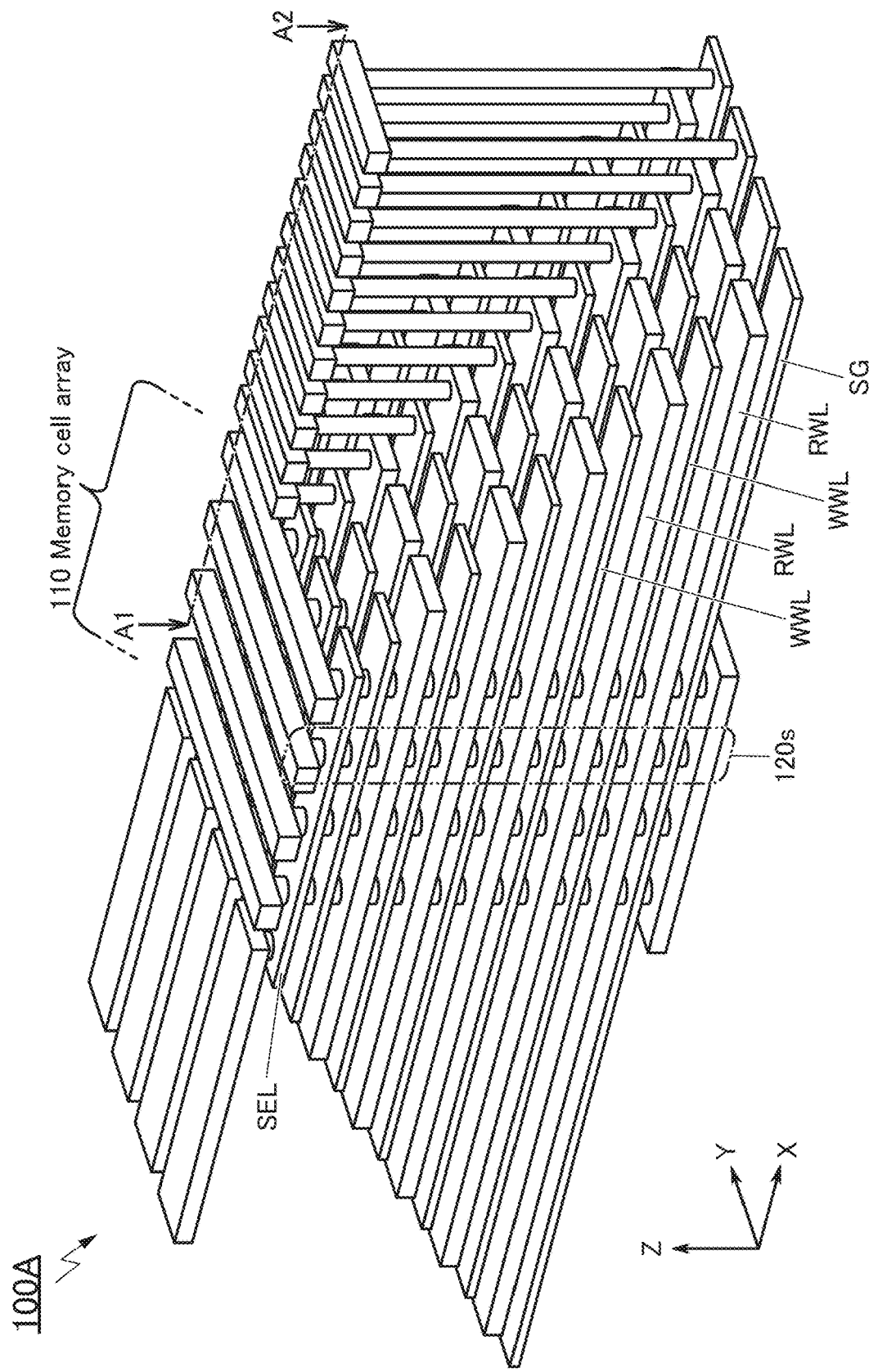
FIG. 47 is a perspective view of a memory device.
Figure 48:
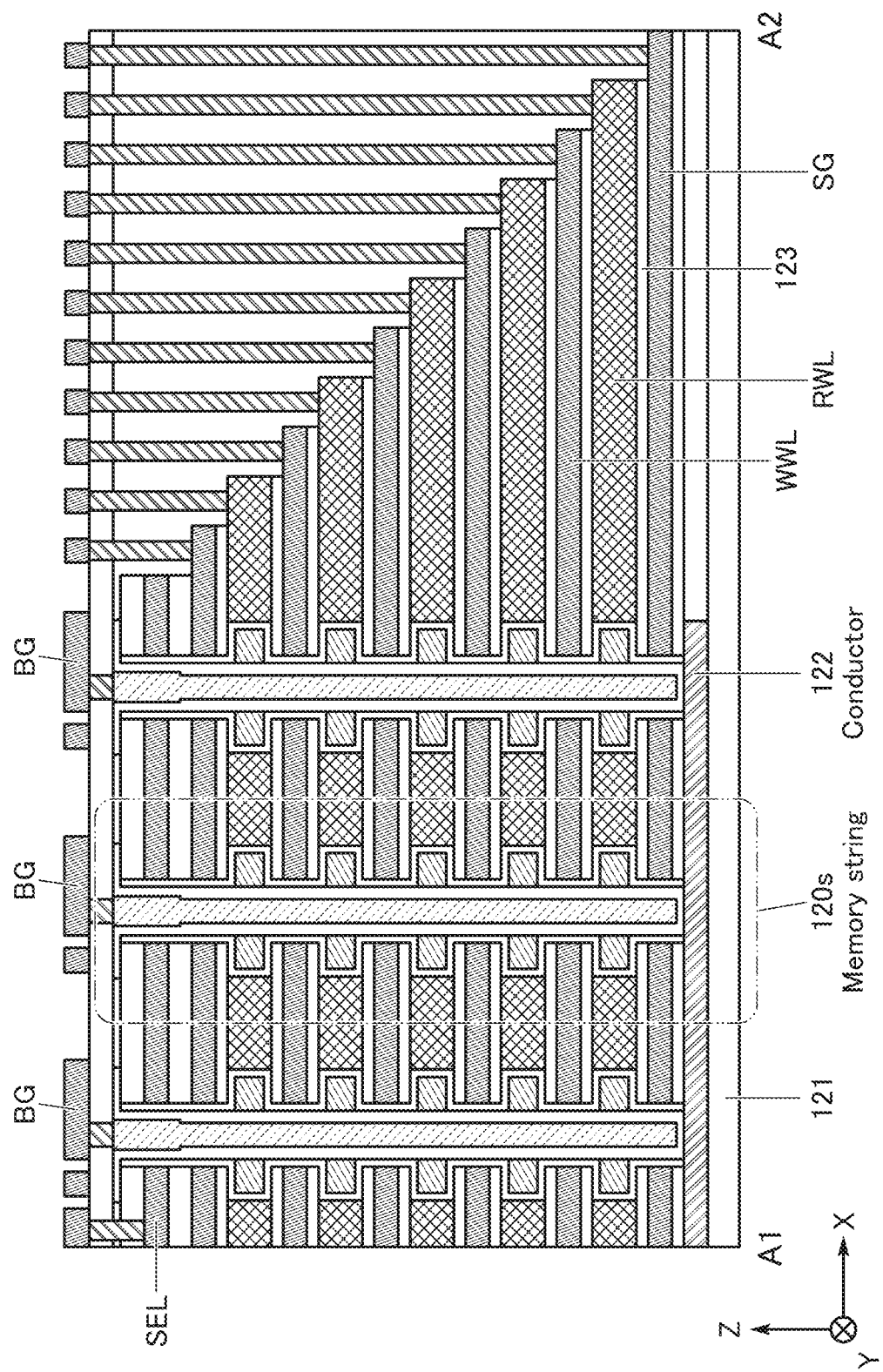
FIG. 48 is a cross-sectional view of the memory device.

In this embodiment, a memory device 100A, which is a variation of the memory device 100, is described. FIG. 47 is a perspective view of the memory device 100A of one embodiment of the present invention. FIG. 48 is a cross-sectional view of a portion A1-A2 indicated by a dashed-dotted line in FIG. 47. Note that other embodiments and the like are referred to for the matters that are not described in this embodiment.

<Structure Example of Memory Device>

Figure 49:
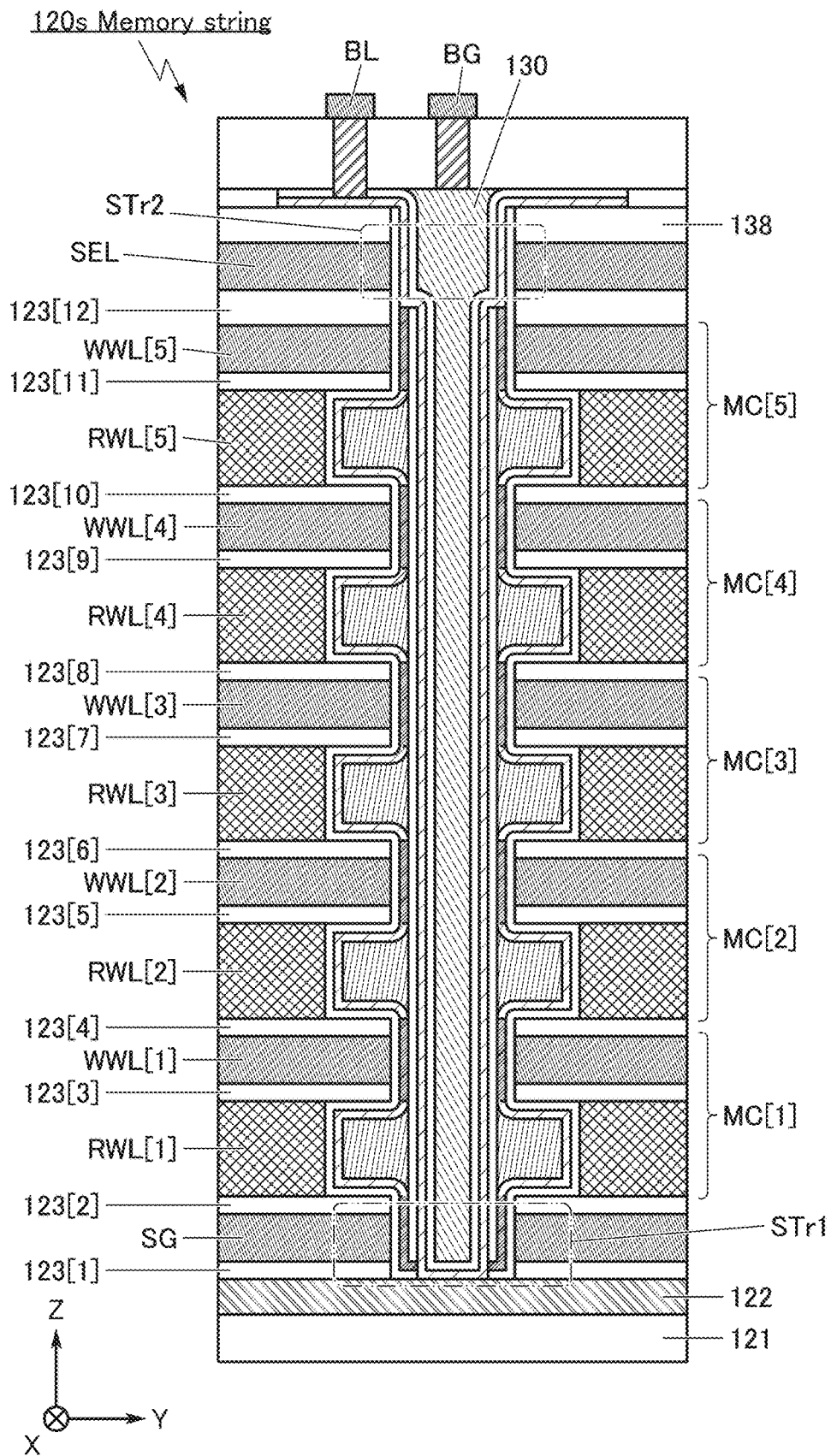
FIG. 49 is a cross-sectional view of a memory string.

The memory device 100A includes memory strings 120s. The memory strings 120s are different from the memory strings 120 in the structure of the transistor STr2. FIG. 49 illustrates a cross-sectional structure example of the memory string 120s. In the memory string 120s, the conductor SEL functioning as the gate electrode of the transistor STr2 is provided over the insulator 123[12]. Furthermore, an insulator 138 is provided over the conductors SEL. Part of the conductor 130 functions as a back gate electrode of the transistor STr2.

Although five memory elements MC are connected in series also in the memory device 100A described in this embodiment as in the memory device 100 described in the above embodiment, the number of memory elements MC provided in the memory string 120 is not limited to five.

The memory string 120s includes the conductor 122 over the substrate 121. Furthermore, the insulator 123[1], the conductor SG, the insulator 123[2], the conductor RWL[1], the insulator 123[3], the conductor WWL[1], the insulator 123[4], the conductor RWL[2], the insulator 123[5], the conductor WWL[2], the insulator 123[6], the conductor RWL[3], the insulator 123[7], the conductor WWL[3], the insulator 123[8], the conductor RWL[4], the insulator 123 [9], the conductor WWL[4], the insulator 123[10], the conductor RWL[5], the insulator 123[11], the conductor WWL[5], the insulator 123[12], the conductor SEL, and the insulator 138 are provided over the conductor 122 (see FIG. 49).

Figure 50:
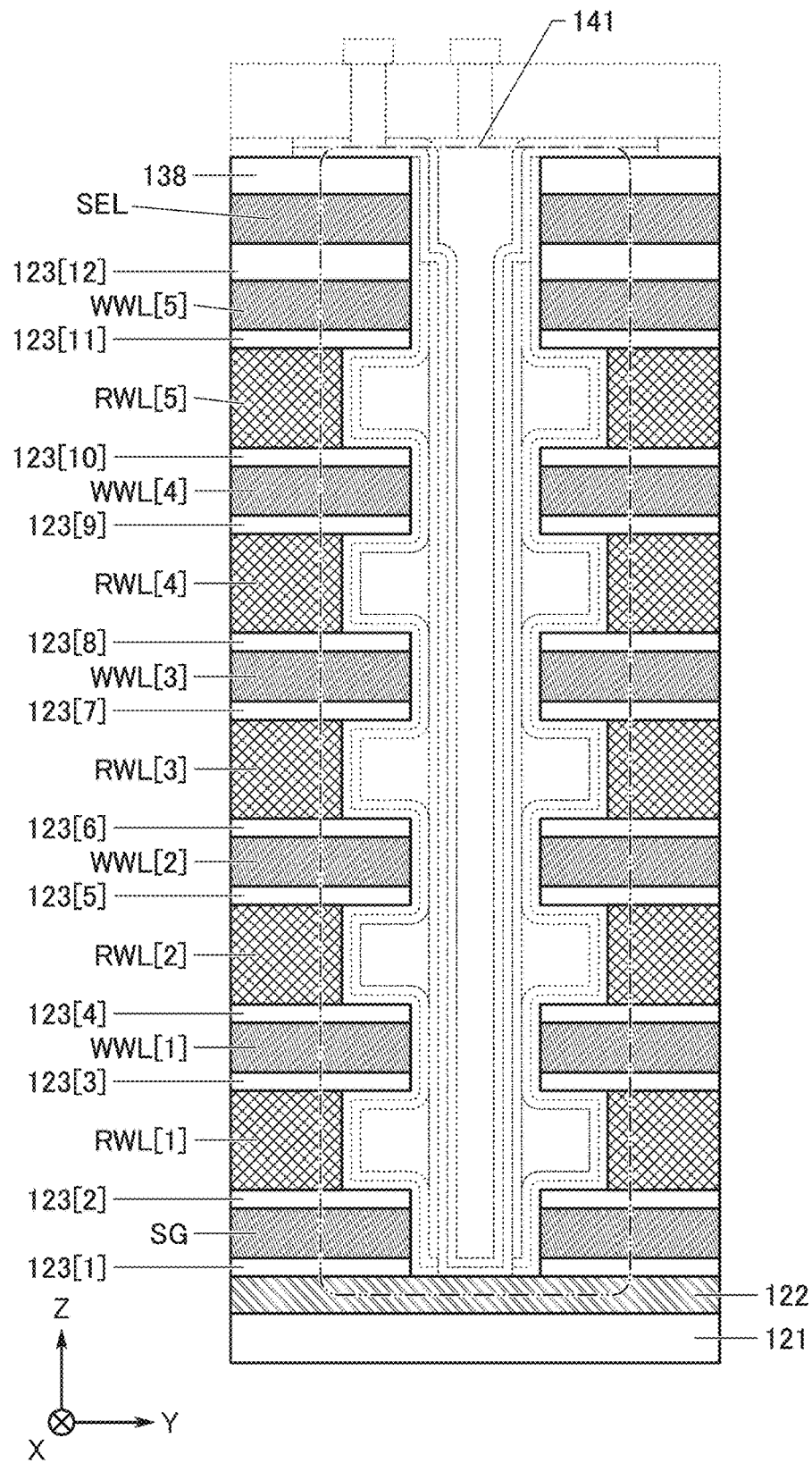
FIG. 50 is a cross-sectional view of the memory string.

Furthermore, the memory string 120s includes the opening 141 which is formed by removing part of each of the insulator 123[1], the conductor SG, the insulator 123[2], the conductor RWL[1], the insulator 123[3], the conductor WWL[1], the insulator 123[4], the conductor RWL[2], the insulator 123[5], the conductor WWL[2], the insulator 123 [6], the conductor RWL[3], the insulator 123[7], the conductor WWL[3], the insulator 123[8], the conductor RWL [4], the insulator 123[9], the conductor WWL[4], the insulator 123[10], the conductor RWL[5], the insulator 123[11], the conductor WWL[5], the insulator 123[12], the conductor SEL, and the insulator 138 (see FIG. 50). For easy recognition of the opening 141, some components are indicated by broken lines in FIG. 50.

<Example of Method for Manufacturing Memory Device>

Next, another example of a method for manufacturing the memory device 100A is described with reference to FIG. 51 to FIG. 67. Note that in FIG. 51 to FIG. 67, A is a top view seen from the Z direction and B is a cross-sectional view of a portion indicated by a dashed-dotted line A1-A2 in A. Furthermore, in FIG. 51 to FIG. 67, C is a cross-sectional view of a portion indicated by a dashed-dotted line A3-A4 in A. FIG. 56D is an enlarged cross-sectional view of a portion surrounded by a dashed-dotted line in FIG. 56B. Although one memory string 120s including two stages of memory elements MC is described as an example in this manufacturing method, this embodiment is not limited to the example. The memory string 120s may include three or more stages of memory elements MC. For example, the memory string 120s preferably includes 32 or more, preferably 64 or more, further preferably 128 or more, still further preferably 256 or more stages of memory elements MC.

Figure 51A:
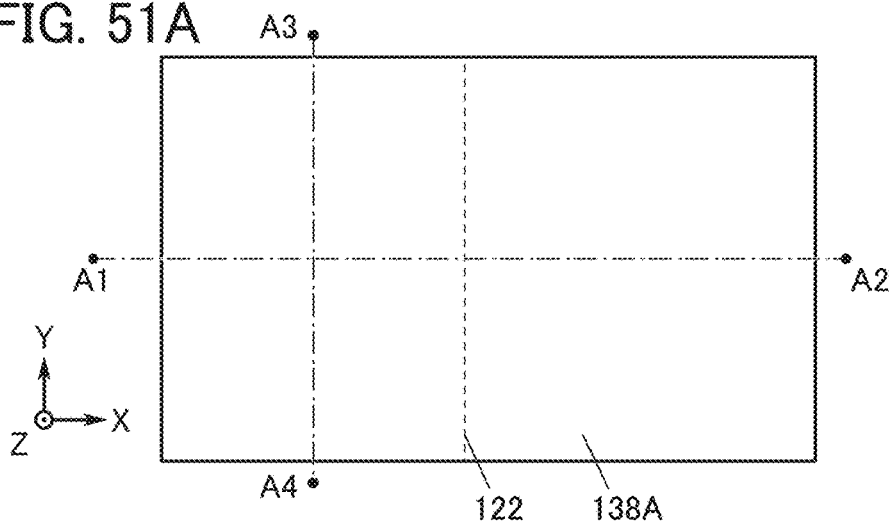
FIG. 51A to FIG. 51C are cross-sectional views illustrating a process for manufacturing a semiconductor device of one embodiment of the present invention.
Figure 51B:
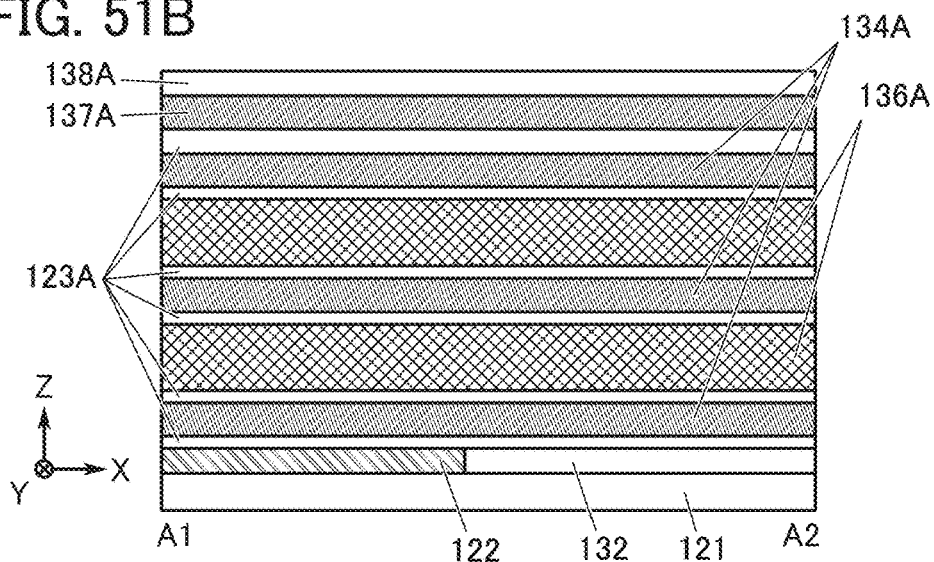
Figure 51C:
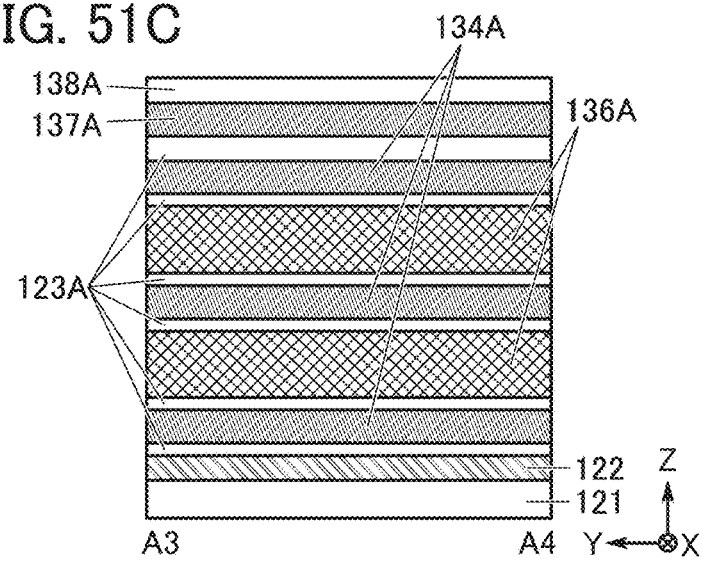

First, as in the example of the method for manufacturing the memory device 100, the conductor 122 is formed over the substrate 121 having an insulating surface, and the insulator 132 is formed around the conductor 122 (see FIG. 51A to FIG. 51C).

Then, a conductive film 137A is formed over the uppermost insulating film 123A, and an insulating film 138A is formed over the conductive film 137A. The conductor 137A can be formed using a method and a material similar to those of the conductive films 134A. Furthermore, the insulating film 138A can be formed using a method and a material similar to those of the insulating films 123A.

Figure 52A:
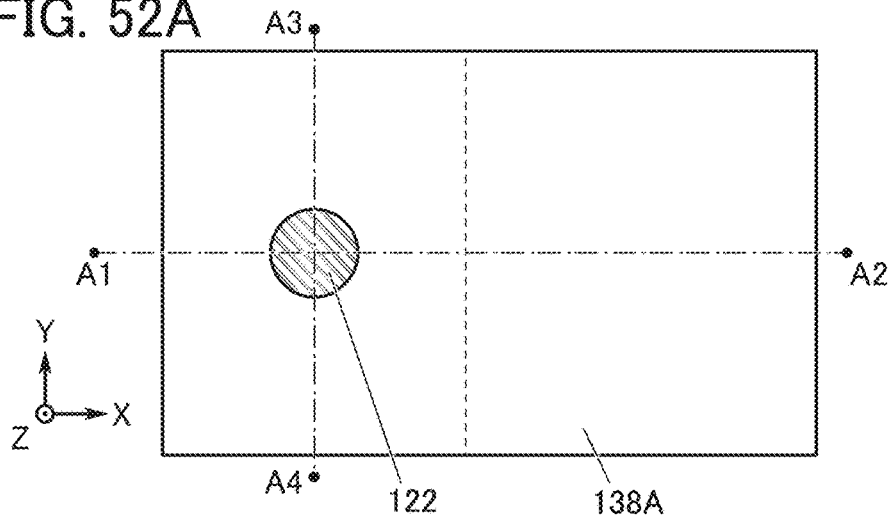
FIG. 52A to FIG. 52C are cross-sectional views illustrating the process for manufacturing a semiconductor device of one embodiment of the present invention.
Figure 52B:
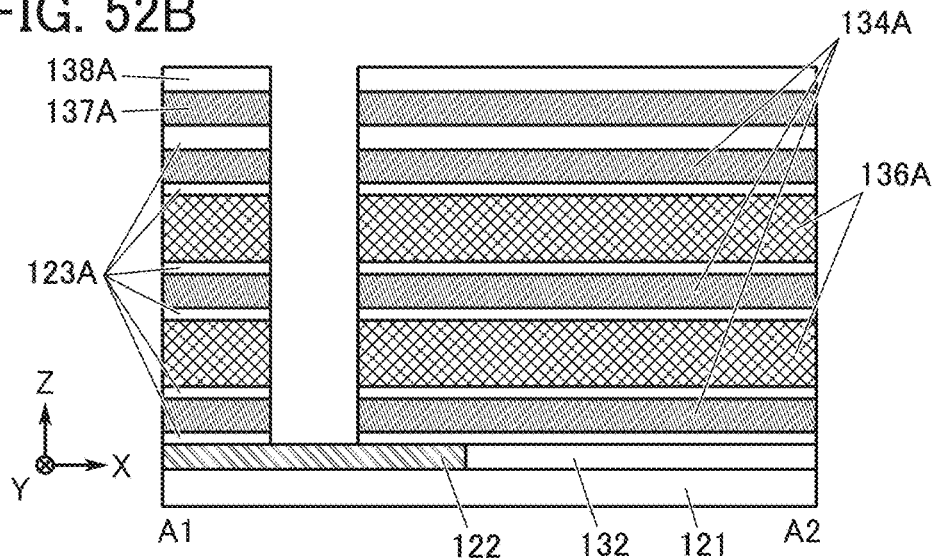
Figure 52C:
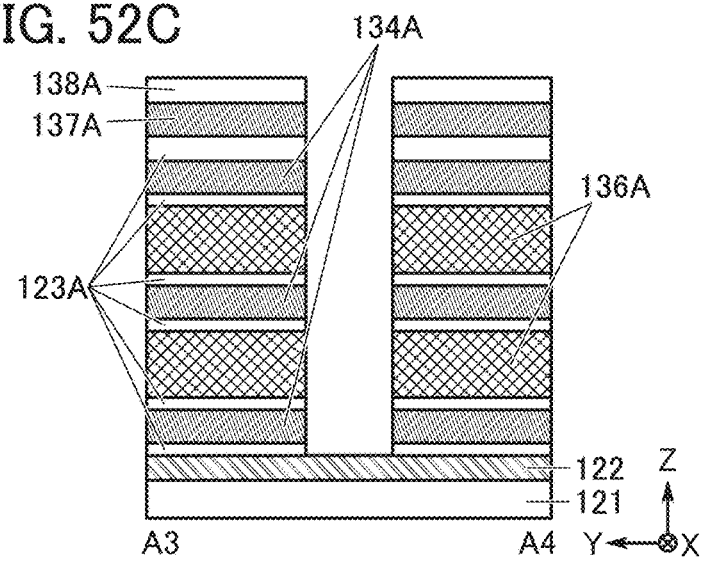

Next, a mask (not illustrated) is formed over the insulating film 138A; and the insulating film 138A, the conductive film 137A, the insulating films 123A, the conductive films 134A, and the conductive films 136A are processed by a lithography technique, so that a first opening is formed so as to expose the conductor 122 (see FIG. 52A to FIG. 52C).

Figure 53A:
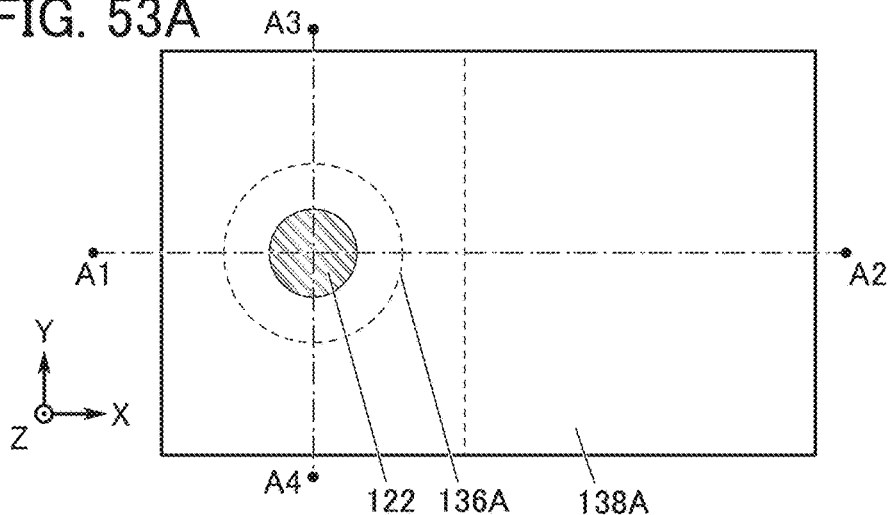
FIG. 53A to FIG. 53C are cross-sectional views illustrating the process for manufacturing a semiconductor device of one embodiment of the present invention.
Figure 53B:
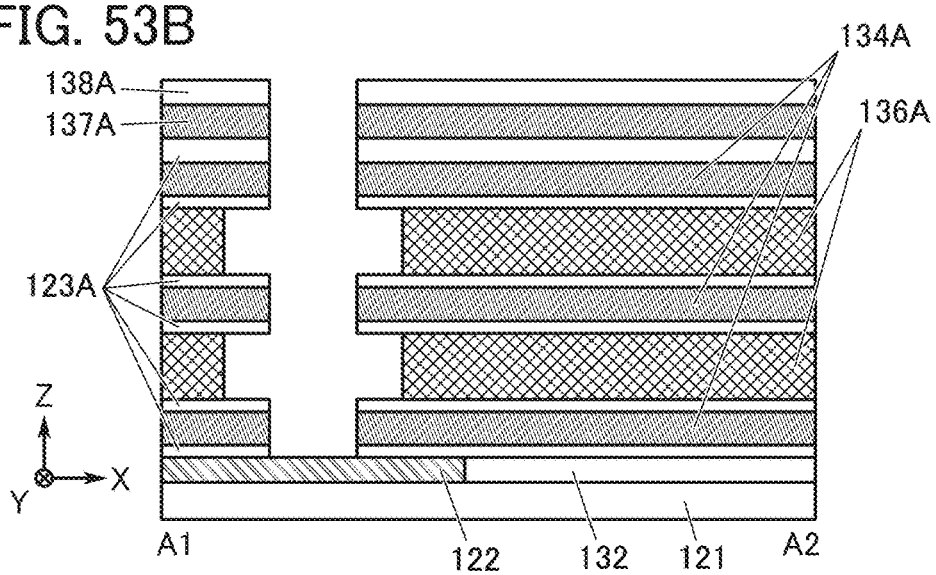
Figure 53C:
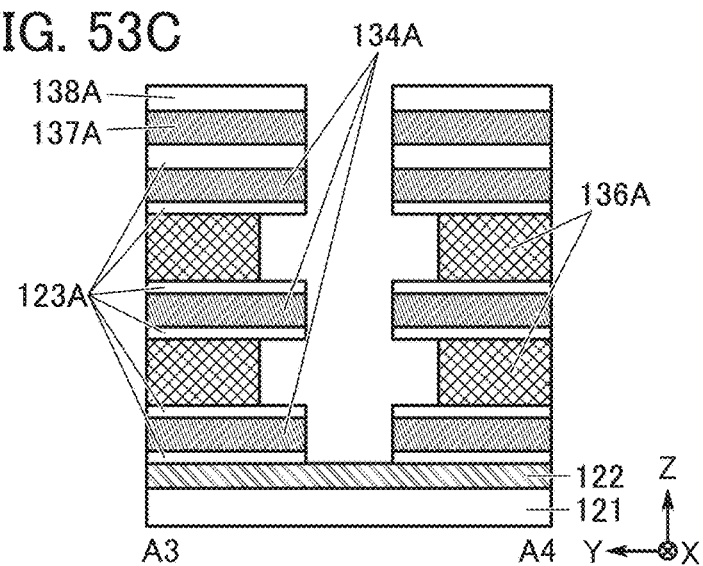

Next, isotropic etching is performed on the conductive films 136A so that the side surfaces of the conductive films 136A in the first opening recede from the side surfaces of the insulating films 123A, the side surfaces of the conductive films 134A, a side surface of the conductive film 137A, and a side surface of the insulating film 138A (see FIG. 53A to FIG. 53C). By this processing, the diameter of the first opening overlapping with the conductive films 136A becomes larger than each of the diameter of the first opening overlapping with the insulating film 123A, the diameter of the first opening overlapping with the conductive film 134A, the diameter of the first opening overlapping with the conductive film 137A, and the diameter of the first opening overlapping with the insulating film 138A. Thus, projections and depressions are formed on the side surface of the first opening.

Figure 54A:
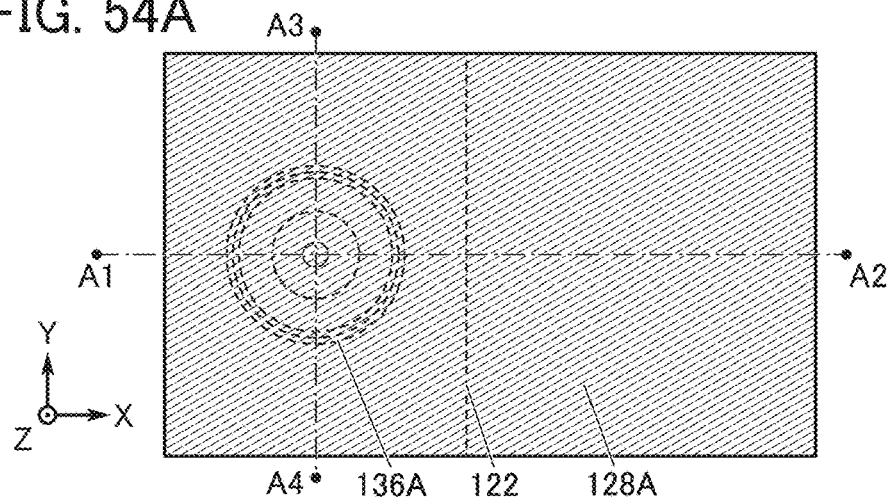
FIG. 54A to FIG. 54C are cross-sectional views illustrating the process for manufacturing a semiconductor device of one embodiment of the present invention.
Figure 54B:
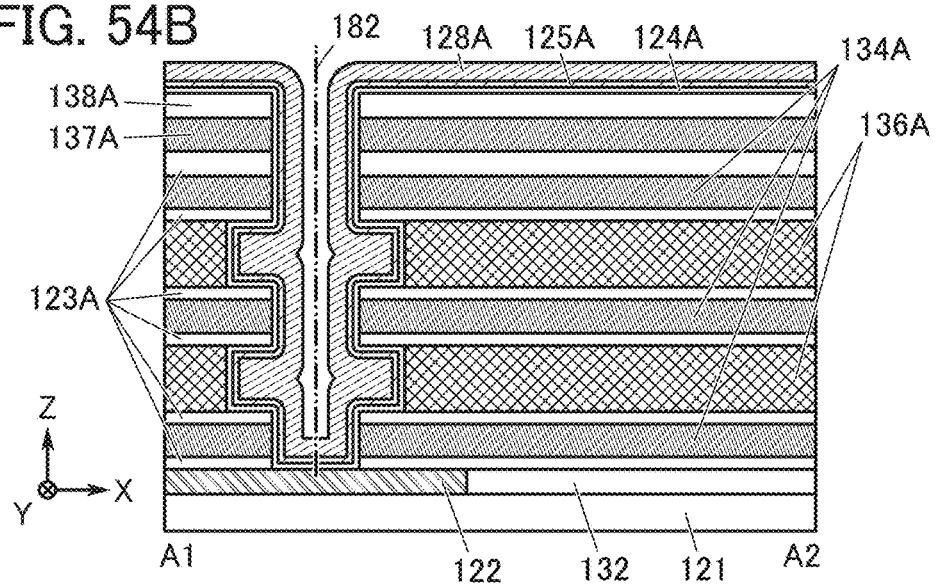
Figure 54C:
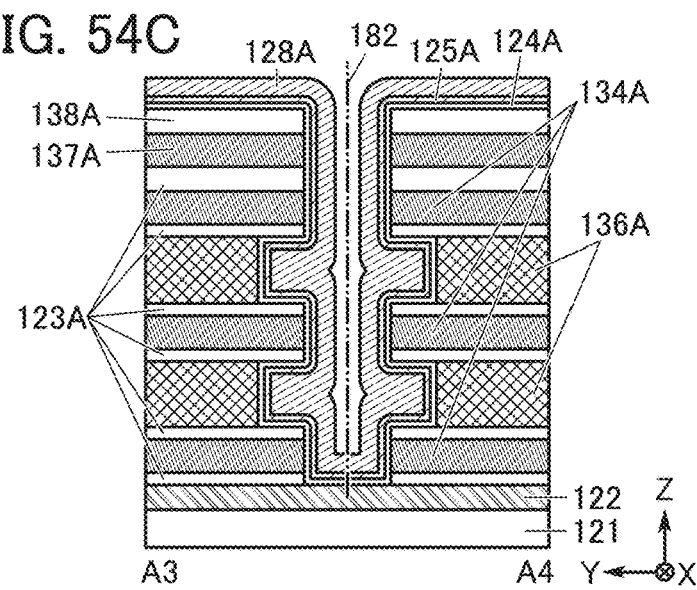

Next, the insulating film 124A is formed over the insulating film 138A and in the first opening (see FIG. 54A to FIG. 54C). The insulating film 124A may have a stacked-layer structure as described in the above embodiment. The insulating film 124A can be formed by a CVD method or an ALD method as described in the above embodiment. It is particularly preferable to employ an ALD method, in which case a film with a uniform thickness can be formed even in a groove or an opening portion.

Figure 55A:
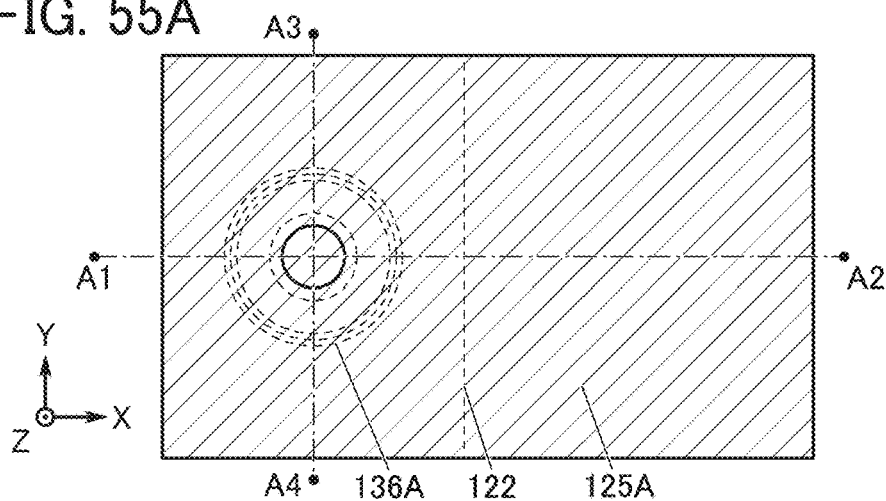
FIG. 55A to FIG. 55C are cross-sectional views illustrating the process for manufacturing a semiconductor device of one embodiment of the present invention.
Figure 55B:
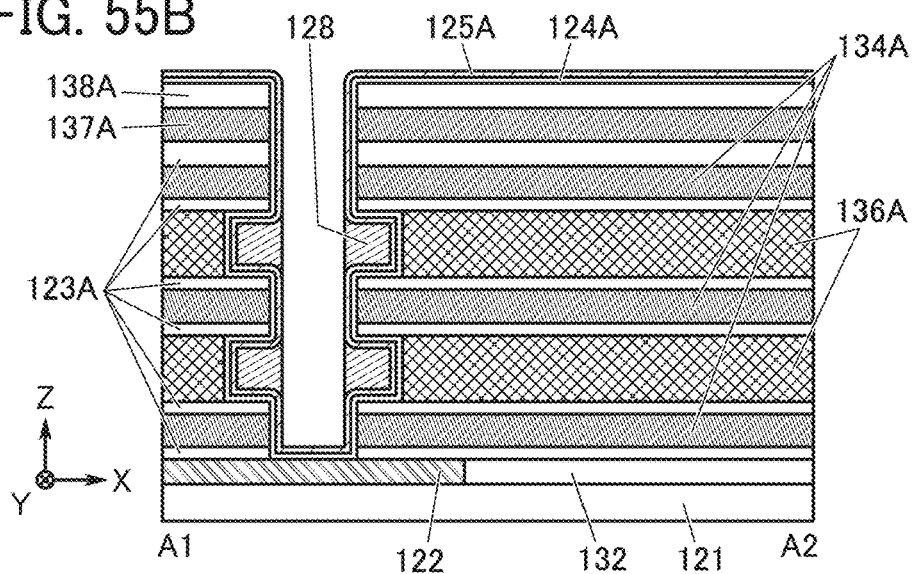
Figure 55C:
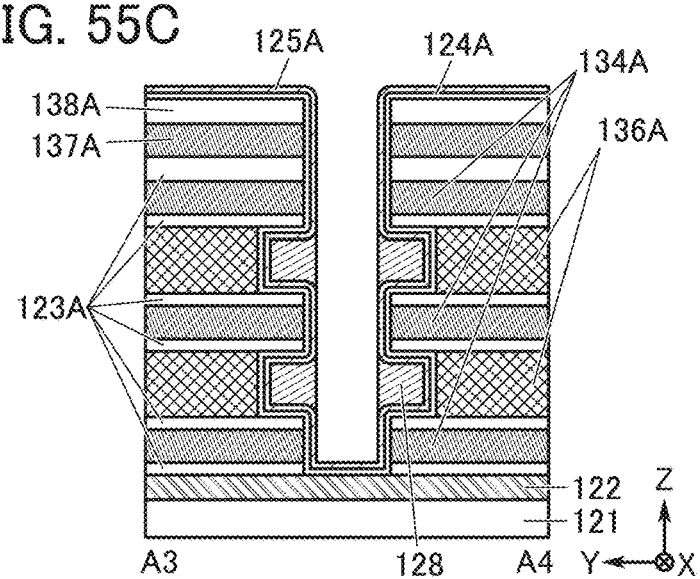
Figure 56A:
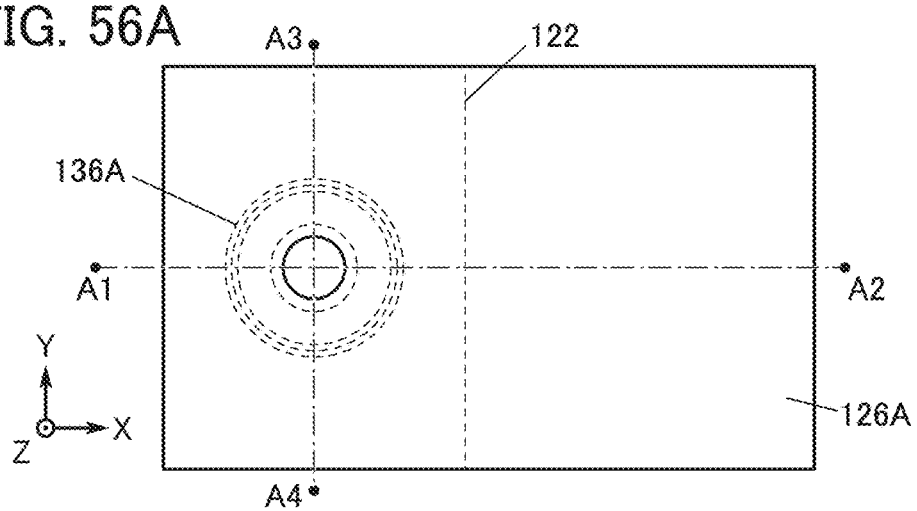
FIG. 56A to FIG. 56D are cross-sectional views illustrating the process for manufacturing a semiconductor device of one embodiment of the present invention.
Figure 56B:
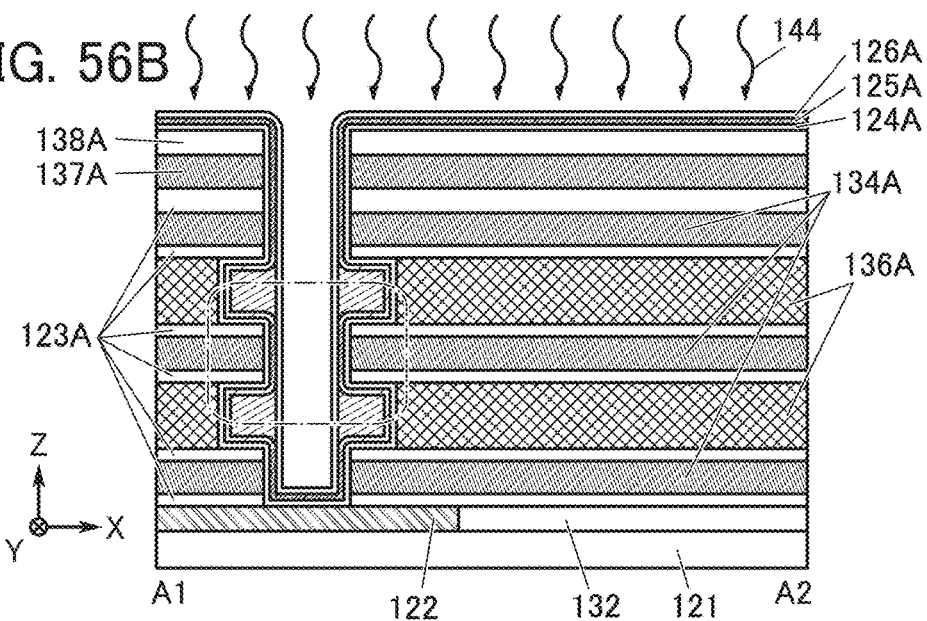
Figure 56C:
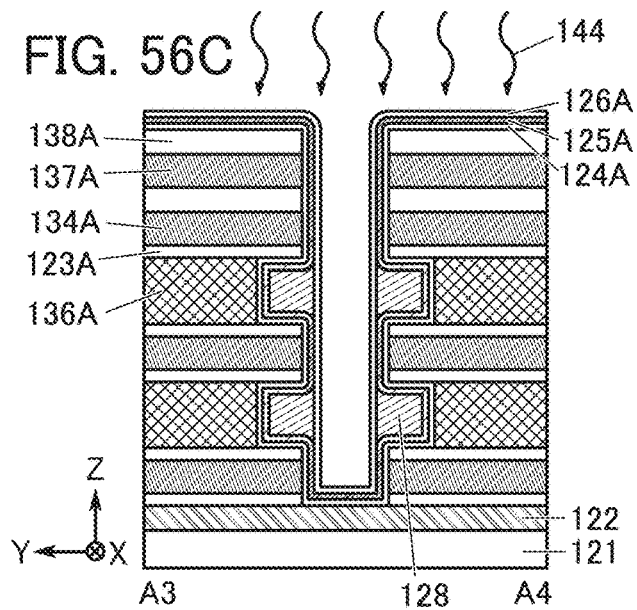
Figure 56D:
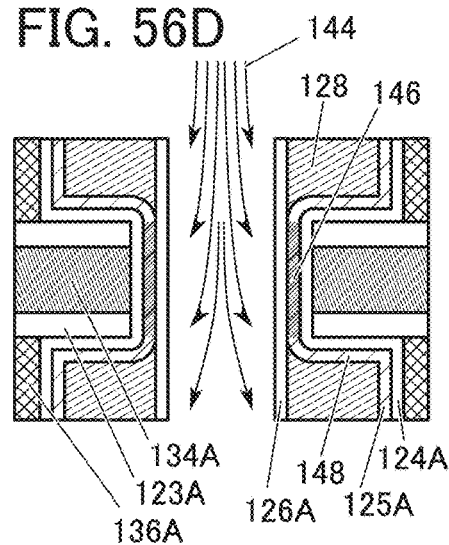
Figure 57A:
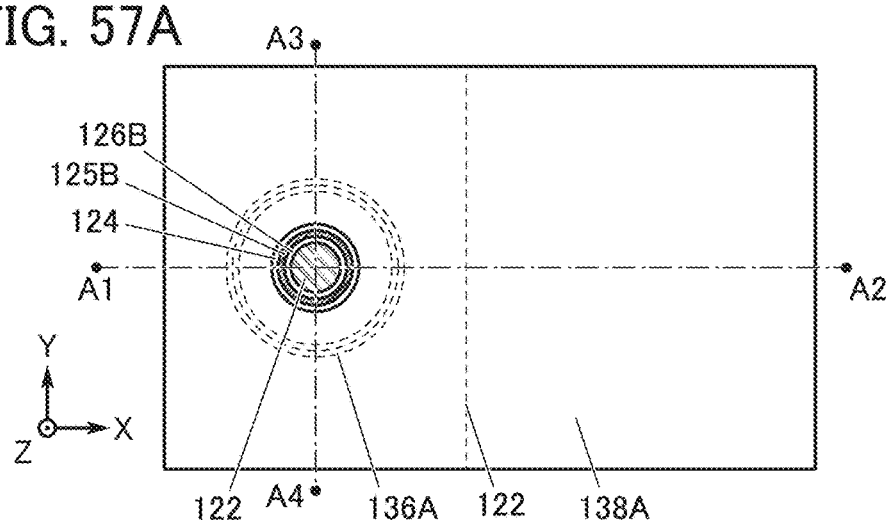
FIG. 57A to FIG. 57C are cross-sectional views illustrating the process for manufacturing a semiconductor device of one embodiment of the present invention.
Figure 57B:
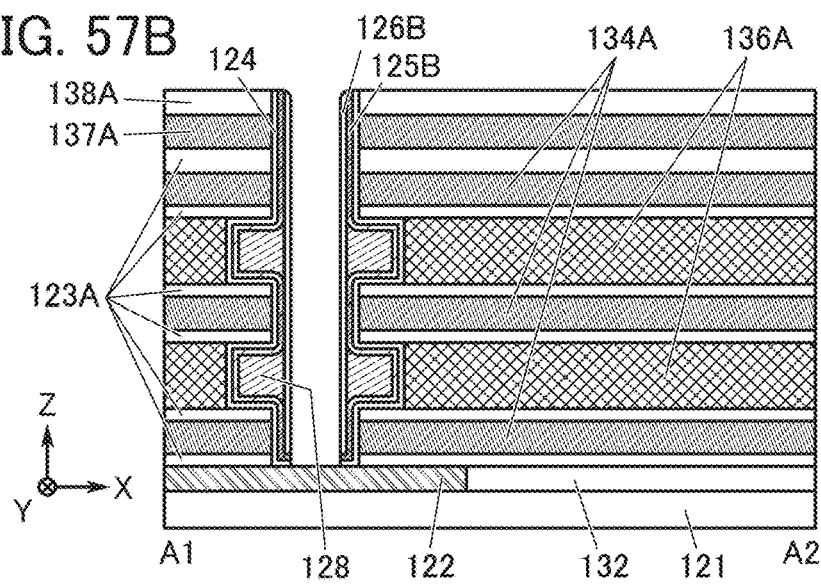
Figure 57C:
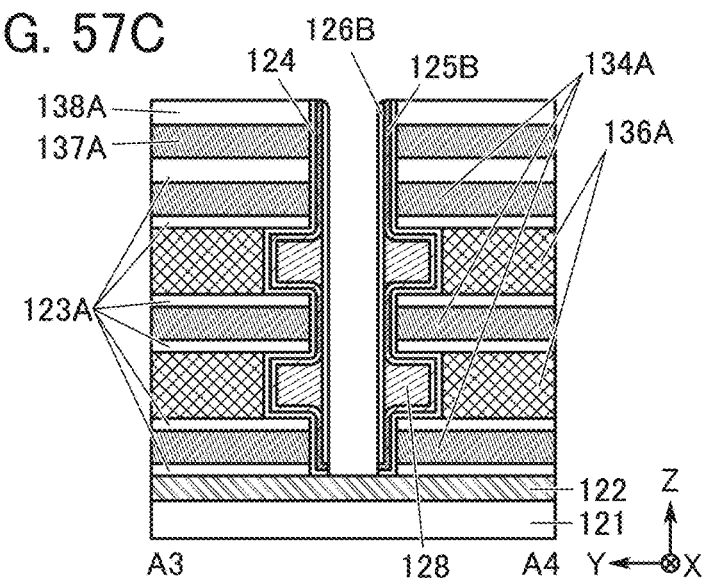

Next, the conductive film 128A is processed to form the conductors 128 (see FIG. 55A to FIG. 55C). The conductive film 128A is processed by isotropic etching or anisotropic etching.

Then, the insulating film 126A is formed in the first opening (see FIG. 56A to FIG. 56D). Subsequently, the resistance of the region 146 of the semiconductor film 125A is increased by irradiation with the microwave 144. After that, heat treatment may be performed as described in the above embodiment. The heat treatment can reduce the resistance of the semiconductor film 125A in contact with the conductors 128, whereby low-resistance regions can be formed in the regions 148.

Note that although the treatment of increasing resistance for the semiconductor film 125A is performed after the formation of the insulating film 126A in the example illustrated in FIG. 56, this embodiment is not limited to the example. The treatment of increasing resistance may be performed before the formation of the insulating film 126A as described in the above embodiment.

Next, the insulating film 124A, the semiconductor film 125A, and the insulating film 126A that are formed in the bottom portion of the first opening are removed to obtain the insulator 124, the semiconductor 125B, and the insulator 126B. At this time, the insulating film 124A, the semiconductor film 125A, and the insulating film 126A over the insulating film 138A are also removed; thus, the insulator 124, the semiconductor 125B, and the insulator 126B are provided only on a sidewall of the first opening (see FIG. 57A to FIG. 57C). By the removal of the insulating film 124A, the semiconductor film 125A, and the insulating film 126A in the bottom portion of the first opening, the conductor 122 is exposed again.

Figure 58A:
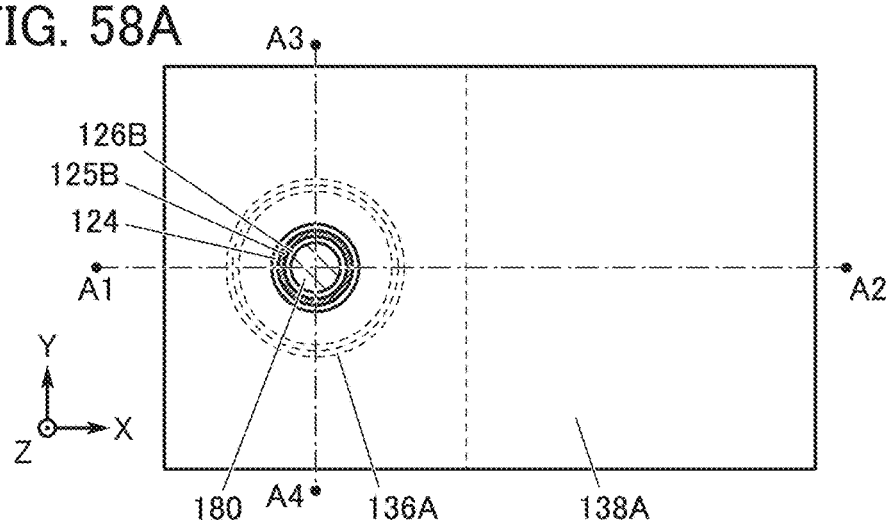
FIG. 58A to FIG. 58C are cross-sectional views illustrating the process for manufacturing a semiconductor device of one embodiment of the present invention.
Figure 58B:
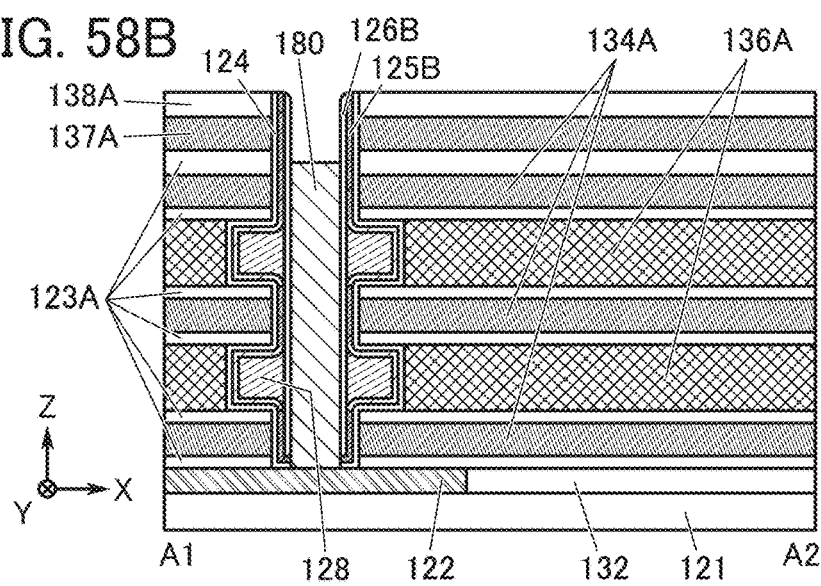
Figure 58C:
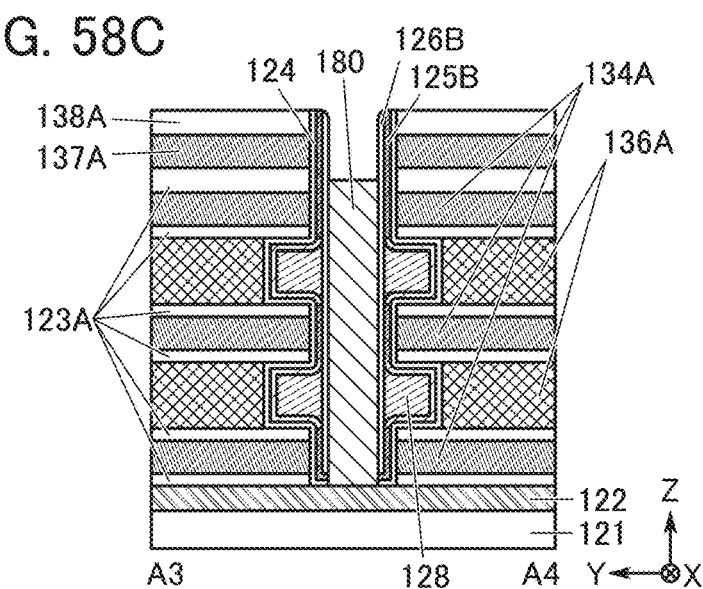
Figure 59A:
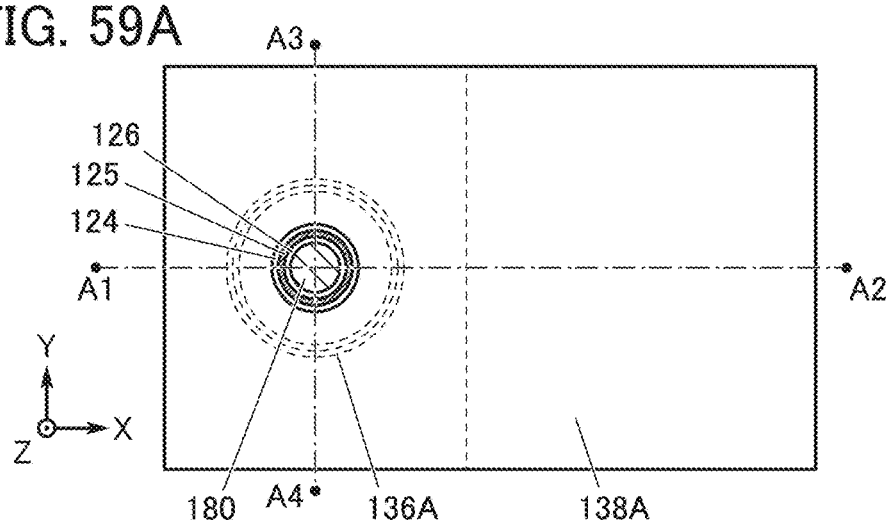
FIG. 59A to FIG. 59C are cross-sectional views illustrating the process for manufacturing a semiconductor device of one embodiment of the present invention.
Figure 59B:
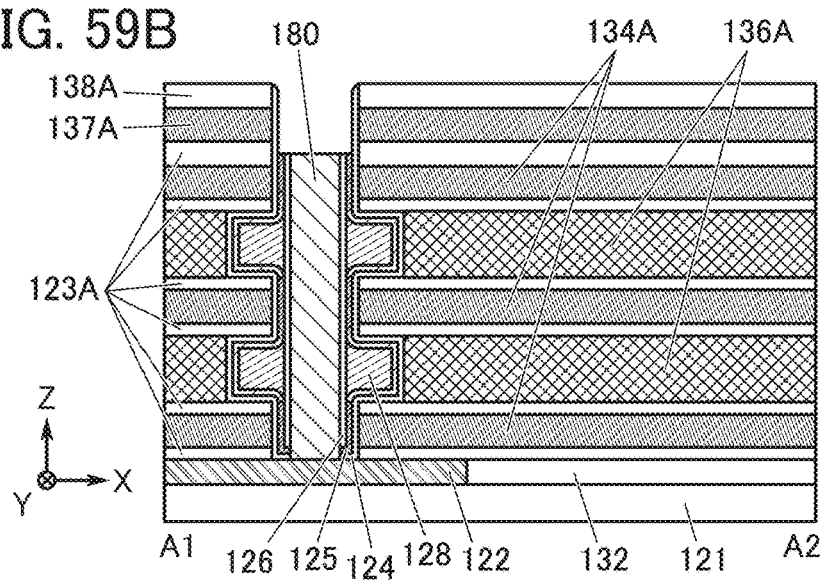
Figure 59C:
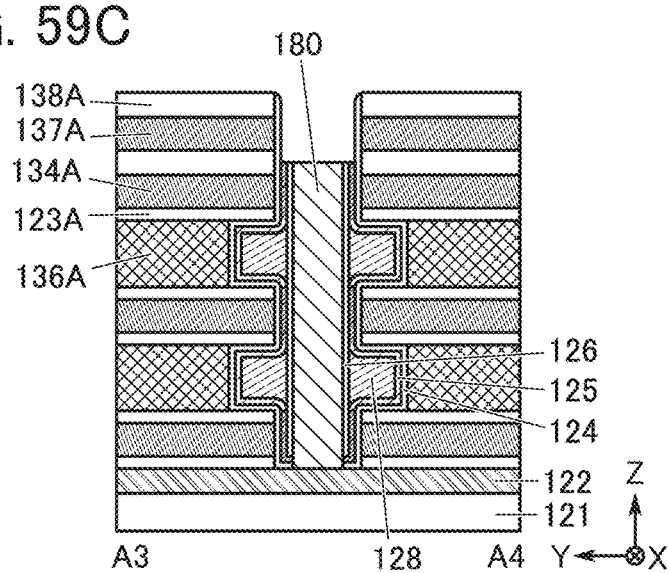
Figure 60A:
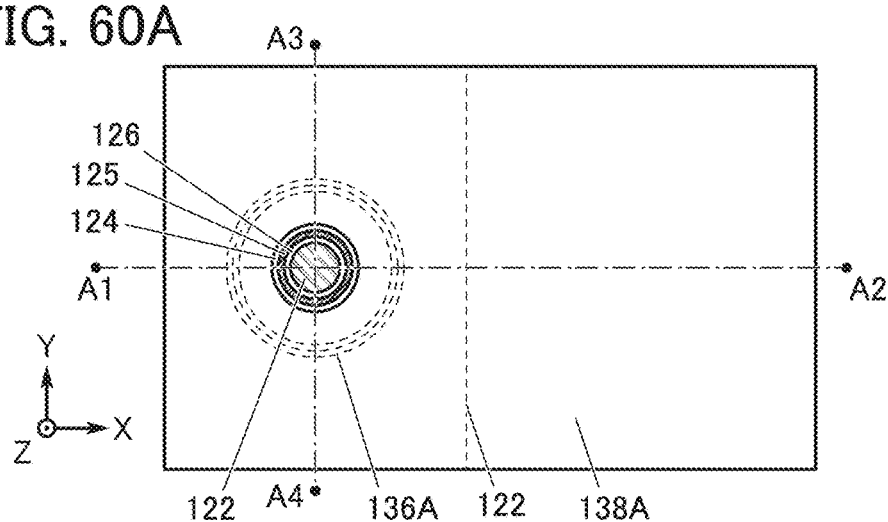
FIG. 60A to FIG. 60C are cross-sectional views illustrating the process for manufacturing a semiconductor device of one embodiment of the present invention.
Figure 60B:
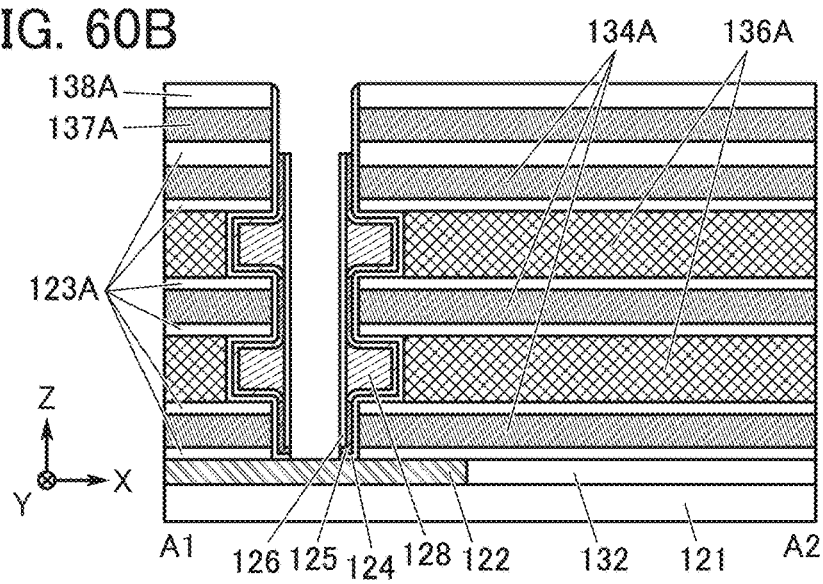
Figure 60C:
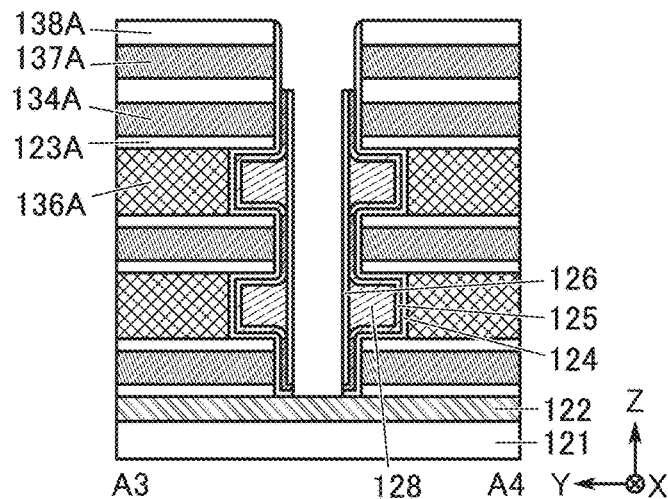

Next, in the X-Y plane illustrated in FIG. 58A to FIG. 58C, the semiconductor 125B and the insulator 126B overlapping with the conductive film 137A are removed. For the removal of the semiconductor 125B and the insulator 126B, first, a material 180 (also referred to as a sacrificial layer) that is removable in a later step is formed to be embedded in the first opening, and part of the material 180 is removed by etching or the like to a desired depth in the first opening (see FIG. 58A to FIG. 58C). Next, the semiconductor 125B and the insulator 126B exposed by the etching are sequentially removed using the remaining material 180 as a mask, so that the semiconductor 125 and the insulator 126 are obtained (see FIG. 59A to FIG. 59C). After the removal of the semiconductor 125B and the insulator 126B, the material 180 is removed (see FIG. 60A to FIG. 60C).

Note that in the case where formation of the transistor STr2 is possible in that region without removal of part of the semiconductor 125B and part of the insulator 126B, the step of removing the semiconductor 125B and the insulator 126B with the material 180 can be omitted. In this case, the transistor STr2 where the semiconductor 125 is provided between a conductor 137 and the semiconductor 127 with the insulator 124 and the insulator 126 positioned between the semiconductor 125 and the conductor 137 and the semiconductor 127 is formed.

Figure 61A:
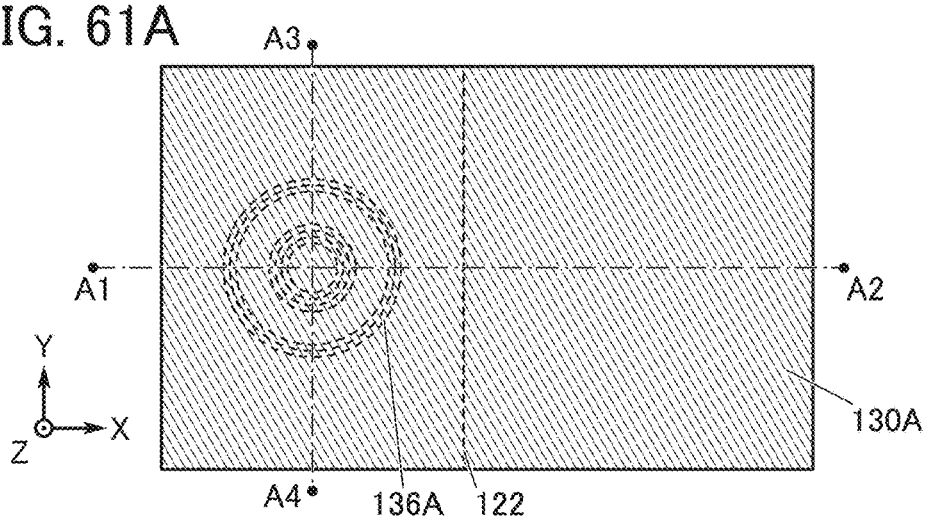
FIG. 61A to FIG. 61C are cross-sectional views illustrating the process for manufacturing a semiconductor device of one embodiment of the present invention.
Figure 61B:
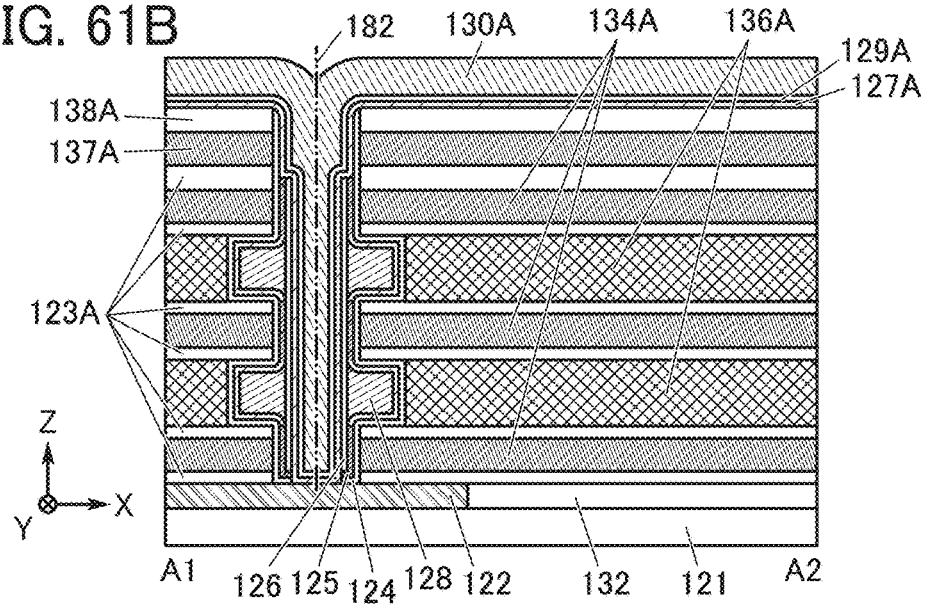
Figure 61C:
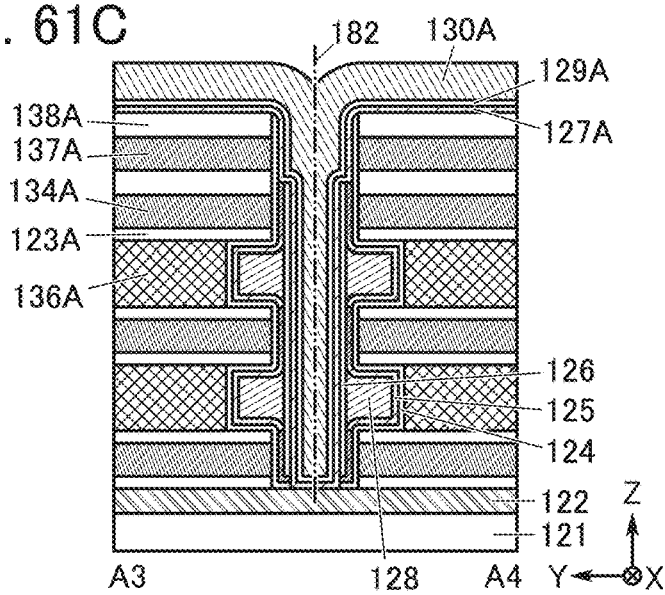

Next, the semiconductor film 127A is formed in the first opening to be partially in contact with the conductor 122 (see FIG. 61A to FIG. 61C). At this time, the semiconductor film 127A is preferably formed to be partially in contact with the semiconductor 125. In the memory device 100A described as an example in this embodiment, the semiconductor film 127A can be connected to the semiconductor 125 in the bottom portion of the first opening and the top portion of the first opening.

As described in the above embodiment, the semiconductor film 127A is preferably an oxide semiconductor having a CAAC structure. As described above, in the case where the semiconductor film 127A is an oxide semiconductor having a CAAC structure, c-axes of the semiconductor film 127A are aligned in a direction of the normal to a surface where the semiconductor film 127A is deposited, at the inside of the first opening. In this case, c-axes of the semiconductor film 127A positioned on the side surface of the first opening are aligned from the surface where the semiconductor film 127A is deposited toward the axis 182 illustrated in FIG. 61A to FIG. 61C. Thus, c-axes of the semiconductor 127 positioned as described above are aligned from the surface where the semiconductor 127 is deposited toward the axis 182.

Subsequently, the insulating film 129A is formed to overlap with the semiconductor film 127A, and the conductive film 130A is formed to overlap with the insulating film 129A.

As described in the above embodiment, treatment of increasing resistance may be performed on the semiconductor film 127A. The treatment of increasing resistance is preferably performed before the formation of the conductive film 130A or before the formation of the insulating film 129A. In the case where the resistance of the region 146 of the semiconductor film 125A is also increased by the treatment of increasing resistance performed on the semiconductor film 127A, the treatment of increasing resistance that has been performed in the aforementioned step may be omitted.

Then, heat treatment is performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

Figure 62A:
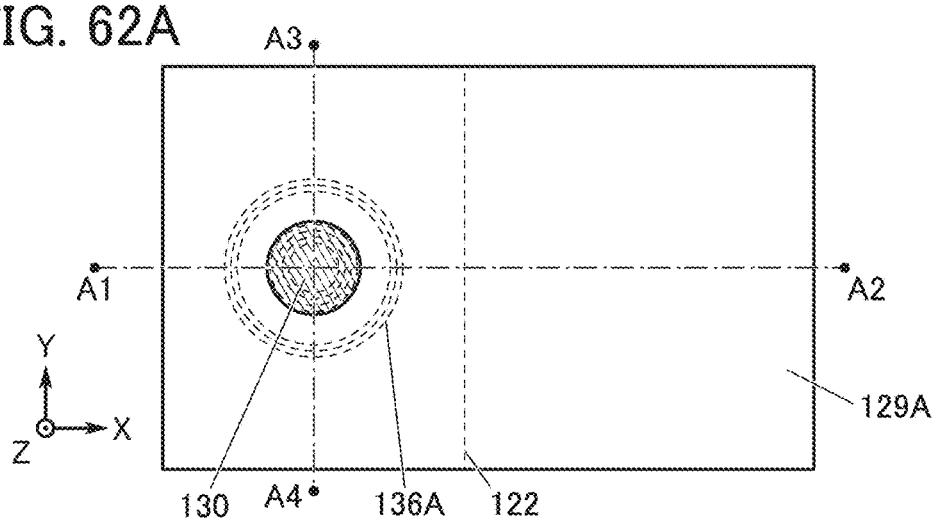
FIG. 62A to FIG. 62C are cross-sectional views illustrating the process for manufacturing a semiconductor device of one embodiment of the present invention.
Figure 62B:
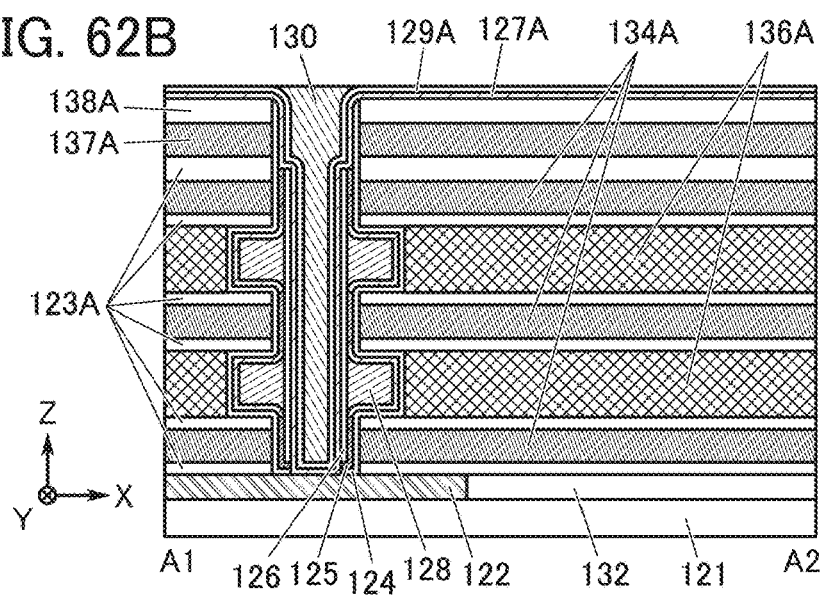
Figure 62C:
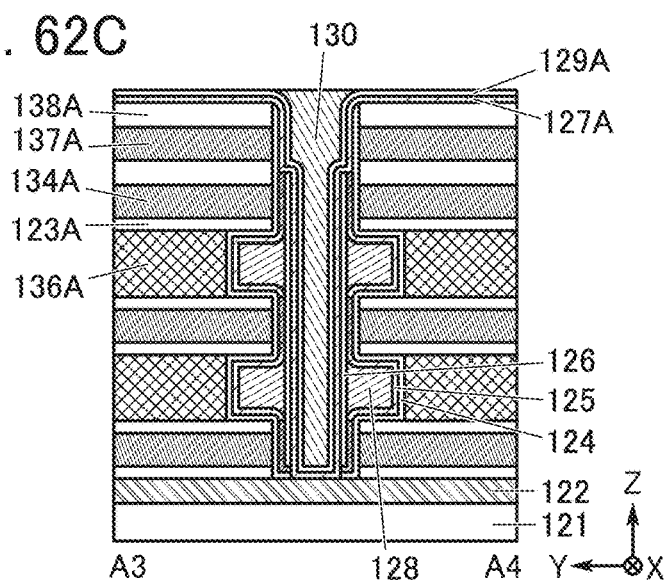

Next, the conductive film 130A is removed by a CMP method or the like until the surface of the insulating film 129A is exposed, whereby the conductor 130 is obtained (see FIG. 62A to FIG. 62C). Note that the above-described heat treatment may be performed after the formation of the conductor 130.

Figure 63A:
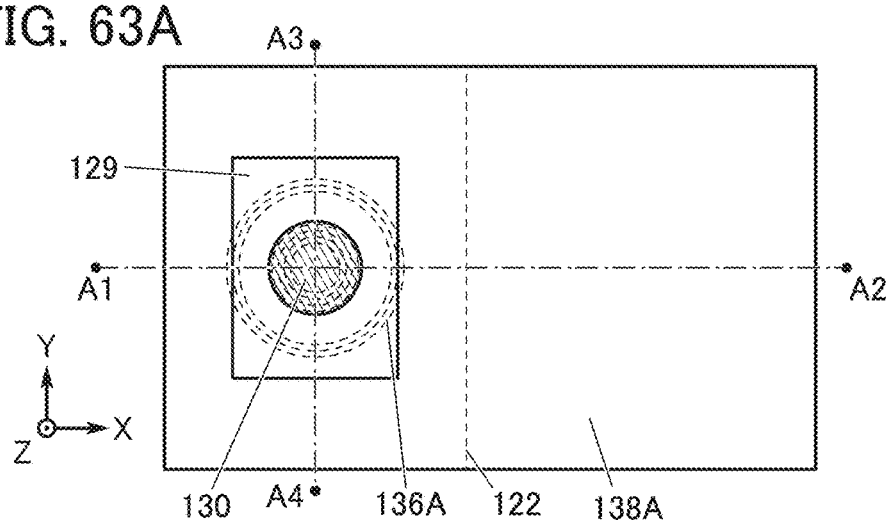
FIG. 63A to FIG. 63C are cross-sectional views illustrating the process for manufacturing a semiconductor device of one embodiment of the present invention.
Figure 63B:
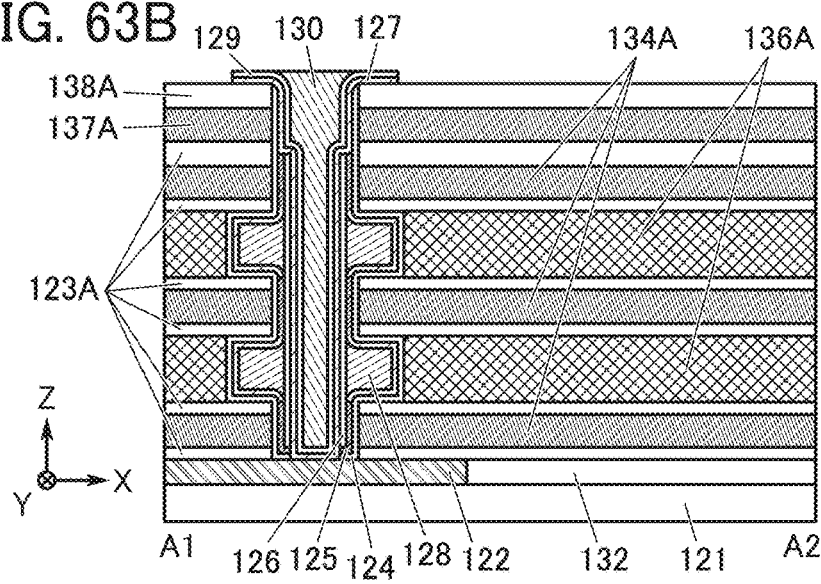
Figure 63C:
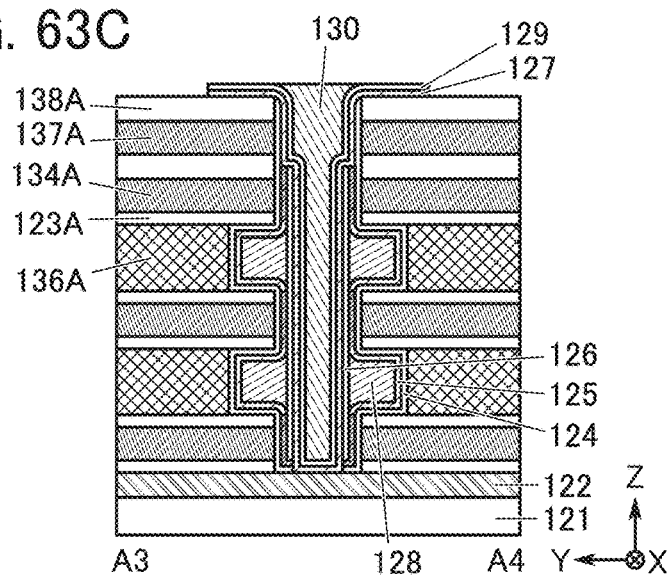

Next, the semiconductor film 127A and the insulating film 129A are processed, whereby the semiconductor 127 and the insulator 129 are obtained (see FIG. 63A to FIG. 63C).

Figure 64A:
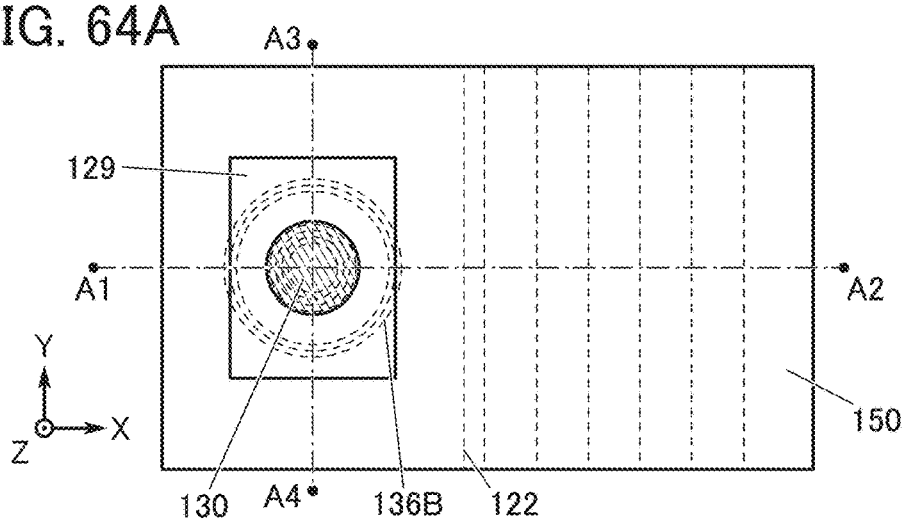
FIG. 64A to FIG. 64C are cross-sectional views illustrating the process for manufacturing a semiconductor device of one embodiment of the present invention.
Figure 64B:
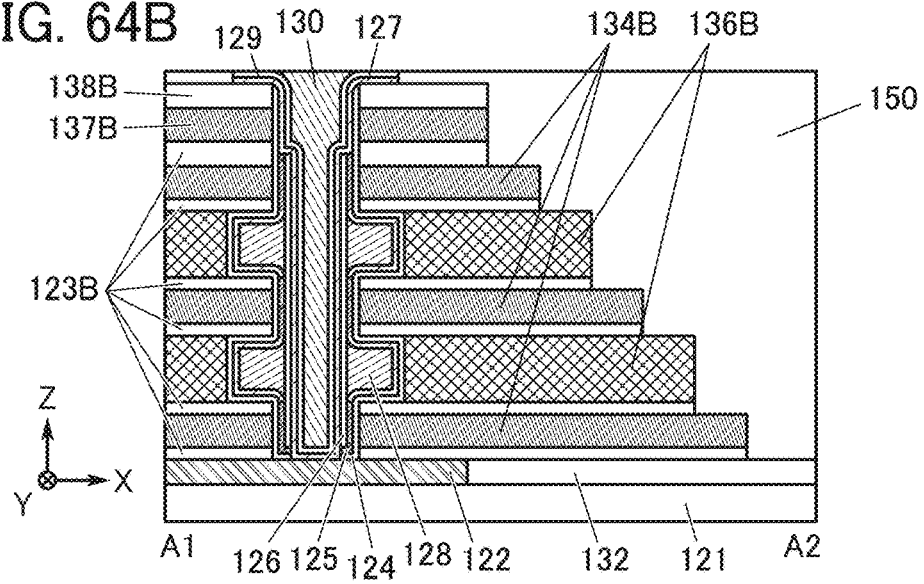
Figure 64C:
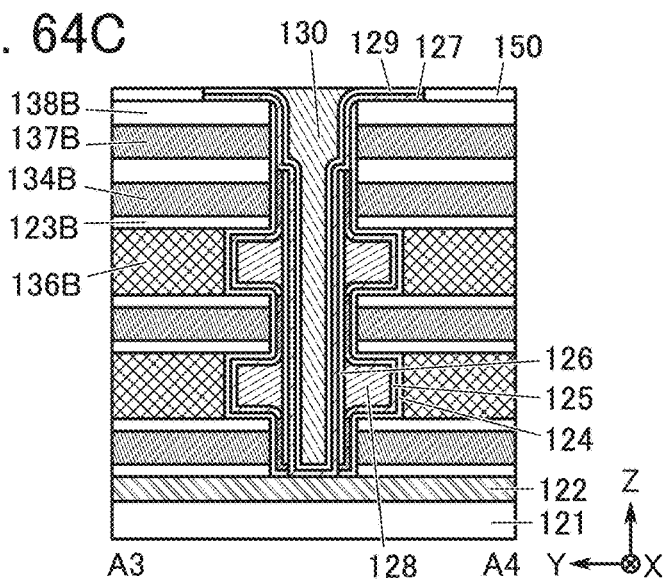

Next, the insulating film 138A, the conductive film 137A, the insulating films 123A, the conductive films 134A and the conductive films 136A are processed, so that an insulator 138B, a conductor 137B, the insulators 123B, the conductors 134B, and the conductors 136B having a step-like shape as illustrated in FIG. 64B are formed (see FIG. 64A to FIG. 64C). In the processing of the insulating film 138A, the conductive film 137A, the insulating films 123A, the conductive films 134A, and the conductive films 136A, etching of the insulating film 138A, the conductive film 137A, the insulating films 123A, the conductive films 134A, and the conductive films 136A and slimming of a mask are alternately performed, whereby the insulator 138B, the conductor 137B, the insulators 123B, the conductors 134B, and the conductors 136B having a step-like shape can be formed.

Subsequently, the insulator 150 is formed. The insulator 150 can be formed by a CVD method as described above. The insulator 150 is preferably subjected to planarization treatment by a CMP method or a reflow method.

Figure 65A:
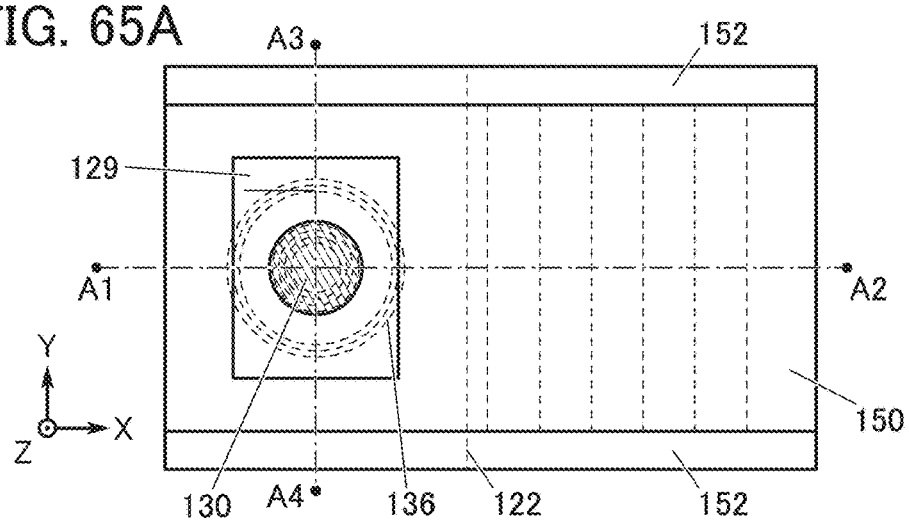
FIG. 65A to FIG. 65C are cross-sectional views illustrating the process for manufacturing a semiconductor device of one embodiment of the present invention.
Figure 65B:
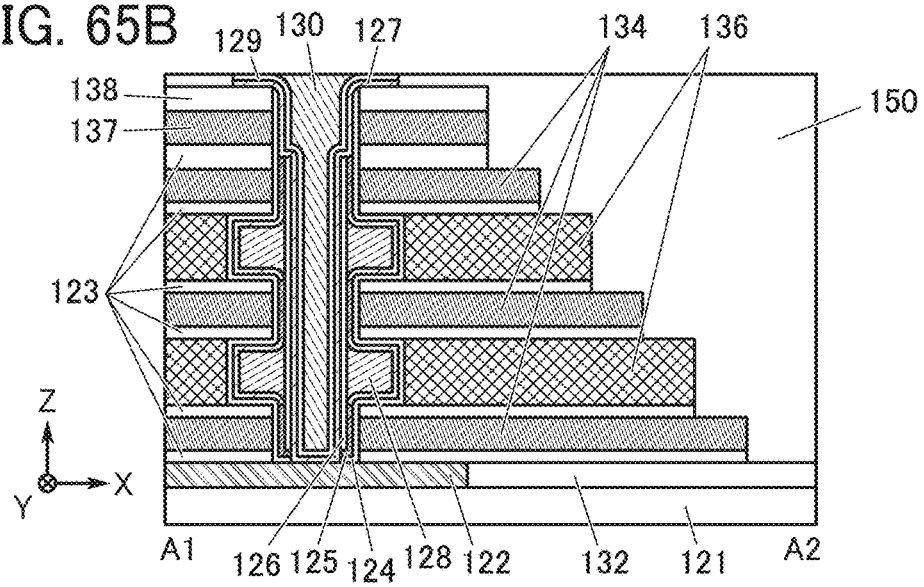
Figure 65C:
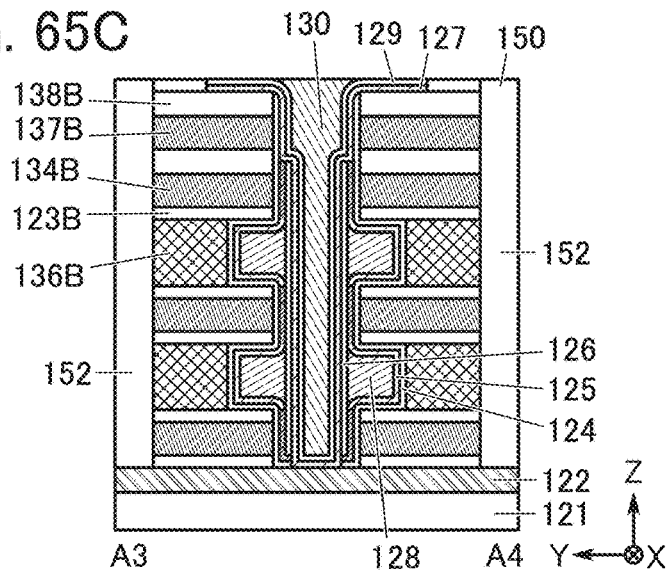

Next, the insulator 150, the insulator 138B, the conductor 137B, the insulators 123B, the conductors 134B, and the conductors 136B are processed, so that the insulator 138, the conductor 137, the insulators 123, the conductors 134, and the conductors 136 are obtained (see FIG. 65A to FIG. 65C). At this time, in the case where the memory string 120 is divided as illustrated in FIG. 9A to FIG. 10F, the conductor 130, the insulator 129, the semiconductor 127, the insulator 126, the conductor 128, the semiconductor 125, and the insulator 124 may be processed.

Then, the insulators 152 are formed so as to be embedded in the areas removed by the above-described processing. The insulators 152 are preferably subjected to planarization treatment by a CMP method or a reflow method. In the case where the memory string 120 is processed to be divided, the insulator 153 may be formed at the same time as the formation of the insulator 152 and/or by a method similar to the formation method of the insulator 152. Note that although one memory string is provided between two insulators 152 in the example illustrated in FIG. 65A and FIG. 65C, this embodiment is not limited to the example. A plurality of memory strings may be provided between the two insulators 152 in the Y direction. At this time, the plurality of memory strings share the conductors 134, the conductors 136, the conductor 137, and the like. Furthermore, at this time, independent wirings BL are preferably electrically connected to the semiconductor 127.

Figure 66A:
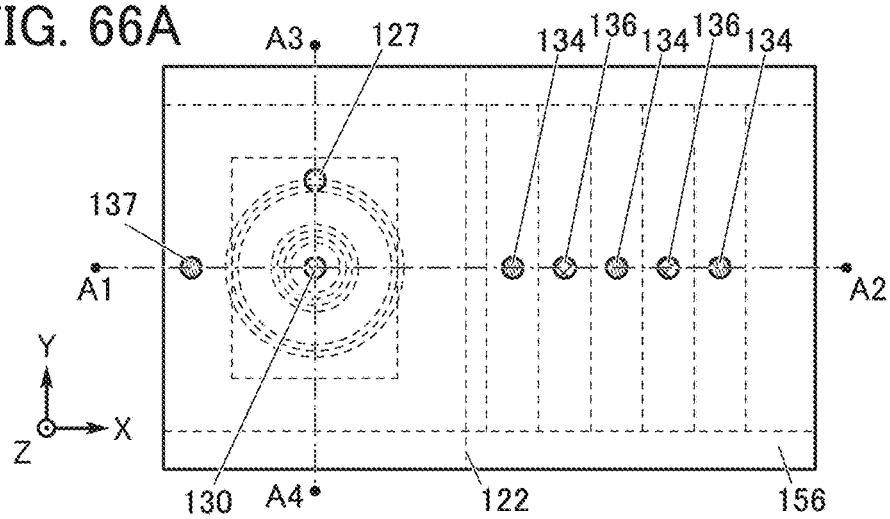
FIG. 66A to FIG. 66C are cross-sectional views illustrating the process for manufacturing a semiconductor device of one embodiment of the present invention.
Figure 66B:
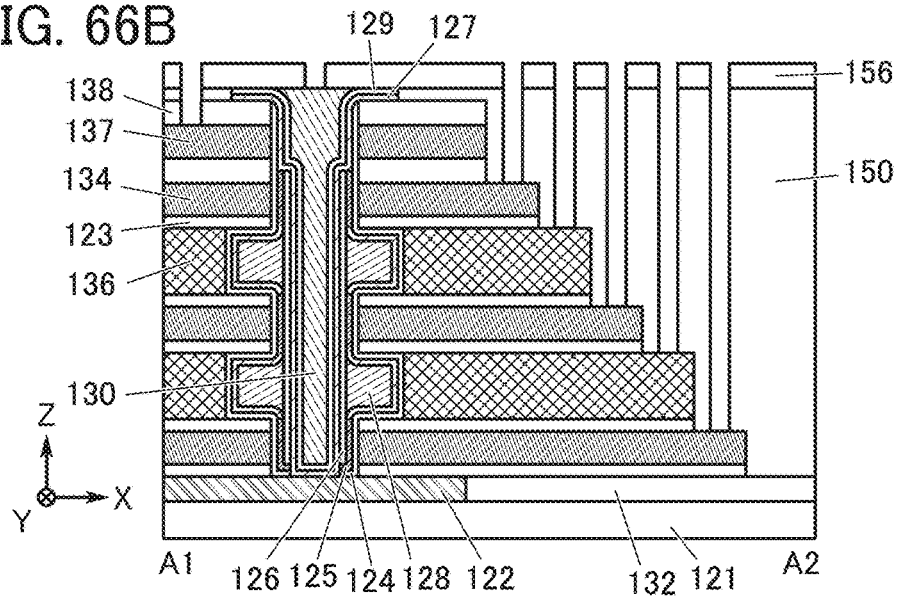
Figure 66C:
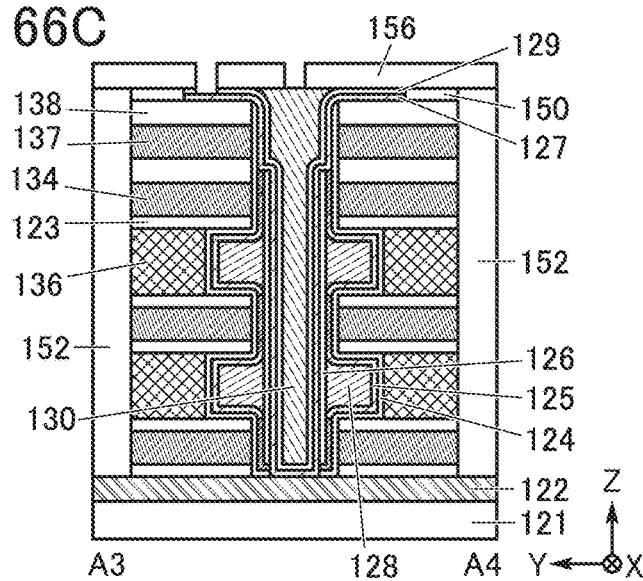

Next, the insulator 156 is formed so as to cover the conductor 130, the insulator 129, the insulator 150, and the insulators 152 (see FIG. 66A to FIG. 66C).

Next, the insulator 156, the insulator 129, the insulator 138, and the insulator 150 are processed by a lithography technique, whereby second openings are formed so as to expose the conductors 134, the conductors 136, the conductor 130, the conductor 137, and the semiconductor 127. The second opening is formed in each of positions overlapping with the conductors 134 and the conductors 136 formed stepwise (see FIG. 66A to FIG. 66C).

Figure 67A:
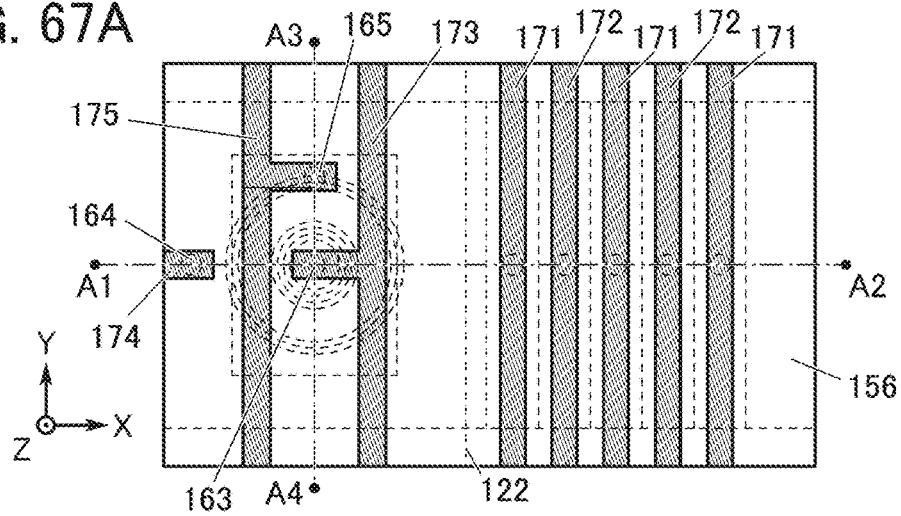
FIG. 67A to FIG. 67C are cross-sectional views illustrating the process for manufacturing a semiconductor device of one embodiment of the present invention.
Figure 67B:
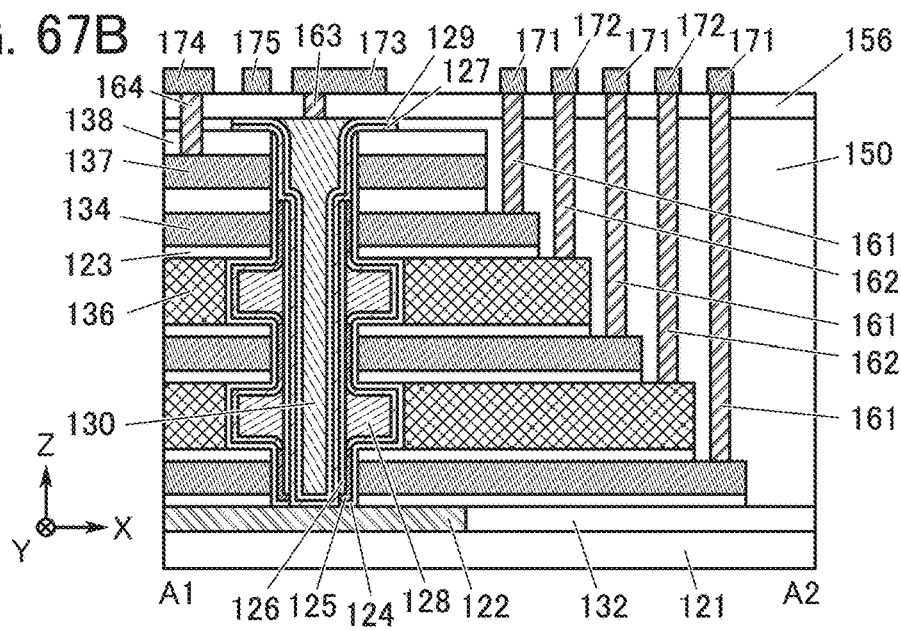
Figure 67C:
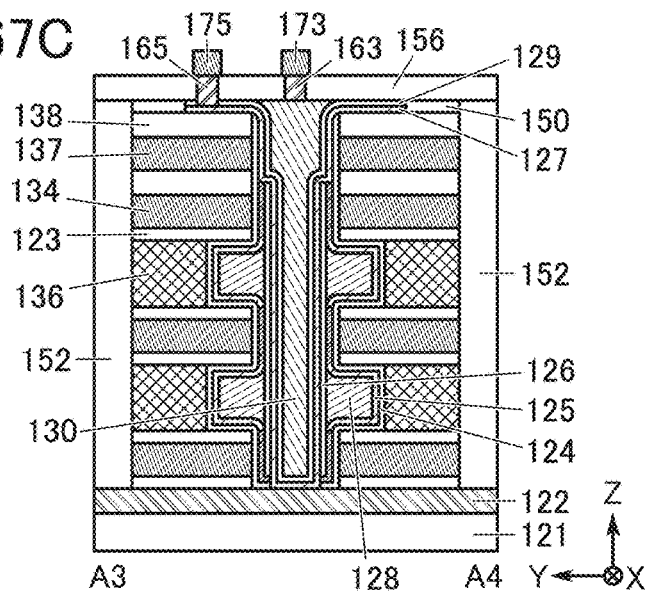

Next, the conductors 161 electrically connected to the conductors 134, the conductors 162 electrically connected to the conductors 136, the conductor 163 electrically connected to the conductor 130, the conductor 164 electrically connected to the conductor 137, and the conductor 165 electrically connected to the semiconductor 127 are formed so as to be embedded in the second openings (see FIG. 67A to FIG. 67C).

Next, the conductors 171 electrically connected to the conductors 161, the conductors 172 electrically connected to the conductors 162, the conductor 173 electrically connected to the conductor 163, the conductor 174 electrically connected to the conductor 164, and the conductor 175 electrically connected to the conductor 165 are formed.

As in the memory device 100 described in the above embodiment, the conductors 171, the conductors 161, and the conductors 134 function as the conductor SG or the conductors WWL in the memory device 100A. Similarly, the conductors 172, the conductors 162, and the conductors 136 function as the conductors RWL. Similarly, the conductor 173, the conductor 163, and the conductor 130 function as the conductor BG. The conductor 174, the conductor 164, and the conductor 137 function as the conductors SEL. The conductor 175 and the conductor 165 function as the conductors BL. Through the above-described steps, the transistor STr1 that includes the semiconductor 127 functioning as the channel formation region and the conductor 134 functioning as the gate; the transistor STr2 that includes the semiconductor 127 functioning as the channel formation region and the conductor 137 functioning as the gate; the transistor WTr that includes the semiconductor 125 functioning as the channel formation region and the conductor 134 functioning as the gate; and the transistor RTr that includes the semiconductor 127 functioning as the channel formation region, the conductor 136 functioning as the gate, the conductor 130 functioning as the back gate, and the conductor 128 between the semiconductor 127 and the conductor 136 can be manufactured. Furthermore, the memory device including the transistor STr1, the transistor STr2, the transistor WTr, and the transistor RTr can be manufactured.

<Circuit Structure Example of Memory String>

Figure 68:
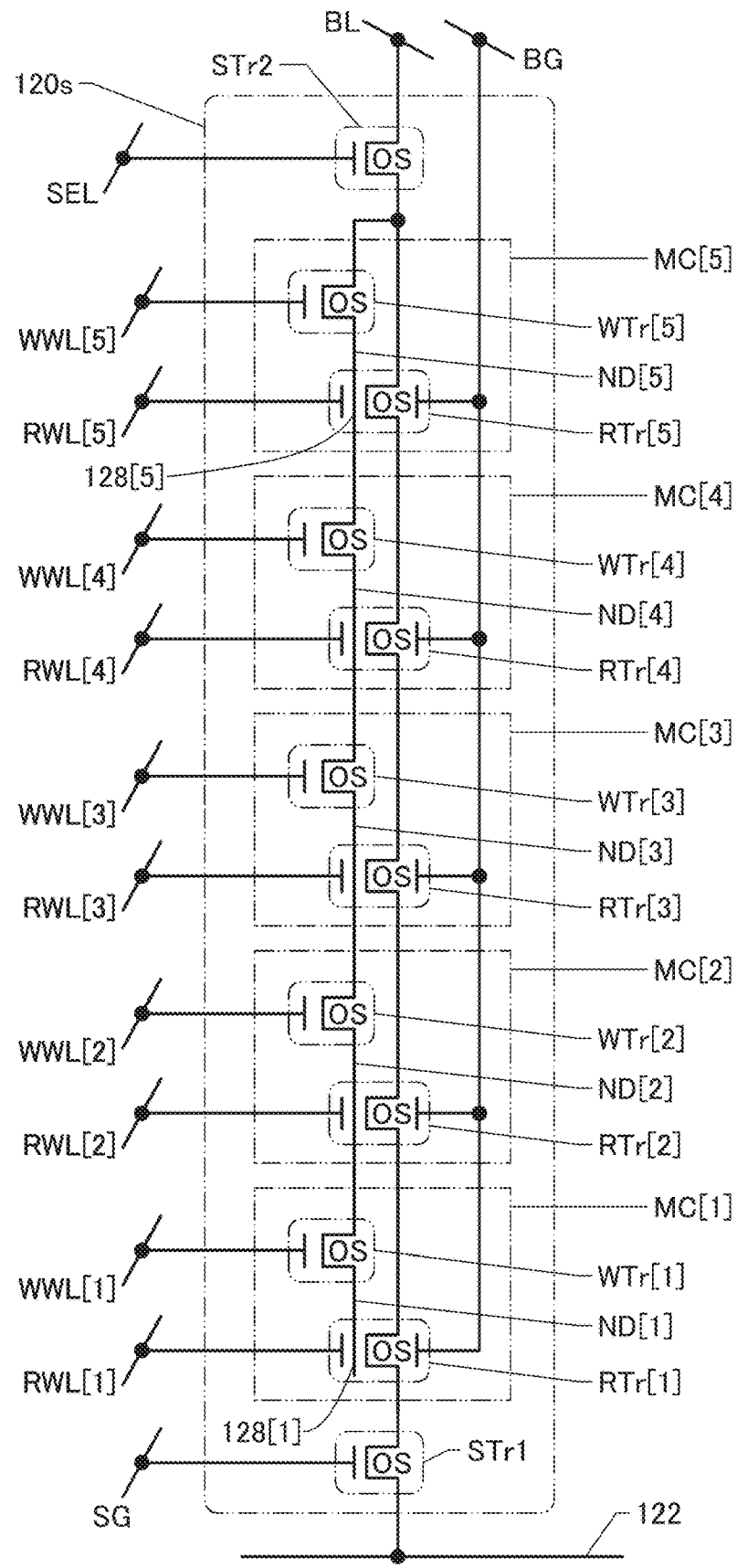
FIG. 68 is a diagram illustrating a circuit structure example of a memory string.

FIG. 68 illustrates a circuit structure example of the memory string 120s. In the circuit structure example illustrated in FIG. 68, the orientation of the transistor STr2 is changed and the positions of the conductor SEL and the wiring BL are interchanged as compared with those in the circuit structure example illustrated in FIG. 29. Note that the circuit structure example of the memory string 120 illustrated in FIG. 29 and the circuit structure example illustrated in FIG. 68 are substantially the same circuit structure. The memory string 120s can operate in a manner similar to that of the memory string 120. Furthermore, a variation similar to that of the memory string 120 can also be applied to the memory string 120s.

This embodiment can be implemented in combination with any of the structures described in the other embodiments and the like, as appropriate.

Embodiment 4

In this embodiment, a structure example of a semiconductor device 400 including the memory device 100 is described. Note that instead of the memory device 100, the memory device 100A may be used as well.

Figure 69:
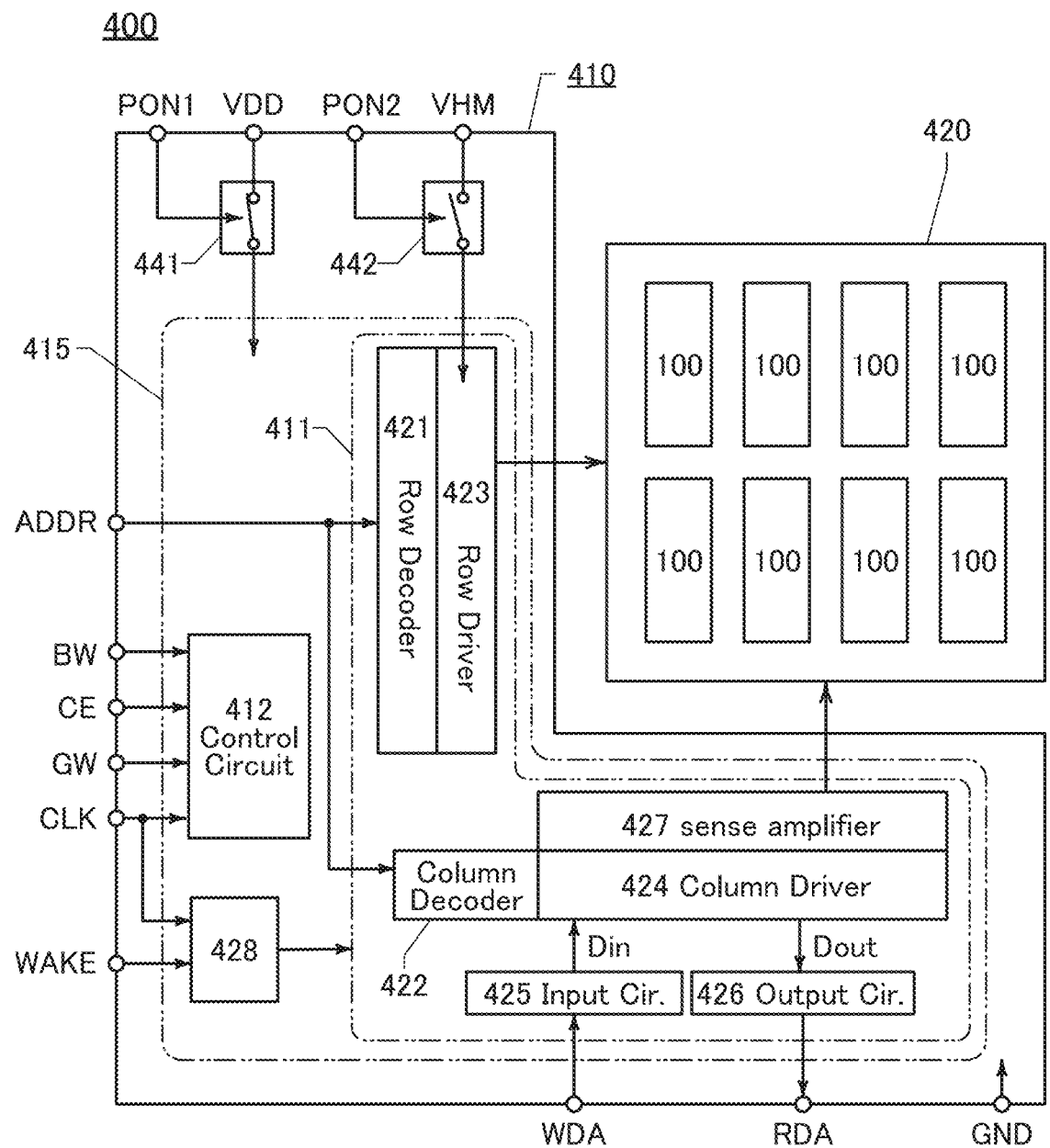
FIG. 69 is a block diagram illustrating a structure example of a semiconductor device.

FIG. 69 is a block diagram showing a structure example of the semiconductor device 400 of one embodiment of the present invention. The semiconductor device 400 illustrated in FIG. 69 includes a driver circuit 410 and a memory array 420. The memory array 420 includes one or more memory devices 100. FIG. 69 illustrates an example in which the memory array 420 includes a plurality of memory devices 100 arranged in a matrix.

The driver circuit 410 includes a PSW 441 (power switch), a PSW 442, and a peripheral circuit 415. The peripheral circuit 415 includes a peripheral circuit 411, a control circuit 412 (Control Circuit), and a voltage generation circuit 428.

In the semiconductor device 400, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signals BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signal PON1 and the signal PON2 may be generated in the control circuit 412.

The control circuit 412 is a logic circuit having a function of controlling the overall operation of the semiconductor device 400. For example, the control circuit performs a logical operation on the signal CE, the signal GW, and the signal BW to determine an operation mode of the semiconductor device 400 (e.g., a writing operation or a reading operation). Alternatively, the control circuit 412 generates a control signal for the peripheral circuit 411 so that the operation mode is executed.

The voltage generation circuit 428 has a function of generating a negative voltage. The signal WAKE has a function of controlling the input of the signal CLK to the voltage generation circuit 428. For example, when an H-level signal is applied as the signal WAKE, the signal CLK is input to the voltage generation circuit 428, and the voltage generation circuit 428 generates a negative voltage.

The peripheral circuit 411 is a circuit for writing and reading data to/from the memory device 100. The peripheral circuit 411 includes a row decoder 421, a column decoder 422, a row driver 423, a column driver 424, an input circuit 425, an output circuit 426, and a sense amplifier 427.

The row decoder 421 and the column decoder 422 have a function of decoding the signal ADDR. The row decoder 421 is a circuit for specifying a row to be accessed, and the column decoder 422 is a circuit for specifying a column to be accessed. The row driver 423 has a function of selecting a wiring WL specified by the row decoder 421. The column driver 424 has a function of writing data to the memory device 100, a function of reading data from the memory device 100, a function of retaining the read data, and the like.

The input circuit 425 has a function of retaining the signal WDA. Data retained by the input circuit 425 is output to the column driver 424. Data output from the input circuit 425 is data (Din) to be written to the memory device 100. Data (Dout) read from the memory device 100 by the column driver 424 is output to the output circuit 426. The output circuit 426 has a function of retaining Dout. In addition, the output circuit 426 has a function of outputting Dout to the outside of the semiconductor device 400. Data output from the output circuit 426 is the signal RDA.

The PSW 441 has a function of controlling the supply of $V_{DD}$ to the peripheral circuit 415. The PSW 442 has a function of controlling the supply of $V_{HM}$ to the row driver 423. Here, in the semiconductor device 400, a high power supply voltage is $V_{DD}$ and a low power supply voltage is GND (a ground potential). In addition, $V_{HM}$ is a high power supply voltage used to set the word line to the H level and is higher than $V_{DD}$. The on/off of the PSW 441 is controlled by the signal PON1, and the on/off of the PSW 442 is controlled by the signal PON2. The number of power domains to which $V_{DD}$ is supplied is one in the peripheral circuit 415 in FIG. 69 but can be more than one. In this case, a power switch is provided for each power domain.

Figure 70A:
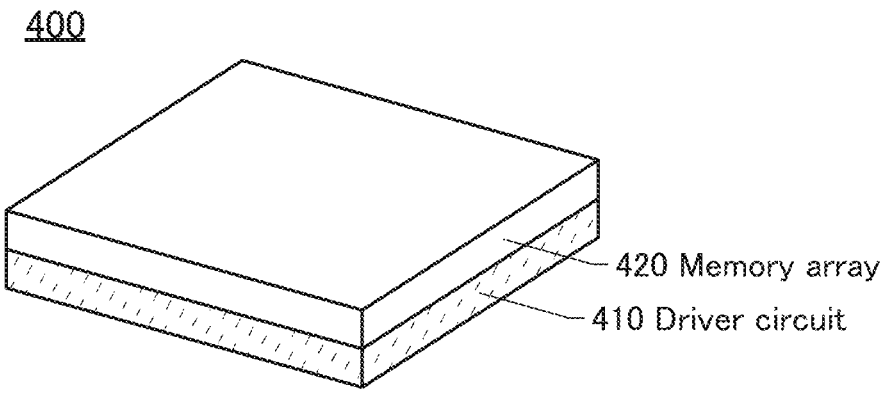
FIG. 70A to FIG. 70C are perspective views illustrating structure examples of semiconductor devices.
Figure 70B:
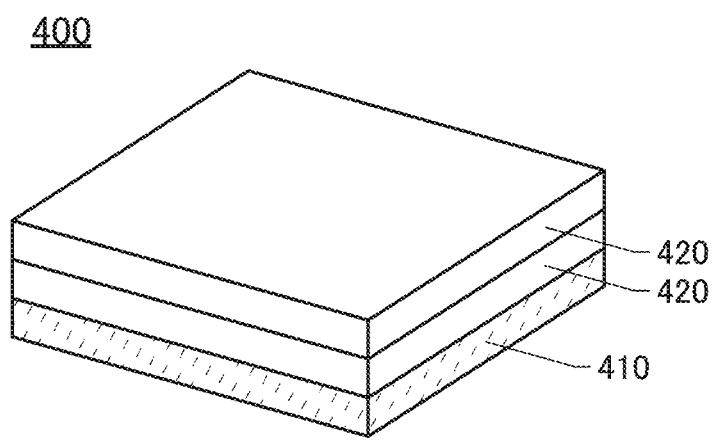

The driver circuit 410 and the memory array 420 may be provided on the same plane. As illustrated in FIG. 70A, the driver circuit 410 and the memory array 420 may be provided to overlap with each other. When the driver circuit 410 and the memory array 420 overlap with each other, the signal transmission distance can be shortened. Alternatively, a plurality of memory arrays 420 may be provided over the driver circuit 410 as illustrated in FIG. 70B.

Figure 70C:
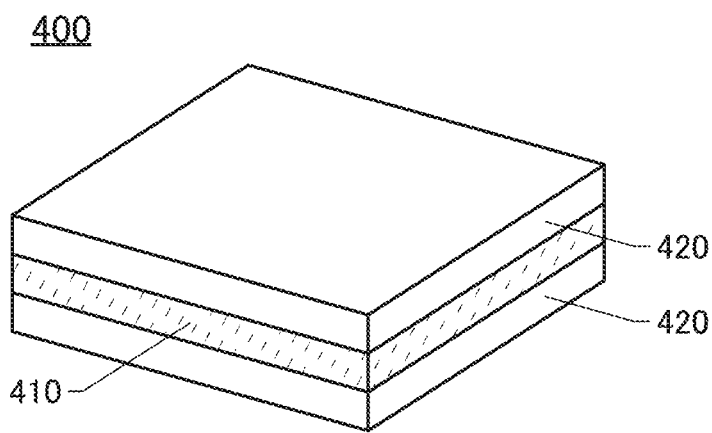

As illustrated in FIG. 70C, the memory array 420 may be provided over and under the driver circuit 410. FIG. 70C illustrates an example in which one memory array 420 is provided over and under the driver circuit 410. Providing a plurality of memory arrays 420 so that the driver circuit 410 is sandwiched therebetween can further shorten the signal propagation distance. The number of memory arrays 420 stacked over the driver circuit 410 and the number of memory arrays 420 stacked under the driver circuit 410 may each be one or more. The number of memory arrays 420 stacked over the driver circuit 410 is preferably equal to the number of memory arrays 420 stacked under the driver circuit 410.

<Cross-Sectional Structure Example of Semiconductor Device 400>

Figure 71:
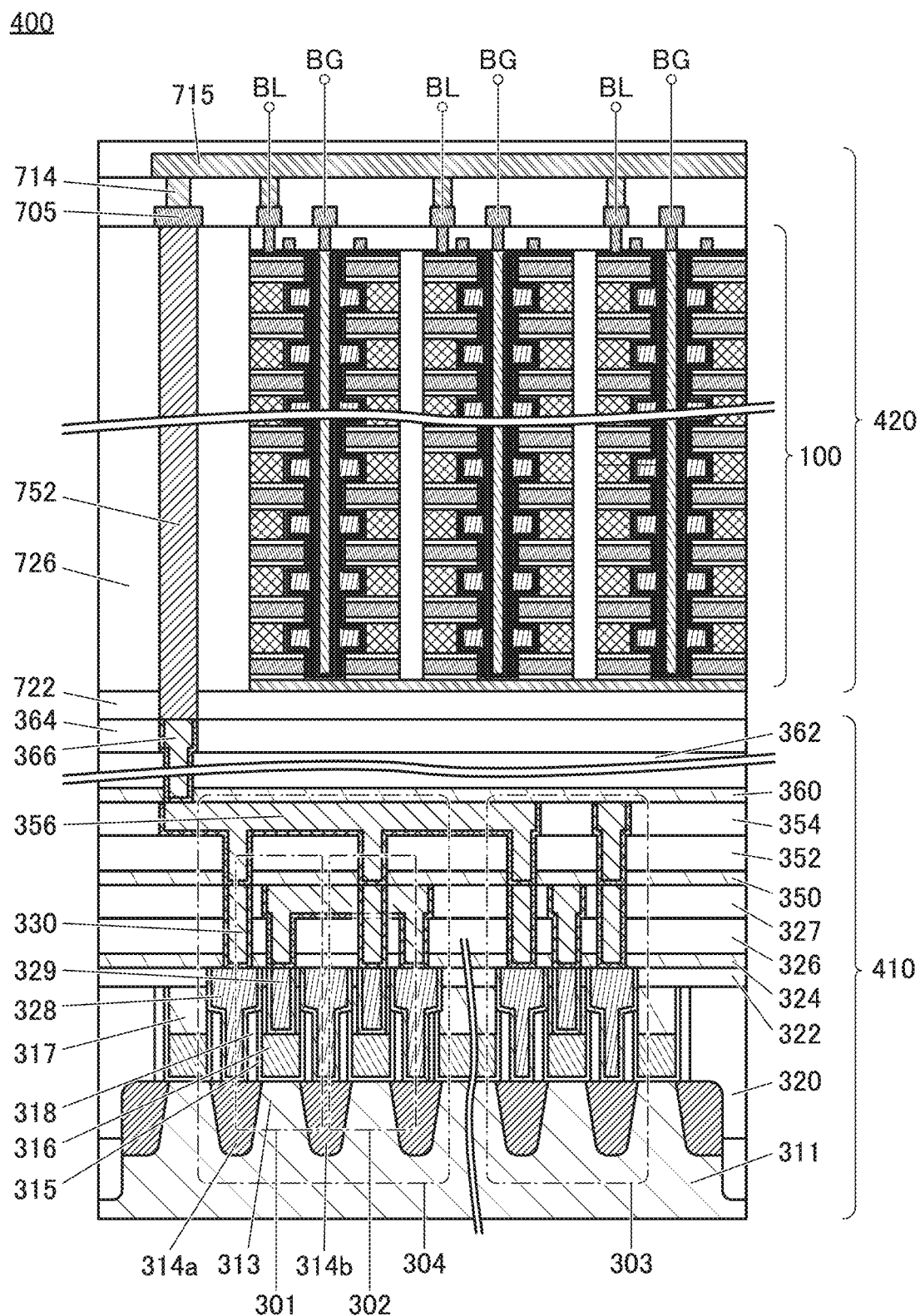
FIG. 71 is a cross-sectional view illustrating a semiconductor device of one embodiment of the present invention.

FIG. 71 illustrates a cross-sectional structure example of the semiconductor device 400 illustrated in FIG. 70A. In FIG. 71, part of the semiconductor device 400 illustrated in FIG. 70A is illustrated.

FIG. 71 illustrates a transistor 301, a transistor 302, and a transistor 303 included in the driver circuit 410. Note that the transistor 301 and the transistor 302 function as part of the sense amplifier 427. Furthermore, the transistor 303 functions as a column selection switch. Specifically, the conductor BL included in the memory array 420 is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which functions as the column selection switch. Accordingly, the layout area of the semiconductor device 400 can be reduced. Note that an example where seven memory elements MC are provided per memory string is illustrated in FIG. 71. However, the number of memory elements MC provided in a memory string is not limited thereto. For example, the number of memory elements MC provided in a memory string may be 32, 64, 128, or 200 or more.

The conductor BL of the memory array 420 is electrically connected to the sense amplifier 427 and the transistor 303 serving as the column selection switch through a conductor 752 formed to be embedded in an insulator 726, the insulator 722, and the like, a conductor 705, a conductor 714, and a conductor 715. Note that circuits and transistors included in the driver circuit 410 are examples, and one embodiment of the present invention is not limited to the circuit structures and the transistor structures. In addition to the above, a transistor or a circuit such as a control circuit, a row decoder, a row driver, a source line driver, or an input-output circuit can be provided as appropriate in accordance with the structure or driving method of the semiconductor device 400.

The transistor 301, the transistor 302, and the transistor 303 are provided on a substrate 311 and each include a conductor 316, an insulator 315, a semiconductor region 313 that is part of the substrate 311, and a low-resistance region 314a and a low-resistance region 314b serving as a source region and a drain region. Note that as shown in FIG. 71, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate. Note that an insulator serving as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Although each of the transistor 301, the transistor 302, and the transistor 303 may be either a p-channel transistor or an n-channel transistor, the transistor 301 and the transistor 302 are preferably transistors having different polarities.

It is preferable that a region of the semiconductor region 313 where the channel is formed, a region in the vicinity thereof, the low-resistance region 314a and the low-resistance region 314b serving as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistor 301, the transistor 302, and the transistor 303.

As the conductor 316 serving as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An insulator 317 serving as an etching stopper is preferably provided above the conductor 316. In addition, an insulator 318 serving as a spacer is preferably provided on a side surface of the insulator 315. When the insulator 317 and the insulator 318 are provided, regions where the low-resistance region 314a and the low-resistance region 314b and a conductor 328 are electrically connected to each other can be defined in a self-aligned manner. Thus, even when misalignment occurs in forming the openings for exposing part of the low-resistance region 314a and the low-resistance region 314b, the openings for exposing the intended regions can be formed. The conductor 328 provided in the openings formed in this manner can provide a favorable contact with reduced contact resistance between the low-resistance region 314a and the low-resistance region 314b and the conductor 328. The contact between the low-resistance region 314a and the low-resistance region 314b and the conductor 328 which is formed in this manner may be referred to as a self-aligned contact. Furthermore, a conductor 329 electrically connected to the conductor 316 may be provided so as to be embedded in the insulator 317 and an insulator 322.

An insulator 320, the insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 301 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 301, or the like into the region where the memory array 420 is provided.

For the film having a barrier property against hydrogen, silicon nitride formed by a CVD method can be used, for example. Here, diffusion of hydrogen into a semiconductor element including an oxide semiconductor, such as the memory elements MC, degrades the characteristics of the semiconductor element in some cases. Therefore, a film that inhibits hydrogen diffusion is preferably used between the memory elements MC and the transistor 301 and the like. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm², preferably less than or equal to $5 \times 10^{15}$ atoms/cm², in the TDS analysis in a film-surface temperature range of 50° C. to 500° C., for example.

Note that the permittivity of each of the insulator 326 and the insulator 327 is preferably lower than that of the insulator 324. For example, the relative permittivity of each of the insulator 326 and the insulator 327 is preferably lower than 4, further preferably lower than 3. The relative permittivity of each of the insulator 326 and the insulator 327 is, for example, preferably less than or equal to 0.7 times, further preferably less than or equal to 0.6 times the relative permittivity of the insulator 324. When a material with a low permittivity is used for the interlayer film, the parasitic capacitance generated between wirings can be reduced.

The conductor 328, the conductor 329, a conductor 330, and the like that are electrically connected to the memory array 420 are embedded in the insulator 320, the insulator 322, the insulator 324, the insulator 326, and the insulator 327. Note that the conductor 328, the conductor 329, and the conductor 330 have functions of plugs or wirings. A plurality of conductors serving as plugs or wirings are collectively denoted by the same reference numeral in some cases. Furthermore, in this specification and the like, a wiring and a plug electrically connected to the wiring may be a single component. That is, there are cases where part of a conductor serves as a wiring and another part of the conductor serves as a plug.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, each of the plugs and wirings is preferably formed using a low-resistance conductive material such as aluminum or copper. The use of a low-resistance conductive material can reduce wiring resistance.

A wiring layer may be provided over the insulator 327 and the conductor 330. For example, in FIG. 71, an insulator 350, an insulator 352, and an insulator 354 are stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328, the conductor 329, and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 301 and the like and the memory elements MC can be separated by the barrier layer, so that diffusion of hydrogen from the transistor 301 and the like into the memory elements MC can be inhibited.

As the conductor having a barrier property against hydrogen, tantalum nitride is preferably used, for example. In addition, the use of a stack including tantalum nitride and tungsten, which has high conductivity, can inhibit diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 71, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328, the conductor 329, and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 301 and the like and the memory element MC can be separated by the barrier layer.

The insulator 722 is provided over the insulator 364 and the conductor 366, and the memory array 420 is provided above the insulator 722. A barrier film formed using a material similar to that for the insulator 324 may be provided between the insulator 364 and the insulator 722.

Figure 72:
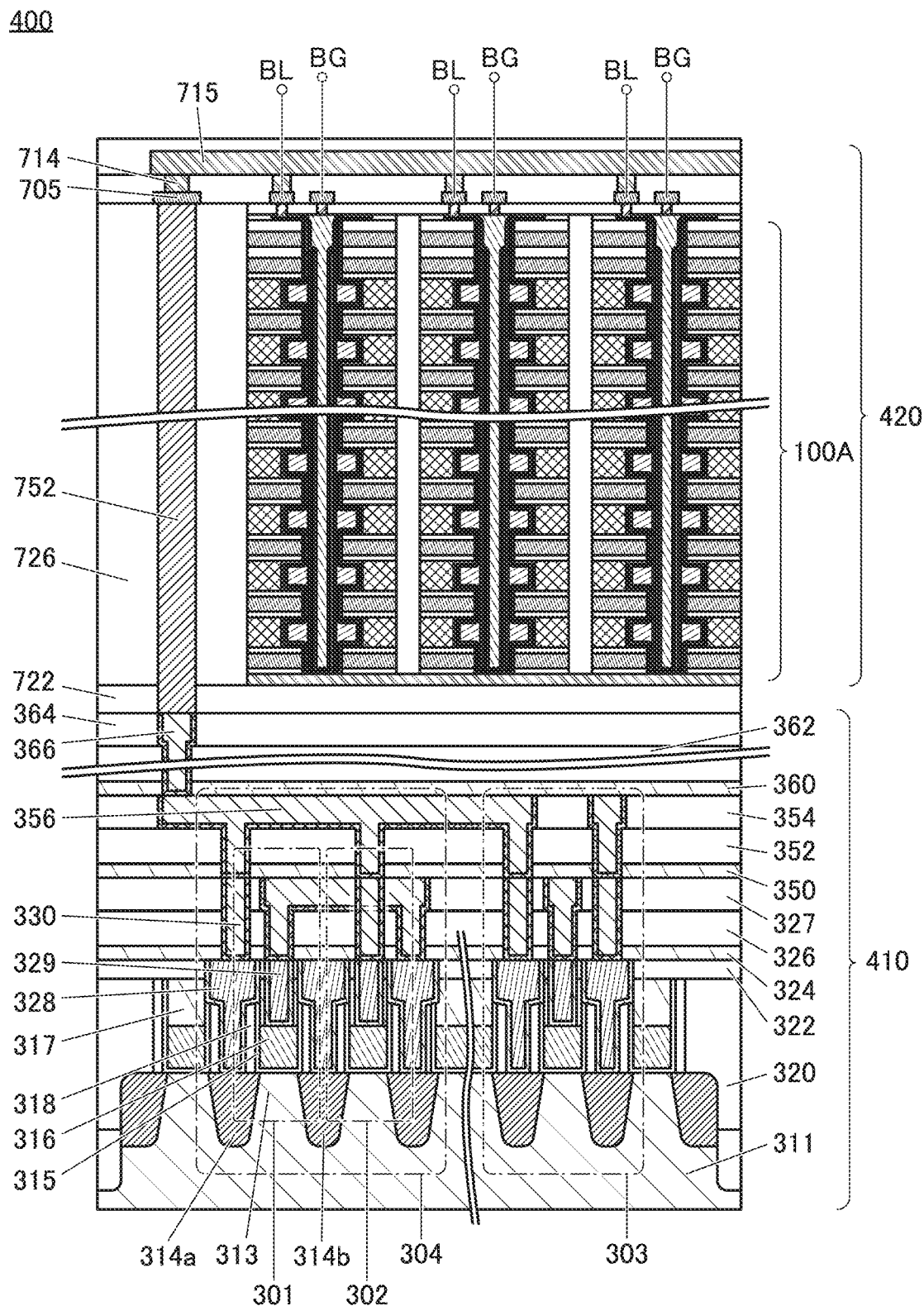
FIG. 72 is a cross-sectional view illustrating a semiconductor device of one embodiment of the present invention.

FIG. 72 illustrates a cross-sectional structure example of the semiconductor device 400 in which the memory device 100A is used instead of the memory device 100.

This embodiment can be implemented in an appropriate combination with the structures described in the other embodiments and the like.

Embodiment 5

In this embodiment, an example of a chip 1200 which is a kind of semiconductor device on which the memory device of the present invention is mounted will be described with reference to FIG. 73A and FIG. 73B. A plurality of circuits (systems) are mounted on the chip 1200. A technique for integrating a plurality of circuits (systems) into one chip is referred to as system on chip (SoC) in some cases.

Figure 73A:
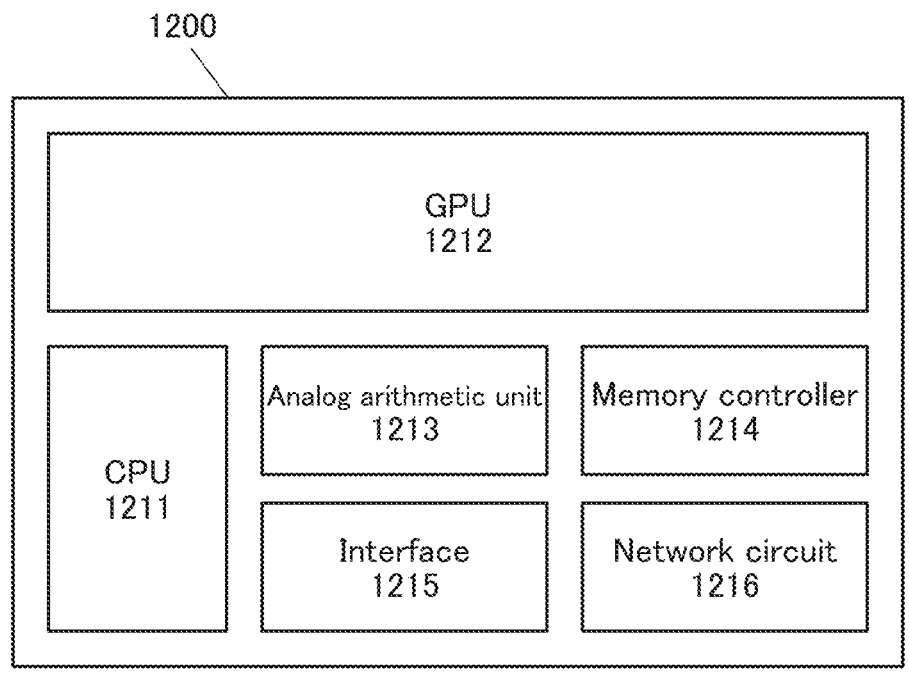
FIG. 73A is a schematic diagram of a semiconductor device.

As illustrated in FIG. 73A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 73B:
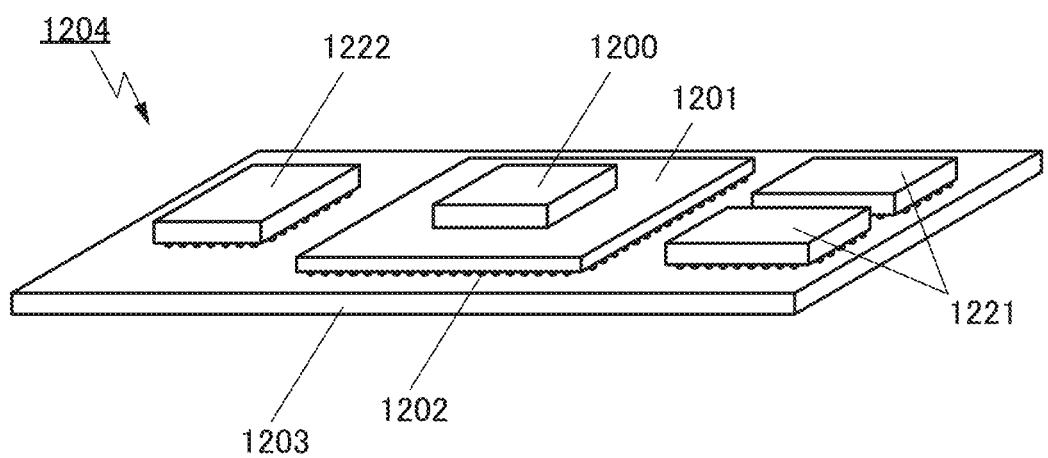
FIG. 73B is a perspective view of the semiconductor device.

A bump (not illustrated) is provided on the chip 1200, and as illustrated in FIG. 73B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. As the flash memory 1222, any of the semiconductor devices described in the above embodiments is preferably used. When any of the semiconductor devices described in the above embodiments is used as the flash memory 1222, the flash memory 1222 can have a large storage capacity.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. Moreover, the GPU 1212 is suitable for parallel computation of a number of data and thus can be used for image processing or a product-sum operation. When an image processing circuit or a product-sum operation circuit is provided in the GPU 1212, image processing and a product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit for the connection to a LAN (Local Area Network) or the like. The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, application examples of the semiconductor device using the memory device described in the above embodiment will be described. The memory device described in the above embodiment can be used for a variety of removable memory devices such as memory cards (e.g., SD cards), USB memories, and SSDs (solid state drives). FIG. 74A to FIG. 74E schematically illustrate some structure examples of removable memory devices. The semiconductor device described in the above embodiment is processed into a packaged memory chip and used in a variety of storage devices and removable memories, for example.

Figure 74A:
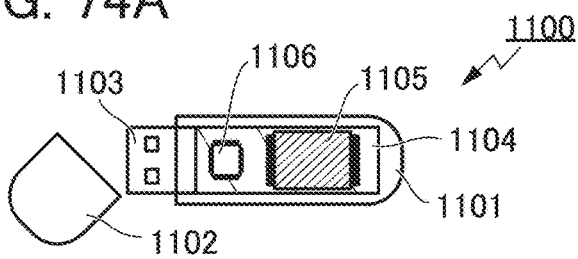
FIG. 74A to FIG. 74E are diagrams for describing examples of memory devices.

FIG. 74A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device described in the above embodiment can be incorporated in the memory chip 1105 or the like.

Figure 74B:
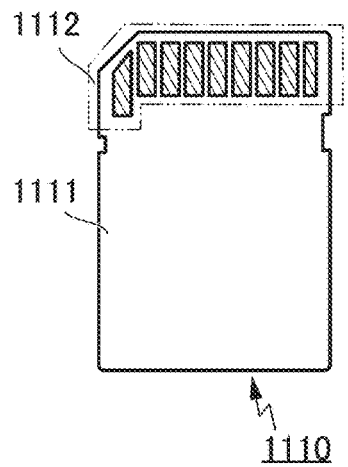
Figure 74C:
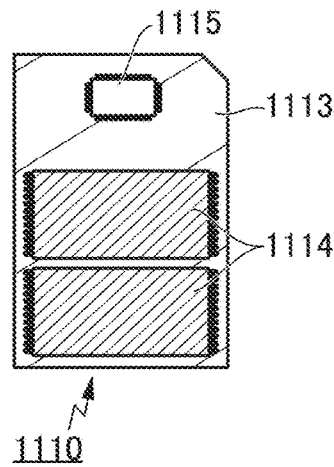

FIG. 74B is a schematic external view of an SD card, and FIG. 74C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The memory device or the semiconductor device described in the above embodiment can be incorporated in the memory chip 1114 or the like.

Figure 74D:
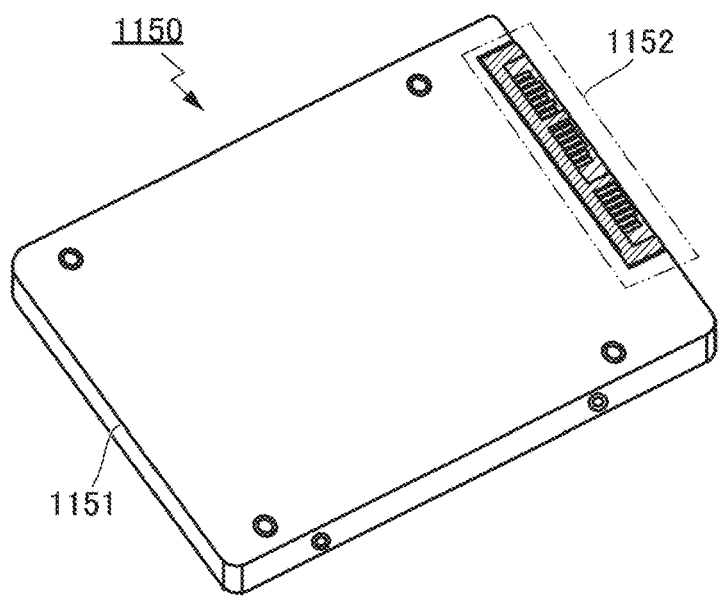
Figure 74E:
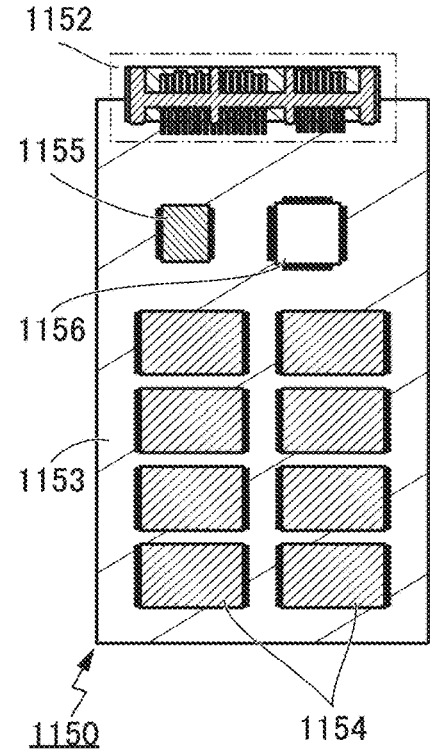

FIG. 74D is a schematic external view of an SSD, and FIG. 74E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The memory device or the semiconductor device described in the above embodiment can be incorporated in the memory chip 1154 or the like.

This embodiment can be implemented in an appropriate combination with the structures described in the other embodiments and the like.

Embodiment 7

FIG. 75A to FIG. 75G illustrate specific examples of electronic devices each provided with the memory device or semiconductor device of one embodiment of the present invention.
<Electronic Device and System>

The memory device or the semiconductor device of one embodiment of the present invention can be mounted on a variety of electronic devices. Examples of electronic devices include an information terminal, a computer, a smartphone, an e-book reader, a television device, digital signage, a large game machine such as a pachinko machine, a digital camera, a digital video camera, a digital photo frame, a mobile phone, a portable game machine, a video recording/reproducing device, a navigation system, and an audio reproducing device. Here, the computer refers not only to a tablet computer, a notebook computer, and a desktop computer, but also to a large computer such as a server system.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.
[Information Terminal]

With the memory device or semiconductor device of one embodiment of the present invention, a memory device for storing a microcontroller program can be configured. Thus, according to one embodiment of the present invention, the size of a microcontroller chip can be reduced.

Figure 75A:
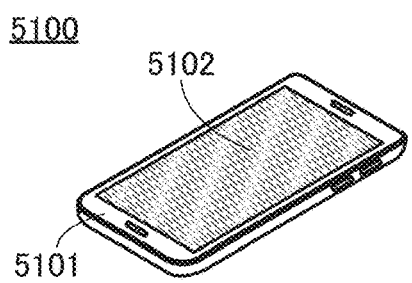
FIG. 75A to FIG. 75G are diagrams for describing examples of electronic devices.

FIG. 75A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 75B:
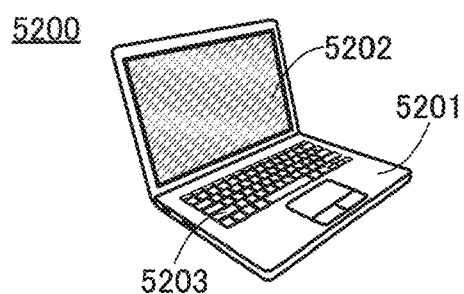

FIG. 75B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIG. 75A and FIG. 75B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.
[Game Machine]

Figure 75C:
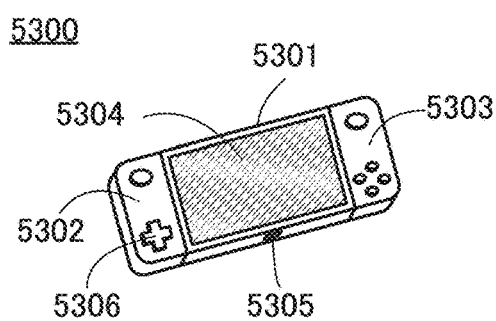

FIG. 75C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The memory device, the semiconductor device, or the like of one embodiment of the present invention can be incorporated into a chip provided on a substrate in the housing 5301, the housing 5302 and the housing 5303, for example.

Figure 75D:
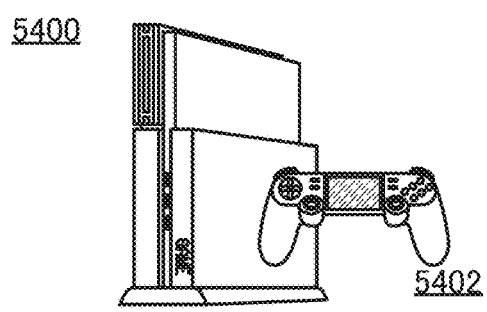

FIG. 75D illustrates a stationary game machine 5400 as an example of a game machine. A controller 5402 is wired or connected wirelessly to the stationary game machine 5400.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although the portable game machine and the stationary game machine are illustrated as examples of game machines in FIG. 75C and FIG. 75D, the game machine using the microcontroller of one embodiment of the present invention is not limited thereto. Examples of game machines using the microcontroller of one embodiment of the present invention include an arcade game machine installed in entertainment facilities (a game center, an amusement park, or the like) and a throwing machine for batting practice installed in sports facilities.

[Large Computer]

The memory device, the semiconductor device, or the like of one embodiment of the present invention can be used in a large computer.

Figure 75E:
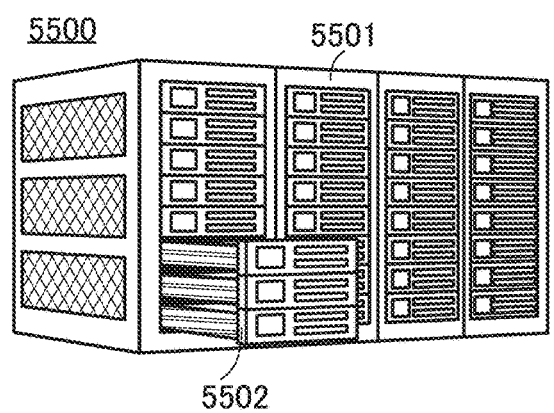
Figure 75F:
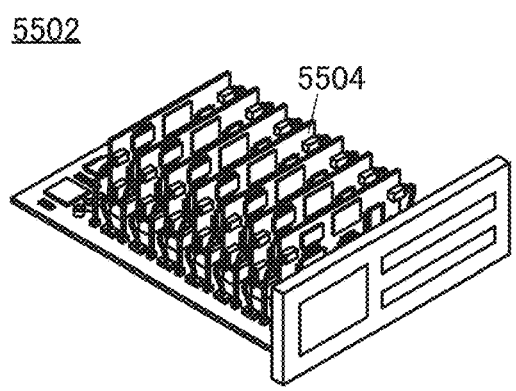

FIG. 75E illustrates a supercomputer 5500 as an example of a large computer. FIG. 75F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, and a microcontroller of one embodiment of the present invention can be mounted on the substrates. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although a supercomputer is illustrated as an example of a large computer in FIG. 75E and FIG. 75F, a large computer using the microcontroller of one embodiment of the present invention is not limited thereto. Examples of a large computer using the microcontroller of one embodiment of the present invention include a computer that provides service (a server) and a large general-purpose computer (a mainframe).

[Household Appliance]

Figure 75G:
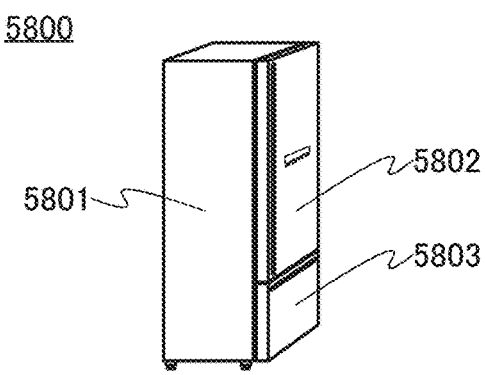

FIG. 75G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

Although the electric refrigerator-freezer is described as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, its effects, and the like described in this embodiment can be combined as appropriate with the description of another electronic device.

This embodiment can be implemented in an appropriate combination with the structures described in the other embodiments and the like.

EXAMPLE

An optimal carrier concentration range of the semiconductor 127 used for the memory string 120 of one embodiment of the present invention was examined using device simulation.

Figure 76A:
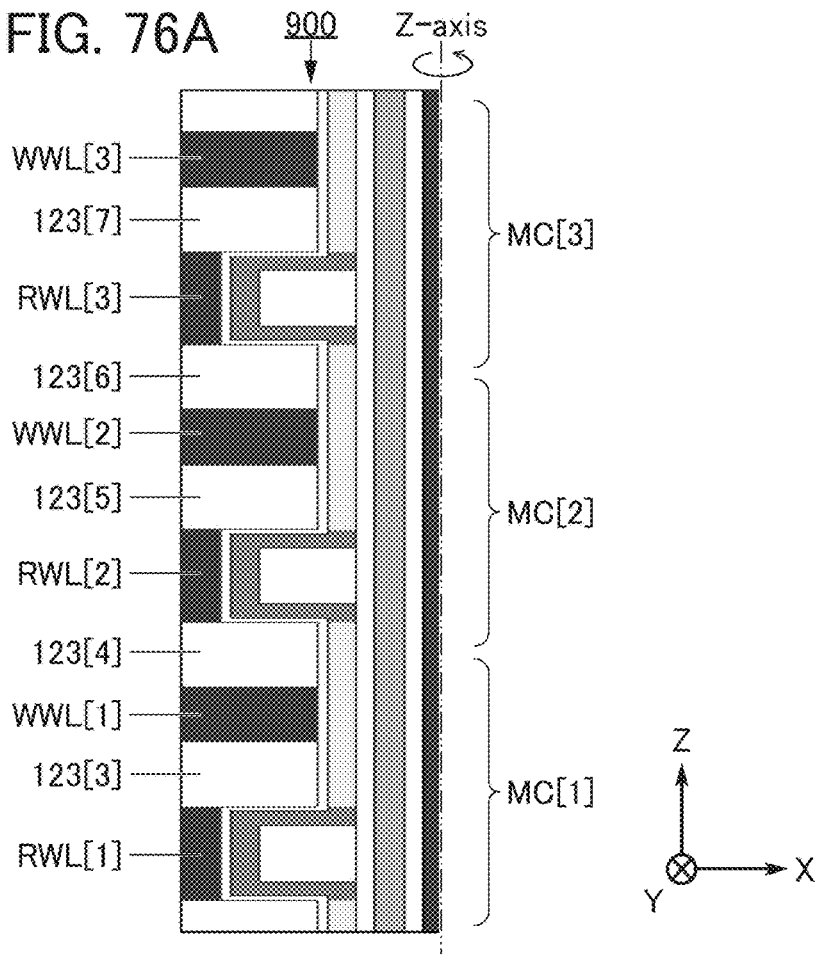
FIG. 76A and FIG. 76B are two-dimensional structural diagrams of a memory string.
Figure 76B:
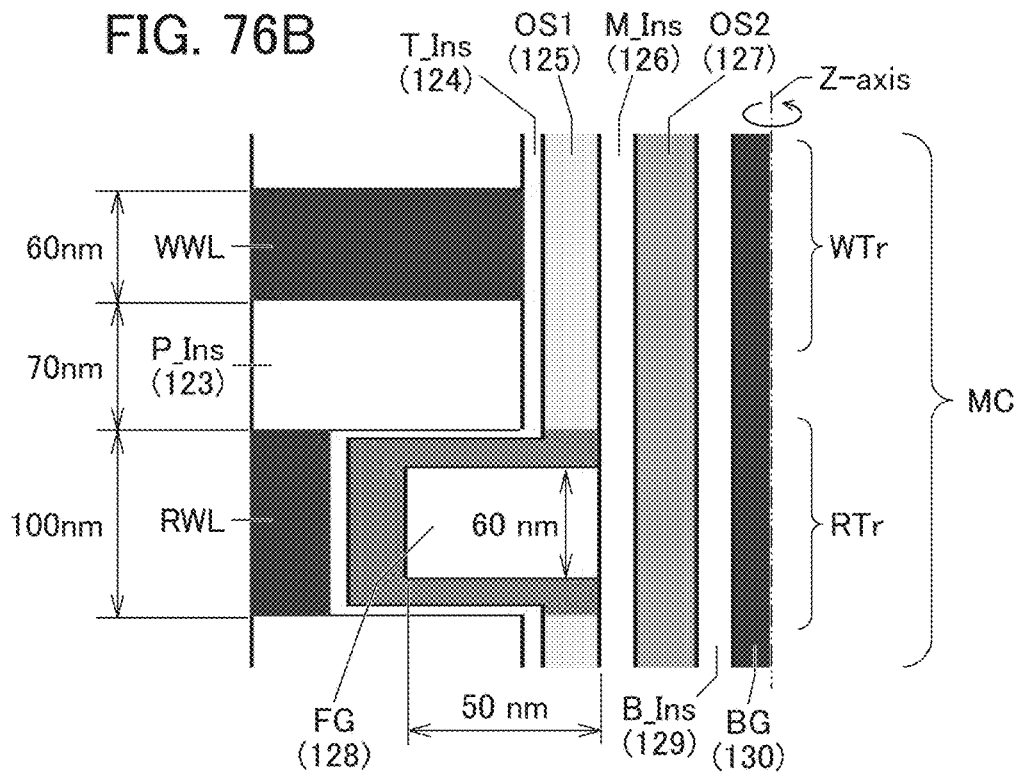

The device simulation was performed using TCAD Sentaurus of Synopsys Inc. The device simulation was performed on the assumption of a memory string including three memory elements MC (memory cells). FIG. 76A is a two-dimensional structural diagram of a memory string 900 used in the device simulation. FIG. 76B is an enlarged view of one of the memory elements MC included in the memory string 900.

As illustrated in FIG. 76A and FIG. 76B, a structure including conductors WWL, conductors RWL, insulators P_Ins (the insulators 123), an insulator T_Ins (the insulator 124), an oxide semiconductor OS1 (the semiconductor 125), an insulator M_Ins (the insulator 126), an oxide semiconductor OS2 (the semiconductor 127), conductors FG (the conductors 128), an insulator B_Ins (the insulator 129), and a conductor BG (the conductor 130) was assumed as the memory string 900.

Table 1 shows setting parameters for the insulators and the conductors. In Table 1, the thicknesses of the insulator T_Ins, the insulator M_Ins, the insulator Bins, and the conductor BG are the lengths of the insulator T_Ins, the insulator M_Ins, the insulator Bins, and the conductor BG in the X direction. Note that in the case of the insulator T_Ins, lengths in directions perpendicular to the side and top surfaces of the conductor FG are each also referred to as the thickness. The thicknesses of the insulator P_Ins, the conductor WWL, and the conductor RWL are the lengths of the insulator P_Ins, the conductor WWL, and the conductor RWL in the Z direction. The length of the conductor FG in the Z direction was set to 60 nm, and the length of the conductor FG in the X direction was set to 50 nm.

TABLE 1

|  | Insulator | | | | Conductor | | |
| --- | --- | --- | --- | --- | --- | --- | --- |
|  | T_Ins | M_Ins | B_Ins | P_Ins | WWL | RWL | BG |
| Thickness [nm] | 5 | 10 | 10 | 70 | 60 | 100 | 10 |
| Relative permittivity | 3.9 | 3.9 | 3.9 | 3.9 | — | — | — |
| Work function [eV] | — | — | — | — | 4.7 | 4.7 | 4.7 |

Table 2 shows setting parameters for the semiconductors. In Table 2, the thicknesses of the oxide semiconductor OS1 and the oxide semiconductor OS2 are the lengths of the oxide semiconductor OS1 and the oxide semiconductor OS2 in the X direction. Note that in the case of the oxide semiconductor OS1, lengths in directions perpendicular to the side and top surfaces of the conductor FG are each also referred to as the thickness.

TABLE 2

| | Semiconductor | |
| --- | --- | --- |
| | OS1 | OS2 |
| Thickness [nm] | 15 | 15 |
| Eg [eV] | 3 | 3 |
| Electron affinity [eV] | 4.6 | 4.6 |
| Relative permittivity | 15 | 15 |
| Electron mobility [cm$^2$/Vs] | 10 | 10 |
| Hole mobility [cm$^2$/Vs] | 0.01 | 0.01 |
| Nc [cm$^{-3}$] | 5.0E+18 | 5.0E+18 |
| Nv [cm$^{-3}$] | 5.0E+18 | 5.0E+18 |

The device simulation was performed on the assumption of the memory string 900 having a circular cylinder structure obtained by rotating the two-dimensional structure illustrated in FIG. 76A about the z-axis by 360°.

Voltage change of the oxide semiconductor OS2 at the time of a reading operation was calculated for both the cases where "0" (the L potential) was retained in the node ND[3] and where "1" (the H potential) was retained in the node ND[3]. In the simulation, the L potential was 0 V and the H potential was 1.5 V.

Figure 77:
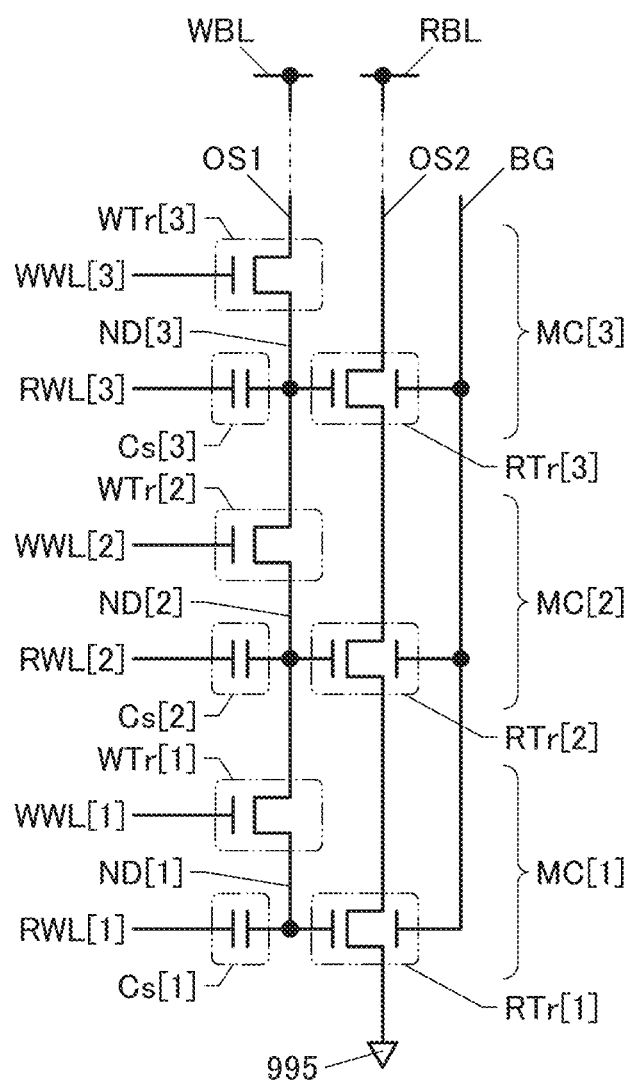
FIG. 77 is an equivalent circuit diagram of the memory string.

FIG. 77 shows an equivalent circuit diagram of the memory string 900. A conductor WBL, a conductor RBL, and a terminal 995 that are not illustrated in FIG. 76A are illustrated in FIG. 77. The conductor WBL is electrically connected to one terminal of the oxide semiconductor OS1. The conductor RBL is electrically connected to one terminal of the oxide semiconductor OS2. The terminal 995 is electrically connected to the other terminal of the oxide semiconductor OS2.

Next, the reading operation performed in the device simulation is described (see FIG. 77). Note that at the time of the reading operation, the voltage of the conductor BG was 0 V and the voltages of the conductor WWL[1] to the conductor WWL[3] were −1 V.

First, the H potential is supplied to the conductor RBL, and 0 V is supplied to the terminal 995. Then, 3.3 V is supplied to the conductor RWL[1] and the conductor RWL[2] and 0 V is supplied to the conductor RWL[3], so that the transistor RTr[1] and the transistor RTr[2] are turned on. The on state and the off state of the transistor RTr[3] are determined in accordance with the voltage of the node ND[3].

Next, voltage supply to the conductor RBL is stopped, so that the conductor RBL is brought into a floating state. Accordingly, the voltage of the conductor RBL changes in accordance with the voltage of the node ND[3]. This voltage change is detected, whereby data retained in the node ND[3] can be notified.

In the device simulation, the voltage change of the conductor RBL at the time of the reading operation was calculated for various carrier concentrations of the oxide semiconductor OS2.

FIG. 78A to FIG. 78H show the calculation results. In FIG. 78A to FIG. 78H, the horizontal axis represents elapsed time (time) and the vertical axis represents the voltage of the oxide semiconductor OS2 (V_BL). The conductor RBL was brought into a floating state two microseconds after the start of the reading operation. In FIG. 78A to FIG. 78H, a profile 999[0] shows a change in V_BL in the case where "0" is retained in the node ND[3]. A profile 999[1] shows a change in V_BL in the case where "1" is retained in the node ND[3].

Figure 78A:
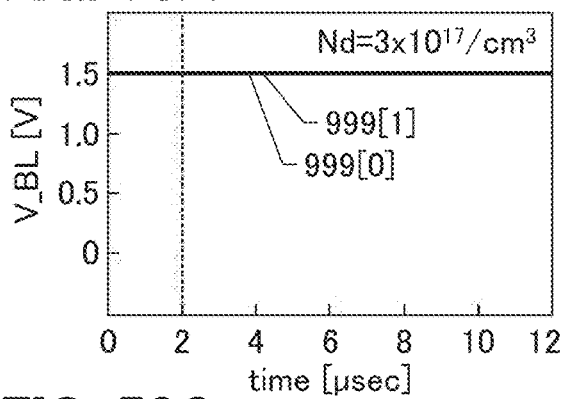
FIG. 78A to FIG. 78H are graphs showing calculation results for a reading operation.
Figure 78B:
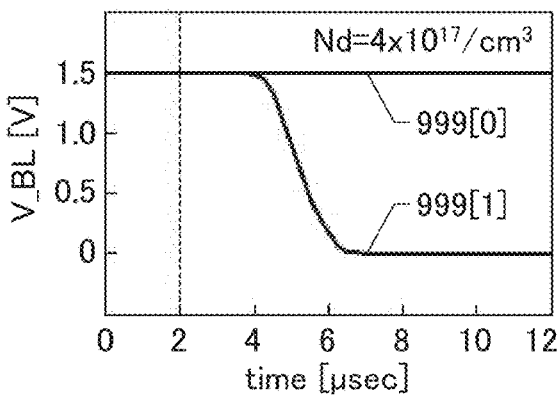
Figure 78C:
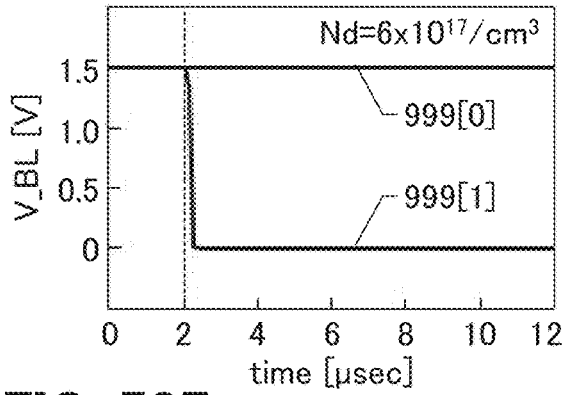
Figure 78D:
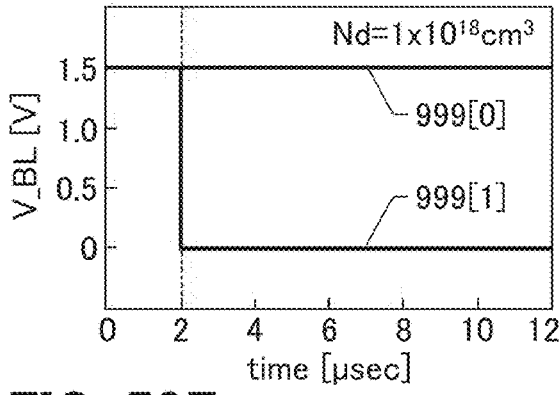
Figure 78E:
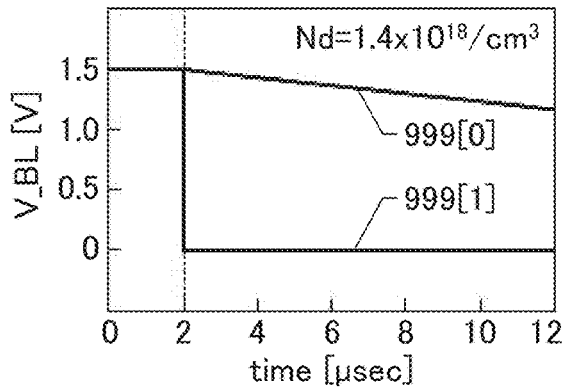
Figure 78F:
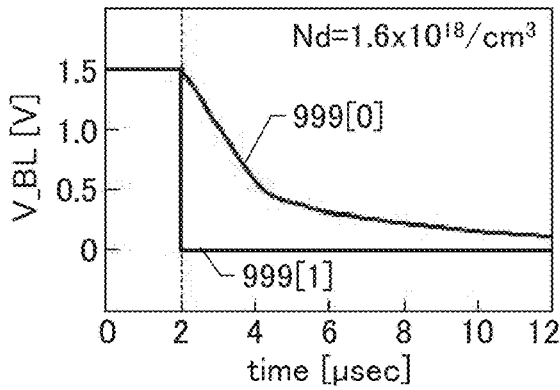
Figure 78G:
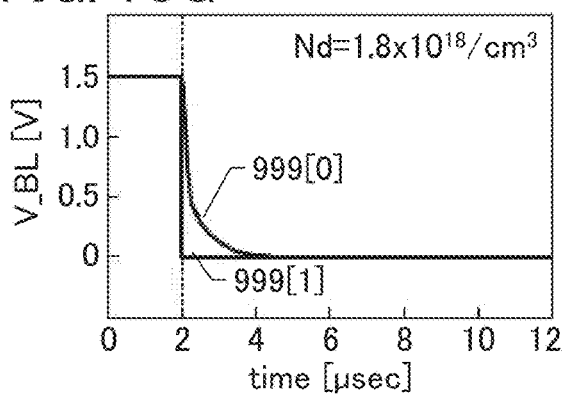
Figure 78H:
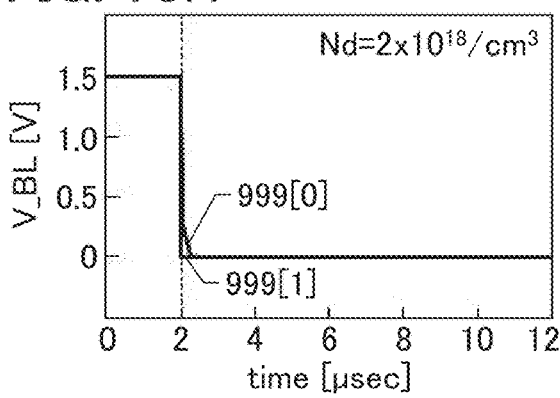

FIG. 78A shows the calculation result in the case where the carrier concentration (Nd) of the oxide semiconductor OS2 was set to 3×10$^{17}$/cm$^3$. FIG. 78B shows the calculation result in the case where Nd was set to 4×10$^{17}$/cm$^3$. FIG. 78C shows the calculation result in the case where Nd was set to 6×10$^{17}$/cm$^3$. FIG. 78D shows the calculation result in the case where Nd was set to 1×10$^{18}$/cm$^3$. FIG. 78E shows the calculation result in the case where Nd was set to 1.4×10$^{18}$/cm$^3$. FIG. 78F shows the calculation result in the case where Nd was set to 1.6×10$^{18}$/cm$^3$. FIG. 78G shows the calculation result in the case where Nd was set to 1.8×10$^{18}$/cm$^3$. FIG. 78H shows the calculation result in the case where Nd was set to 2×10$^{18}$/cm$^3$.

Figure 79:
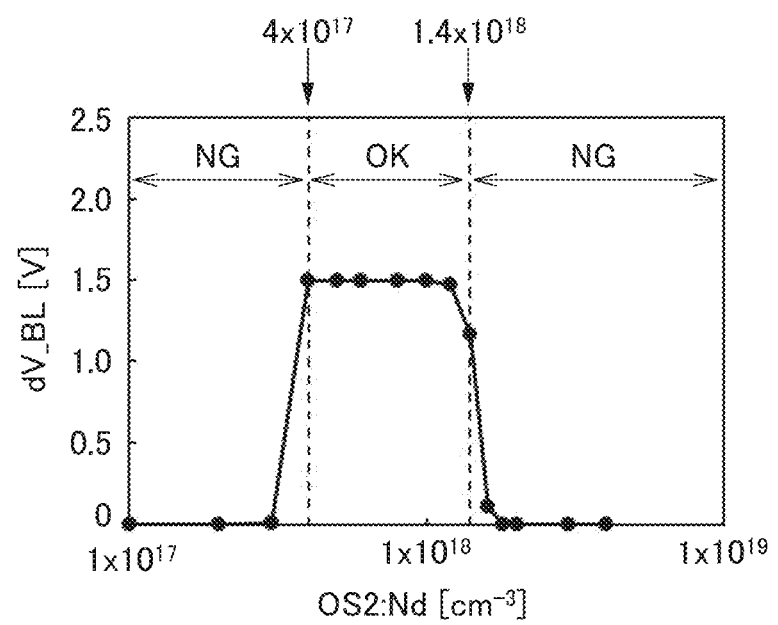
FIG. 79 is a graph showing calculation results for a reading operation.

FIG. 79 is a graph showing the relation between Nd of the oxide semiconductor OS2 and a voltage difference (dV_BL) between the profile 999[0] and the profile 999[1] 12 microseconds after the start of the reading operation. In FIG. 79, the horizontal axis represents Nd of the oxide semiconductor OS2 and the vertical axis represents dV_BL. Given that dV_BL of 1 V or higher indicates "reading OK" and dV_BL of lower than 1 V indicates "reading NG", it is found that the data retained in the node ND[3] can be read when Nd is higher than or equal to 4×10$^{17}$/cm$^3$ and lower than or equal to 1.4×10$^{18}$/cm$^3$.

The sheet resistance of an oxide semiconductor can be calculated from the thickness and carrier concentration of the oxide semiconductor with the use of Formula 1 and Formula 2.

[Formula 1]
$$R_{sheet} = \frac{\rho_{OS}}{t_{OS}} \qquad (1)$$

[Formula 2]
$$\rho_{OS} = \frac{1}{q \times n_{OS} \times \mu_{OS}} \qquad (2)$$

$R_{sheet}$ represents the sheet resistance, $\rho_{os}$ represents the resistivity of the oxide semiconductor, $t_{os}$ represents the thickness of the oxide semiconductor, $n_{os}$ represents the carrier concentration in the oxide semiconductor, $\mu_{os}$ represents the electron mobility of the oxide semiconductor, and q represents elementary electric charge.

Table 3 shows a conversion table of the carrier concentration and the sheet resistance for various thicknesses of the oxide semiconductor at the time when $\mu_{os}$ is 10 cm$^2$/Vs and q is 1.6022×10$^{-19}$ coulombs.

TABLE 3

| Sheet resistance [Ω/□] | Thickness of oxide semiconductor [nm] | | | | | |
|---|---|---|---|---|---|---|
| | 30 | 25 | 20 | 15 | 10 | 5 |
| Carrier concentration [cm$^{-3}$] 1.0E+17 | 2.1E+06 | 2.5E+06 | 3.1E+06 | 4.2E+06 | 6.2E+06 | 1.2E+07 |
| 2.0E+17 | 1.0E+06 | 1.2E+06 | 1.6E+06 | 2.1E+06 | 3.1E+06 | 6.2E+06 |
| 4.0E+17 | 5.2E+05 | 6.2E+05 | 7.8E+05 | 1.0E+06 | 1.6E+06 | 3.1E+06 |
| 6.0E+17 | 3.5E+05 | 4.2E+05 | 5.2E+05 | 6.9E+05 | 1.0E+06 | 2.1E+06 |
| 8.0E+17 | 2.6E+05 | 3.1E+05 | 3.9E+05 | 5.2E+05 | 7.8E+05 | 1.6E+06 |
| 1.0E+18 | 2.1E+05 | 2.5E+05 | 3.1E+05 | 4.2E+05 | 6.2E+05 | 1.2E+06 |
| 1.2E+18 | 1.7E+05 | 2.1E+05 | 2.6E+05 | 3.5E+05 | 5.2E+05 | 1.0E+06 |
| 1.4E+18 | 1.5E+05 | 1.8E+05 | 2.2E+05 | 3.0E+05 | 4.5E+05 | 8.9E+05 |
| 1.6E+18 | 1.3E+05 | 1.6E+05 | 2.0E+05 | 2.6E+05 | 3.9E+05 | 7.8E+05 |
| 1.8E+18 | 1.2E+05 | 1.4E+05 | 1.7E+05 | 2.3E+05 | 3.5E+05 | 6.9E+05 |
| 2.0E+18 | 1.0E+05 | 1.2E+05 | 1.6E+05 | 2.1E+05 | 3.1E+05 | 6.2E+05 |
| 3.0E+18 | 6.9E+04 | 8.3E+04 | 1.0E+05 | 1.4E+05 | 2.1E+05 | 4.2E+05 |
| 4.0E+18 | 5.2E+04 | 6.2E+04 | 7.8E+04 | 1.0E+05 | 1.6E+05 | 3.1E+05 |
| 6.0E+18 | 3.5E+04 | 4.2E+04 | 5.2E+04 | 6.9E+04 | 1.0E+05 | 2.1E+05 |
| 8.0E+18 | 2.6E+04 | 3.1E+04 | 3.9E+04 | 5.2E+04 | 7.8E+04 | 1.6E+05 |
| 1.0E+19 | 2.1E+04 | 2.5E+04 | 3.1E+04 | 4.2E+04 | 6.2E+04 | 1.2E+05 |

According to Table 3, it is found that when the thickness of the oxide semiconductor is 15 nm and the carrier concentration is $4\times10^{17}$/cm$^3$, the sheet resistance is $1\times10^6 \Omega/\square$. Furthermore, it is found that when the carrier concentration is $1.4\times10^{18}$/cm$^3$, the sheet resistance is $3\times10^5 \Omega/\square$.

The device simulation demonstrates that the carrier concentration of the semiconductor 127 is preferably higher than or equal to $4\times10^{17}$/cm$^3$ and lower than or equal to $1.4\times10^{18}$/cm$^3$. Furthermore, the device simulation demonstrates that the sheet resistance of the semiconductor 127 is preferably higher than or equal to $3\times10^5 \Omega/\square$ and lower than or equal to $1\times10^6 \Omega/\square$.

This example can be implemented in combination with any of the structures described in the other embodiments and the like, as appropriate.

REFERENCE NUMERALS

100: memory device, 105: region, 110: memory cell array, 120: memory string, 121: substrate, 122: conductor, 123: insulator, 124: insulator, 125: semiconductor, 126: insulator, 127: semiconductor, 128: conductor, 129: insulator, 130: conductor, 132: insulator, 134: conductor, 136: conductor

The invention claimed is:

1. A memory device comprising:
    a first conductor, a second conductor, a third conductor, and a fourth conductor;
    a first insulator, a second insulator, and a third insulator;
    a first semiconductor and a second semiconductor; and
    a first transistor,
    wherein the first conductor extends in a first direction,
    wherein, on a side surface extending in the first direction of the first conductor, the first insulator is adjacent to the first conductor, the first semiconductor is adjacent to the first insulator, the second insulator is adjacent to the first semiconductor, the second semiconductor is adjacent to the second insulator, and the third insulator is adjacent to the second semiconductor,
    wherein the memory device comprises a first region and a second region,
    wherein in the first region, the second conductor is adjacent to the third insulator,
    wherein in the second region, the third conductor is adjacent to the third insulator,
    wherein, in the second region, the fourth conductor is between the second insulator and the second semiconductor, and
    wherein the first semiconductor and the second semiconductor are electrically connected to one of a source and a drain of the first transistor.

2. The memory device according to claim 1, wherein in the first region, the first insulator, the second insulator, the third insulator, the first semiconductor, and the second semiconductor are provided concentrically.

3. The memory device according to claim 1, wherein in the second region, the first insulator, the second insulator, the third insulator, the first semiconductor, the second semiconductor, and the fourth conductor are provided concentrically.

4. The memory device according to claim 1, wherein the first region is configured to be a second transistor, and wherein the second region is configured to be a third transistor.

5. The memory device according to claim 1, wherein the first semiconductor is an oxide semiconductor.

6. The memory device according to claim 1, wherein the second semiconductor is an oxide semiconductor.

7. The memory device according to claim 1, wherein part of the first semiconductor is configured to be a channel formation region of the first transistor.

8. The memory device according to claim 1, wherein a carrier concentration of the first semiconductor is higher than or equal to $4\times10^{17}$/cm$^3$ and lower than or equal to $1.4\times10^{18}$/cm$^3$.

9. The memory device according to claim 1, wherein a sheet resistance of the first semiconductor is higher than or equal to $3\times10^5$ $\Omega/\square$ and lower than or equal to $1\times10^6$ $\Omega/\square$.

* * * * *